(12) United States Patent
Hosoda et al.

(10) Patent No.: US 9,825,049 B2
(45) Date of Patent: Nov. 21, 2017

(54) SEMICONDUCTOR DEVICE AND MANUFACTURING METHOD OF SEMICONDUCTOR DEVICE

(71) Applicant: Renesas Electronics Corporation, Koutou-ku, Tokyo (JP)

(72) Inventors: Naohiro Hosoda, Tokyo (JP); Daisuke Okada, Tokyo (JP); Kozo Katayama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/997,515

(22) Filed: Jan. 16, 2016

(65) Prior Publication Data
US 2016/0133641 A1 May 12, 2016

Related U.S. Application Data

(63) Continuation of application No. 13/614,853, filed on Sep. 13, 2012, now Pat. No. 9,245,900.

(30) Foreign Application Priority Data

Oct. 4, 2011 (JP) .................................. 2011-220254
Aug. 3, 2012 (JP) .................................. 2012-172569

(51) Int. Cl.
*H01L 29/788* (2006.01)
*H01L 29/792* (2006.01)
(Continued)

(52) U.S. Cl.
CPC ...... *H01L 27/11568* (2013.01); *H01L 27/115* (2013.01); *H01L 29/42344* (2013.01);
(Continued)

(58) Field of Classification Search
CPC . H01L 29/792; H01L 29/7923; H01L 27/115; H01L 27/11568; H01L 29/66833;
(Continued)

(56) References Cited

U.S. PATENT DOCUMENTS 6,174,772 B1 * 1/2001 Hsieh ................ H01L 21/28273
257/321
7,667,259 B2 * 2/2010 Yasui .................... H01L 27/115
257/314
(Continued)

FOREIGN PATENT DOCUMENTS

JP 2001-148434 A 5/2001
JP 2005-123518 A 5/2005
(Continued)

OTHER PUBLICATIONS

Office Action dated Jan. 14, 2016, in Taiwanese Patent Application No. 101131415.
(Continued)

*Primary Examiner* — Fernando L Toledo
*Assistant Examiner* — Aaron Gray
(74) *Attorney, Agent, or Firm* — Shapiro, Gabor and Rosenberger, PLLC

(57) ABSTRACT

A semiconductor device of the present invention has a first insulating film formed between a control gate electrode and a semiconductor substrate and a second insulating film formed between a memory gate electrode and the semiconductor substrate and between the control gate electrode and the memory gate electrode, the second insulating film having a charge accumulating part therein. The second insulating film has a first film, a second film serving as a charge accumulating part disposed on the first film, and a third film disposed on the second film. The third film has a sidewall film positioned between the control gate electrode and the (Continued)

memory gate electrode and a deposited film positioned between the memory gate electrode and the semiconductor substrate. In this structure, the distance at a corner part of the second insulating film can be increased, and electric-field concentration can be reduced.

9 Claims, 94 Drawing Sheets

(51) Int. Cl.
  *H01L 21/336* (2006.01)
  *H01L 27/11568* (2017.01)
  *H01L 27/115* (2017.01)
  *H01L 29/66* (2006.01)
  *H01L 29/423* (2006.01)
(52) U.S. Cl.
  CPC .. *H01L 29/42364* (2013.01); *H01L 29/66833* (2013.01); *H01L 29/792* (2013.01)
(58) Field of Classification Search
  CPC ......... H01L 21/28282; H01L 29/42344; H01L 29/42364; H01L 29/42368
  USPC ............... 257/314, 315, 316, 321, 324, 326, 257/E29.309, E21.679, E21.423; 438/257, 261, 264, 266, 267
  See application file for complete search history.

(56) References Cited

U.S. PATENT DOCUMENTS

| | | |
|---|---|---|
| 2002/0149060 A1 | 10/2002 | Ogura et al. |
| 2002/0149061 A1 | 10/2002 | Ogura et al. |
| 2003/0198086 A1 | 10/2003 | Shukuri |
| 2004/0188753 A1* | 9/2004 | Kawashima ...... H01L 21/28273 257/316 |
| 2005/0085039 A1* | 4/2005 | Yasui ................ H01L 21/28273 438/257 |
| 2007/0148866 A1 | 6/2007 | Kim |
| 2007/0207581 A1 | 9/2007 | Yasui et al. |
| 2007/0210371 A1 | 9/2007 | Hisamoto et al. |
| 2008/0290401 A1* | 11/2008 | Yasui ................ G11C 16/0425 257/324 |
| 2011/0175156 A1 | 7/2011 | Okuyama |

FOREIGN PATENT DOCUMENTS

| | | |
|---|---|---|
| JP | 2010-108976 A | 5/2010 |
| JP | 2011-103401 A | 5/2011 |

OTHER PUBLICATIONS

Extended European Search Report dated May 28, 2013, in European Patent Application No. 12186702.2.

\* cited by examiner

| OPERATION | APPLIED VOLTAGE | Vd | Vcg | Vmg | Vs | Vb |
|---|---|---|---|---|---|---|
| WRITE | | 0.3V | 1V | 8V | 6V | 0 |
| ERASURE | | 0 | 0 | −11V | 0 | 0 |
| READ | | Vdd | Vdd | 0 | 0 | 0 |

Vdd = 1.5V

| OPERATION \ APPLIED VOLTAGE | Vd | Vcg | Vmg | Vs | Vb |
|---|---|---|---|---|---|
| ERASURE | 0 | 0 | −6V | 6V | 0 |

| OPERATION \ APPLIED VOLTAGE | Vd | Vcg | Vmg | Vs | Vb |
|---|---|---|---|---|---|
| WRITE | 0.3V | 1V | 8V | 6V | 0 |
| ERASURE | 0 | 0 | +12V | 0 | 0 |
| READ | Vdd | Vdd | 0 | 0 | 0 |

Vdd = 1.5V

SEMICONDUCTOR DEVICE AND MANUFACTURING METHOD OF SEMICONDUCTOR DEVICE

CROSS-REFERENCE TO RELATED APPLICATIONS

The present application claims priorities from Japanese Patent Application No. 2011-220254 filed on Oct. 4, 2011, and Japanese Patent Application No. 2012-172569 filed on Aug. 3, 2012, the contents of which are hereby incorporated by reference to this application.

TECHNICAL FIELD

The present invention relates to a semiconductor device and a manufacturing method of a semiconductor device, and particularly relates to techniques effectively applied to a semiconductor device having a non-volatile memory.

BACKGROUND

A flash memory is widely used as a type of EEPROM (Electrically Erasable and Programmable Read Only Memory), which is an electrically writable/erasable non-volatile semiconductor storage device. The flash memory has an electrically-conductive floating gate electrode surrounded by an oxide film or a trap insulating film below a gate electrode of a MISFET. Information is stored by utilizing the difference in the threshold value of the MISFET depending on presence/absence of charge (electrons or holes) in the floating gate or the trap insulating film.

For example, Japanese Patent Application Laid-Open Publication No. 2005-123518 (Patent Document 1) discloses a non-volatile memory cell in which a charge retaining characteristic is improved by providing a taper on a sidewall of a select gate electrode (15) in order to improve the charge retaining characteristic by suppressing reduction in the thickness of a corner part (20) of a charge accumulating film. For example, paragraphs [0041] and [0042] disclose that a sidewall spacer (69) of a silicon oxide film is formed after the formation of the select gate electrode, thereby controlling the angle of a corner part of an ONO-film (FIG. 25).

Japanese Patent Application Laid-Open Publication No. 2001-148434 (Patent Document 2) discloses a non-volatile memory cell capable of achieving the low-voltage drive, high-speed program, and high-density integration. In this disclosure, for example, in order to reduce the coupling capacitance between a first gate electrode (141) and a second gate electrode (142) to improve a driving speed, an end surface of a gate electrode (141) is oxidized to form an oxide film (141a) or a sidewall (not shown) serving as an insulating member is formed on a side surface of the gate electrode (141) instead of the oxide film (141a) (paragraph [0108], FIG. 13). It also discloses that the capacitance between gate electrodes is reduced by oxidizing an end surface of a gate electrode (241) to form an oxide film (241a) or forming a sidewall serving as an insulating member on a side surface of the gate electrode (241) instead of the oxide film (241a) (paragraph [0128], FIG. 18).

Japanese Patent Application Laid-Open Publication No. 2010-108976 (Patent Document 3) discloses a semiconductor device in which a corner part, which is formed at an end part of a side in contact with a gate insulating film (GOX), is processed into a reversely tapered shape at a control gate electrode (CG) of a memory cell, thereby suppressing the disturbance. It also discloses that the distance between the control gate electrode (CG) and the memory gate electrode (MG) is increased in a region close to a semiconductor substrate by increasing the film thickness (film thickness b) of a potential barrier film (EV1) at a lower part of the control gate electrode (CG), thereby suppressing the disturbance (paragraphs [0105] to [0108], FIG. 14, FIG. 15).

Japanese Patent Application Laid-Open Publication No. 2011-103401 (Patent Document 4) discloses a split-gate-type memory cell in which a sidewall insulating film (11) composed of, for example, a silicon oxide film or a silicon nitride film is formed between a stacked gate insulating film (9) and a memory gate electrode (10) which are formed on one of sidewalls of a control gate electrode (8), and the memory gate electrode is electrically separated from the control gate electrode by the sidewall insulating film and the stacked gate insulating film. This structure can prevent the short-circuit failure caused by contact between a silicide layer formed on the surface of the control gate electrode and a silicide layer formed on the surface of the memory gate electrode. The inside of parentheses shows symbols described in the documents.

SUMMARY

The inventors of the present invention have been working in research and development of non-volatile memories and have been studying about improvement of the characteristics of the non-volatile memories.

Recently, in a semiconductor device having the above-described non-volatile memory, reduction in current consumption (reduction in power consumption) has been desired in addition to improvement of operating characteristics and data retaining characteristics.

In order to realize this reduction in current consumption, studies in consideration of the structure of the device, operating methods thereof (for example, erasing method), and others are required.

Therefore, an object of the present invention is to provide techniques capable of improving characteristics of the semiconductor device. Specifically, the object is to provide techniques capable of improving characteristics (particularly, erasure characteristic) of a memory cell in the semiconductor device.

Another object of the present invention is to provide a manufacturing method of the semiconductor device for manufacturing the semiconductor device having good characteristics.

The above and other objects and novel characteristics of the present invention will be apparent from the description of the present specification and the accompanying drawings.

The following is a brief description of an outline of the typical invention disclosed in the present application.

In the invention disclosed in this application, a semiconductor device according to a typical embodiment includes: a semiconductor substrate; a first gate electrode disposed above the semiconductor substrate; and a second gate electrode disposed above the semiconductor substrate so as to be adjacent to the first gate electrode. Furthermore, it includes: a first insulating film formed between the first gate electrode and the semiconductor substrate; and a second insulating film formed between the second gate electrode and the semiconductor substrate and between the first gate electrode and the second gate electrode, the second insulating film having a charge accumulating part therein. The second insulating film includes: a first film; a second film disposed on the first film and serving as the charge accumulating part; and a third film disposed on the second film. The third film includes: a sidewall film positioned between the first gate electrode and the second gate electrode; and a deposited film positioned between the second gate electrode and the semiconductor substrate.

In the invention disclosed in this application, a semiconductor device according to a typical embodiment includes: a semiconductor substrate; a first gate electrode disposed above the semiconductor substrate; and a second gate electrode disposed above the semiconductor substrate so as to be adjacent to the first gate electrode. Furthermore, it includes: a first insulating film formed between the first gate electrode and the semiconductor substrate; and a second insulating film formed between the second gate electrode and the semiconductor substrate and between the first gate electrode and the second gate electrode, the second insulating film having a charge accumulating part therein. The second insulating film includes: a first film; a second film disposed on the first film and serving as the charge accumulating part; and a third film disposed on the second film. The first film has a first part positioned between the second gate electrode and the semiconductor substrate and a second part positioned between the first gate electrode and the second gate electrode, and a film thickness of a lower part of the second part is larger than a film thickness of the first part. Electrons are accumulated in the charge accumulating part, and the electrons accumulated in the charge accumulating part are erased when holes generated in the semiconductor substrate are injected by a tunneling phenomenon into the charge accumulating part via the first part.

In the invention disclosed in this application, a manufacturing method of a semiconductor device according to a typical embodiment includes: (a) a step of forming a first gate electrode on a semiconductor substrate via a first insulating film; (b) a step of forming a second insulating film having a charge accumulating part therein on the semiconductor substrate and on a surface and a side surface of the first gate electrode; and (c) a step of forming a second gate electrode on a sidewall part of the first gate electrode via the second insulating film. The step (b) is a step of forming the second insulating film having a first film, a second film, and a third film and includes: (b1) a step of forming the first film on the semiconductor substrate and on the surface and the side surface of the first gate electrode; (b2) a step of forming the second film serving as the charge accumulating part on the first film; and (b3) a step of forming a first deposited film on the second film. Furthermore, it includes: (b4) a step of anisotropically etching the first deposited film, thereby forming a sidewall film on the sidewall part of the first gate electrode via the first film and the second film; and (b5) a step of forming a second deposited film on the second film and the sidewall film, thereby forming the third film having the sidewall film and the second deposited film.

In the invention disclosed in this application, a manufacturing method of a semiconductor device according to a typical embodiment includes: (a) a step of forming a first gate electrode on a semiconductor substrate via a first insulating film; (b) a step of forming a second insulating film having a charge accumulating part therein on the semiconductor substrate and on a surface and aside surface of the first gate electrode; and (c) a step of forming a second gate electrode on a sidewall part of the first gate electrode via the second insulating film. The step (b) is a step of forming the second insulating film having a first film, a second film, and a third film and includes: (b1) a step of forming a first deposited film on the semiconductor substrate and on a surface and a side surface of the first gate electrode; and (b2) a step of anisotropically etching the first deposited film, thereby forming a sidewall film on a sidewall part of the first gate electrode. Furthermore, it includes: (b3) a step of forming a second deposited film on the semiconductor substrate, on the surface of the first gate electrode, and on the sidewall film, thereby forming the first film having the sidewall film and the second deposited film; (b4) a step of forming the second film serving as the charge accumulating part on the first film; and (b5) a step of forming the third film on the second film.

In the invention disclosed in this application, a semiconductor device according to a typical embodiment includes: a semiconductor substrate; a first gate electrode disposed above the semiconductor substrate; and a second gate electrode disposed above the semiconductor substrate so as to be adjacent to the first gate electrode. Furthermore, it includes: a first insulating film formed between the first gate electrode and the semiconductor substrate; and a second insulating film formed between the second gate electrode and the semiconductor substrate and between the first gate electrode and the second gate electrode, the second insulating film having a charge accumulating part therein. The second insulating film includes: a first film; a second film disposed on the first film and serving as the charge accumulating part; and a third film disposed on the second film. The first film includes: a sidewall film positioned between the first gate electrode and the second gate electrode; and a deposited film positioned between the second gate electrode and the semiconductor substrate. Electrons are accumulated in the charge accumulating part, and the electrons accumulated in the charge accumulating part are erased when holes are injected by a tunneling phenomenon into the charge accumulating part via the third film from the second gate electrode side.

In the invention disclosed in this application, according to the semiconductor device described in the typical embodiments below, the characteristics of the semiconductor device can be improved.

Also, in the invention disclosed in this application, according to the manufacturing method of a semiconductor device described in the typical embodiments below, the semiconductor device with good characteristics can be manufactured.

DETAILED DESCRIPTION

Figure 1:
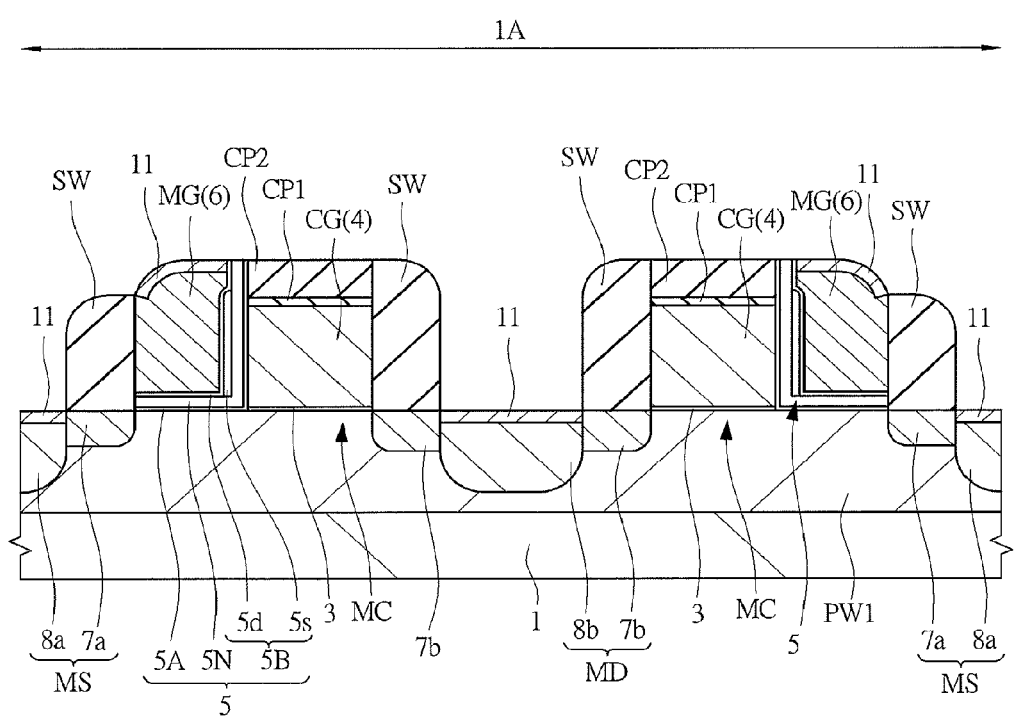
FIG. 1 is a main-part cross-sectional view showing a semiconductor device of a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and others described above (including number of pieces, values, amount, range and others).

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments.

Also, in the drawings used in the following embodiments, hatching is omitted even in a cross-sectional view so as to make the drawings easy to see. Further, hatching is used even in a plan view so as to make the drawings easy to see.

First Embodiment

Hereinafter, a structure and a manufacturing method of a semiconductor device (semiconductor storage device) of the present embodiment will be described in detail with reference to drawings.

[Description of Structure]

Figure 2:
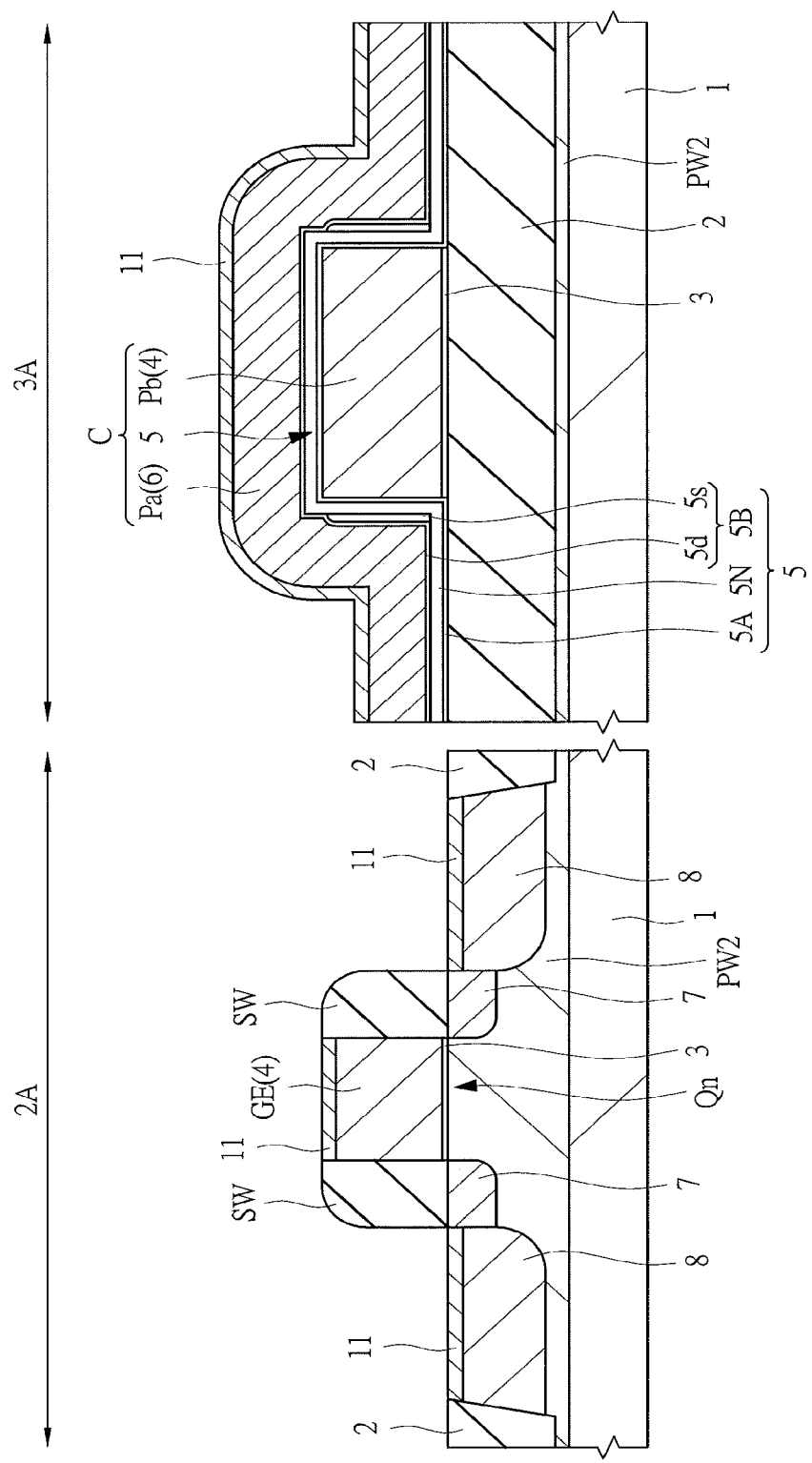
FIG. 2 is a main-part cross-sectional view showing the semiconductor device of the first embodiment.
Figure 3:
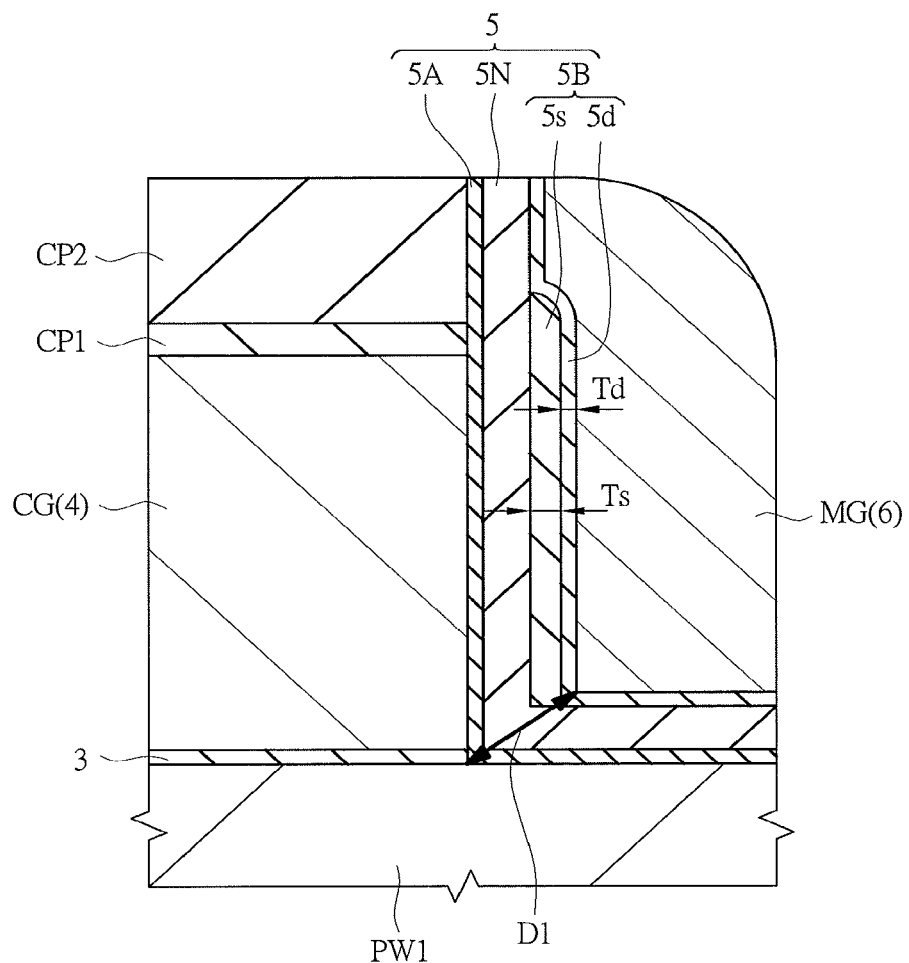
FIG. 3 is a cross-sectional view of a memory cell part of FIG. 1.

FIG. 1 and FIG. 2 are main-part cross-sectional views showing the semiconductor device of the present embodiment, and FIG. 3 is a cross-sectional view of a memory cell part of FIG. 1.

First, the semiconductor device described in the present embodiment has non-volatile memories (non-volatile semiconductor storage devices, EEPROMs, flash memories, non-volatile storage elements) and peripheral circuits.

In the non-volatile memory, a trap insulating film (insulating film capable of accumulating charge) is used as a charge accumulating part. Memory cells MC are memory cells of a split gate type. More specifically, two MISFETs, that is, a control transistor (select transistor) having a control gate electrode (select gate electrode) CG and a memory transistor having a memory gate electrode (gate electrode for memory) MG are connected in the memory cell.

Herein, a MISFET (Metal Insulator Semiconductor Field Effect Transistor) provided with a gate insulating film, which includes the charge accumulating part (charge accumulating layer), and a memory gate electrode MG is referred to as a memory transistor (transistor for storage) and a MISFET provided with a gate insulating film and the control gate electrode CG is referred to as a control transistor (select transistor, transistor for selecting memory cells).

The peripheral circuits are circuits for driving the non-volatile memories and are composed of, for example, various logic circuits. The various logic circuits are composed of, for example, n-channel-type MISFETs Qn and p-channel-type MISFETs described later. In addition, capacitive elements (herein, PIP:Poly-Insulator-Poly) C and others described later are also formed.

As shown in FIG. 1 and FIG. 2, the semiconductor device of the present embodiment includes the memory cells MC of the non-volatile memory disposed in a memory cell region 1A of a semiconductor substrate 1, the n-channel-type MISFET Qn disposed in a peripheral circuit region 2A, and the capacitive element C disposed in a peripheral circuit region 3A.

FIG. 1 shows a main-part cross-sectional view of the two memory cells MC sharing a drain region (MD), a left part of FIG. 2 shows a main-part cross-sectional view of the n-channel-type MISFET Qn, and a right part of FIG. 2 shows a main-part cross-sectional view of the capacitive element C.

As shown in FIG. 1, the two memory cells are approximately symmetrically disposed with interposing the drain region (MD (8b)) therebetween. In the memory cell region 1A, a plurality of memory cells MC are further disposed. For example, to the left of the memory cell MC on the left side of the memory cell region 1A shown in FIG. 1, the memory cells MC are disposed in the left-right direction (gate-length direction) in FIG. 1 so that a source region (MS) and a shared drain region (MD) are alternately disposed to constitute a memory cell row. Moreover, also in the direction perpendicular to the surface of paper of FIG. 1 (gate-width direction), a plurality of memory cell rows are disposed. In this manner, the plurality of memory cells MC are formed in an array.

As shown in FIG. 2, isolation regions 2 for separating elements are formed in the semiconductor substrate (semiconductor wafer) 1, and p-type wells PW1 and PW2 are exposed from an active region sectioned (separated) by the isolation regions 2.

The isolation regions 2 are not shown in the cross-sectional part (FIG. 1) shown in the memory cell region 1A. However, the entire memory cell region in which the memory cells MC are formed in an array is sectioned by the isolation regions 2. Furthermore, the isolation regions 2 are arbitrarily disposed at the locations where electrical separation is required, for example, the isolation regions 2 are disposed between the memory cell rows (except the source regions (MS)). The capacitive elements C are formed on the isolation regions 2.

First, a structure of the memory cell MC of the memory cell region 1A will be described (see FIG. 1, FIG. 3).

The memory cell MC includes the control gate electrode (first gate electrode) CG disposed above the semiconductor substrate 1 (p-type well PW1) and the memory gate electrode (second gate electrode) MG disposed above the semiconductor substrate 1 (p-type well PW1) and adjacent to the control gate electrode CG. On the control gate electrode CG, a thin silicon oxide film CP1 and a silicon nitride film (cap insulating film) CP2 are disposed. The memory cell MC further includes an insulating film 3 disposed between the control gate electrode CG and the semiconductor substrate 1 (p-type well PW1) and an insulating film 5 disposed between the memory gate electrode MG and the semiconductor substrate 1 (p-type well PW1) and disposed between the memory gate electrode MG and the control gate electrode CG. The memory cell MC further includes the source region MS and the drain region MD formed in the p-type well PW1 of the semiconductor substrate 1.

The control gate electrode CG and the memory gate electrode MG are disposed to be juxtaposed to each other in the left-right direction (gate-length direction) of FIG. 1 on a main surface of the semiconductor substrate 1 in a state in which the insulating film 5 is interposed between opposing side surfaces (sidewalls) thereof. The extending direction of the control gate electrode CG and the memory gate electrode MG is the direction perpendicular to the surface of the paper of FIG. 1 (gate-width direction). The control gate electrode CG and the memory gate electrode MG are formed above the semiconductor substrate 1 (p-type well PW1) between the drain region MD and the source region MS via the insulating films 3 and 5 (note that the control gate electrode CG is formed via the insulating film 3, and the memory gate electrode MG is formed via the insulating film 5). The memory gate electrode MG is positioned on the source region MS side, and the control gate electrode CG is positioned on the drain region MD side. In this specification, the source region MS and the drain region MD are defined based on those in an operating period. A semiconductor region to which a high voltage is applied in a writing operation described later is uniformly referred to as a source region MS, and a semiconductor region to which a low voltage is applied in the writing operation is uniformly referred to as a drain region MD.

The control gate electrode CG and the memory gate electrode MG are adjacent to each other with the insulating film 5 interposed therebetween, and the memory gate electrode MG is disposed like a sidewall spacer on a sidewall part of the control gate electrode CG via the insulating film 5. The insulating film 5 extends over both regions, that is, the region between the memory gate electrode MG and the semiconductor substrate 1 (p-type well PW1) and the region between the memory gate electrode MG and the control gate electrode CG. As described later, the insulating film 5 is composed of a stacked film of a plurality of insulating films.

The insulating film 3 formed between the control gate electrode CG and the semiconductor substrate 1 (p-type well PW1) (more specifically, the insulating film 3 below the control gate electrode CG) functions as a gate insulating film of a control transistor, and the insulating film 5 between the memory gate electrode MG and the semiconductor substrate 1 (p-type well PW1) (more specifically, the insulating film 5 below the memory gate electrode MG) functions as a gate insulating film of a memory transistor (gate insulating film having a charge accumulating part therein).

The insulating film 3 can be formed of, for example, a silicon oxide film or a silicon oxynitride film. Alternatively, other than the above-described silicon oxide film, silicon oxynitride film, and others, for example, a metal oxide film having a dielectric constant higher than that of a silicon nitride film such as a hafnium oxide film, an aluminum oxide film (alumina), or a tantalum oxide film may be used as the insulating film 3.

The insulating film 5 is a multilayer insulating film having a charge barrier film and a charge accumulating film. In this case, an ONO (oxide-nitride-oxide) film is used. Specifically, the insulating film 5 is composed of a silicon oxide film serving as a first film (lower layer film) 5A, a silicon nitride film serving as a second film (intermediate film) 5N, and a silicon oxide film serving as a third film (upper layer film) 5B. The third film (upper layer film) 5B is composed of a stacked film of a sidewall film 5s and a deposited film 5d, each of which is composed of a silicon oxide film. The second film 5N is the charge accumulating part.

The first film (lower layer film) 5A has a vertical part (perpendicular part) positioned between the sidewall of the control gate electrode CG and the sidewall of the memory gate electrode MG and a transverse part (horizontal part) positioned between the semiconductor substrate 1 (p-type well PW1) and a bottom part (bottom surface) of the memory gate electrode MG. In other words, the first film 5A is an insulating film continuously formed from the part between the sidewall of the control gate electrode CG and the sidewall of the memory gate electrode MG and to the part between the semiconductor substrate 1 and the bottom part of the memory gate electrode MG. Holes are injected into the second film (charge accumulating part) 5N by a tunneling phenomenon via the transverse part of the first film (tunnel oxide film) 5A to carry out an erasing operation of the electrons which have been written to the charge accumulating part. Operation of the memory cell will be described later. Therefore, the film thickness of the transverse part is preferably at least 2 nm or less. The film thickness of the vertical part (thickness in the gate-length direction) may be 2 nm or more.

The second film (intermediate film) 5N has a vertical part (perpendicular part) disposed on the first film 5A and positioned between the sidewall of the control gate electrode CG and the sidewall of the memory gate electrode MG and a transverse part (horizontal part) positioned between the semiconductor substrate 1 (p-type well PW1) and the bottom part (bottom surface) of the memory gate electrode MG. In other words, the second film 5N is an insulating film continuously formed from the part between the sidewall of the control gate electrode CG and the sidewall of the memory gate electrode MG to the part between the semiconductor substrate 1 and the bottom part of the memory gate electrode MG. More specifically, the second film 5N has the vertical part (perpendicular part) positioned between the vertical part of the first film 5A and the sidewall of the memory gate electrode MG and the transverse part (horizontal part) positioned between the transverse part of the first film 5A and the bottom part (bottom surface) of the memory gate electrode MG.

As described above, the third film 5B is composed of the stacked film of the sidewall film 5s and the deposited film 5d. The third film 5B has a vertical part (perpendicular part) positioned between the sidewall of the control gate electrode CG and the sidewall of the memory gate electrode MG and a transverse part (horizontal part) positioned between the semiconductor substrate 1 (p-type well PW1) and the bottom part (bottom surface) of the memory gate electrode MG. In other words, the third film 5B is an insulating film continuously formed from the part between the sidewall of the control gate electrode CG and the sidewall of the memory gate electrode MG to the part between the semiconductor substrate 1 and the bottom part of the memory gate electrode MG. More specifically, the third film 5B has the vertical part (perpendicular part) positioned between the vertical part of the second film 5N and the sidewall of the memory gate electrode MG and the transverse part (horizontal part) positioned between the transverse part of the second film 5N and the bottom part (bottom surface) of the memory gate electrode MG. The vertical part of the third film 5B is composed of a stacked part of the sidewall film $5s$ and the vertical part of the deposited film $5d$, and the transverse part thereof is composed of the transverse part of the deposited film $5d$.

The height H5s of the sidewall film $5s$ is set to be lower than the height HMG of the memory gate electrode MG (H5s<HMG). In other words, the upper part of the sidewall film $5s$ is disposed at a position lower than the upper part of the memory gate electrode MG.

Other than the above-described silicon oxide film, an insulating film such as a silicon nitride film or a silicon oxynitride film can also be used as the sidewall film $5s$. However, if a nitride film having high charge trapping capability is disposed at a location other than the second film (charge accumulating part) 5N, charge is accumulated also in the nitride film, and a threshold potential (Vth) may be varied. Therefore, a silicon oxide film or a silicon oxynitride film is preferably used as the sidewall film $5s$. In the present embodiment, a silicon oxide film is used.

Accordingly, the deposited film $5d$ extends so as to cover the sidewall of the sidewall film $5s$ from a part on the transverse part of the second film 5N and further extends along the sidewall of the vertical part of the second film 5N.

The film thickness of the third film 5B will be described. The maximum film thickness (T1) of the vertical part of the third film is the sum (Ts+Td) of the maximum film thickness Ts of the sidewall film $5s$ and the film thickness Td of the vertical part of the silicon oxide film (deposited film) $5d$. Also, the film thickness (T2) of the transverse part of the third film is the film thickness Td of the vertical part of the silicon oxide film (deposited film) $5d$. In this manner, the film thickness of the vertical part of the third film is larger than the film thickness of the transverse part (see FIG. 3).

In the description above, the shapes of the stacked films (5A, 5N, 5B, $5d$) corresponding to the memory cell on the side shown in FIG. 3 and others have been described as the shape of the insulating film 5. However, for example, in the left-side memory cell shown in FIG. 1, the stacked films have approximately line-symmetric shapes about the drain region (MD ($8b$)).

By forming the structure in which the silicon nitride film (5N) is sandwiched by the silicon oxide film (5A) and the silicon oxide film (5B) in this manner, charge can be accumulated in the silicon nitride film (5N). In other words, in the insulating film 5, the silicon nitride film (5N) is an insulating film for accumulating charge and functions as a charge accumulating layer (charge accumulating part). More specifically, the silicon nitride film (5N) is a trap insulating film formed in the insulating film 5, and the silicon oxide films (5A, 5B) positioned above and below the silicon nitride film (5N) function as charge blocking layers (charge blocking film, charge confinement layer). The stacked film of the silicon oxide film (5A), the silicon nitride film (5N), and the silicon oxide film (5B) is sometimes referred to as an ONO film. The insulating film 5 has been described as an ONO film here, but a combination of other insulating films may be employed if the second film 5N is composed of an insulating film having a charge accumulating function and the first film 5A and the third film 5B ($5s$, $5d$) are composed by using insulating films different from the second film 5N. For example, as the insulating film having the charge accumulating function (charge accumulating layer), for example, an insulating film such as an aluminum oxide film, a hafnium oxide film, or a tantalum oxide film may be used. These films are high-dielectric-constant films having higher dielectric constant than that of a silicon nitride film. Also, an insulating film having silicon nano-dots may be used as the charge accumulating layer.

In the above-described insulating film 5, the insulating film 5 between the memory gate electrode MG and the semiconductor substrate 1 (p-type well PW1) functions as a gate insulating film of the memory transistor in a state in which charge (electrons) is retained or charge is not retained. Also, the insulating film 5 between the memory gate electrode MG and the control gate electrode CG functions as an insulating film for insulating (electrically separating) the memory gate electrode MG and the control gate electrode CG.

A channel region of the memory transistor is formed below the insulating film 5 below the memory gate electrode MG, and a channel region of the control transistor is formed below the insulating film 3 below the control gate electrode CG. In a channel forming region of the control transistor below the insulating film 3 below the control gate electrode CG, a semiconductor region (p-type semiconductor region or n-type semiconductor region) for adjusting a threshold value of the control transistor is formed according to needs. In a channel forming region of the memory transistor below the insulating film 5 below the memory gate electrode MG, a semiconductor region (p-type semiconductor region or n-type semiconductor region) for adjusting a threshold value of the memory transistor is formed according to needs.

As described above, in the writing operation, the source region MS is a semiconductor region to which a high voltage is applied, and the drain region MD is a semiconductor region to which a low voltage is applied. These regions MS and MD are composed of semiconductor regions to which an n-type impurity has been introduced (n-type impurity diffused layer).

The drain region MD is a region having a LDD (lightly doped drain) structure. More specifically, the drain region MD has an $n^-$-type semiconductor region (low-concentration impurity diffused layer) $7b$ and an $n^+$-type semiconductor region (high-concentration impurity diffused layer) $8b$ having an impurity concentration higher than that of the $n^-$-type semiconductor region $7b$. The $n^+$-type semiconductor region $8b$ has a deeper junction depth and a higher impurity concentration than those of the $n^-$-type semiconductor region $7b$.

The source region MS is also a region having the LDD structure. More specifically, the source region MS has an $n^-$-type semiconductor region (low-concentration impurity diffused layer) $7a$ and an $n^+$-type semiconductor region (high-concentration impurity diffused layer) $8a$ having an impurity concentration higher than that of the $n^-$-type semiconductor region $7a$. The $n^+$-type semiconductor region $8a$ has a deeper junction depth and a higher impurity concentration than those of the $n^-$-type semiconductor region $7a$.

On sidewall parts of a composite pattern of the memory gate electrode MG and the control gate electrode CG, sidewall insulating films (sidewalls, sidewall spacers) SW composed of an insulator (silicon oxide film, insulating film) such as silicon oxide are formed. More specifically, the sidewall insulating films SW are formed on the sidewall (side surface) of the memory gate electrode MG on the side opposite to the side which is adjacent to the control gate electrode CG via the insulating film 5 and on the sidewall (side surface) of the control gate electrode CG on the side opposite to the side which is adjacent to the memory gate electrode MG via the insulating film 5.

The $n^-$-type semiconductor region 7a of the source region MS is formed in a self-aligning manner with respect to the sidewall of the memory gate electrode MG, and the $n^+$-type semiconductor region 8a is formed in a self-aligning manner with respect to the side surface of the sidewall insulating film SW on the memory gate electrode MG side. Therefore, the low-concentration $n^-$-type semiconductor region 7a is formed below the sidewall insulating film SW on the memory gate electrode MG side. Also, the high-concentration $n^+$-type semiconductor region 8a is formed outside the low-concentration $n^-$-type semiconductor region 7a. Therefore, the low-concentration $n^-$-type semiconductor region 7a is formed so as to be adjacent to the channel region of the memory transistor, and the high-concentration $n^+$-type semiconductor region 8a is formed so as to be in contact with the low-concentration $n^-$-type semiconductor region 7a and be separated from the channel region of the memory transistor by the distance corresponding to the $n^-$-type semiconductor region 7a.

The $n^-$-type semiconductor region 7b of the drain region MD is formed in a self-aligning manner with respect to the sidewall of the control gate electrode CG, and the $n^+$-type semiconductor region 8b is formed in a self-aligning manner with respect to the side surface of the sidewall insulating film SW on the control gate electrode CG side. Therefore, the low-concentration $n^-$-type semiconductor region 7b is formed below the sidewall insulating film SW on the control gate electrode CG side. Also, the high-concentration $n^+$-type semiconductor region 8b is formed outside the low-concentration $n^-$-type semiconductor region 7b. Therefore, the low-concentration $n^-$-type semiconductor region 7b is formed so as to be adjacent to the channel region of the control transistor, and the high-concentration $n^+$-type semiconductor region 8b is formed so as to be in contact with the low-concentration $n^-$-type semiconductor region 7b and be separated from the channel region of the control transistor by the distance corresponding to the $n^-$-type semiconductor region 7b.

The control gate electrode CG is composed of an electrically-conductive film (conductor film) and is preferably composed of a silicon film 4 such as a polycrystalline silicon film. The silicon film 4 is, for example, an n-type silicon film (a polycrystalline silicon film to which an n-type impurity has been introduced, doped polysilicon film) and has a low resistivity because an n-type impurity has been introduced thereinto.

The memory gate electrode MG is composed of an electrically-conductive film (conductor film) and is formed of a silicon film 6 such as a polycrystalline silicon film as shown in FIG. 1 and FIG. 2.

A metal silicide layer (metal silicide film) 11 is formed on the upper part (upper surface) of the memory gate electrode MG and on the upper surfaces (surfaces) of the $n^+$-type semiconductor region 8a and the $n^+$-type semiconductor region 8b. The metal silicide layer 11 is composed of, for example, a cobalt silicide layer or a nickel silicide layer. Diffusion resistance and contact resistance can be reduced by the metal silicide layer 11. From a viewpoint of preventing short-circuit between the memory gate electrode MG and the control gate electrode CG as much as possible, in some cases, the metal silicide layer 11 is not formed on either one or both of the upper parts of the memory gate electrode MG and the control gate electrode CG.

Next, the n-channel-type MISFET Qn of the peripheral circuit region 2A will be described.

As shown in the left side of FIG. 2, the n-channel-type MISFET Qn is disposed in the peripheral circuit region 2A. The n-channel-type MISFET Qn has the gate electrode GE disposed above the semiconductor substrate 1 (p-type well PW2), the insulating film 3 disposed between the gate electrode GE and the semiconductor substrate 1 (p-type well PW2), and source/drain regions (7, 8) formed in the semiconductor substrate 1 (p-type well PW2) on both sides of the gate electrode GE.

The extending direction of the gate electrode GE is the direction perpendicular to the paper surface of FIG. 1 (gate-width direction). The insulating film 3 disposed between the gate electrode GE and the semiconductor substrate 1 (p-type well PW2) functions as a gate insulating film of the n-channel-type MISFET Qn. The channel region of the n-channel-type MISFET Qn is formed below the insulating film 3 below the gate electrode GE.

The source/drain regions (7, 8) have an LDD structure and are composed of the $n^+$-type semiconductor region 8 and the $n^-$-type semiconductor region 7. The $n^+$-type semiconductor region 8 has a deeper junction depth and a higher impurity concentration than those of the $n^-$-type semiconductor region 7.

The sidewall insulating films (sidewalls, sidewall spacers) SW composed of an insulator (silicon oxide film, insulating film) such as silicon oxide are formed on the sidewall parts of the gate electrode GE.

The $n^-$-type semiconductor region 7 is formed in a self-aligning manner with respect to the sidewall of the gate electrode GE. Therefore, the low-concentration $n^-$-type semiconductor region 7 is formed below the sidewall insulating film SW of the sidewall part of the gate electrode GE. Accordingly, the low-concentration $n^-$-type semiconductor region 7 is formed so as to be adjacent to the channel region of the MISFET. Also, the $n^+$-type semiconductor region 8 is formed in a self-aligning manner with respect to the side surface of the sidewall insulating film SW. In this manner, the low-concentration $n^-$-type semiconductor region 7 is formed so as to be adjacent to the channel region of the MISFET, and the high-concentration $n^+$-type semiconductor region 8 is formed so as to be in contact with the low-concentration $n^-$-type semiconductor region 7 and be separated from the channel region of the MISFET by the distance corresponding to the $n^-$-type semiconductor region 7.

The gate electrode GE is composed of an electrically-conductive film (conductor film) and is preferably composed of, for example, the silicon film 4 such as an n-type polycrystalline silicon film (polycrystalline silicon film to which an n-type impurity has been introduced, doped polysilicon film) like the above-described control gate electrode CG.

The metal silicide layer 11 is formed on the upper part (upper surface) of the gate electrode GE and on the upper surface (surface) of the $n^+$-type semiconductor region 8. The metal silicide layer 11 is composed of, for example, a cobalt silicide layer or a nickel silicide layer. Diffusion resistance and contact resistance can be reduced by the metal silicide layer 11.

Next, the capacitive element C of the peripheral circuit region 3A will be described. As shown in the right side of FIG. 2, the capacitive element C is disposed in the peripheral circuit region 3A. The capacitive element C in this case has a PIP structure. Specifically, the capacitive element has an upper electrode Pa and a lower electrode Pb, and the above-described insulating film 5 (5A, 5N, 5B (5s, 5d)) is disposed as a capacitive insulating film between these electrodes. Like the above-described gate electrode GE and the above-described control gate electrode CG, the lower electrode Pb is composed of the silicon film 4 such as an n-type polycrystalline silicon film (polycrystalline silicon film to which an n-type impurity has been introduced, doped poly-silicon film). Also, like the above-described memory gate electrode MG, the upper electrode Pa is composed of the silicon film 6 such as a polycrystalline silicon film. The insulating film (3) is disposed in a lower layer of the lower electrode Pb. Further, the metal silicide layer 11 is disposed on the surface of the upper electrode Pa.

The insulating film 5 (5A, 5N, 5B (5d)) is disposed on the upper surface of the lower electrode Pb, and the insulating film 5 (5A, 5N, 5B (5s, 5d)) is disposed on the side surfaces of the lower electrode Pb. Here, the upper electrode Pa is disposed on the side surfaces of the lower electrode Pb so as to cover the insulating film 5, and corner parts are present at the parts of the upper electrode Pa extending on the semiconductor substrate 1 from the side surfaces of the lower electrode Pb. Since electric field is likely to concentrate at these parts, there is a possibility that reliability of the capacitive element Cis reduced. However, when the insulating film 5 is disposed on the side surfaces of the lower electrode Pb like the capacitive element C of the present embodiment, the electric field at the corner parts of the lower electrode can be reduced, and reliability of the capacitive element C can be improved. Furthermore, since the insulating film 5 is disposed on the side surfaces of the lower electrode Pb, the capacitance values at the side surfaces of the capacitive element C are reduced, and only the region in which the lower electrode Pb and the upper electrode Pa are planarly overlapped with each other contributes as capacitance. Therefore, errors in the design value of the capacitance of the capacitive element C are reduced, and the yield of the semiconductor device can be improved.

[Description of Operations]

Figures 4, 5:
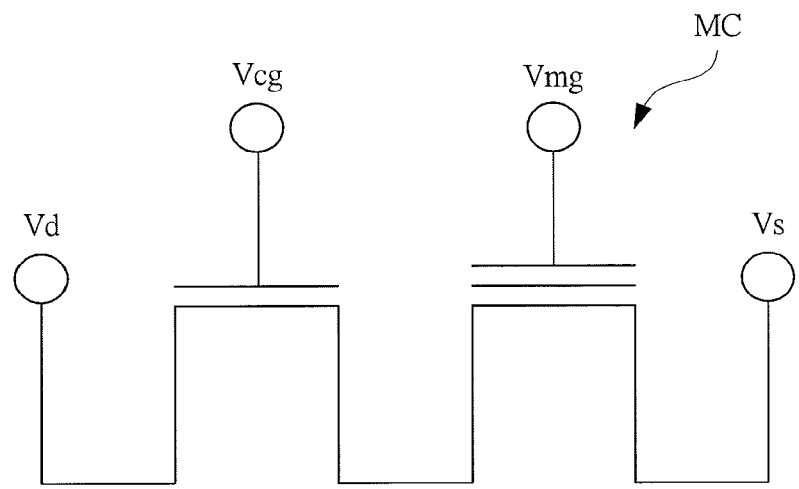
FIG. 4 is an equivalent circuit diagram of a memory cell MC.
FIG. 5 is a table showing an example of conditions of applied voltages to each part of a select memory cell in "write", "erasure", and "read" of the first embodiment.

FIG. 4 is an equivalent circuit diagram of the memory cell MC. As shown in the drawing, the memory transistor and the control transistor are connected in series between the drain region (MD) and the source region (MS) to constitute one memory cell. FIG. 5 is a table showing an example of the conditions of applied voltages to each part of the select memory cell in "write", "erasure", and "read" of the present embodiment. The table of FIG. 5 describes voltages Vmg applied to the memory gate electrode MG, voltages Vs applied to the source region (source region MS), voltages Vcg applied to the control gate electrode CG, voltages Vd (for example, Vdd=1.5 V) applied to the drain region (drain region MD), and voltages Vb applied to the p-type well PW1 in each case of "write", "erasure", and "read". Since the voltages shown in the table of FIG. 5 are suitable examples of the conditions of applied voltages, the voltages are not limited thereto and various modifications can be made according to needs. In the present embodiment, injection of electrons into the silicon nitride film (5N) serving as the charge accumulating layer (charge accumulating part) in the insulating film 5 of the memory transistor is defined as "write", and injection of holes thereinto is defined as "erasure".

As a writing method, hot-electron write which is so-called SSI (Source Side Injection) method can be used. For example, the voltages shown in the section of "write" of FIG. 5 are applied to the parts of the select memory cell, which is to carry out the write, thereby injecting electrons into the silicon nitride film (5N) in the insulating film 5 of the select memory cell. Hot electrons are generated in the channel region (between the source and the drain) below the part between the two gate electrodes (the memory gate electrode MG and the control gate electrode CG), and the hot electrons are injected into the silicon nitride film (5N) which is the charge accumulating layer (charge accumulating part) in the insulating film 5 below the memory gate electrode MG. The injected hot electrons (electrons) are trapped by a trap level in the silicon nitride film (5N) in the insulating film 5, and as a result, the threshold voltage of the memory transistor is increased.

As an erasing method, an erasing method by hole injection utilizing a direct tunneling phenomenon can be used. Specifically, erasure is carried out by injecting holes into the charge accumulating part (the silicon nitride film (5N) in the insulating film 5) by the direct tunneling phenomenon. For example, as shown in the section of "erasure" of FIG. 5, for example, a negative potential of −11 V is applied to the memory gate electrode MG (Vmg) to set the p-type well PW1 (Vb) to, for example, 0 V. As a result, the generated holes are injected by the direct tunneling phenomenon via the silicon oxide film (5A) into the charge accumulating part (the silicon nitride film (5N) in the insulating film 5) to cancel out the electrons in the silicon nitride film (5N), or the injected holes are trapped by the trap level in the silicon nitride film (5N), thereby carrying out an erasing operation. As a result, the threshold voltage of the memory transistor is reduced (to be in an erased state). In order to utilize the direct tunneling phenomenon, it is preferred that the film thickness of the silicon oxide film (5A) of the lower layer of the silicon nitride film (5N) is 2 nm or less and the potential difference between Vmg and Vb is −8 to −14 V. In the case in which such an erasing method is used, the current consumption can be reduced compared with the case in which so-called BTBT (Band-To-Band Tunneling) erasure is used (see FIG. 6B).

In the read, for example, the voltages shown in the section of "read" of FIG. 5 are applied to the parts of the select memory cell which is to carry out the read. When the voltage Vmg applied to the memory gate electrode MG in the read is set to have a value between the threshold voltage of the memory transistor in the write state and the threshold voltage of the memory transistor in the erase state, the write state and the erase state can be distinguished depending on whether a current flows to the memory cell or not.

<1> As described above, according to the present embodiment, since the third film (silicon oxide film) 5B constituting the insulating film (ONO film) 5 is composed of the stacked film of the sidewall film 5s and the deposited film 5d, the distance D1 between the upper surface and the lower surface at the corner part of the insulating film 5 can be increased (see FIG. 3) between the corner part of the memory gate electrode MG and the semiconductor substrate (PW1). As a result, electric-field concentration at this part can be reduced, and an erasure characteristic can be improved.

Figures 6A, 6B:
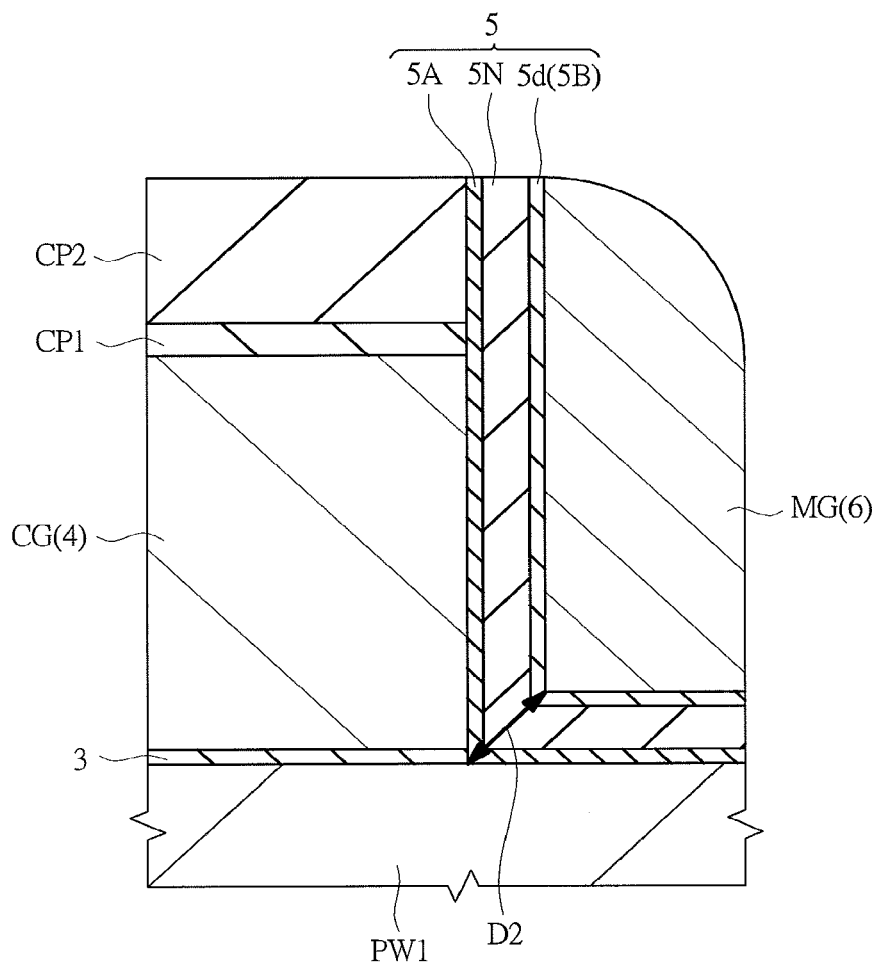
FIG. 6A is a drawing showing a memory cell of a comparative example of the first embodiment.
FIG. 6B is a table showing applied voltages of the comparative example.

FIGS. 6A and 6B are drawings showing a memory cell of a comparative example of the present embodiment and applied voltages thereof. FIG. 6A is a main-part cross-sectional view showing the structure of a memory cell part of the comparative example, and FIG. 6B shows an example of the applied voltages of the case in which BTBT erasure is used. As shown in FIG. 6A, in the memory cell of the comparative example in which the sidewall film 5s is omitted, since the distance D2 between the upper surface and the lower surface at the corner part of the insulating film 5 is small (D2<D1) between the corner part of a memory gate electrode MG and a semiconductor substrate (PW1), electric-field concentration occurs at the part, and the erasure characteristic is deteriorated.

More specifically, electric-field concentration occurs at the corner part of the memory gate electrode MG, and electrons are injected into a silicon nitride film (5N) by a FN (Fowler Nordheim) tunneling phenomenon from the memory gate electrode MG via a silicon oxide film. As a result, the erasing operation (hole injection) is suppressed, and the erasure characteristic is deteriorated. If the injection amount of electrons is increased, erasure cannot be carried out, the threshold voltage of the memory transistor is increased, and a write state may be retained.

On the other hand, according to the present embodiment, since the sidewall film 5s is formed, the distance D1 between the bottom part of the side surface of the memory gate electrode MG and the semiconductor substrate (PW1) is made larger than the distance D2 of the comparative example, and occurrence of the FN tunneling phenomenon at this part can be suppressed. Therefore, erasure (hole injection) can be efficiently carried out, and the erasure characteristic can be improved. In particular, since the sidewall film 5s is formed between the memory gate electrode MG and the silicon nitride film (5N) in the structure of the present embodiment as shown in FIG. 3, injection of electrons from the memory gate electrode MG side in the erasing operation can be more effectively suppressed.

Figure 8:
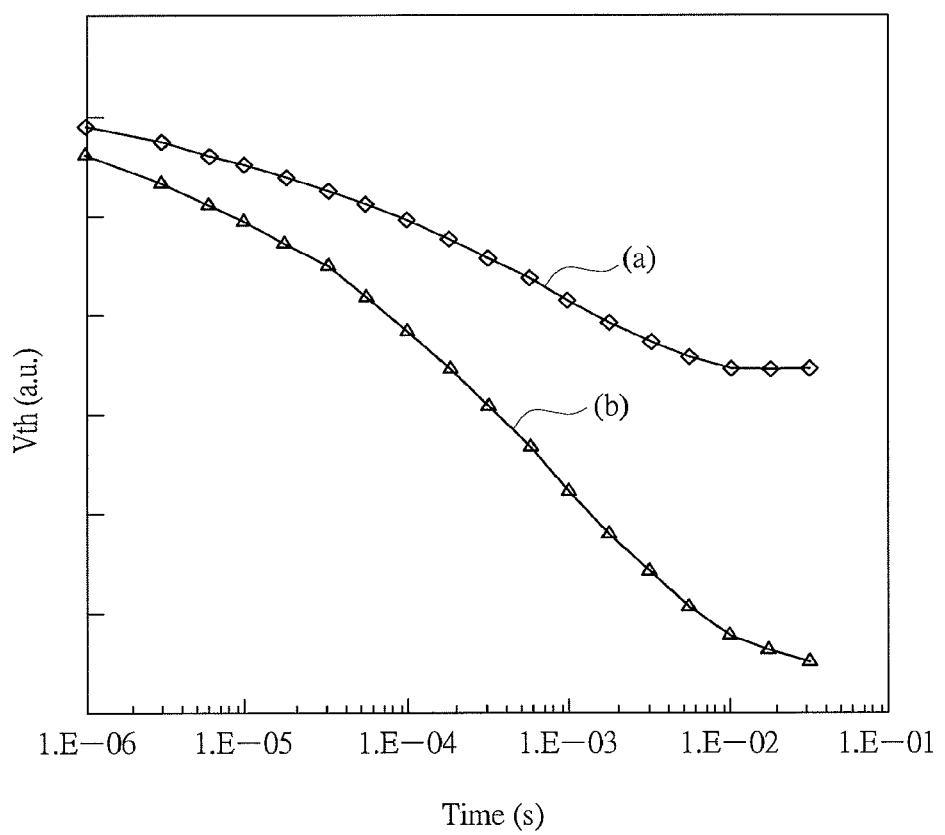
FIG. 8 is a graph showing erasure characteristics of the memory cell of the first embodiment and the memory cell of the comparative example.

FIG. 8 is a graph showing the erasure characteristics of the memory cell of the present embodiment and the memory cell of the comparative example. The horizontal axis represents application time [Time(s)] of the erasure potentials, and the vertical axis represents the threshold potentials [Vth(a.u.)]. Note that "1.E–0n" (n: integer) represents "1×10$^{-n}$ [s]".

A graph (a) shows the case of the memory cell of the comparative example. In the case of the graph (a), the threshold voltage is gradually decreased. On the other hand, in the case of the present embodiment shown in a graph (b), the threshold voltage is rapidly decreased in accordance with the application time of the erasure potential, and it can be understood that the erasing operation (hole injection) is efficiently carried out.

By using the erasing method using the hole injection that utilizes the direct tunneling phenomenon, the current consumption can be reduced to 1/100,000 (1/10$^5$) to 1/1,000,000 (1/10$^6$) compared with the case in which the BTBT erasure is used. As described above, FIG. 6B shows an example of applied voltages of the case in which the BTBT erasure is used.

Figure 7:
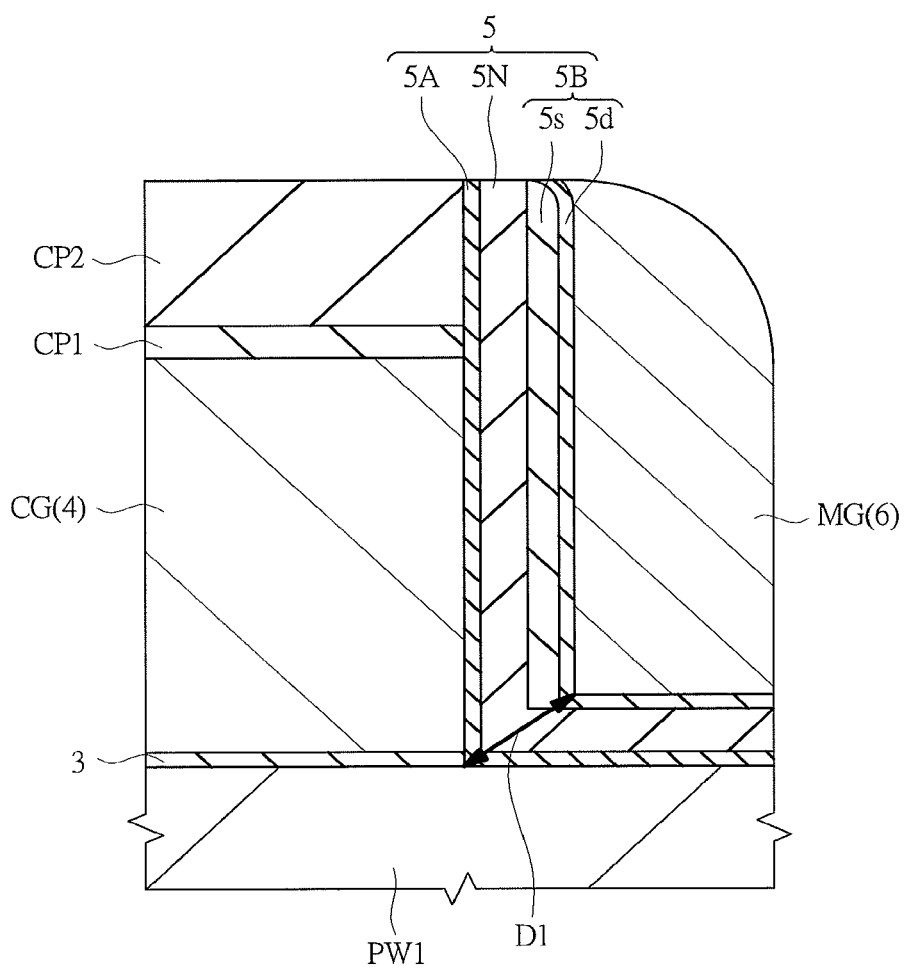
FIG. 7 is a main-part cross-sectional view showing a structure of another memory cell part of the semiconductor device of the first embodiment.

<2> The height H5s of the sidewall film 5s is set to be lower than the height HMG of the memory gate electrode MG (H5s<HMG). More specifically, the insulating film 5 formed between the upper surface of the semiconductor substrate 1 and the lower surface of the memory gate electrode MG is configured to have the film thickness substantially equal to the film thickness of the insulating film 5 formed between the metal silicide layer 11 and the silicon nitride film CP2. In this case, the memory gate electrode MG extends also to the part above the sidewall film 5s, and the sidewall of the sidewall film 5s is covered with the silicon film 6, which forms the memory gate electrode MG. FIG. 7 is a main-part cross-sectional view showing the structure of another memory cell part of the semiconductor device of the present embodiment. The memory cell shown in FIG. 7 is a memory cell having a gate length of the memory gate electrode MG equal to that of the memory cell shown in FIG. 3, and the height H5s of the sidewall film 5s is made equal to the height HMG of the memory gate electrode MG (H5s=HMG). Compared with the memory cell having a shape like this, the cross-sectional area of the memory gate electrode MG can be increased in the memory cell shown in FIG. 3 because the memory gate electrode MG extends also to the part above the sidewall film 5s. As a result, the resistance of the memory gate electrode MG can be reduced, the operation speed of the memory cell can be increased, and a memory operating characteristic can be improved. Furthermore, since the memory gate electrode MG extends also to the part above the sidewall film 5s, the formation region of the metal silicide layer 11 on the surface thereof can be enlarged by the amount corresponding to the film thickness (film thickness in the gate-length direction) of the sidewall film 5s. In other words, the metal silicide layer 11 can be formed also in the region planarly overlapped with the sidewall film 5s of the memory gate electrode. As a result, the resistance of the memory gate electrode MG can be further reduced, the operation speed of the memory cell can be increased, and the memory operating characteristic can be improved. The height H5s of the sidewall film 5s is preferably set to be higher than the height HCG of the control gate electrode CG (H5s>HCG, see FIG. 3) when the etching controllability of a later-described etch back step is taken into consideration. Also from the point of ensuring the withstand voltages of the memory gate electrode MG and the control gate electrode CG, the height H5s is preferably set to be higher than the height HCG of the control gate electrode CG.

In the case in which the silicon oxide film CP1 and the silicon nitride film CP2 serving as insulating films are formed on the control gate electrode CG as described above, the silicide film is not formed on the control gate electrode CG. Therefore, different from the case (see FIG. 39) in which the silicide film 11 is formed on the control gate electrode CG without forming the silicon oxide film CP1 and the silicon nitride film CP2, it is not necessary to take into consideration the short-circuit between the silicide film on the memory gate electrode MG and the silicide film on the control gate electrode CG. Therefore, as described above, the memory gate electrode MG can be configured to extend also to the part above the sidewall film 5s, and the resistance of the memory gate electrode MG can be reduced. In this manner, the structure in which the height H5s is made higher than the height HCG of the control gate electrode CG is effective when applied to the structure using the silicon oxide film CP1 and the silicon nitride film CP2.

<3> Also, by increasing the etch-back amount (the recessed amount of the sidewall film 5s) when etch back is carried out so as to reduce the height H5s of the sidewall film 5s, the shape of the side surface of the sidewall film 5s can be tapered. In other words, the angle formed by the side surface of the sidewall film 5s and the silicon nitride film (5N) can be made larger than 90°. Since the deposited film 5d and the memory gate electrode MG are formed along with that, the angle of the corner part of the memory gate electrode MG also becomes larger than 90° (see FIG. 3, FIG. 39, FIG. 40, and others). The tapered shape will be described in more detail in a modification example 1 described later.

When the angle of the angle part of the memory gate electrode MG is made larger than 90° (rounded) as described above, electric-field concentration at the corner part of the memory gate electrode MG can be reduced, and occurrence of the FN tunneling phenomenon can be suppressed. As a result, erasure (hole injection) can be efficiently carried out, and the erasure characteristic can be improved. The above-described etch-back step will be described in detail in the section of "Description of Manufacturing Method" described later.

[Description of Manufacturing Method]

Next, a manufacturing method of the semiconductor device of the present embodiment will be described and the structure of the semiconductor device will be more specified with reference to FIG. 9 to FIG. 38. FIG. 9 to FIG. 38 are main-part cross-sectional views showing manufacturing steps of the semiconductor device of the present embodiment. Among these, FIG. 15 to FIG. 22 are main-part cross-sectional views of the memory cell region. As described above, 1A denotes the memory cell region, 2A and 3A denote the peripheral circuit regions, the n-channel-type MISFET Qn is formed in 2A, and the capacitive element C is formed in 3A.

Figure 9:
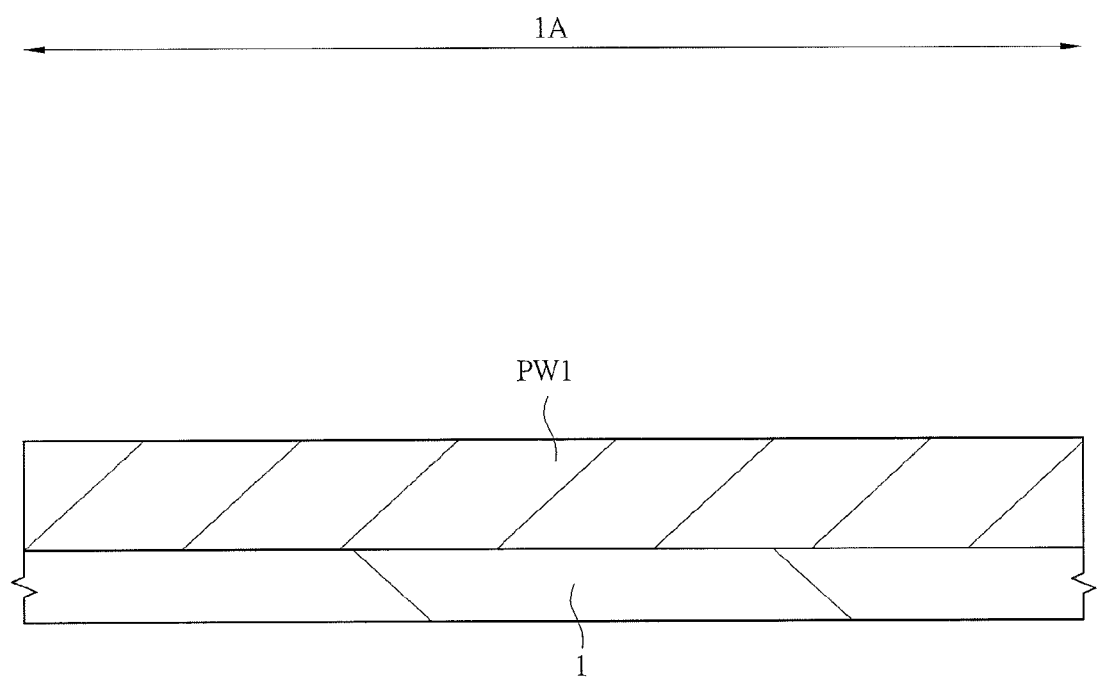
FIG. 9 is a main-part cross-sectional view showing a manufacturing step of the semiconductor device of the first embodiment.
Figure 10:
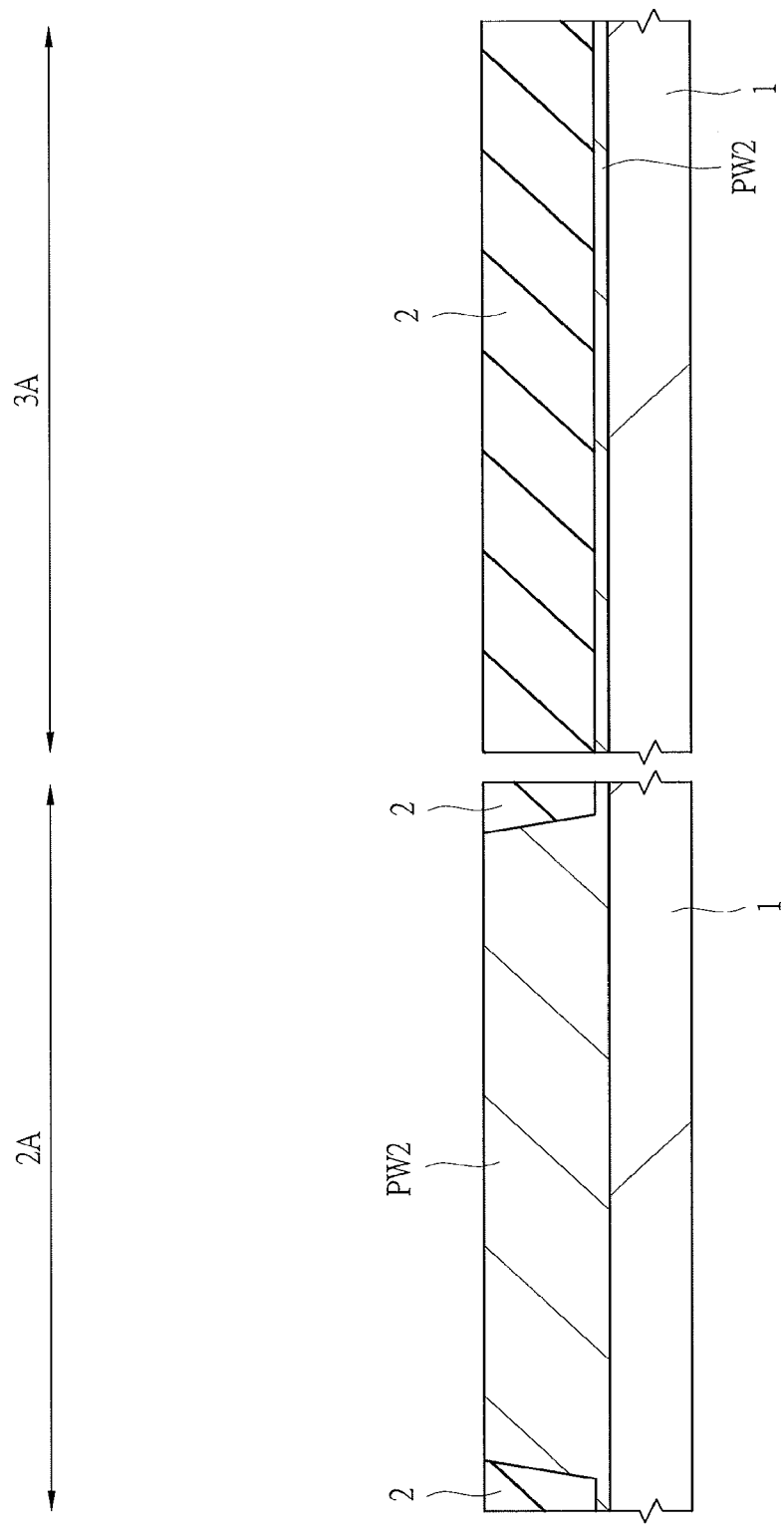
FIG. 10 is a main-part cross-sectional view showing a manufacturing step of the semiconductor device of the first embodiment.

First, as shown in FIG. 9 and FIG. 10, for example, a silicon substrate made of p-type single-crystal silicon having a specific resistance of about 1 to 10 Ωcm is prepared as the semiconductor substrate (semiconductor wafer) 1. The semiconductor substrate 1 other than a silicon substrate may be used.

Then, the isolation regions 2 are formed in the main surface of the semiconductor substrate 1. For example, the isolation regions 2 are formed by forming isolation trenches in the semiconductor substrate 1 and burying an insulating film in the isolation trenches (FIG. 10). Such an isolation method is called STI (Shallow Trench Isolation). Alternatively, the isolation regions 2 may be formed by using, for example, LOCOS (Local Oxidization of Silicon). Although the isolation regions 2 do not appear in the cross-sectional part (FIG. 9) shown in the memory cell region 1A, the isolation regions 2 are arbitrarily disposed at the locations where electrical separation is required as described above.

Then, the p-type well PW1 is formed in the memory cell region 1A of the semiconductor substrate 1, and the p-type well PW2 is formed in the peripheral circuit region 2A of the semiconductor substrate 1. The p-type wells PW1 and PW2 are formed by carrying out ion implantation of a p-type impurity (for example, boron (B)). In this case, as shown in FIG. 10, the p-type well PW2 is thinly disposed in a lower part of the isolation region 2 formed in the peripheral circuit region 3A.

Figure 11:
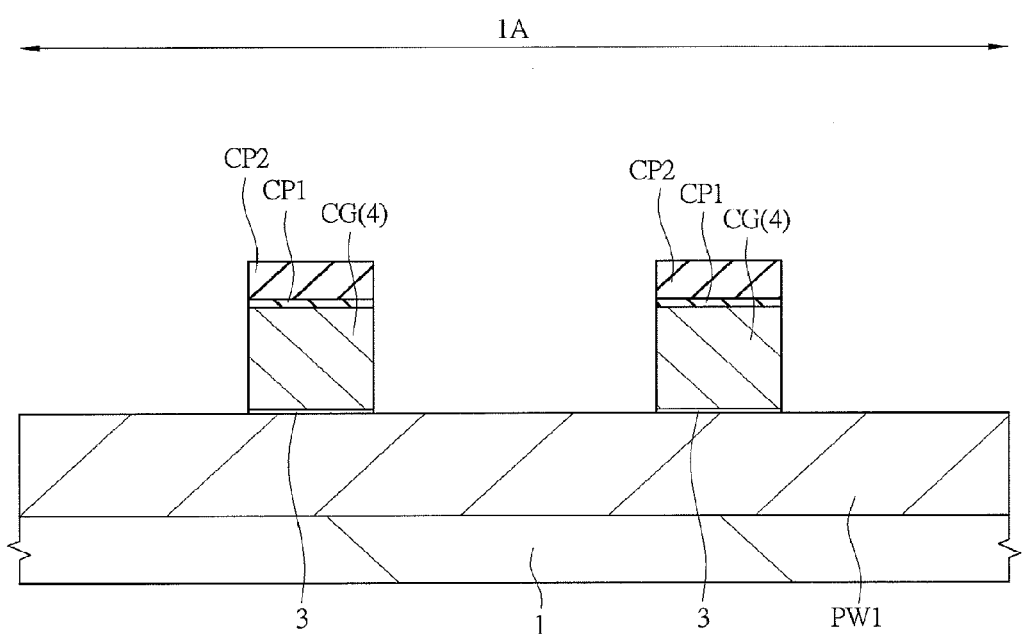
FIG. 11 is a main-part cross-sectional view showing a manufacturing step of the semiconductor device of the first embodiment continued from FIG. 9.
Figure 12:
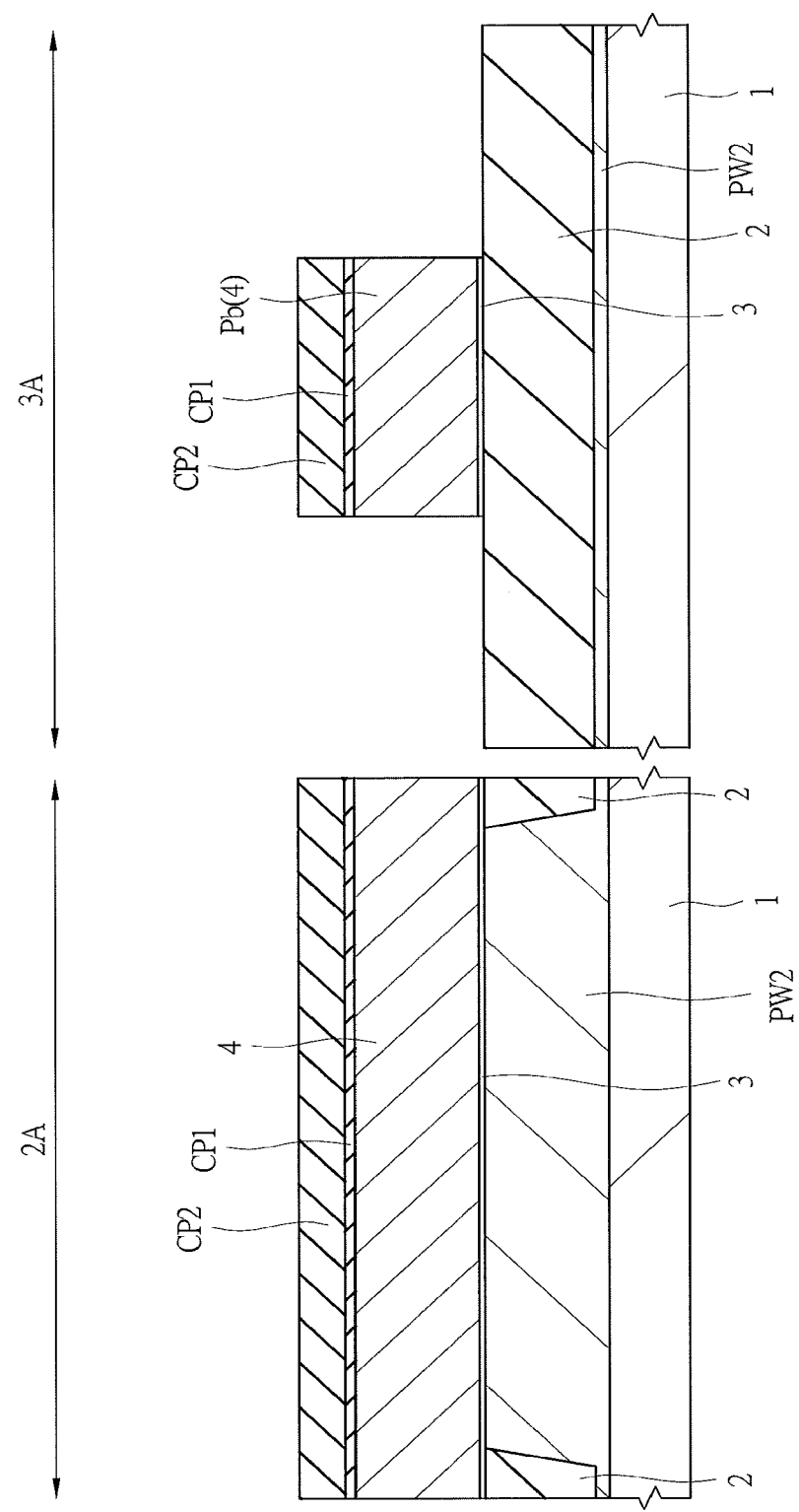
FIG. 12 is a main-part cross-sectional view showing a manufacturing step of the semiconductor device of the first embodiment continued from FIG. 10.

Then, after the surface of the semiconductor substrate 1 (p-type wells PW1 and PW2) is cleaned by, for example, diluted hydrofluoric-acid cleaning, as shown in FIG. 11 and FIG. 12, a silicon oxide film or the like is formed as the insulating film (gate insulating film) 3 by thermal oxidation so as to have a film thickness of about 2 to 3 nm on the main surface (surfaces of the p-type wells PW1 and PW2) of the semiconductor substrate 1. Other than the silicon oxide film, a different insulating film such as a silicon oxynitride film may be used as the insulating film 3. In addition to them, a metal oxide film having a higher dielectric constant than that of a silicon nitride film such as a hafnium oxide film, an aluminum oxide film (alumina), or a tantalum oxide film and a stacked film of an oxide film or the like and a metal oxide film may be formed. Other than the thermal oxidation, CVD (Chemical Vapor Deposition) may be used to form the film. Furthermore, the insulating film (gate insulating film) 3 on the memory cell region 1A and the insulating film (gate insulating film) 3 on the peripheral circuit region 2A may be formed to have different film thicknesses and may be composed of different types of films.

Then, the silicon film 4 serving as the electrically-conductive film (conductor film) is formed on the entire surface of the semiconductor substrate 1. As this silicon film 4, a polycrystalline silicon film or the like is formed to have a film thickness of about 100 to 200 nm by using, for example, CVD. The silicon film 4 may be formed by depositing an amorphous silicon film and then crystallizing it by carrying out the thermal treatment. The silicon film 4 serves as the control gate electrode CG in the memory cell region 1A, serves as the gate electrode GE of the n-channel-type MISFET Qn in the peripheral circuit region 2A, and serves as the lower electrode Pb of the capacitive element C in the peripheral circuit region 3A.

Then, an n-type impurity (for example, arsenic (As) or phosphorous (P)) is implanted into the silicon film 4 of the memory cell region 1A.

Then, the thin silicon oxide film CP1 is formed by thermally oxidizing the surface of the silicon film 4 by, for example, about 6 nm. The silicon oxide film CP1 may be formed by using CVD. Then, the silicon nitride film (cap insulating film) CP2 of about 80 to 90 nm is formed on the upper part of the silicon oxide film CP1 by using, for example, CVD.

Then, a photoresist film (not shown) is formed by using photolithography in the region in which the control gate electrodes CG are to be formed, and the silicon nitride film CP2, the silicon oxide film CP1, and the silicon film 4 are etched with using the photoresist film as a mask. Thereafter, the photoresist film is removed by, for example, ashing, thereby forming the control gate electrodes CG (for example, having a gate length of about 80 nm). Such a series of steps from photolithography to removal of the photoresist film is called patterning. In this case, the silicon nitride film CP2 and the silicon oxide film CP1 are formed on the upper parts of the control gate electrodes CG, but these films can be omitted (see FIG. 39). In that case, the height of the control gate electrodes CG can be arbitrarily adjusted, and the height of the control gate electrodes CG may be made equivalent to the height of the silicon nitride film CP2 of the case in which the silicon nitride film CP2 is provided.

Here, the insulating film 3 left below the control gate electrodes CG in the memory cell region 1A serves as the gate insulating film of the control transistor. The insulating film 3 other than the part covered with the control gate electrodes CG can be removed by, for example, a subsequent patterning step.

Figure 14:
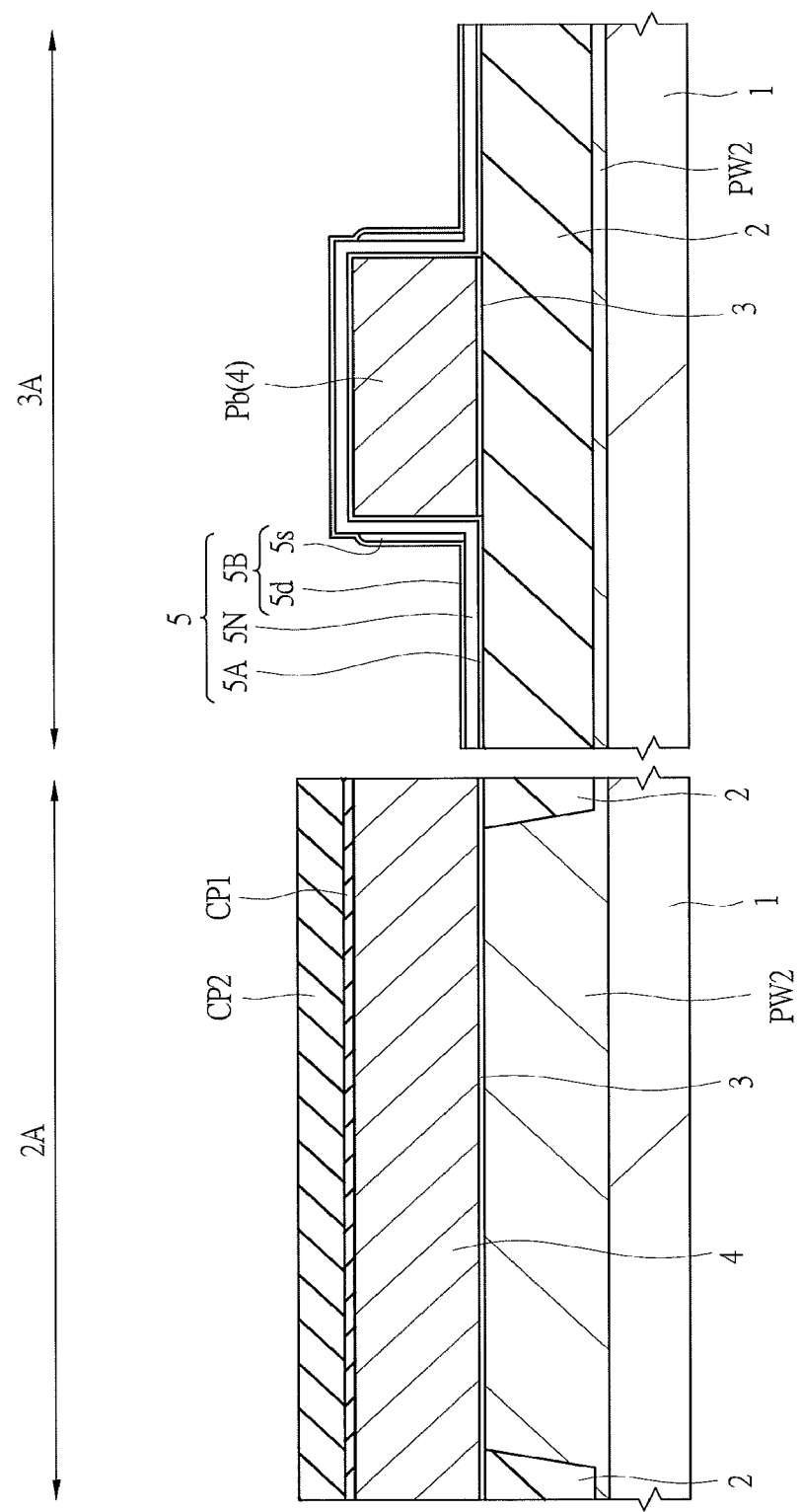
FIG. 14 is a main-part cross-sectional view showing a manufacturing step of the semiconductor device of the first embodiment continued from FIG. 12.

Then, the silicon nitride film CP2 and the silicon oxide film CP1 of the peripheral circuit region 2A and the peripheral circuit region 3A are removed by etching (see FIG. 14).

Figure 13:
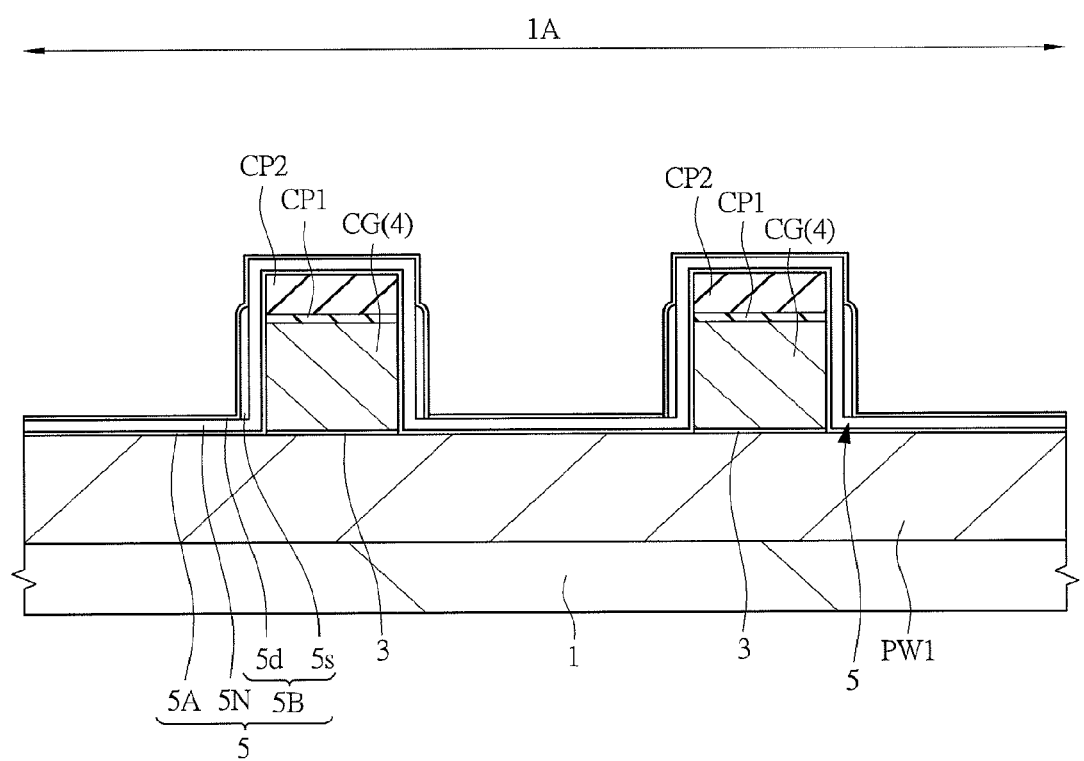
FIG. 13 is a main-part cross-sectional view showing a manufacturing step of the semiconductor device of the first embodiment continued from FIG. 11.

Then, as shown in FIG. 13 and FIG. 14, the insulating film (5A, 5N, 5B) is formed on the semiconductor substrate 1 including the part on the surfaces (upper surfaces and side surfaces) of the control gate electrodes CG (4). The step of forming the insulating film 5 will be described in detail with reference to FIG. 15 to FIG. 22, which are main-part cross-sectional views of the memory cell region 1A. In FIG. 15 to FIG. 22, in order to make the drawings easily understood, the width (gate length) of the control gate electrode CG is shown to be shorter than the other parts.

Figure 15:
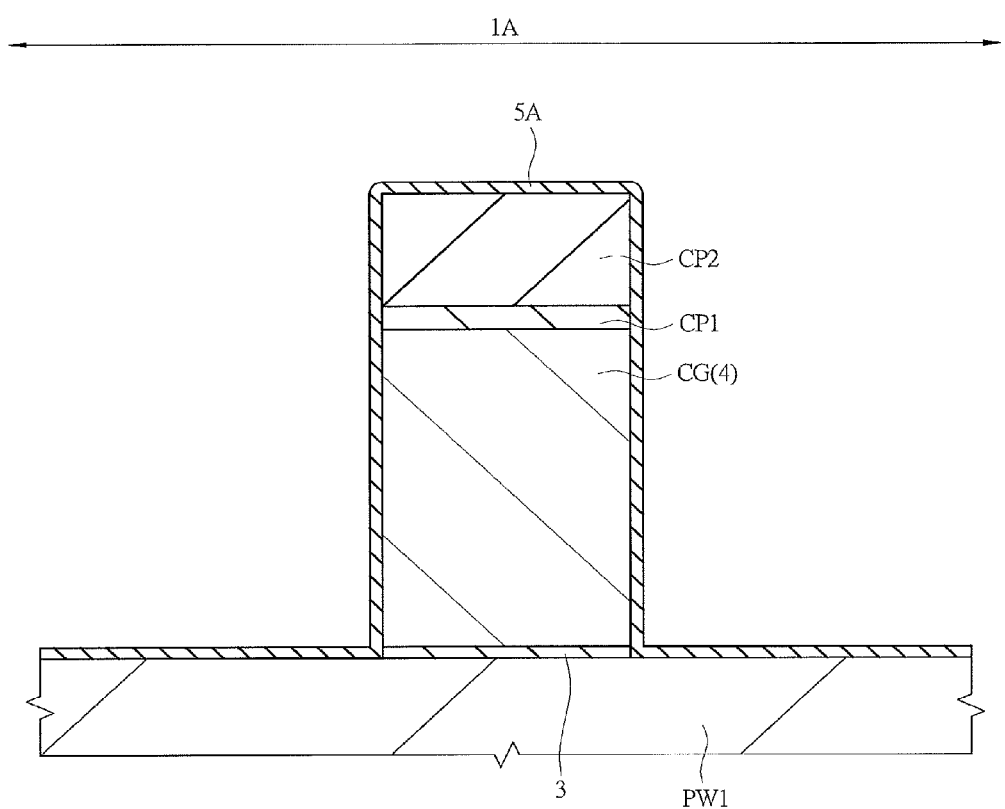
FIG. 15 is a main-part cross-sectional view showing a manufacturing step of the semiconductor device of the first embodiment.
Figure 16:
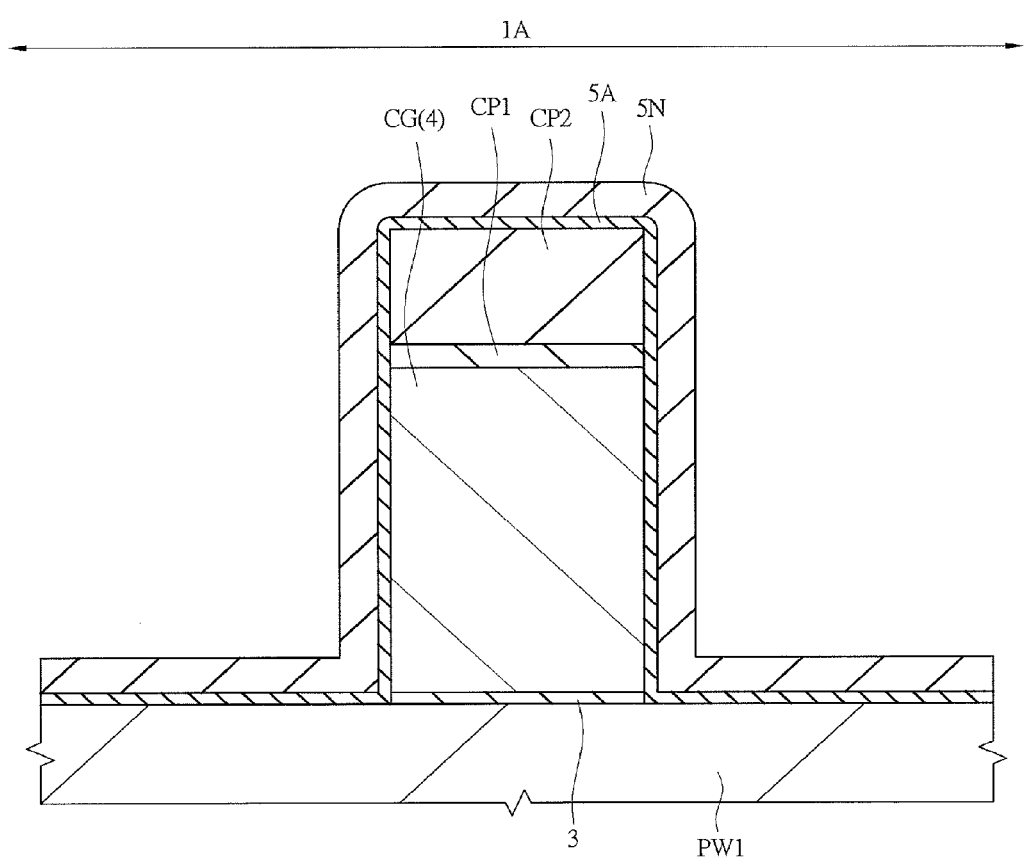
FIG. 16 is a main-part cross-sectional view showing a manufacturing step of the semiconductor device of the first embodiment continued from FIG. 15.

First, after carrying out the cleaning treatment to the main surface of the semiconductor substrate 1, as shown in FIG. 15, the silicon oxide film 5A is formed on the semiconductor substrate 1 (p-type well PW1) including the upper surface and the side surface of the control gate electrode CG. The silicon oxide film 5A is formed to have a film thickness of, for example, about 1.6 nm by thermal oxidation (preferably, ISSG (In Situ Steam Generation) oxidation) or the like. The silicon oxide film 5A may be formed by using CVD. In the drawing, the shape of the silicon oxide film 5A of the case in which the film is formed by CVD is shown. As described above, in order to use the direct tunneling erasing method, the film thickness of the silicon oxide film 5A, which is the first film (lower layer film) constituting the insulating film (ONO film) 5, is preferably 2 nm or less. Then, as shown in FIG. 16, the silicon nitride film 5N is deposited to have a film thickness of, for example, about 16 nm by CVD on the silicon oxide film 5A. The silicon nitride film 5N is positioned on the upper surface and the side surfaces of the control gate electrode CG and on the semiconductor substrate 1 (p-type well PW1) via the silicon oxide film 5A. As described above, the silicon nitride film 5N serves as the charge accumulating part of the memory cell and serves as the second film (intermediate film) constituting the insulating film (ONO film) 5.

Figure 17:
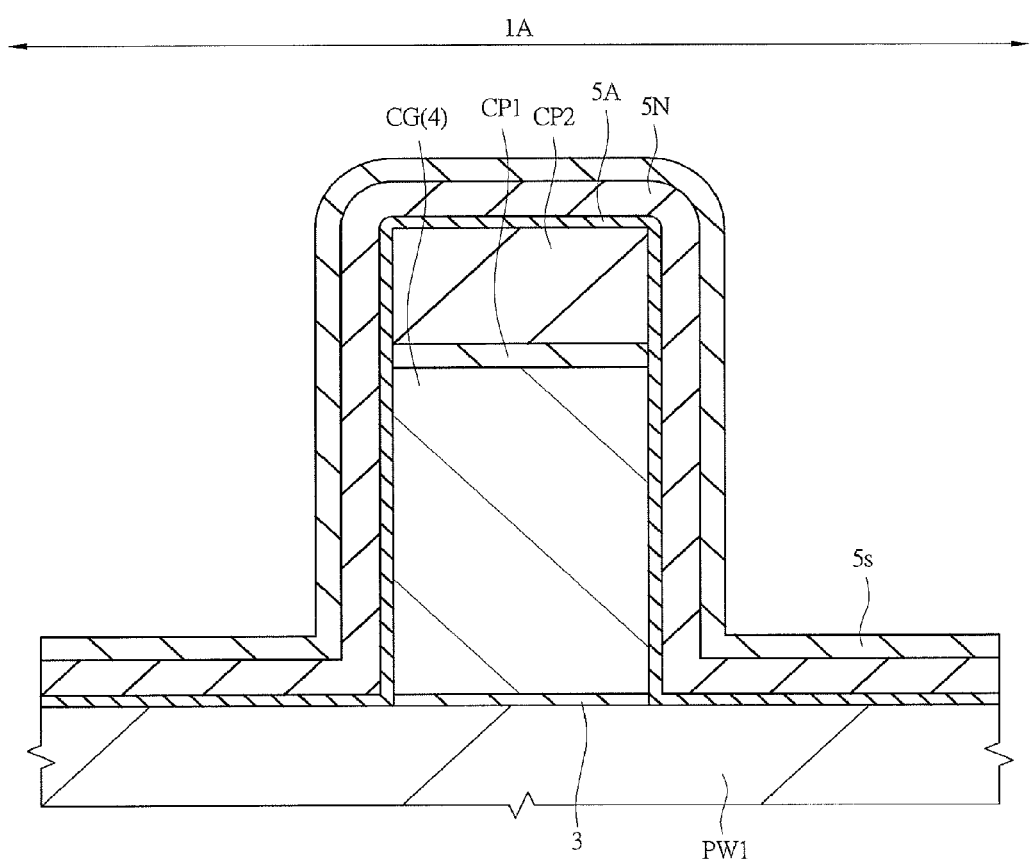
FIG. 17 is a main-part cross-sectional view showing a manufacturing step of the semiconductor device of the first embodiment continued from FIG. 16.
Figure 18:
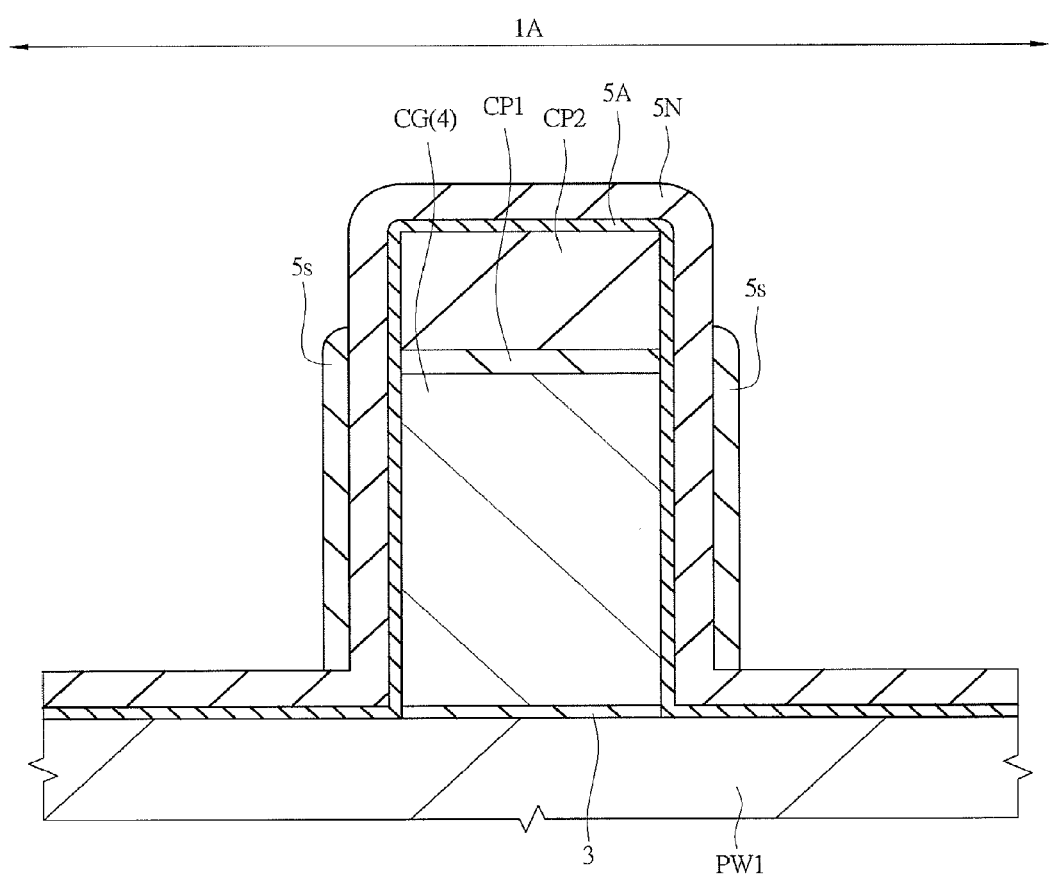
FIG. 18 is a main-part cross-sectional view showing a manufacturing step of the semiconductor device of the first embodiment continued from FIG. 17.

Then, as shown in FIG. 17, the silicon oxide film (5s) is deposited to have a film thickness of, for example, about 5 nm to 10 nm on the silicon nitride film 5N by CVD. The silicon oxide film (5s) is positioned on the upper surface and the side surfaces of the control gate electrode CG and on the semiconductor substrate 1 (p-type well PW1) via the silicon oxide film 5A and the silicon nitride film 5N. Then, the silicon oxide film (5s) is anisotropically etched (etch back) from the surface thereof. Through this step, as shown in FIG. 18, the sidewall film 5s composed of the silicon oxide film (5s) can be left on the sidewall parts on both sides of the control gate electrode CG via the silicon oxide film 5A and the silicon nitride film 5N. The film thickness (maximum film thickness) of the silicon oxide film (5s) in the gate-length direction is, for example, about 5 nm to 10 nm.

As the above-described anisotropic etching, for example, dry etching can be carried out under plasma with using a mixed gas of $CF_4$ and $CHF_3$ as an etching gas.

In this process, etch-back is carried out until the upper part of the sidewall film 5s becomes lower than the upper part (upper surface) of the silicon nitride film (cap insulating film) CP2 by increasing the etch-back amount. By adjusting the height H5s of the sidewall film (sidewall film) 5s in this manner, the height H5s of the sidewall film 5s becomes lower than the height HMG of the memory gate electrode MG (H5s<HMG, see FIG. 3 and others). In this process, in the peripheral circuit region 3A, the sidewall film 5s is formed also on the sidewall parts of the lower electrode Pb constituting the capacitive element C. Also in this case, the height H5s of the sidewall film 5s is lower than the height HPb of the lower electrode Pb (H5s<HPb, see FIG. 2).

If the etch-back amount is too large, the film thickness of the sidewall film 5s may become excessively small. Therefore, it is preferred that the height H5s of the sidewall film 5s is set in consideration of etching controllability of this etch-back step so as to be higher than the height HCG of the control gate electrode CG (H5s>HCG).

In the structure of the case in which the silicon nitride film CP2 and the silicon oxide film CP1 are not formed, the control gate electrode CG is disposed instead of these films. In other words, the height of the upper surface of the silicon nitride film CP2 corresponds to the height HCG of the control gate electrode CG. In this case, the height HMG of the memory gate electrode MG is approximately the same as the height HCG of the control gate electrode CG. Also in this case, the height H5s of the sidewall film 5s is set to be lower than the height HMG of the memory gate electrode MG. Also, it is preferred that the height H5s of the sidewall film 5s is set to be 90% or more of the height HCG of the control gate electrode CG (H5s>0.9×HCG, see FIG. 39) in consideration of the etching controllability of the etch-back step.

Figure 19:
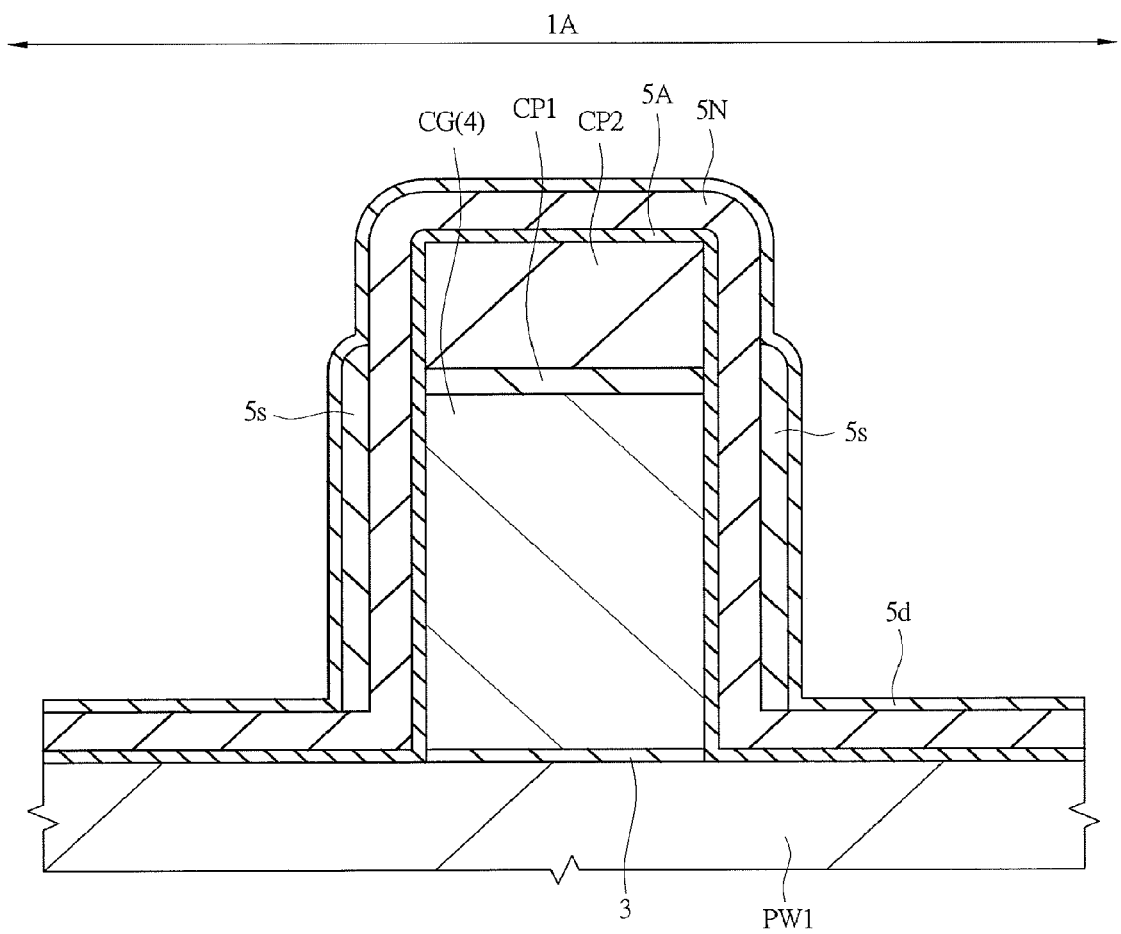
FIG. 19 is a main-part cross-sectional view showing a manufacturing step of the semiconductor device of the first embodiment continued from FIG. 18.

Then, as shown in FIG. 19, the silicon oxide film (deposited film) 5d is formed to have a film thickness of, for example, about 3 nm by CVD on the silicon nitride film 5N and the sidewall film 5s. The sidewall film 5s and the silicon oxide film 5d form the third film (upper film) constituting the insulating film (ONO film) 5.

Through the above-described steps, the insulating film (ONO film) 5 composed of the first film (the silicon oxide film 5A), the second film (the silicon nitride film 5N), and the third film (the sidewall film 5s and the silicon oxide film 5d, the silicon oxide film (5B)) can be formed.

In the present embodiment, compared with the case of a second embodiment described later, the semiconductor substrate 1 is not exposed when forming the sidewall film 5s composed of the silicon oxide film (5s). Therefore, etching damage to the semiconductor substrate 1 can be reduced. Accordingly, the characteristic of the silicon oxide film 5A serving as a tunneling oxide film can be easily maintained, and reliability of the device can be improved.

Also, in order to remove etching damage to the underlying silicon nitride film 5N caused by the formation of the sidewall film 5s, sacrifice oxidation and etching of a sacrifice oxide film may be carried out after the formation of the sidewall film 5s.

In the present embodiment, the silicon nitride film 5N is formed as the charge accumulating part (charge accumulating layer, insulating film having a trap level) in the insulating film 5. However, for example, a different insulating film such as an aluminum oxide film, a hafnium oxide film, or a tantalum oxide film may be used. These films are high-dielectric constant films having high dielectric constant than that of a silicon nitride film. Also, the charge accumulating layer may be formed by using an insulating film having silicon nano-dots.

The insulating film 5 formed in the memory cell region 1A functions as a gate insulating film of the memory gate electrode MG and has a charge retaining (charge accumulating) function. Therefore, the insulating film 5 has a layered structure including at least three layers, and it is configured so that the potential barrier height of the inner layer (silicon nitride film 5N) is lower than the potential barrier height of the outer layers (silicon oxide films 5A and 5B).

Figure 20:
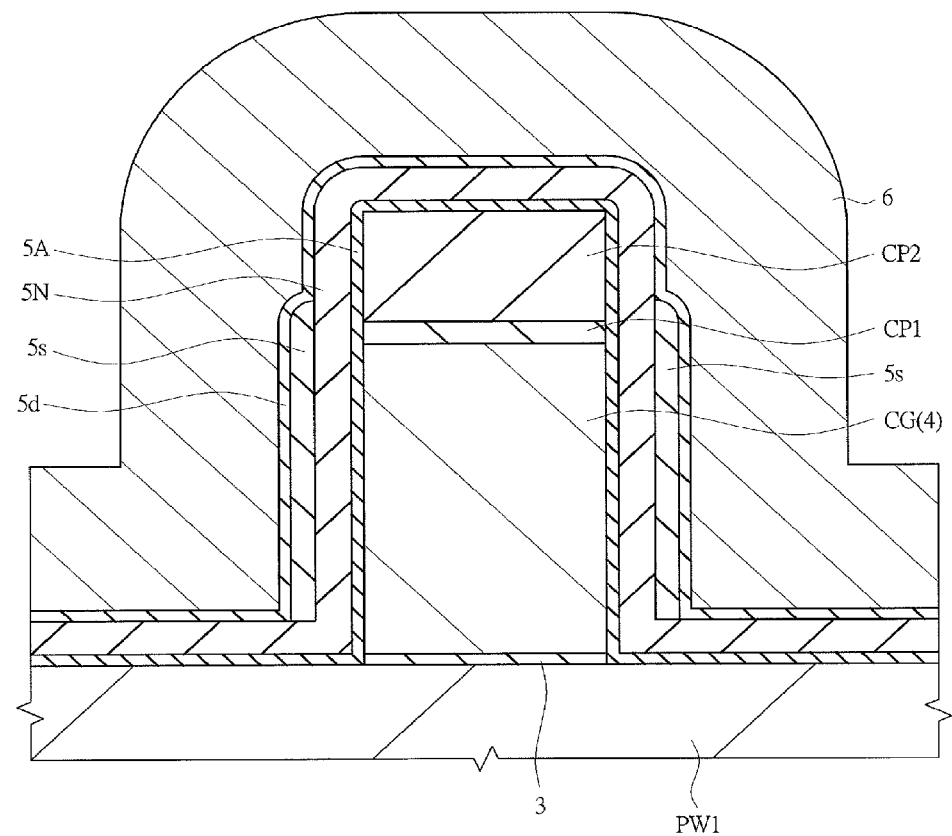
FIG. 20 is a main-part cross-sectional view showing a manufacturing step of the semiconductor device of the first embodiment continued from FIG. 19.

Then, as shown in FIG. 20, the silicon film 6 is formed as the electrically-conductive film (conductor film). As this silicon film 6, for example, a polycrystalline silicon film is formed to have a film thickness of about 50 to 200 nm by using, for example, CVD. Alternatively, the silicon film 6 may be formed by depositing an amorphous silicon film and then crystallizing it by carrying out thermal treatment. An impurity may be introduced into the silicon film 6 according to needs.

Figure 21:
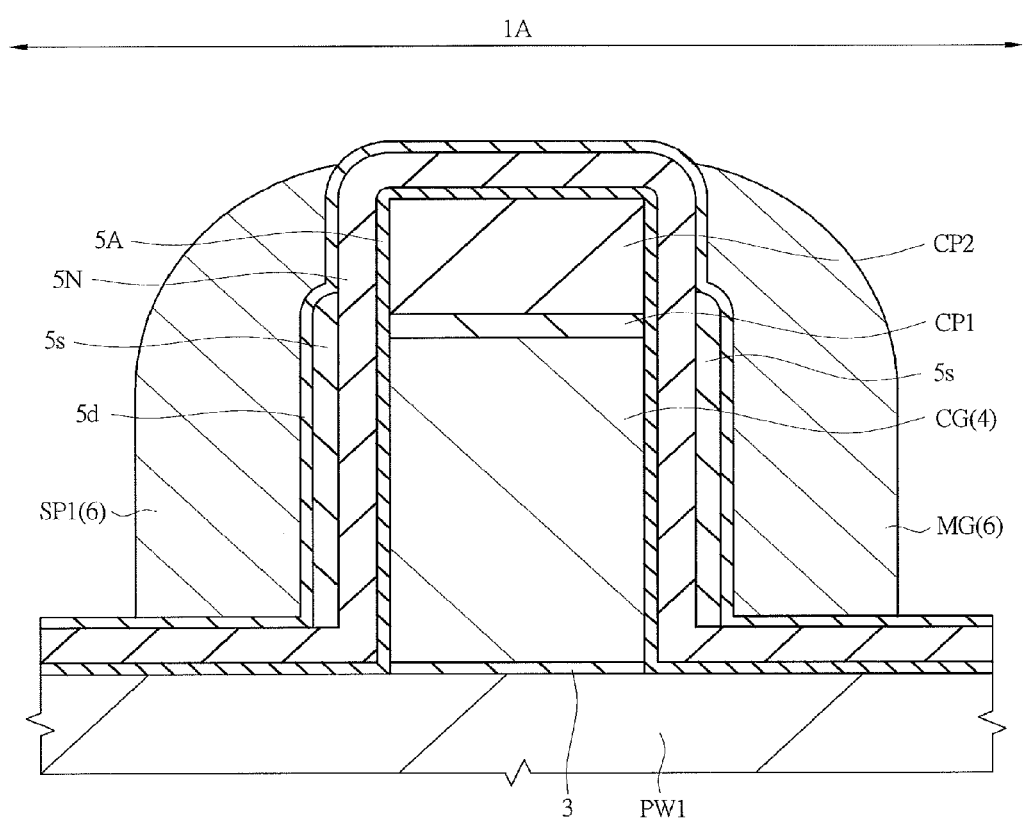
FIG. 21 is a main-part cross-sectional view showing a manufacturing step of the semiconductor device of the first embodiment continued from FIG. 20.
Figure 22:
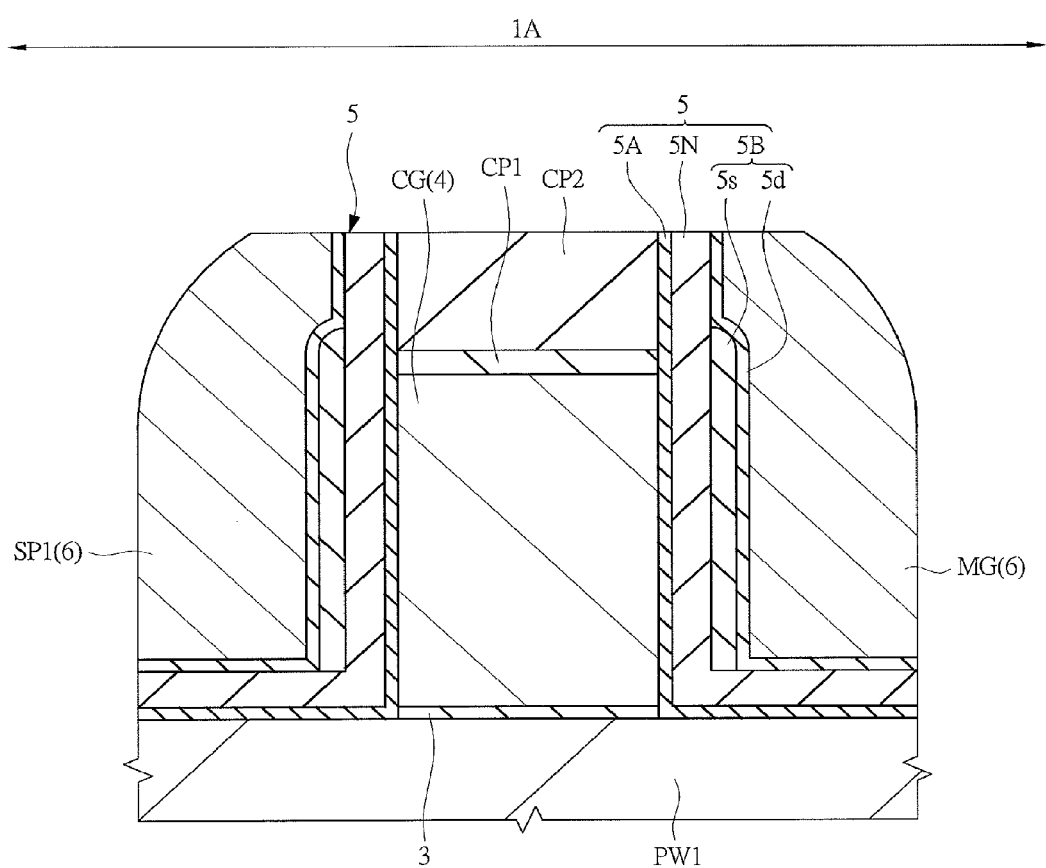
FIG. 22 is a main-part cross-sectional view showing a manufacturing step of the semiconductor device of the first embodiment continued from FIG. 21.

Then, the silicon film 6 of the memory cell region 1A is etched back (FIG. 21). Thereafter, the insulating film 5 at the upper part of the control gate electrode CG or others is removed by etching (FIG. 22). The steps after the step of forming the silicon film 6 described above will be described in further detail with reference to FIG. 23 to FIG. 38.

Figure 23:
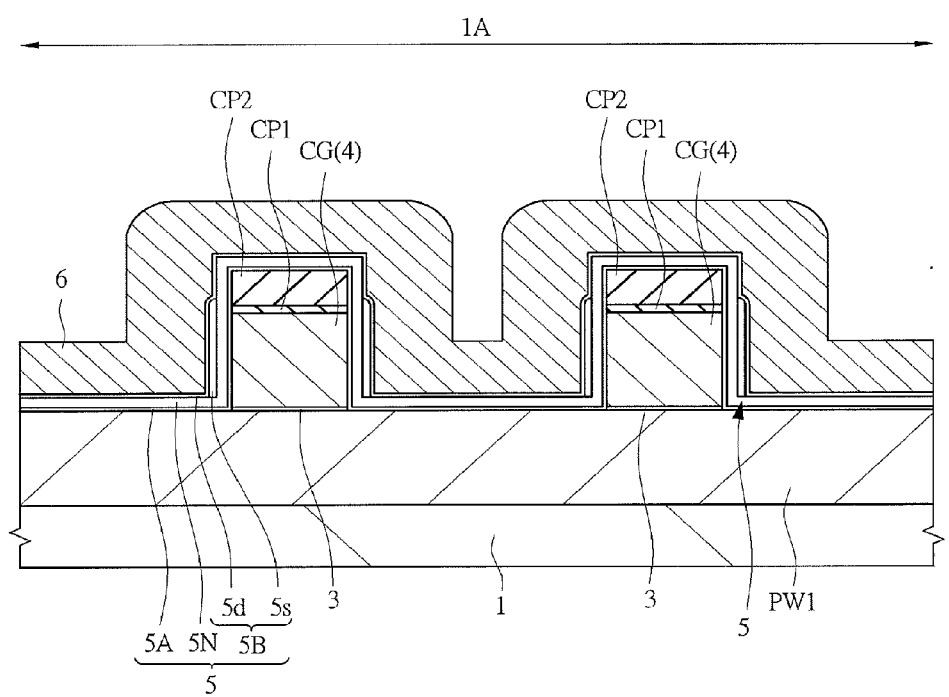
FIG. 23 is a main-part cross-sectional view showing a manufacturing step of the semiconductor device of the first embodiment continued from FIG. 13.
Figure 24:
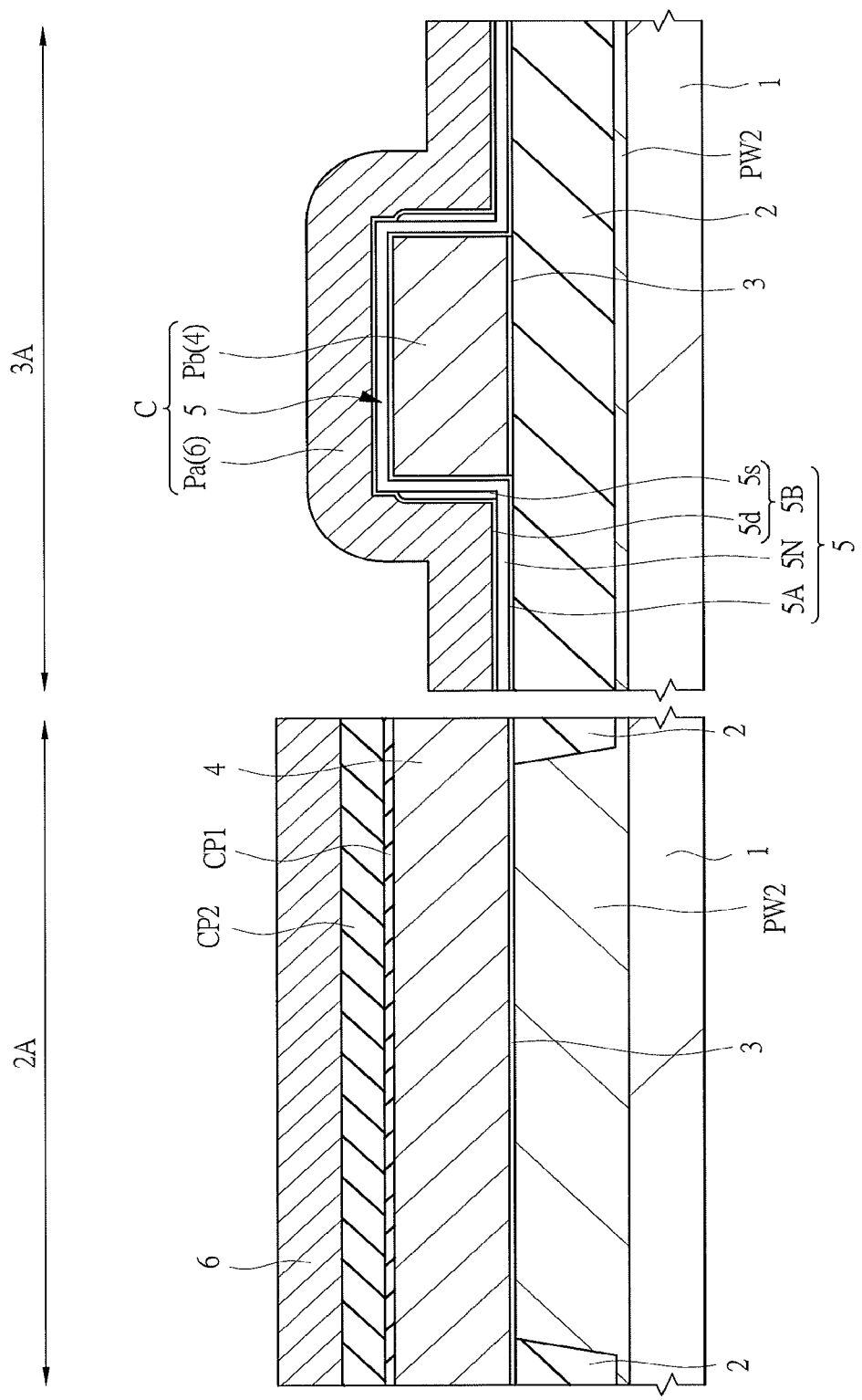
FIG. 24 is a main-part cross-sectional view showing a manufacturing step of the semiconductor device of the first embodiment continued from FIG. 14.

As shown in FIG. 23 and FIG. 24, for example, a polycrystalline silicon film is formed to have a film thickness of about 50 to 200 nm as the silicon film 6 on the upper part of the insulating film 5 by using CVD or the like. Alternatively, the silicon film 6 may be formed by depositing an amorphous silicon film and crystallizing it by carrying out thermal treatment. An impurity may be introduced into the silicon film 6 according to needs. As described later, the silicon film 6 serves as the memory gate electrode MG (for example, having a gate length of about 50 nm) in the memory cell region 1A and serves as the upper electrode Pa of the capacitive element C in the peripheral circuit region 3A.

Figure 25:
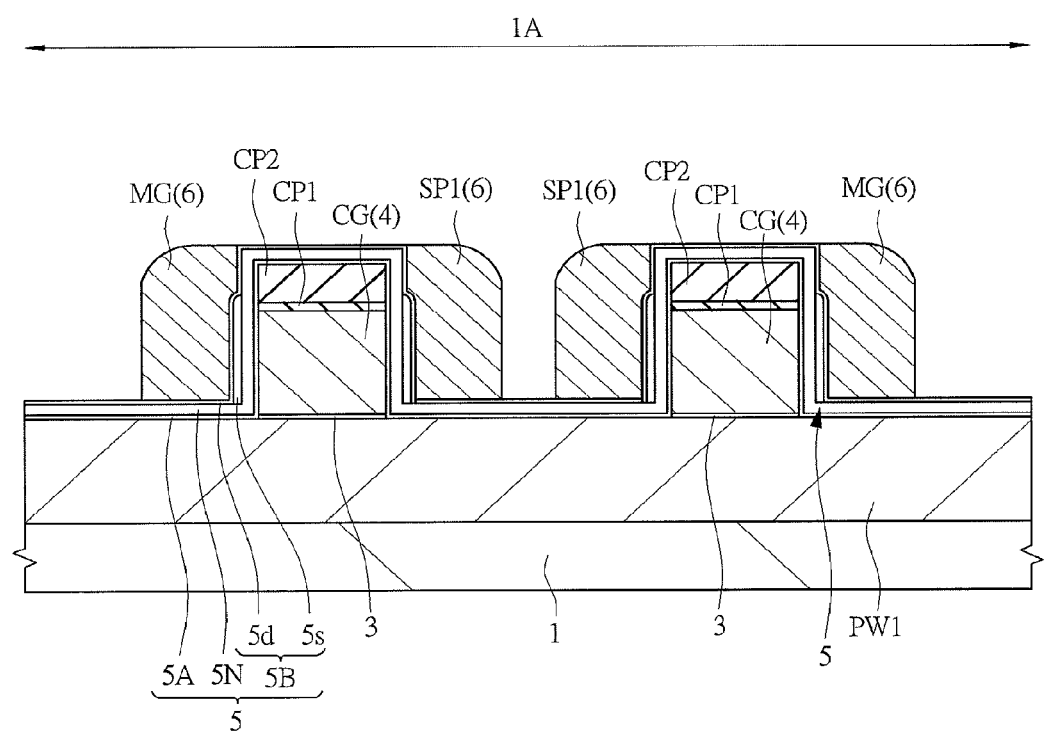
FIG. 25 is a main-part cross-sectional view showing a manufacturing step of the semiconductor device of the first embodiment continued from FIG. 23.
Figure 26:
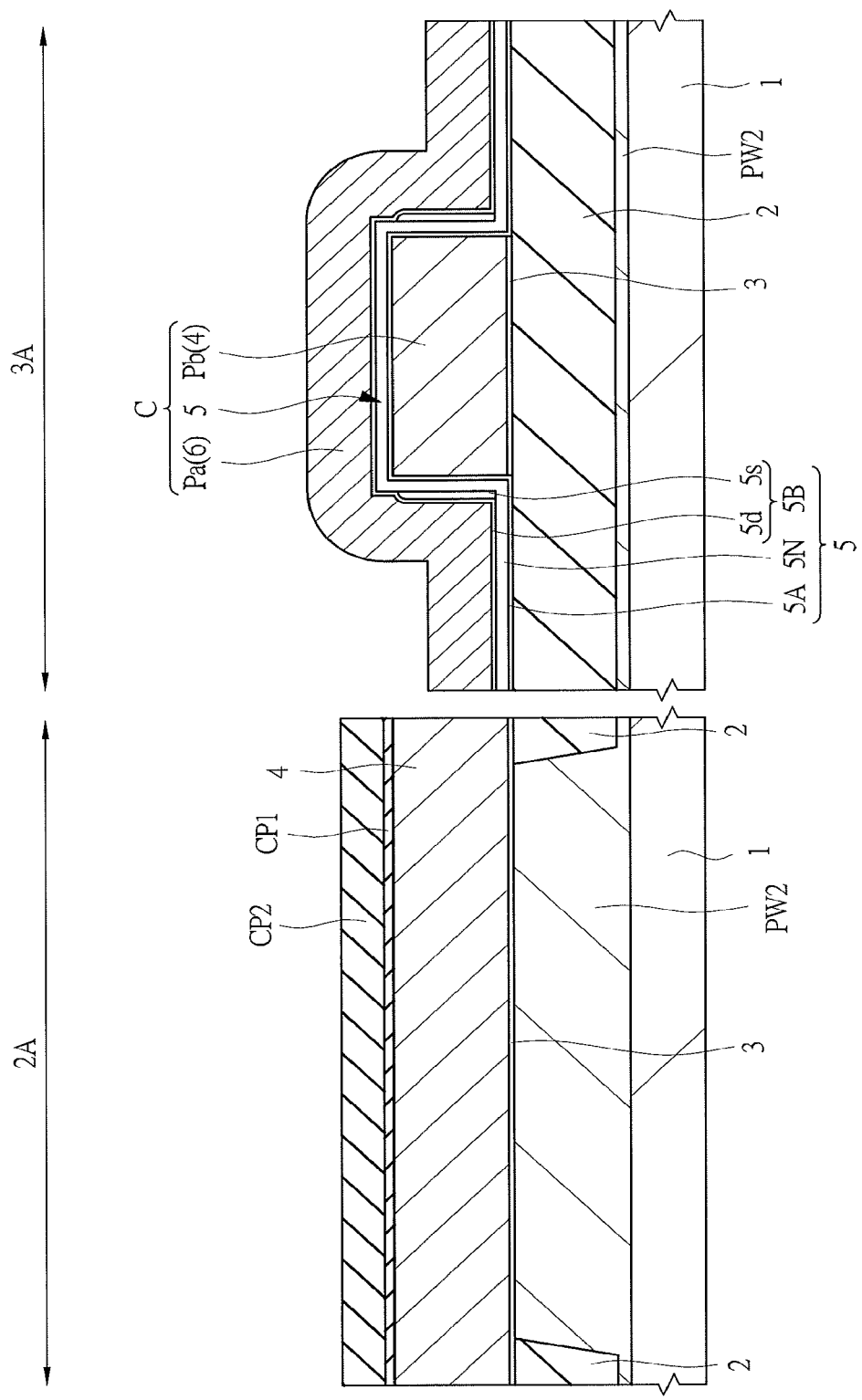
FIG. 26 is a main-part cross-sectional view showing a manufacturing step of the semiconductor device of the first embodiment continued from FIG. 24.

Then, as shown in FIG. 25 and FIG. 26, the silicon film 6 of the memory cell region 1A is etched back (selectively removed). In this etch-back step, the silicon film 6 is removed by anisotropic dry etching by the amount corresponding to a predetermined film thickness from the surface thereof. Through this step, the silicon film 6 can be left like sidewall spacers on the sidewall parts on both sides of the control gate electrode CG via the insulating film 5 (see FIG. 25, FIG. 21). In this case, in the peripheral circuit region 2A, the silicon film 6 is etched, and the silicon nitride film CP2 at the upper part of the silicon film 4 is exposed (FIG. 26). The peripheral circuit region 3A is covered with a photoresist film (not shown) or the like and the silicon film 6 is not etched. As a matter of course, if the upper electrode Pa is desired to be patterned into a desired shape, patterning may be carried out by utilizing this step.

The memory gate electrode MG is formed of the silicon film 6 left on one sidewall part out of the both sidewall parts of the control gate electrode CG described above. A silicon spacer SP1 is formed of the silicon film 6 left on the other sidewall part (FIG. 25). The memory gate electrode MG and the silicon spacer SP1 are formed on the sidewall parts which are on the mutually opposite sides of the control gate electrode CG, and have an approximately symmetric structure about the control gate electrode CG.

The insulating film 5 below the memory gate electrode MG serves as the gate insulating film of the memory transistor. The memory gate length (the gate length of the memory gate electrode MG) is determined in accordance with the deposited film thickness of the silicon film 6.

Figure 27:
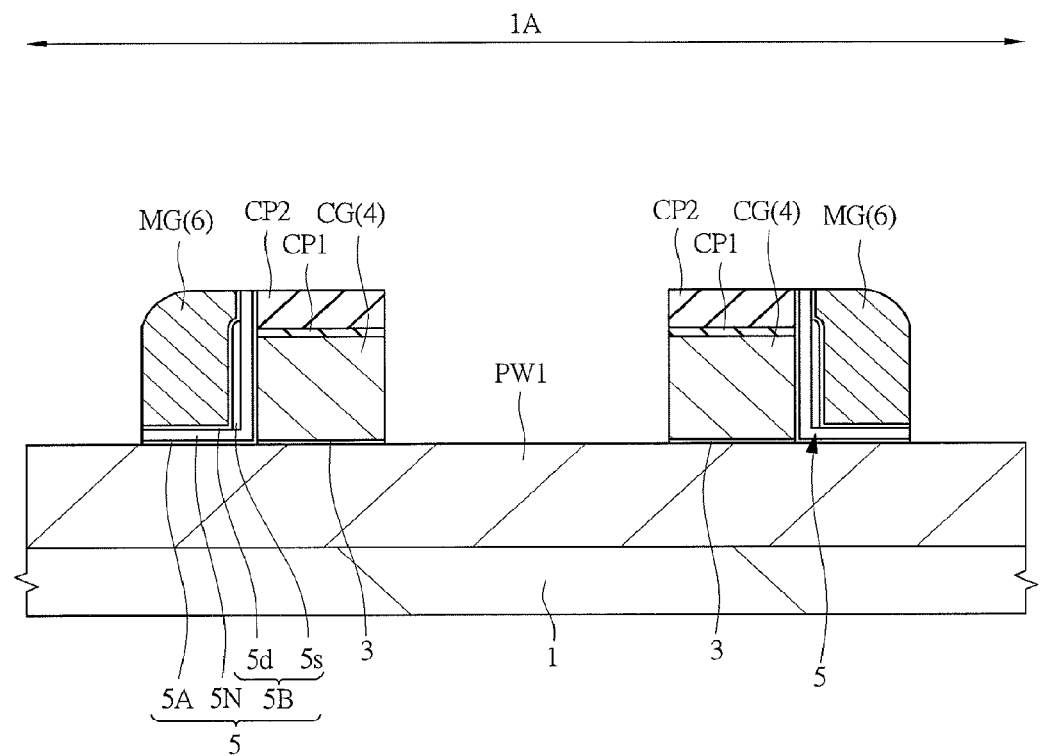
FIG. 27 is a main-part cross-sectional view showing a manufacturing step of the semiconductor device of the first embodiment continued from FIG. 25.
Figure 28:
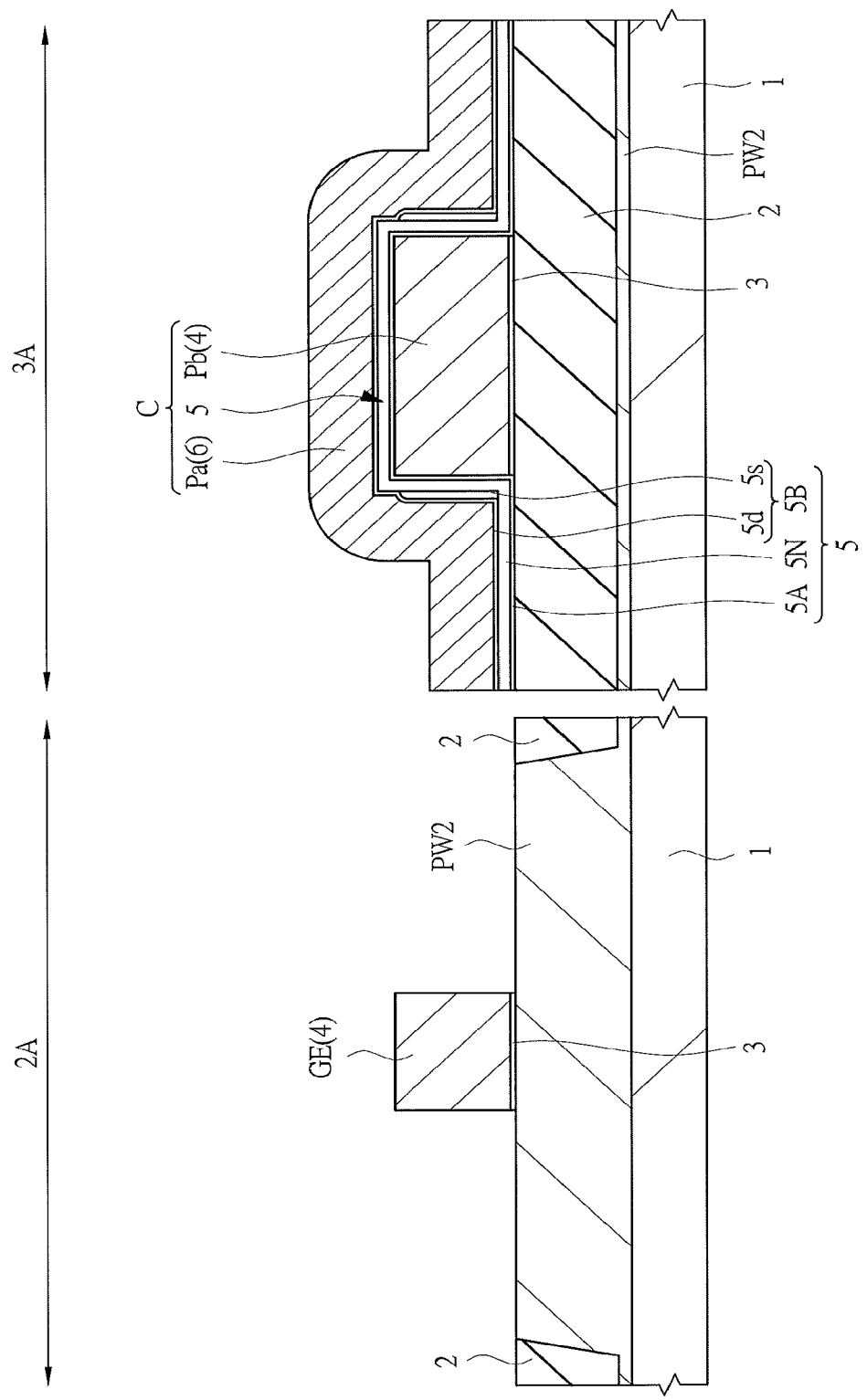
FIG. 28 is a main-part cross-sectional view showing a manufacturing step of the semiconductor device of the first embodiment continued from FIG. 26.

Then, as shown in FIG. 27 and FIG. 28, the insulating film 5 at the upper part of the control gate electrode CG is removed by etching. As a result, the silicon nitride film CP2 at the upper part of the control gate electrode CG is exposed, and the p-type well PW1 is exposed (see FIG. 27, FIG. 22). In this process, in the peripheral circuit region 2A, the insulating film 5 is etched, and the silicon film 4 is exposed.

Then, in the peripheral circuit region 2A, an impurity is introduced into the silicon film 4. For example, an n-type impurity such as phosphorous is implanted into the silicon film 4 of the region in which the n-channel-type MISFET Qn is to be formed. Although it is not illustrated, an impurity of the opposite conductivity type (p type) is implanted into the region in which the p-channel-type MISFET is to be formed.

Then, in the region of the silicon film 4 in which the gate electrode GE of the n-channel-type MISFET Qn is to be formed, a photoresist film (not shown) is formed by using photolithography, and the silicon film 4 is etched with using this photoresist film as a mask. Thereafter, the gate electrode GE is formed by removing the photoresist film by asking or the like and further removing the insulating films (CP1, CP2) at the upper part of the silicon film 4 (FIG. 28). The insulating film 3 left below the gate electrode GE serves as the gate insulating film of the n-channel-type MISFET Qn. The insulating film 3 except the part covered with the gate electrode GE may be removed in the formation of the gate electrode GE or may be removed by a subsequent patterning step.

Figure 29:
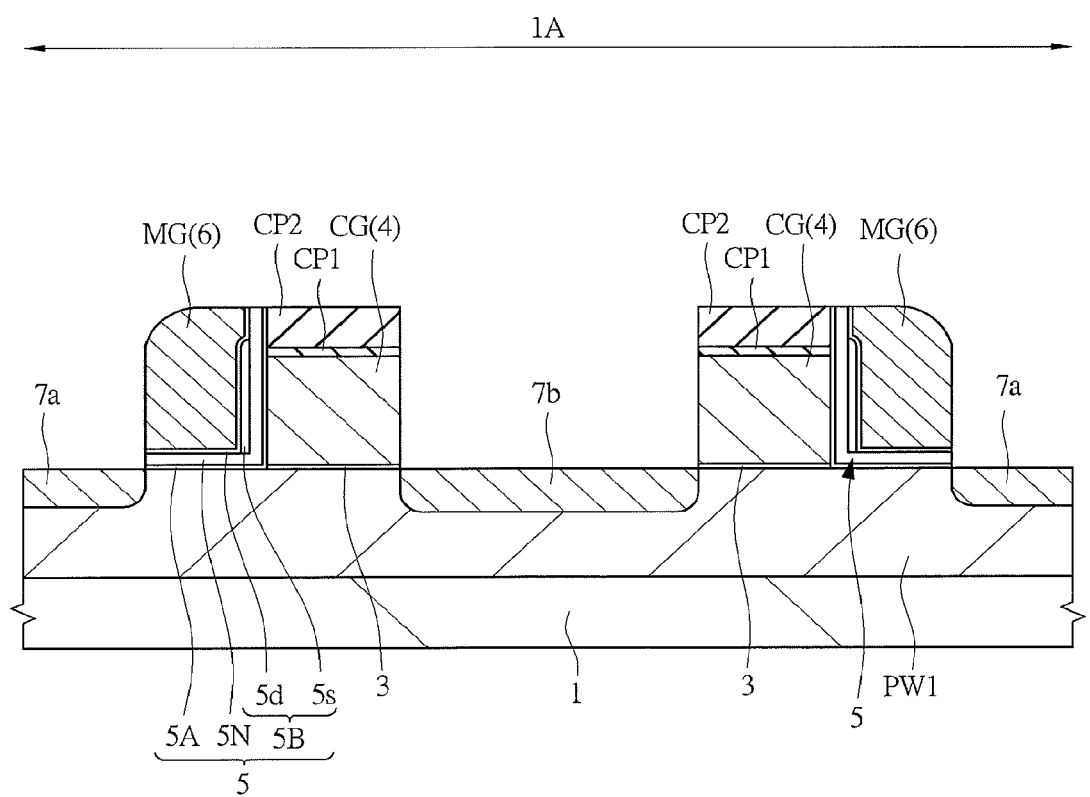
FIG. 29 is a main-part cross-sectional view showing a manufacturing step of the semiconductor device of the first embodiment continued from FIG. 27.
Figure 30:
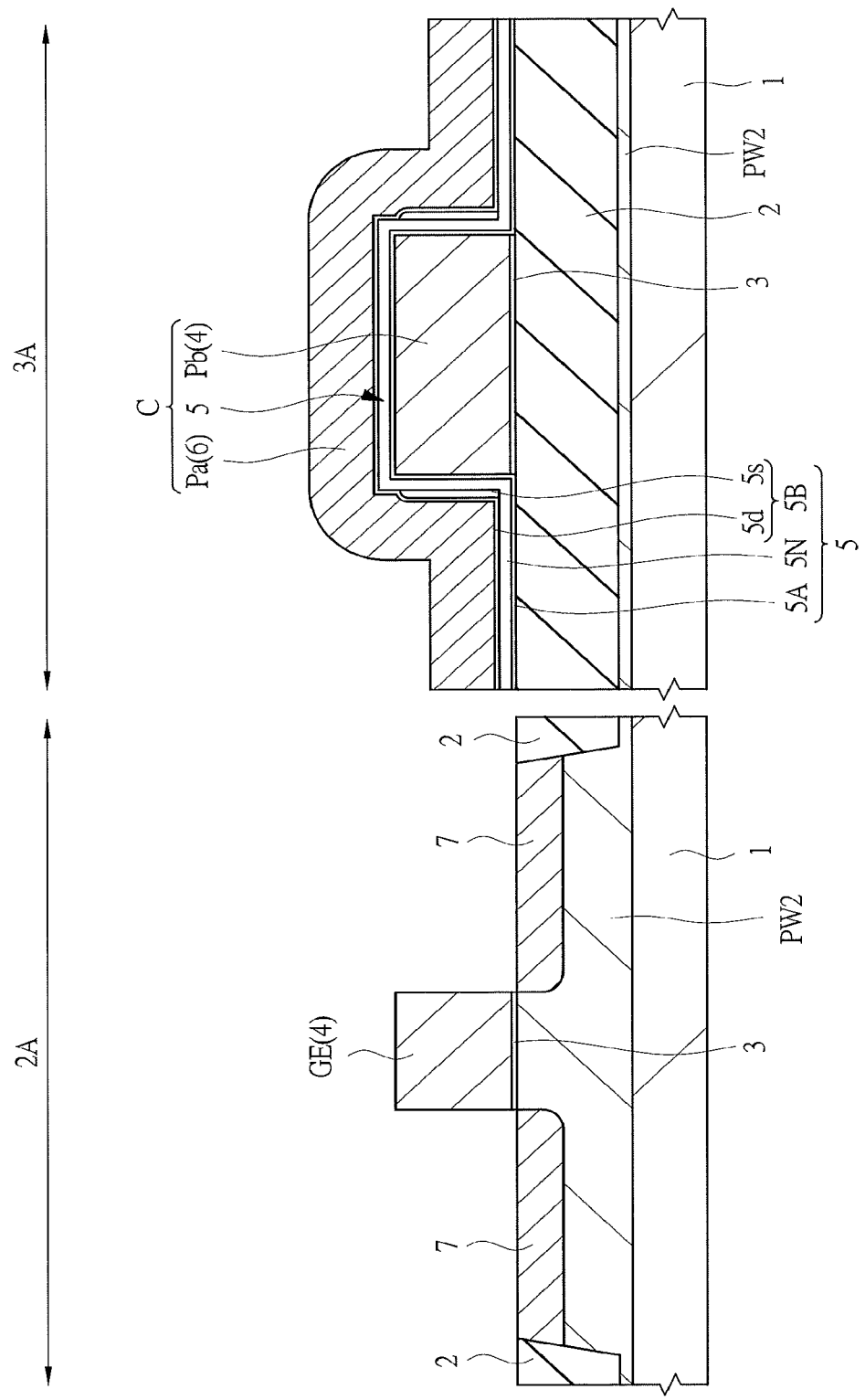
FIG. 30 is a main-part cross-sectional view showing a manufacturing step of the semiconductor device of the first embodiment continued from FIG. 28.

Then, as shown in FIG. 29 and FIG. 30, in the memory cell region 1A, the n⁻-type semiconductor region 7a and the n⁻-type semiconductor region 7b are formed by implanting an n-type impurity such as arsenic (As) or phosphorous (P) into the semiconductor substrate 1 (p-type well PW1) on the control gate electrode CG side. In this process, the n⁻-type semiconductor region 7a is formed in a self-aligning manner with respect to the sidewall of the memory gate electrode MG (the sidewall on the side opposite to the side that is adjacent to the control gate electrode CG via the insulating film 5). Also, the n⁻-type semiconductor region 7b is formed in a self-aligning manner with respect to the sidewall of the control gate electrode CG (the sidewall on the side opposite to the side adjacent to the memory gate electrode MG via the insulating film 5). In the peripheral circuit region 2A, the n⁻-type semiconductor regions 7 are formed by implanting an n-type impurity such as arsenic (As) or phosphorous (P) into the semiconductor substrate 1 (p-type well PW2) on the both sides of the gate electrode GE. In this process, the n⁻-type semiconductor regions 7 are formed in a self-aligning manner with respect to the sidewalls of the gate electrode GE.

The n⁻-type semiconductor region 7a, the n⁻-type semiconductor region 7b, and the n⁻-type semiconductor regions 7 may be formed in the same ion implantation step, but are formed in mutually different ion implantation steps in this case. When the regions are formed in mutually different ion implantation steps in this manner, the n⁻-type semiconductor region 7a, the n⁻-type semiconductor region 7b, and the n⁻-type semiconductor regions 7 can be formed to have desired impurity concentrations and desired junction depths, respectively.

Figure 31:
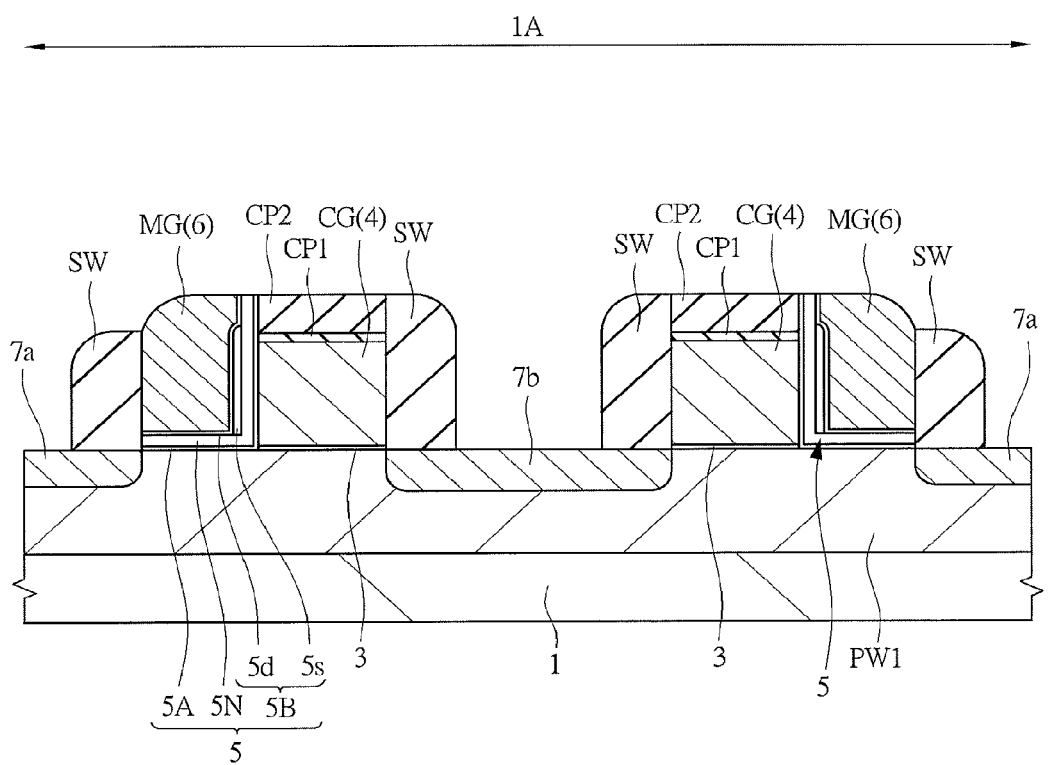
FIG. 31 is a main-part cross-sectional view showing a manufacturing step of the semiconductor device of the first embodiment continued from FIG. 29.
Figure 32:
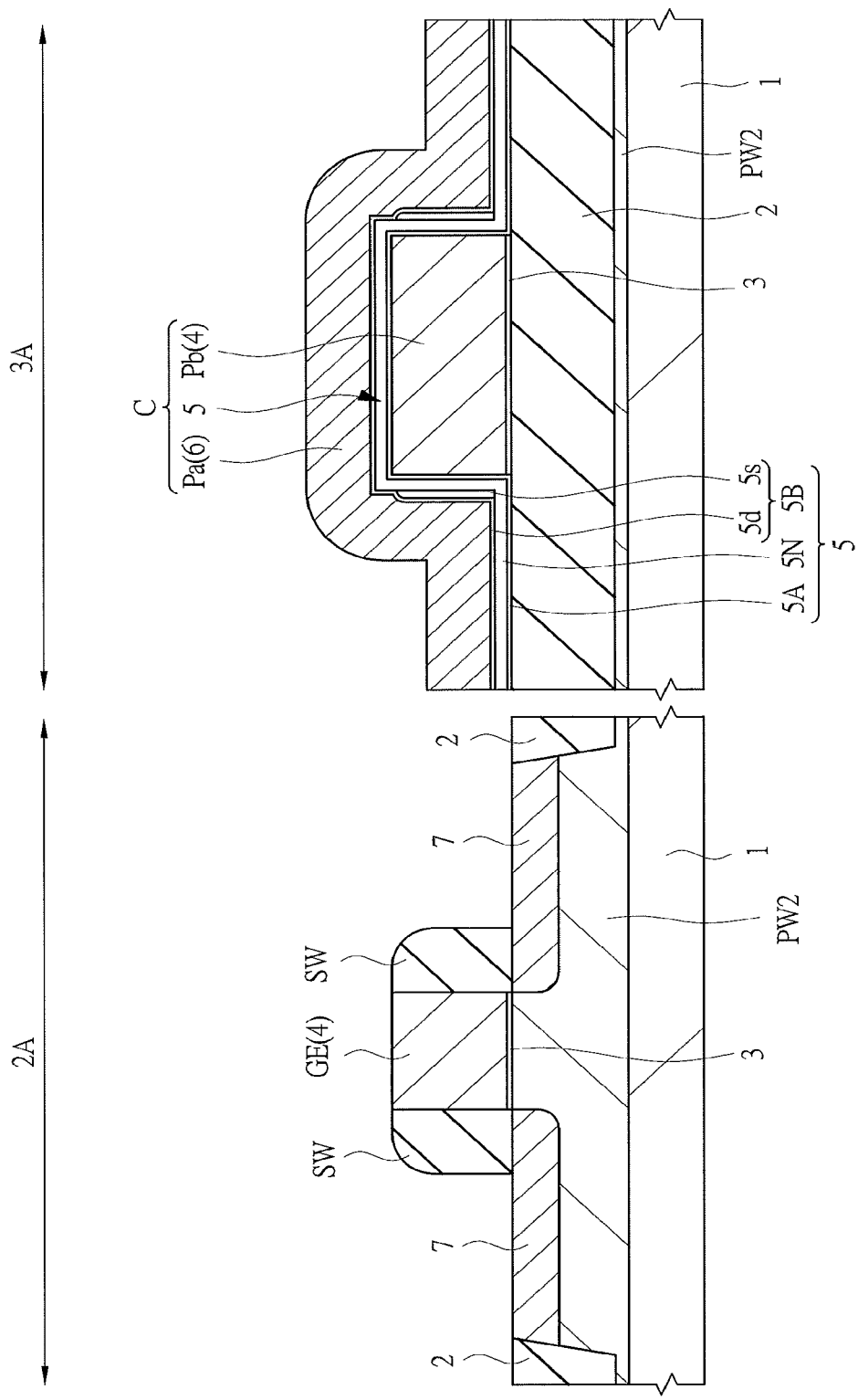
FIG. 32 is a main-part cross-sectional view showing a manufacturing step of the semiconductor device of the first embodiment continued from FIG. 30.

Then, as shown in FIG. 31 and FIG. 32, in the memory cell region 1A, the sidewall insulating film SW composed of an insulating film such as silicon oxide is formed on the sidewall parts of the pattern (composite pattern) in which the control gate electrode CG and the memory gate electrode MG are adjacent to each other via the insulating film 5. Moreover, in the peripheral circuit region 2A, the sidewall insulating film SW is formed on the sidewall parts of the gate electrode GE. The sidewall insulating film SW is formed on the sidewall parts of the above-described composite pattern (CG, MG) and on the sidewall parts of the gate electrode GE by, for example, depositing an insulating film such as a silicon oxide film on the entire main surface of the semiconductor substrate 1 and then etching back the insulating film. Other than a silicon oxide film, for example, a silicon nitride film or a stacked film of a silicon oxide film and a silicon nitride film may be used to form the sidewall insulating film SW.

Figure 33:
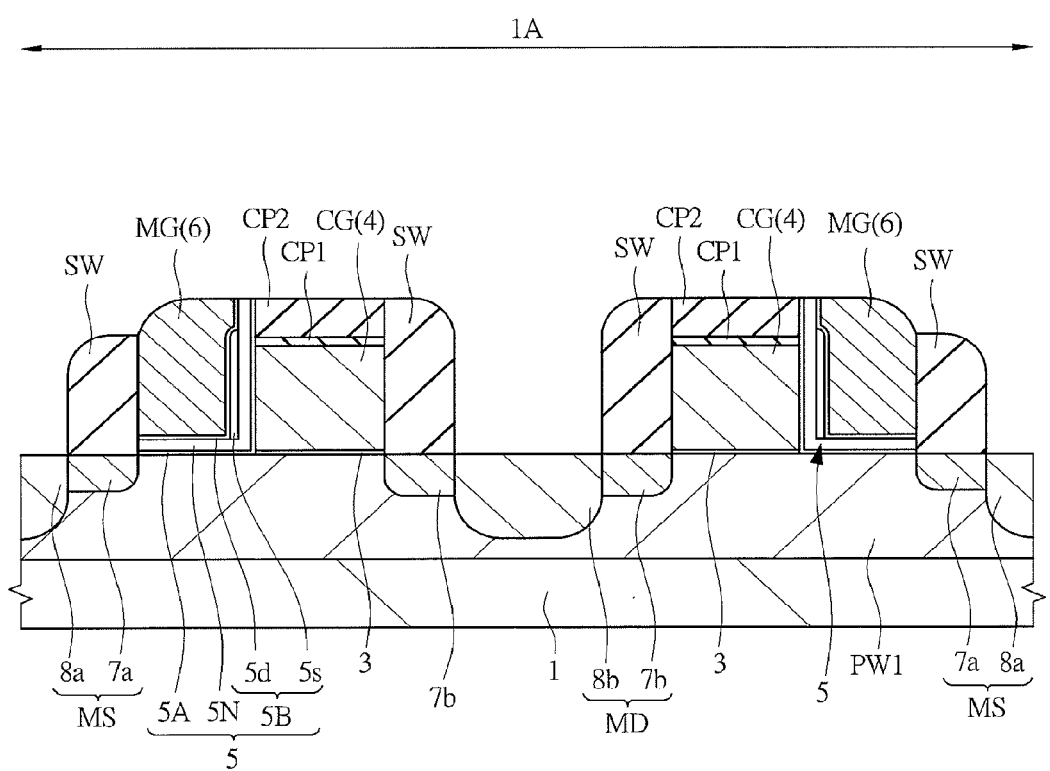
FIG. 33 is a main-part cross-sectional view showing a manufacturing step of the semiconductor device of the first embodiment continued from FIG. 31.
Figure 34:
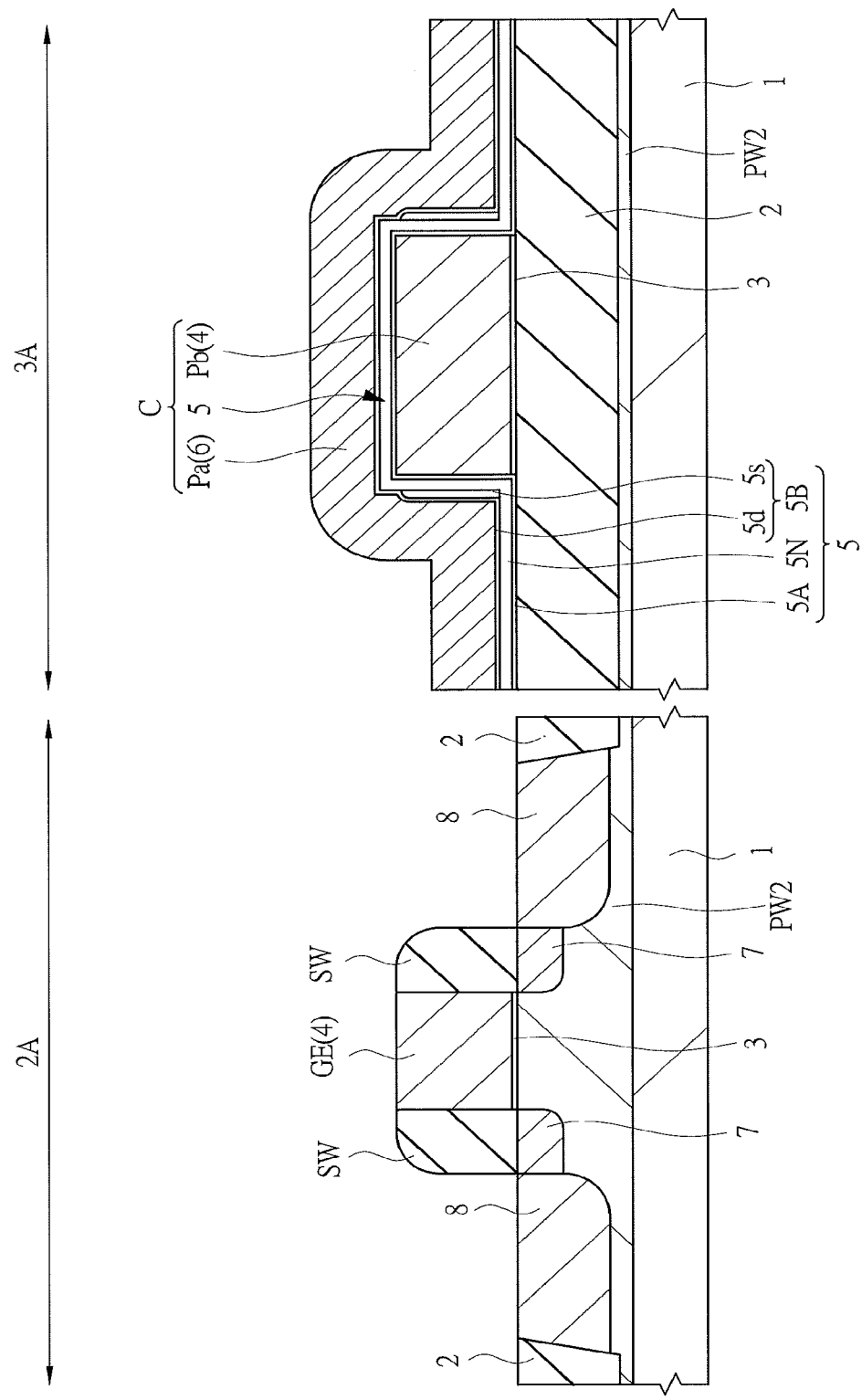
FIG. 34 is a main-part cross-sectional view showing a manufacturing step of the semiconductor device of the first embodiment continued from FIG. 32.

Then, as shown in FIG. 33 and FIG. 34, the n⁺-type semiconductor region 8a and the n⁺-type semiconductor region 8b having high impurity concentration are formed by implanting an n-type impurity such as arsenic (As) or phosphorous (P) into the semiconductor substrate 1 (p-type well PW1) with using the control gate electrode CG, the memory gate electrode MG, and the sidewall insulating film SW as a mask. In this process, the n⁺-type semiconductor region 8a is formed in a self-aligning manner with respect to the sidewall insulating film SW on the memory gate electrode MG side in the memory cell region 1A. The n⁺-type semiconductor region 8b is formed in a self-aligning manner with respect to the sidewall insulating film SW on the control gate electrode CG side in the memory cell region 1A. The n⁺-type semiconductor region 8a is formed as a semiconductor region that has a higher impurity concentration and a deeper junction depth than those of the n⁻-type semiconductor region 7a. The n⁺-type semiconductor region 8b is formed as a semiconductor region that has a higher impurity concentration and a deeper junction depth than those of the n⁻-type semiconductor region 7b. In the peripheral circuit region 2A, the n⁺-type semiconductor regions 8 are formed by implanting an n-type impurity such as arsenic (As) or phosphorous (P) into the semiconductor substrate 1 (p-type well PW2) on the both sides of the gate electrode GE. In this process, the n$^+$-type semiconductor regions 8 are formed in a self-aligning manner with respect to the sidewall insulating film SW on the sidewall parts of the gate electrode GE in the peripheral circuit region 2A. As a result, in the peripheral circuit region 2A, the source/drain regions (7, 8) of the LDD structure are formed on the both sides of the gate electrode GE.

Through the above-described steps, the n-type drain region MD, which functions as the drain region of the memory transistor, is formed by the n$^-$-type semiconductor region 7b and the n$^+$-type semiconductor region 8b having a higher impurity concentration than the region 7b, and the n-type source region MS, which functions as the source region of the memory transistor, is formed by the n$^-$-type semiconductor region 7a and the n$^+$-type semiconductor region 8a having a higher impurity concentration than the region 7a.

Then, thermal treatment for activating the impurities introduced into the source region MS (the n$^-$-type semiconductor region 7a and the n$^+$-type semiconductor region 8a), the drain region MD (the n$^-$-type semiconductor region 7b and the n$^+$-type semiconductor region 8b), and the source/drain regions (7, 8) is carried out.

Through the steps described above, the memory cell MC of a non-volatile memory is formed in the memory cell region 1A, and the n-channel-type MISFET Qn is formed in the peripheral circuit region 2A. The capacitive element C is formed in the peripheral circuit region 3A.

Then, according to needs, the main surface of the semiconductor substrate 1 is cleaned by carrying out, for example, wet etching using diluted hydrofluoric acid or the like. As a result, the upper surface of the n$^+$-type semiconductor region 8a, the upper surface of the n$^+$-type semiconductor region 8b, the upper surface of the control gate electrode CG, and the upper surface of the memory gate electrode MG are cleaned, and unnecessary matters such as natural oxide films are removed. Also, the upper surface of the n$^+$-type semiconductor region 8 and the upper surface of the gate electrode GE are cleaned, and unnecessary matters such as natural oxide films are removed.

Figure 35:
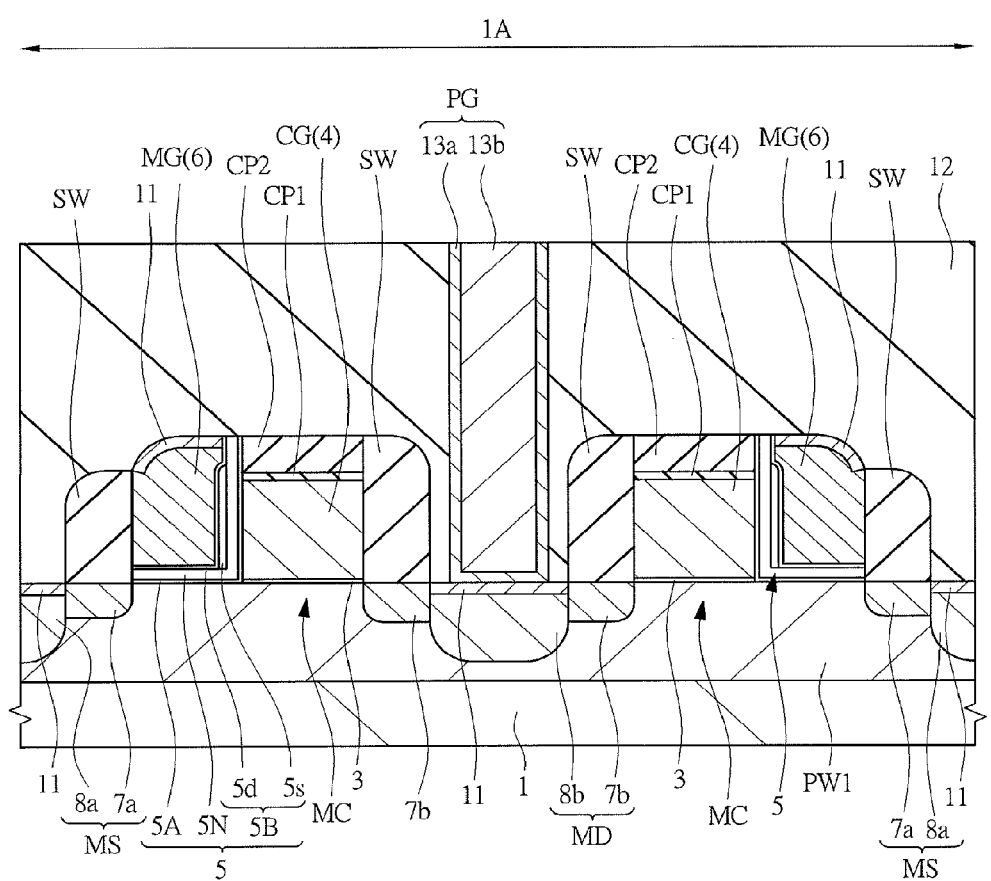
FIG. 35 is a main-part cross-sectional view showing a manufacturing step of the semiconductor device of the first embodiment continued from FIG. 33.
Figure 36:
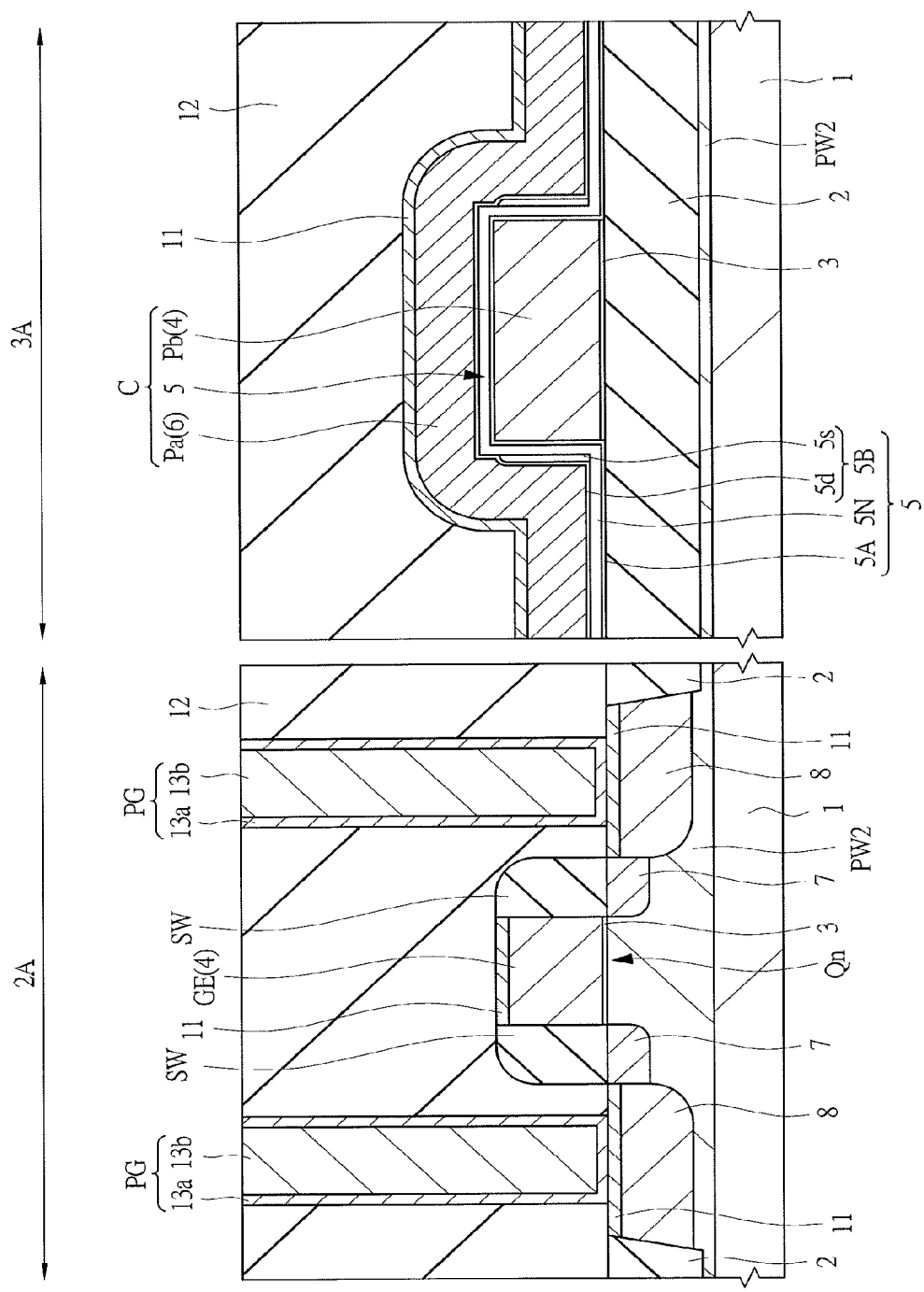
FIG. 36 is a main-part cross-sectional view showing a manufacturing step of the semiconductor device of the first embodiment continued from FIG. 34.

Then, as shown in FIG. 35 and FIG. 36, the metal silicide layer (metal silicide film) 11 is formed on each of the upper parts of the memory gate electrode MG, the n$^+$-type semiconductor region 8a, and the n$^+$-type semiconductor region 8b by using salicide techniques. Also, the metal silicide layer 11 is formed on each of the upper parts of the gate electrode GE and the n$^+$-type semiconductor regions 8. Also, the metal silicide layer 11 is formed on the upper part of the upper electrode Pa of the capacitive element C.

Diffusion resistance, contact resistance, and others can be reduced by the metal silicide layer 11. The metal silicide layer 11 can be formed in the following manner.

For example, a metal film (not shown) is formed on the entire main surface of the semiconductor substrate 1, and the semiconductor substrate 1 is subjected to thermal treatment, thereby causing the upper layer parts of the memory gate electrode MG, the gate electrode GE, the n$^+$-type semiconductor regions 8, 8a, and 8b, and the upper electrode Pa to react with the above-described metal film. As a result, the metal silicide layer 11 is formed on each of the upper parts of the memory gate electrode MG, the gate electrode GE, the n$^+$-type semiconductor regions 8, 8a, and 8b, and the upper electrode Pa. The above-described metal film is composed of, for example, a cobalt (Co) film or a nickel (Ni) film and can be formed by using, for example, sputtering.

Here, since the height H5s of the sidewall film 5s is set to be lower than the height HMG of the memory gate electrode MG (H5s<HMG, see FIG. 3) as described above, the memory gate electrode MG extends also to the part above the sidewall film 5s, and the sidewall and the upper part of the sidewall film 5s are covered with the silicon film 6, which forms the memory gate electrode MG. As a result, the formation region of the metal silicide layer 11 on the surface of the memory gate electrode MG can be enlarged by the amount corresponding to the film thickness of the sidewall film 5s (film thickness in the gate-length direction).

Then, after the unreacted metal film is removed, for example, a single film of a silicon oxide film or a stacked film of a silicon nitride film and a silicon oxide film formed on the silicon nitride film to be thicker than the silicon nitride film is formed as the insulating film (interlayer insulating film) 12 on the entire main surface of the semiconductor substrate 1 by using CVD or the like. After the formation of the insulating film 12, the upper surface of the insulating film 12 is planarized by using, for example, CMP (Chemical Mechanical Polishing) according to needs.

Then, contact holes (openings, through holes) are formed in the insulating film 12 by subjecting the insulating film 12 to dry etching. Then, a stacked film of a barrier conductor film 13a and a main conductor film 13b is formed in the contact holes. Then, the unnecessary parts of the main conductor film 13b and the barrier conductor film 13a on the insulating film 12 are removed by, for example, CMP or etch-back, thereby forming plugs PG. The plugs PG are formed on upper parts of, for example, the n$^+$-type semiconductor regions 8, 8a, and 8b. Although not shown in the cross sections shown in FIG. 35 and FIG. 36, the plugs PG are formed also on the upper parts of the control gate electrode CG, the memory gate electrode MG, the gate electrode GE, and others. For example, a titanium film, a titanium nitride film, or a stacked film of these can be used as the barrier conductor film 13a. For example, a tungsten film or the like can be used as the main conductor film 13b.

Figure 37:
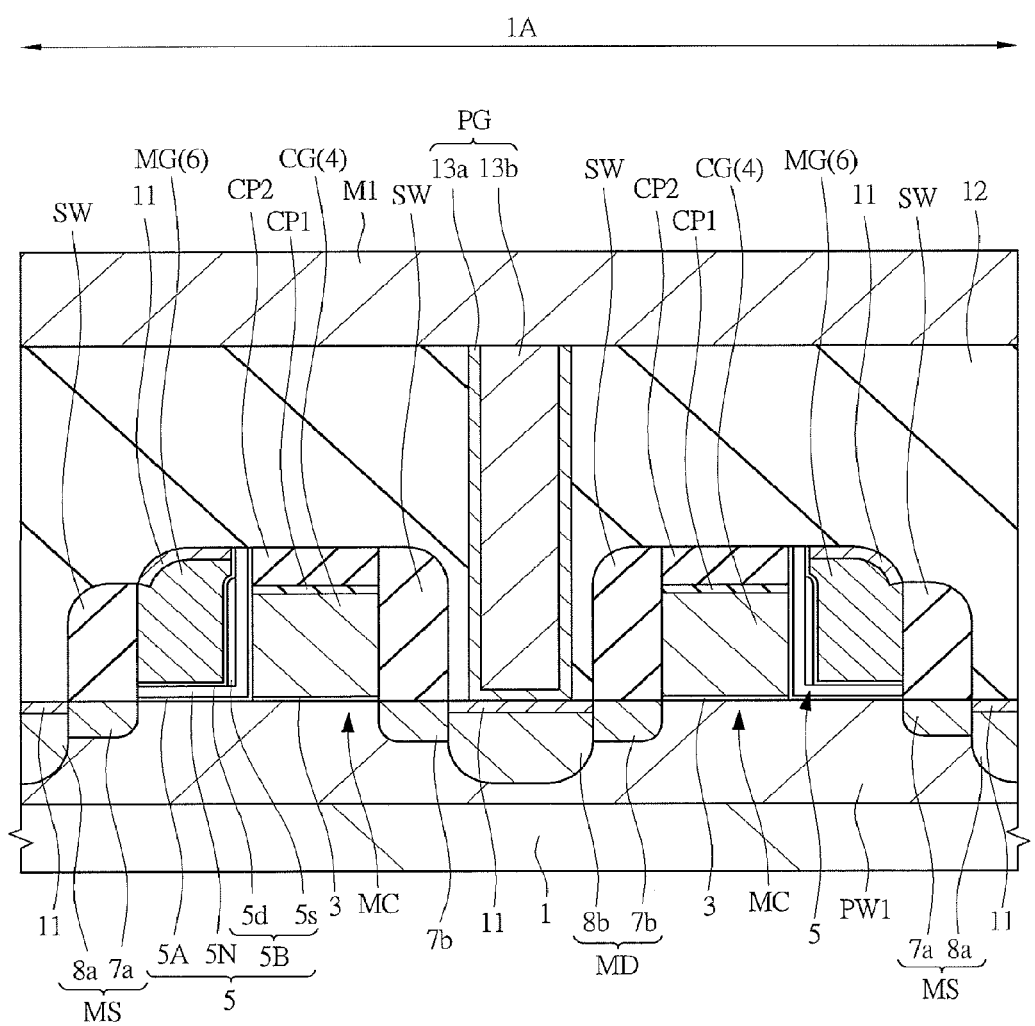
FIG. 37 is a main-part cross-sectional view showing a manufacturing step of the semiconductor device of the first embodiment continued from FIG. 35.
Figure 38:
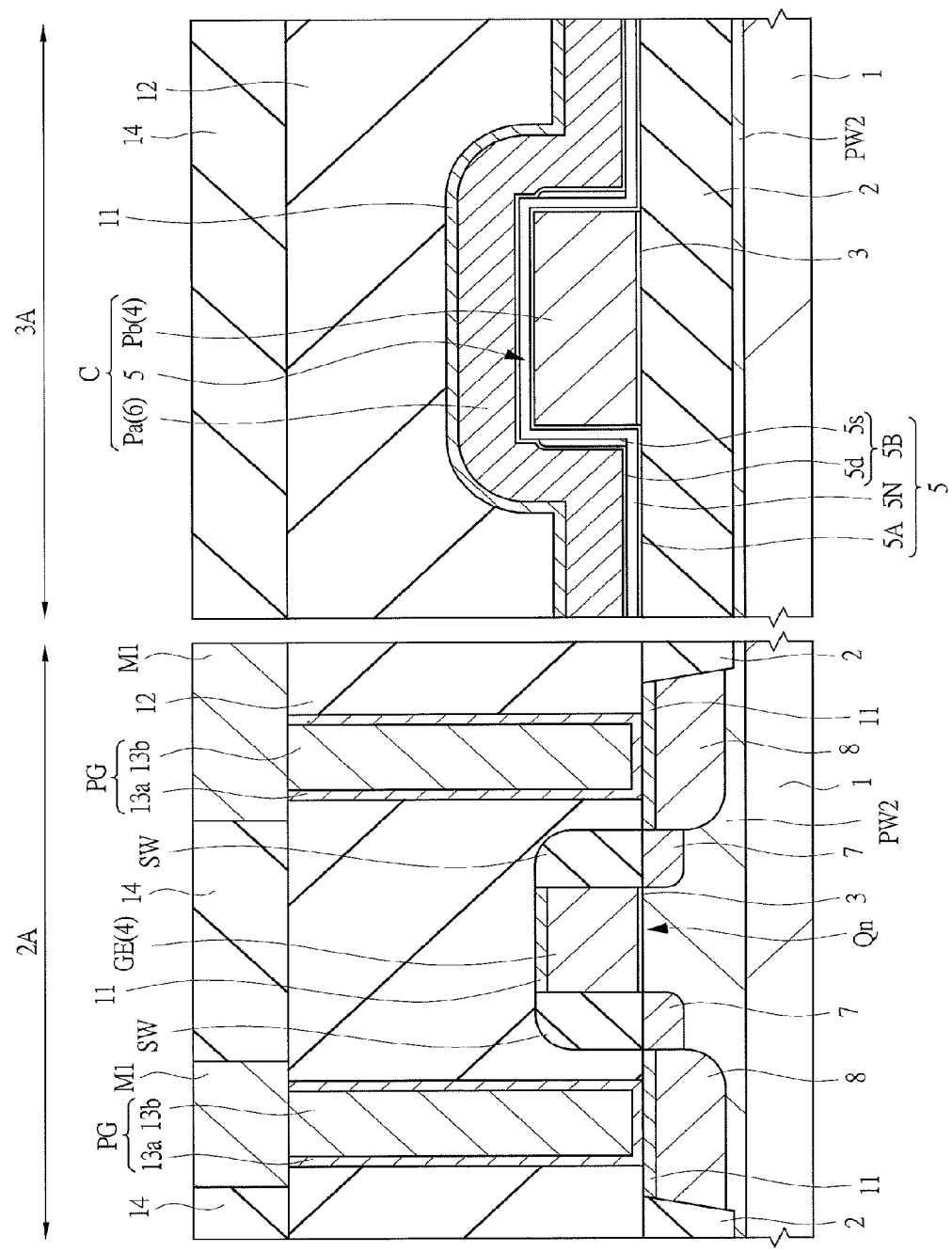
FIG. 38 is a main-part cross-sectional view showing a manufacturing step of the semiconductor device of the first embodiment continued from FIG. 36.

Then, as shown in FIG. 37 and FIG. 38, first-layer wiring (M1) is formed on the insulating film 12, in which the plugs PG have been buried. The first-layer wiring is formed by using, for example, damascene techniques (herein, single damascene techniques). First, a trench insulating film 14 is formed on the insulating film, in which the plugs PG have been buried, and wiring trenches are formed in the trench insulating film 14 by using photolithography techniques and dry etching techniques. Then, a barrier conductor film (not shown) is formed on the main surface of the semiconductor substrate 1 including the interior of the wiring trenches, and subsequently, a seed layer of copper (not shown) is formed on the barrier conductor film by, for example, CVD or sputtering. Then, a copper plating film is formed on the seed layer by using, for example, electrolytic plating to bury the interior of the wiring trenches with the copper plating film. Thereafter, the copper plating film, the seed layer, and a barrier metal film in the regions except the interior of the wiring trenches are removed by CMP, thereby forming the first-layer wiring whose main conductive material is copper. As the barrier conductor film, for example, a titanium nitride film, a tantalum film, or a tantalum nitride film can be used.

Thereafter, wiring of second and subsequent layers is formed by dual damascene, but the description thereof will be omitted here. Other than the above-described damascene techniques, each of the wirings can be formed by patterning an electrically-conductive film for wiring. In that case, as the electrically-conductive film, for example, tungsten or aluminum can be used.

DESCRIPTION OF MODIFICATION EXAMPLES

Figure 39:
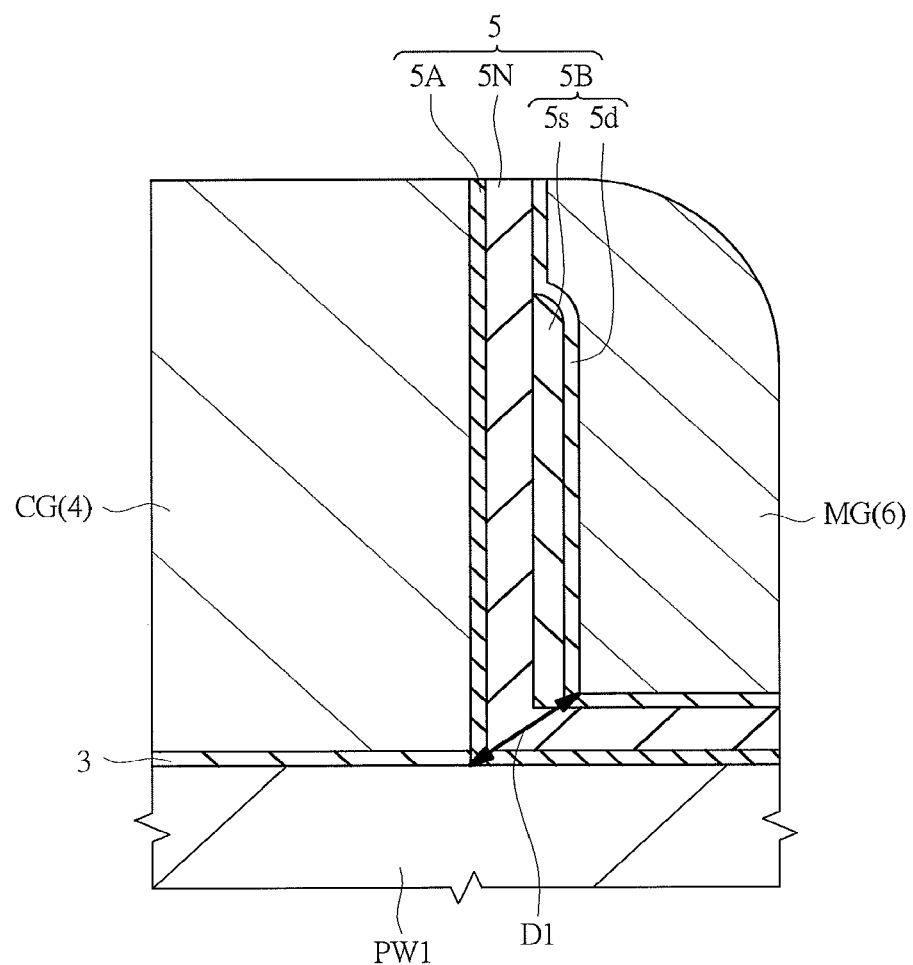
FIG. 39 is a main-part cross-sectional view showing another memory cell structure of the semiconductor device of the first embodiment.

With respect to the above-described structure of FIG. 3 having the silicon nitride film CP2 and the silicon oxide film CP1 on the control gate electrode CG, the silicon nitride film CP2 and the silicon oxide film CP1 may be omitted as shown in FIG. 39. FIG. 39 is a main-part cross-sectional view showing another memory cell structure of the semiconductor device of the present embodiment.

In this case, the height of the control gate electrode CG is arbitrarily adjustable, and the height of the control gate electrode CG may be made equivalent to the height of the silicon nitride film CP2 of the case in which the silicon nitride film CP2 is provided.

Also, it is preferred that the height H5s of the sidewall film 5s is set to 90% or more of the height HCG of the control gate electrode CG (H5s>0.9×HCG).

In the structure shown in FIG. 3, the height H5s of the sidewall film 5s is set to be lower than the height HMG of the memory gate electrode MG (H5s<HMG, see FIG. 3). However, as shown in FIG. 7 described above, the height H5s of the sidewall film 5s may be made equivalent to the height HMG of the memory gate electrode MG (H5s=HMG). Also in the memory cell having the shape like this, the effect of improving the erasure characteristic described in the section <1> above can be achieved, and the memory cell proves to be useful.

Then, a modification example of the shape of the sidewall film 5s of the above-described embodiment (see FIG. 3 and others) will be described below.

Modification Example 1

Figure 40A:
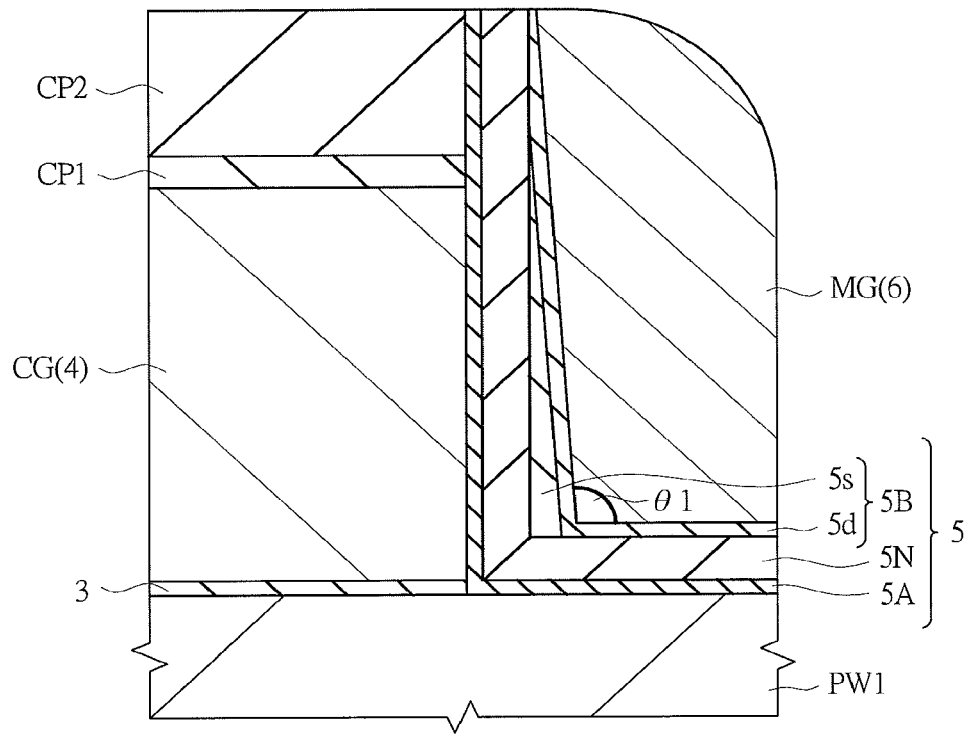
FIG. 40A is a main-part cross-sectional view showing a memory cell structure and others of a semiconductor device of a modification example 1 of the first embodiment.
Figure 40B:
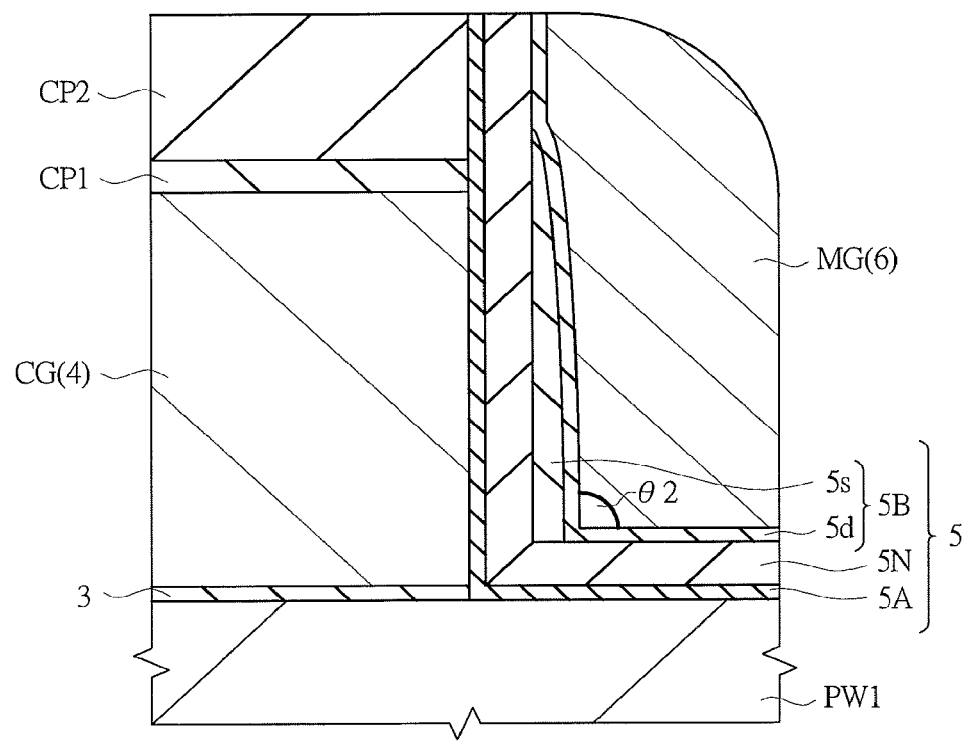
FIG. 40B is a main-part cross-sectional view showing a memory cell structure and others of a semiconductor device of the modification example 1 of the first embodiment.

FIGS. 40A and 40B are main-part cross-sectional views showing structures of memory cells of a semiconductor device of the modification example 1 of the present embodiment. Since these structures are similar to the above-described embodiment (see FIG. 3 and others) except for the sidewall film 5s, detailed description thereof will be omitted.

An insulating film 5 shown in FIG. 40A is a so-called multilayer insulating film (ONO film). Specifically, the insulating film 5 is composed of a silicon oxide film serving as a first film (lower layer film) 5A, a silicon nitride film serving as a second film (intermediate film) 5N, and a silicon oxide film serving as a third film (upper layer film) 5B. The third film (upper layer film) 5B is composed of a stacked film of a sidewall film 5s and a deposited film 5d, each of which is composed of a silicon oxide film. The second film 5N is a charge accumulating part.

In the present embodiment, the side surface of the sidewall film 5s has a tapered shape. In other words, the film thickness of the sidewall film 5s is increased from the upper part thereof to the lower part thereof, and the angle (θ1) formed by the side surface of the sidewall film 5s and the deposited film 5d (silicon nitride film (5N)) is larger than 90°.

In the structure shown in FIG. 3, the side surface of the sidewall film 5s is schematically illustrated as a perpendicular surface. However, since it is difficult to carry out complete anisotropic etching and components of isotropic etching are also contained slightly, as the etching time becomes longer, etching in the transverse direction (gate-length direction) progresses. As a result, also in the embodiment shown in FIG. 3, as the etching time becomes longer, the angle (θ2) formed by the side surface of the sidewall film 5s and the deposited film 5d (silicon nitride film (5N)) becomes larger than 90° as shown in FIG. 40B.

Compared with FIG. 40B, the shape of taper is gradual in FIG. 40A, and the formed angle is larger than that of the case of FIG. 40B (θ1>θ2). In other words, the corner part of the memory gate electrode MG is largely rounded compared with the case of FIG. 40B.

By employing the above-described structure, electric-field concentration at the corner part of the memory gate electrode MG can be reduced, and occurrence of the FN tunneling phenomenon can be suppressed. Therefore, erasure (hole injection) can be efficiently carried out, and the erasure characteristic can be improved.

A method for increasing the tapered angle, in other words, for increasing the difference in the film thickness between the upper part and the lower part will be described below.

In the above-described embodiment (see FIG. 3 and others), in the etch-back step of the silicon oxide film (5s), the silicon oxide film (5s) is anisotropically etched (FIG. 18) from the surface thereof, and the tapered angle can be increased by adjusting etching conditions in this etching step. For example, the tapered angle can be increased by adding isotropic etching conditions.

For example, by increasing the flow rate of $CHF_3$ to be larger than the flow rate of $CF_4$ in the mixed gas of $CF_4$ and $CHF_3$ serving as the etching gas described in the above-described embodiment (see FIG. 3 and others), isotropic etching components are increased, and the tapered angle can be increased.

Modification Example 2

Figure 41:
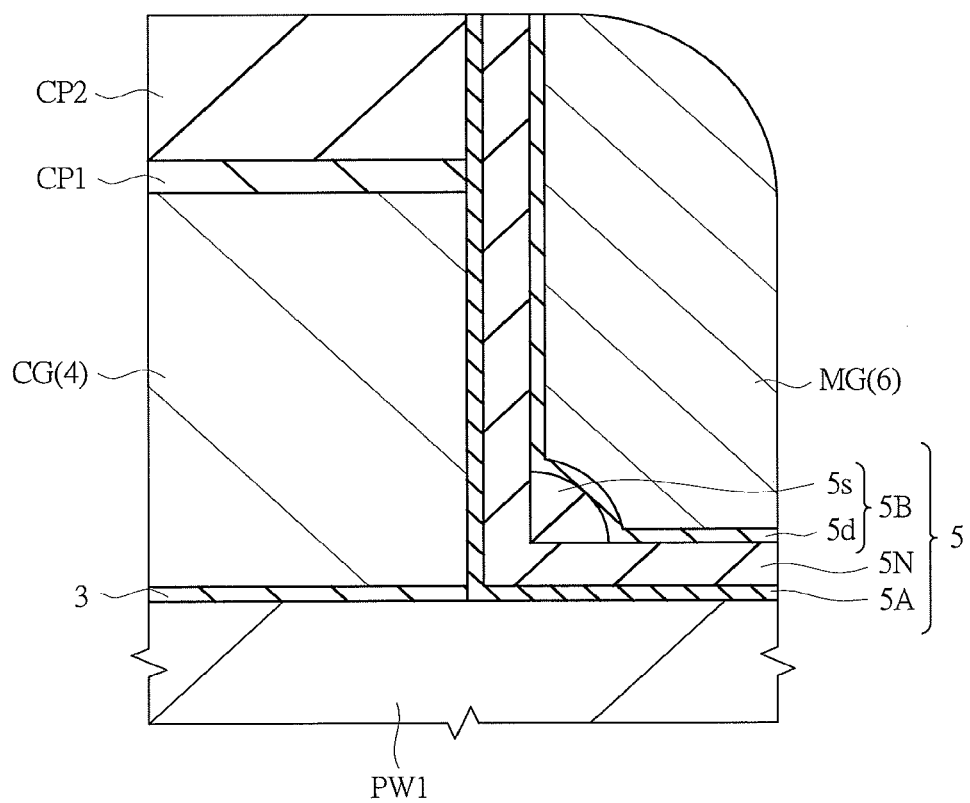
FIG. 41 is a main-part cross-sectional view showing a memory cell structure of a semiconductor device of a modification example 2 of the first embodiment.

FIG. 41 is a main-part cross-sectional view showing a structure of a memory cell of a semiconductor device of a modification example 2 of the present embodiment.

In the above-described embodiment (see FIG. 3 and others), the height H5s of the sidewall film 5s is set to be lower than the height HMG of the memory gate electrode MG and be higher than the height HCG of the control gate electrode CG (HMG>H5s>HCG), but the height H5s may be set to be lower than the height HCG of the control gate electrode CG (H5s<HCG, FIG. 41). Since the structure is similar to that of the above-described embodiment (see FIG. 3 and others) except for the sidewall film 5s, detailed description thereof will be omitted.

An insulating film 5 shown in FIG. 41 is a so-called multilayer insulating film (ONO film). Specifically, the insulating film 5 is composed of a silicon oxide film serving as a first film (lower layer film) 5A, a silicon nitride film serving as a second film (intermediate film) 5N, and a silicon oxide film serving as a third film (upper layer film) 5B. The third film (upper layer film) 5B is composed of a stacked film of a sidewall film 5s and a deposited film 5d, each of which is composed of a silicon oxide film. The second film 5N is a charge accumulating part.

In the present embodiment, the height H5s of the sidewall film 5s is set to be lower than the height HCG of the control gate electrode CG (H5s<HCG). Specifically, the height of the sidewall film 5s is about 30% or less of the height HCG of the control gate electrode CG, and the sidewall film 5s is disposed only at the corner part of the memory gate electrode MG.

Also by this structure, the corner part of the memory gate electrode MG is directly rounded by the sidewall film 5s, and electric-field concentration at this part can be reduced. Therefore, occurrence of the FN tunneling phenomenon can be suppressed, and the erasure characteristic can be improved.

In order to reduce the height H5s of the sidewall film 5s in this manner, the amount of etch-back has to be increased, and the etching control may become difficult.

Therefore, by forming the silicon oxide film (5s) to have a large film thickness in advance, for example, to have a film thickness of approximately 15% or larger of the film thickness of the memory gate electrode MG, the sidewall film 5s can be left only at the corner part of the memory gate electrode MG. The film thickness (film thickness in the gate-length direction) of the left sidewall film 5s is, for example, 10% or more of the film thickness of the memory gate electrode MG.

Modification Example 3

Figure 42:
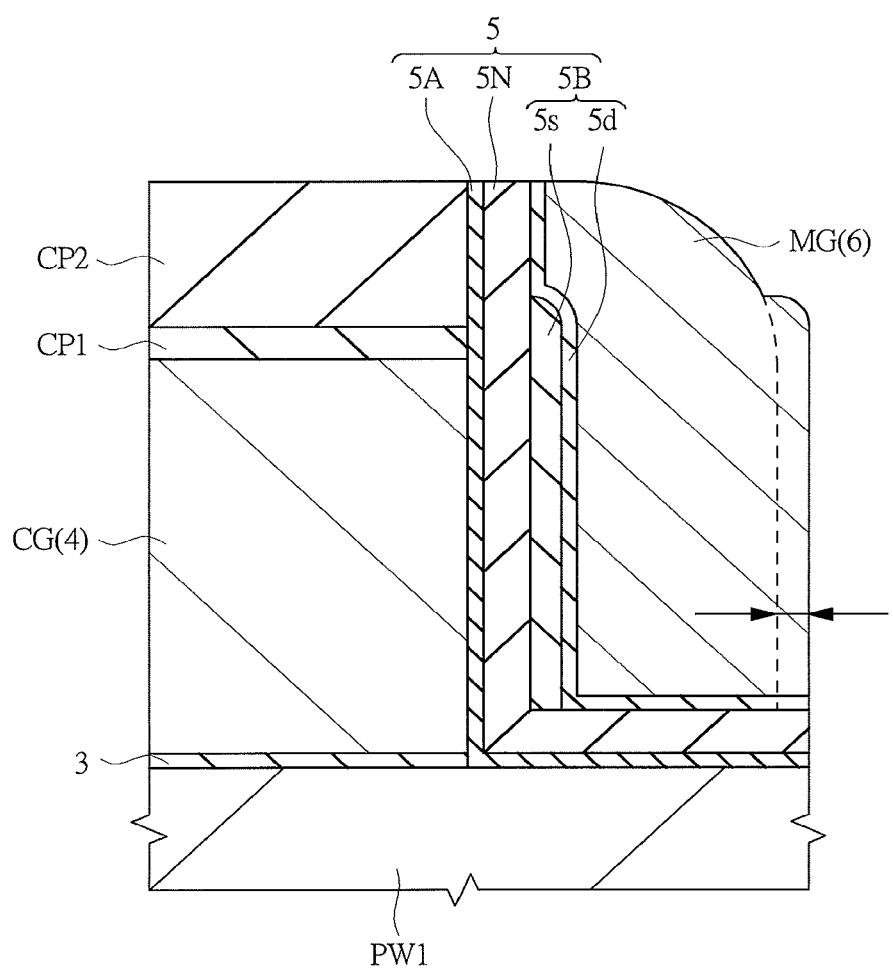
FIG. 42 is a main-part cross-sectional view showing another structure of the semiconductor device of the first embodiment.

In the above-described embodiment (see FIG. 3 and others), the end part (side surface) on the source region (MS) side of the memory gate electrode MG is illustrated as an approximately perpendicular surface in order to simplify the drawing. However, as shown by arrows in FIG. 42, the end part of the memory gate electrode MG may be projected to the source region (MS) side so as to correspond to the shape of the sidewall film 5s (see the part of the arrows in the drawing). FIG. 42 is a main-part cross-sectional view showing another structure (modification example 3) of a semiconductor device of the present embodiment.

Second Embodiment

In the first embodiment, among the first film (lower layer film) 5A, the second film (intermediate film) 5N, and the third film (upper layer film) 5B constituting the insulating film (ONO film) 5, the third film is composed of a stacked film of the sidewall film 5s and the deposited film 5d, but the first film 5A may be composed of the stacked film of the sidewall film 5s and the deposited film 5d. In other words, instead of the structure in the first embodiment in which the sidewall film 5s is provided on the memory gate electrode MG side (outer side, upper layer side) of the insulating film (ONO film) 5, the sidewall film 5s may be provided on the control gate electrode CG side (inner side, lower layer side) of the insulating film (ONO film) 5.

Figure 43:
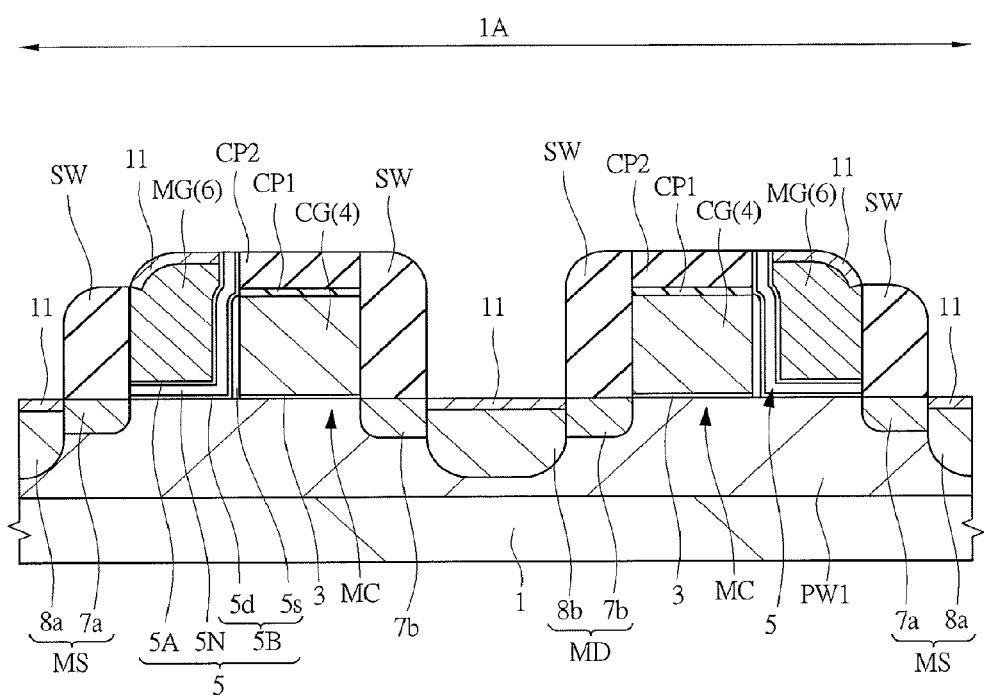
FIG. 43 is a main-part cross-sectional view showing a semiconductor device of a second embodiment.
Figure 44:
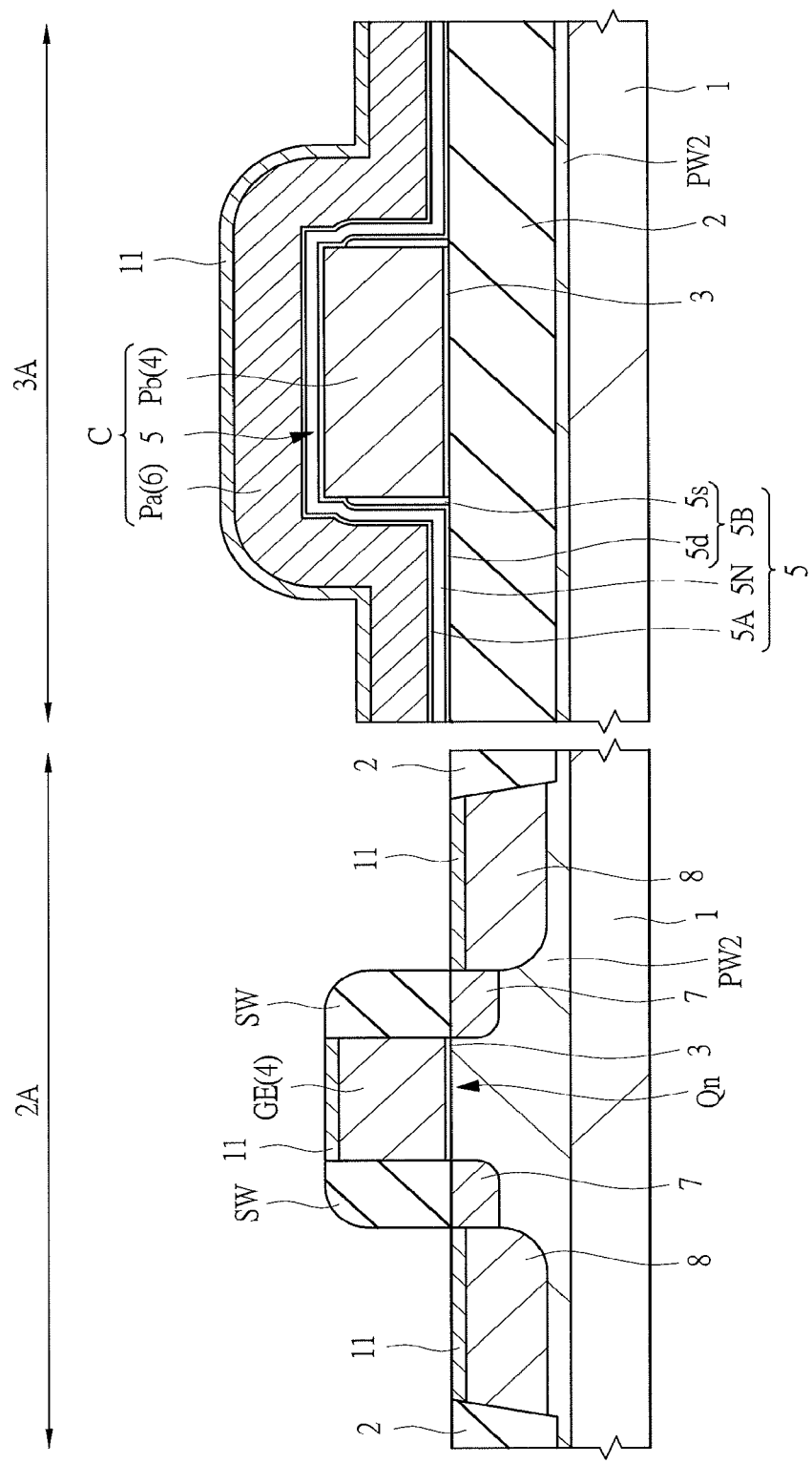
FIG. 44 is a main-part cross-sectional view showing the semiconductor device of the second embodiment.
Figure 45:
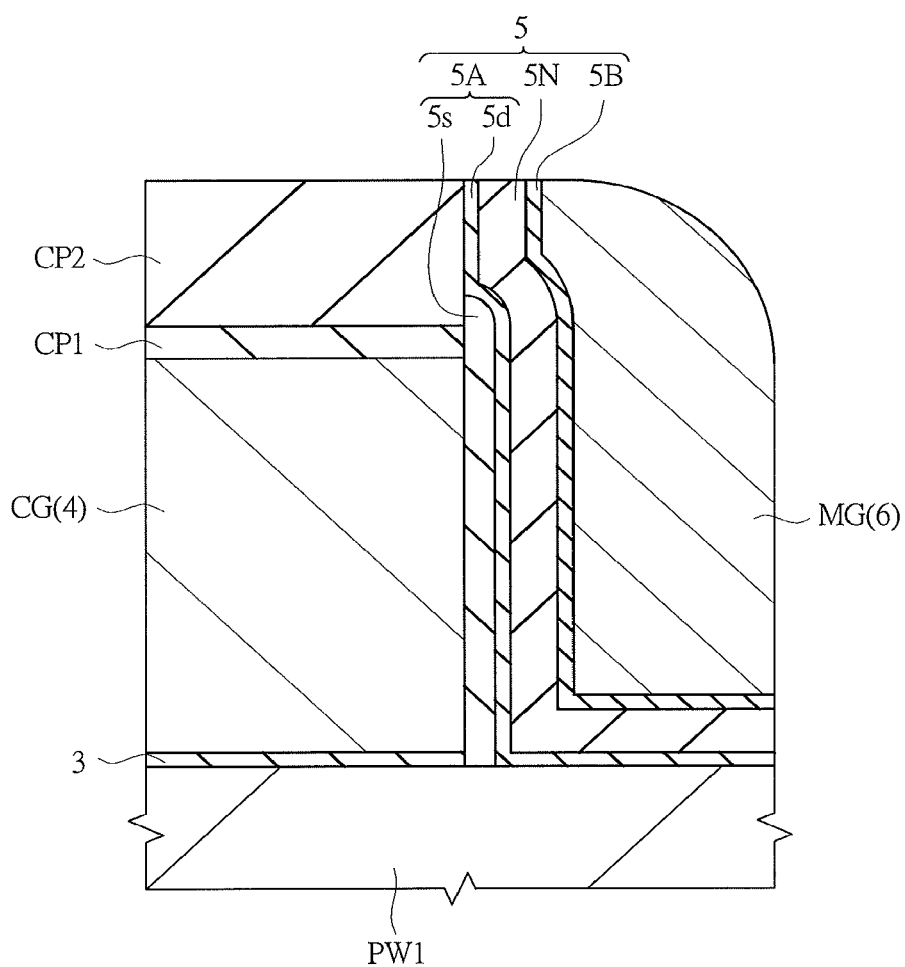
FIG. 45 is a cross-sectional view of a memory cell part of FIG. 43.

FIG. 43 and FIG. 44 are main-part cross-sectional views showing a semiconductor device of the present embodiment, and FIG. 45 is a cross-sectional view of a memory cell part of FIG. 43.

FIG. 43 shows the main-part cross-sectional view of two memory cells MC sharing a drain region (MD), a left part of FIG. 44 shows the main-part cross-sectional view of an n-channel-type MISFET Qn, and a right part of FIG. 44 shows the main-part cross-sectional view of a capacitive element C.

Since the structure is similar to that of the first embodiment (see FIGS. 1 to 3 and others) except the insulating film 5 (position of the sidewall film 5s), detailed description thereof will be omitted.

The insulating film 5 shown in FIG. 45 is a so-called multilayer insulating film (ONO film). Specifically, the insulating film 5 is composed of a silicon oxide film serving as a first film (lower layer film) 5A, a silicon nitride film serving as a second film (intermediate film) 5N, and a silicon oxide film serving as a third film (upper layer film) 5B. The first film (lower layer film) 5A is composed of a stacked film of a sidewall film 5s and a deposited film 5d, each of which is composed of a silicon oxide film. The second film 5N is a charge accumulating part.

As described above, the first film 5A is composed of the stacked film of the sidewall film 5s and the deposited film 5d. This first film 5A has a vertical part (perpendicular part) which is positioned between the sidewall of the control gate electrode CG and the sidewall of the memory gate electrode MG and a transverse part (horizontal part) which is positioned between the semiconductor substrate 1 (p-type well PW1) and the bottom part (bottom surface) of the memory gate electrode MG. In other words, the first film 5A has the vertical part (perpendicular part) which is positioned between the vertical part of the second film 5N and the sidewall of the control gate electrode CG and the transverse part (horizontal part) which is positioned between the transverse part of the second film 5N and the semiconductor substrate 1 (p-type well PW1). The vertical part of the first film 5A is composed of a stacked part of the sidewall film 5s and the vertical part of the deposited film 5d, and the transverse part thereof is composed of the transverse part of the deposited film 5d.

In this case, the height H5s of the sidewall film 5s is set to be lower than the height HMG of the memory gate electrode MG (HMG>H5s).

When the height H5s of the sidewall film 5s is set to be lower than the height HMG of the memory gate electrode MG in this manner (H5s<HMG), the memory gate electrode MG extends also to a part above the sidewall film 5s. As a result, the formation region of the memory gate electrode MG and the formation region of the metal silicide layer (11) formed on the surface thereof can be enlarged by the amount corresponding to the film thickness (film thickness in the gate-length direction) of the sidewall film 5s. Accordingly, the resistance of the memory gate electrode MG can be reduced, and a memory operating characteristic can be improved. When etching controllability of the etch-back step is taken into consideration, it is preferred that the height H5s of the sidewall film 5s is set to be higher than the height HCG of the control gate electrode CG (H5s>HCG).

The film thickness of the first film 5A will be described. The maximum film thickness (T1) of the vertical part of the first film is the sum (Ts+Td) of the maximum film thickness Ts of the sidewall film 5s and the film thickness Td of the vertical part of the silicon oxide film (deposited film) 5d. Also, the film thickness (T2) of the transverse part of the first film is the film thickness Td of the vertical part of the silicon oxide film (deposited film) 5d. As described above, the film thickness of the vertical part of the first film is larger than the film thickness of the transverse part.

Holes are injected into the second film (charge accumulating part) 5N by a tunneling phenomenon via the transverse part of the first film 5A, thereby carrying out an erasing operation of the electrons which have been written to the charge accumulating part. The operation of the memory cell is as that described in the first embodiment. Therefore, it is preferred that the film thickness of at least this transverse part (the deposited film 5d, tunneling oxide film) is 2 nm or less. The film thickness of the vertical part (thickness in the gate-length direction) may be 2 nm or more.

The second film (intermediate film) 5N has a vertical part (perpendicular part) which is disposed on the first film 5A and is positioned between the sidewall of the control gate electrode CG and the sidewall of the memory gate electrode MG and a transverse part (horizontal part) which is positioned between the semiconductor substrate 1 (p-type well PW1) and the bottom part (bottom surface) of the memory gate electrode MG. In other words, the second film 5N has the vertical part (perpendicular part) which is positioned between the vertical part of the first film 5A and the sidewall of the memory gate electrode MG and the transverse part (horizontal part) which is positioned between the transverse part of the first film 5A and the bottom part (bottom surface) of the memory gate electrode MG.

The third film (lower layer film) 5B has a vertical part (perpendicular part) which is positioned between the sidewall of the control gate electrode CG and the sidewall of the memory gate electrode MG and a transverse part (horizontal part) which is positioned between the semiconductor substrate 1 (p-type well PW1) and the bottom part (bottom surface) of the memory gate electrode MG.

The operations of "write", "erasure", and "read" of the memory cell of the present embodiment are as those described in the section of "Description of Operations" of the first embodiment. More specifically, hot-electron write which is a so-called SSI method is used for write, and an erasing method using hole injection utilizing the direct tunneling phenomenon is used for erasure.

Also in the present embodiment, the erasure characteristic can be improved as described in the section <1> of the first embodiment. Also, as described in the section <2> of the first embodiment, resistance of the memory gate electrode MG can be reduced, and a formation region of the metal silicide layer 11 can be enlarged.

The manufacturing steps of the memory cell of the present embodiment are similar to the steps described in the first embodiment (see FIG. 9 to FIG. 14, FIG. 23 to FIG. 38, and others) except the step of forming the insulating film 5.

Next, a manufacturing method of the semiconductor device of the present embodiment, in particular, the steps of forming the insulating film 5 will be described and the structure of the semiconductor device will be more specified with reference to FIG. 46 to FIG. 53. FIG. 46 to FIG. 53 are main-part cross-sectional views showing manufacturing steps of the memory cell of the semiconductor device of the present embodiment.

In the same manner as the first embodiment, the insulating film (gate insulating film) 3, the control gate electrode CG, and others are formed on the main surface (the surfaces of the p-type well PW1 and PW2) of the semiconductor substrate 1 (see FIG. 9 to FIG. 12). The silicon nitride film CP2 and the silicon oxide film CP1 on the control gate electrode CG can be omitted (see FIG. 54).

Then, the insulating film 5 (5A, 5N, 5B) is formed on the semiconductor substrate 1 including the surface (upper surface and side surfaces) of the control gate electrode CG (4). The steps of forming the insulating film 5 will be described in detail with reference to FIG. 44 to FIG. 51. In these drawings, in order to make the drawings easily understood, the width (gate length) of the control gate electrode CG is shown to be shorter than the other parts.

Figure 46:
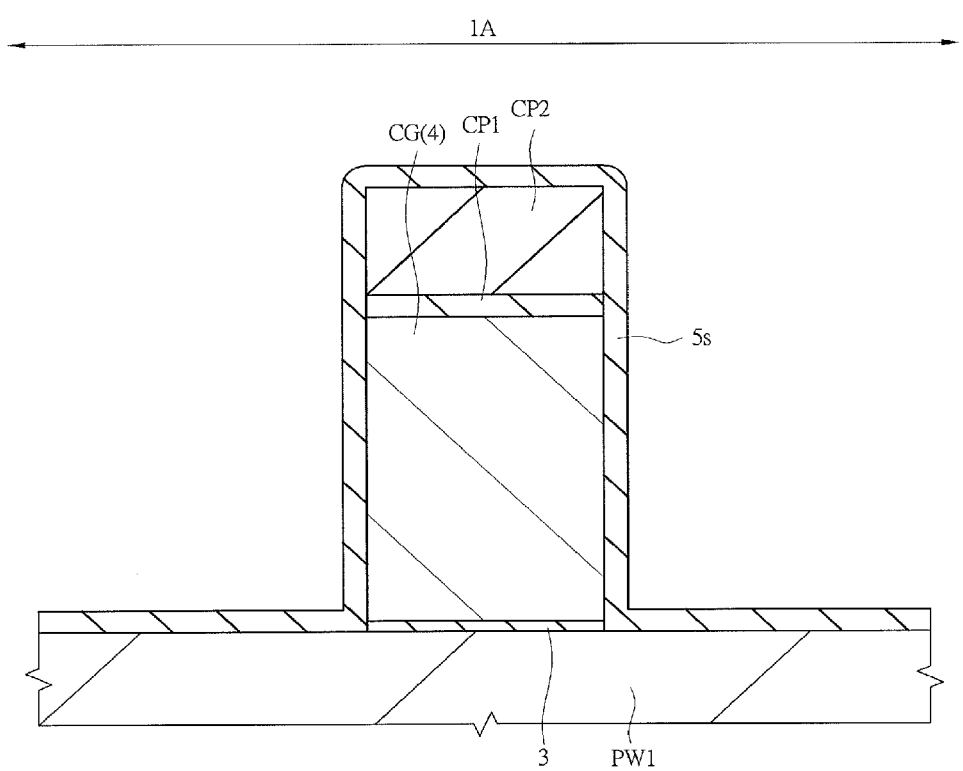
FIG. 46 is a main-part cross-sectional view showing a manufacturing step of the semiconductor device of the second embodiment.
Figure 47:
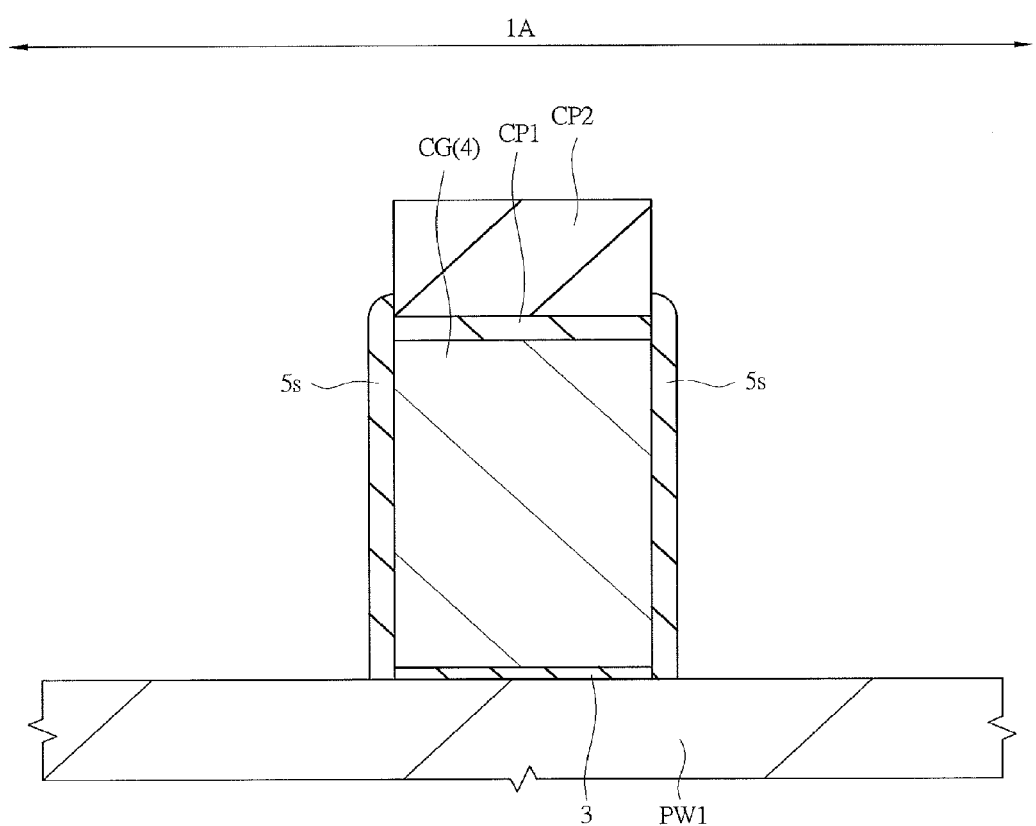
FIG. 47 is a main-part cross-sectional view showing a manufacturing step of the semiconductor device of the second embodiment continued from FIG. 46.

First, after carrying out the cleaning treatment to the main surface of the semiconductor substrate 1, as shown in FIG. 46, the silicon oxide film (5s) is deposited to have a film thickness of, for example, about 10 nm by CVD on the semiconductor substrate 1 (p-type well PW1) including the upper surface and the side surfaces of the control gate electrode CG. Then, the silicon oxide film (5s) is anisotropically etched (etch back) from the surface thereof. Through this step, as shown in FIG. 47, the sidewall film 5s composed of the silicon oxide film (5s) can be left on each of the sidewall parts on both sides of the control gate electrode CG. As the above-described anisotropic etching, for example, dry etching can be carried out under plasma with using a mixed gas of $CF_4$ and $CHF_3$ as an etching gas. In this process, etch-back is carried out until the upper part of the sidewall film 5s becomes lower than the upper part (upper surface) of the silicon nitride film (cap insulating film) CP2 by increasing the etch-back amount. By adjusting the height H5s of the sidewall film 5s in this manner, the height H5s of the sidewall film 5s becomes lower than the height HMG of the memory gate electrode MG (H5s<HMG, see FIG. 45 and others). In this process, in the peripheral circuit region 3A, the sidewall film 5s is formed also on the sidewall parts of the lower electrode Pb constituting the capacitive element C. Also in this case, the height H5s of the sidewall film 5s is lower than the height HPb of the lower electrode Pb (H5s<HPb, see FIG. 44).

By adjusting the height H5s of the sidewall film 5s in this manner, the height H5s of the sidewall film 5s becomes lower than the height HMG of the memory gate electrode MG (H5s<HMG).

In order to remove etching damage to the semiconductor substrate 1 caused by the formation of the sidewall film 5s, sacrifice oxidation and etching of a sacrifice oxide film may be carried out after the formation of the sidewall film 5s.

Figure 48:
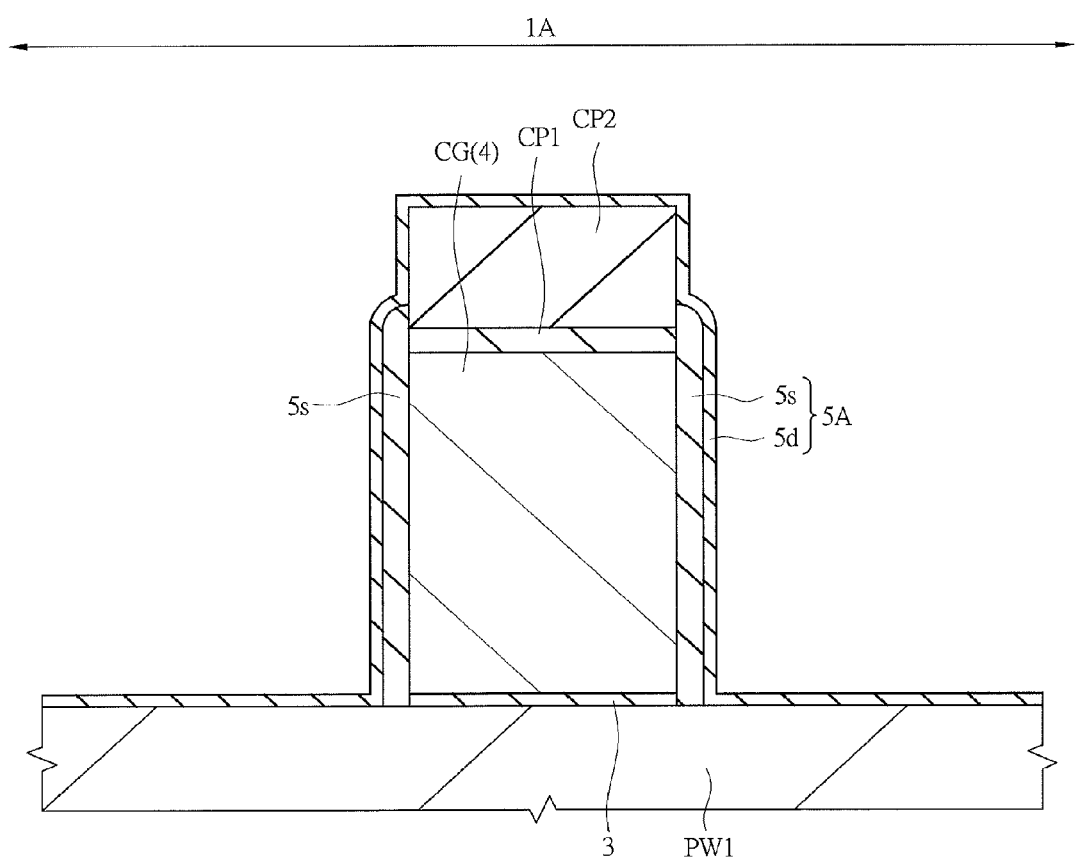
FIG. 48 is a main-part cross-sectional view showing a manufacturing step of the semiconductor device of the second embodiment continued from FIG. 47.

Then, as shown in FIG. 48, the silicon oxide film (deposited film) 5d is formed to have a film thickness of, for example, about 1.6 nm by CVD on the sidewall film 5s. The sidewall film 5s and the silicon oxide film 5d form the first film (lower layer film) 5A constituting the insulating film (ONO film) 5.

As described above, in order to use the direct tunneling erasing method, the film thickness of the transverse part (silicon oxide film 5d) of the first film (lower layer film) constituting the insulating film (ONO film) 5 is preferably 2 nm or less.

Figure 49:
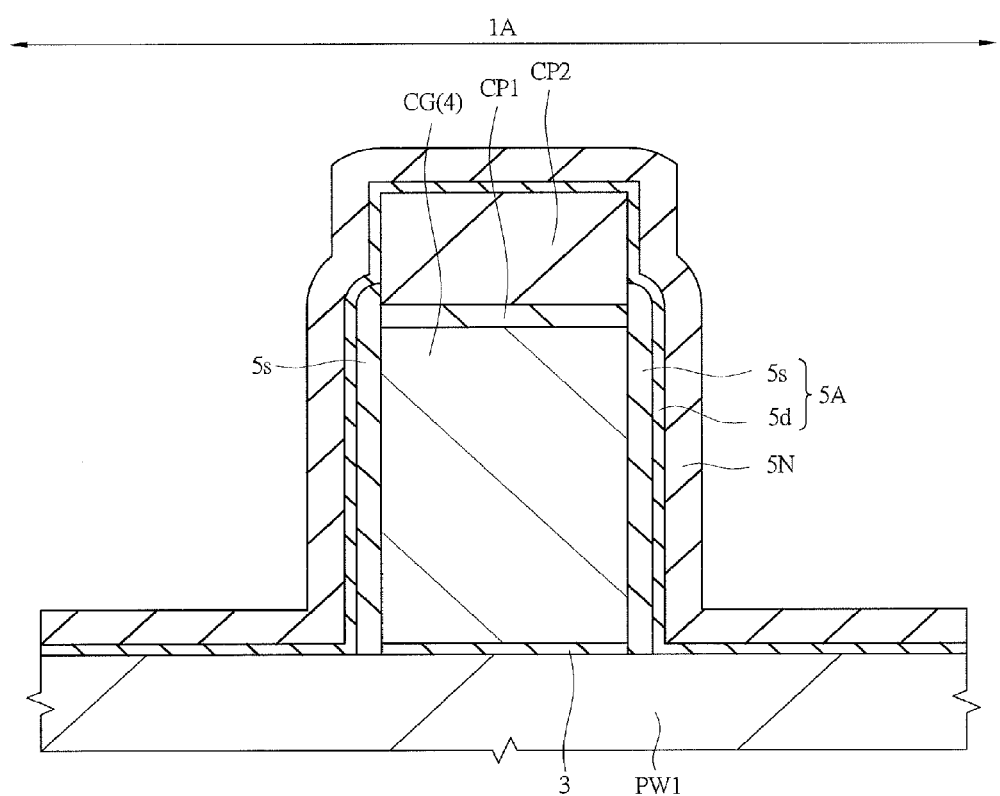
FIG. 49 is a main-part cross-sectional view showing a manufacturing step of the semiconductor device of the second embodiment continued from FIG. 48.

Then, as shown in FIG. 49, the silicon nitride film 5N is deposited to have a film thickness of, for example, about 16 nm by CVD on the silicon oxide film (silicon oxide film 5d) 5A. The silicon nitride film 5N is positioned on the upper surface and the side surfaces of the control gate electrode CG and on the semiconductor substrate 1 (p-type well PW1) via the silicon oxide film 5A. As described above, the silicon nitride film 5N serves as a charge accumulating part of the memory cell and serves as the second film (intermediate film) constituting the insulating film (ONO film) 5.

Figure 50:
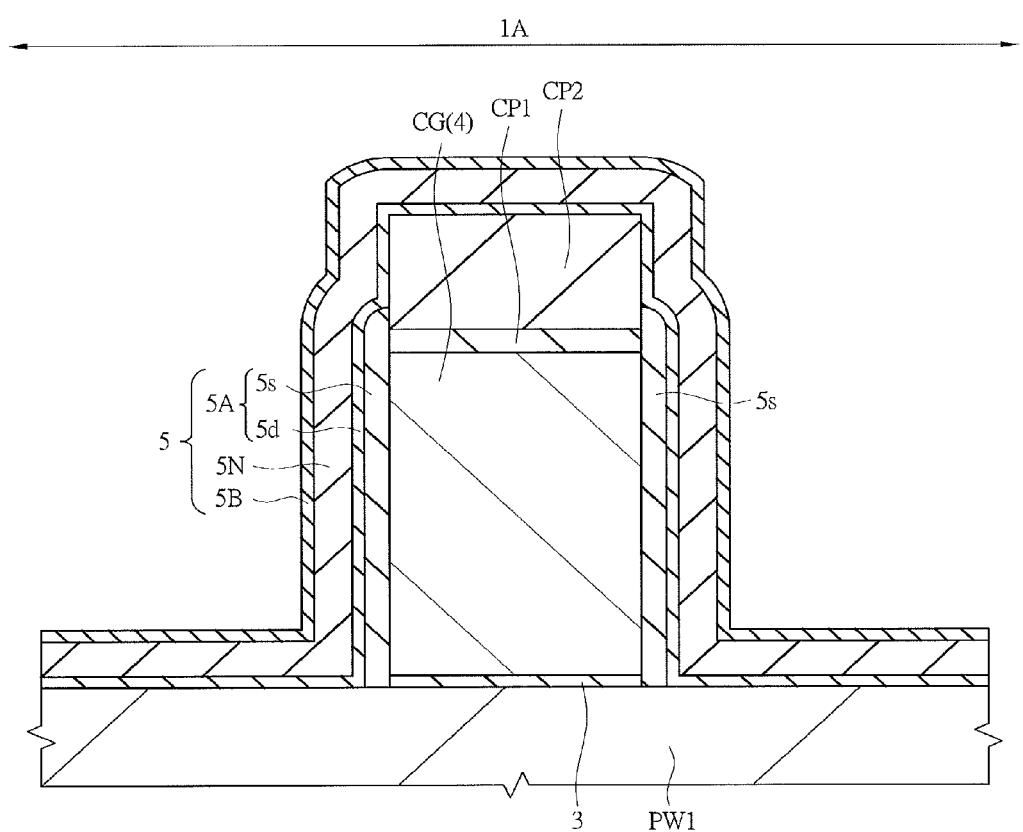
FIG. 50 is a main-part cross-sectional view showing a manufacturing step of the semiconductor device of the second embodiment continued from FIG. 49.

Then, as shown in FIG. 50, the silicon oxide film 5B is deposited to have a film thickness of, for example, about 3 nm by CVD on the silicon nitride film 5N. The silicon oxide film 5B is positioned on the upper surface and the side surfaces of the control gate electrode CG and on the semiconductor substrate 1 (p-type well PW1) via the silicon oxide film 5A and the silicon nitride film 5N.

Through the steps above, the insulating film (ONO film) 5 composed of the first film (the sidewall film 5s and the silicon oxide film 5d, the silicon oxide film 5A), the second film (silicon nitride film 5N), and the third film (silicon oxide film 5B) can be formed.

In the present embodiment, the silicon nitride film 5N is formed as the charge accumulating part (charge accumulating layer, insulating film having a trap level) in the insulating film 5, but a different insulating film such as an aluminum oxide film, a hafnium oxide film, or a tantalum oxide film may be used. These films are high-dielectric constant films having higher dielectric constant than that of a silicon nitride film. Alternatively, a charge accumulating layer may be formed by using an insulating film having silicon nano-dots.

The insulating film 5 formed in the memory cell region 1A functions as a gate insulating film of the memory gate electrode MG and has a charge retaining (charge accumulating) function. Therefore, the insulating film 5 has a layered structure including at least three layers, and it is configured so that the potential barrier height of the inner layer (silicon nitride film 5N) is lower than the potential barrier height of the outer layers (silicon oxide films 5A and 5B).

Figure 51:
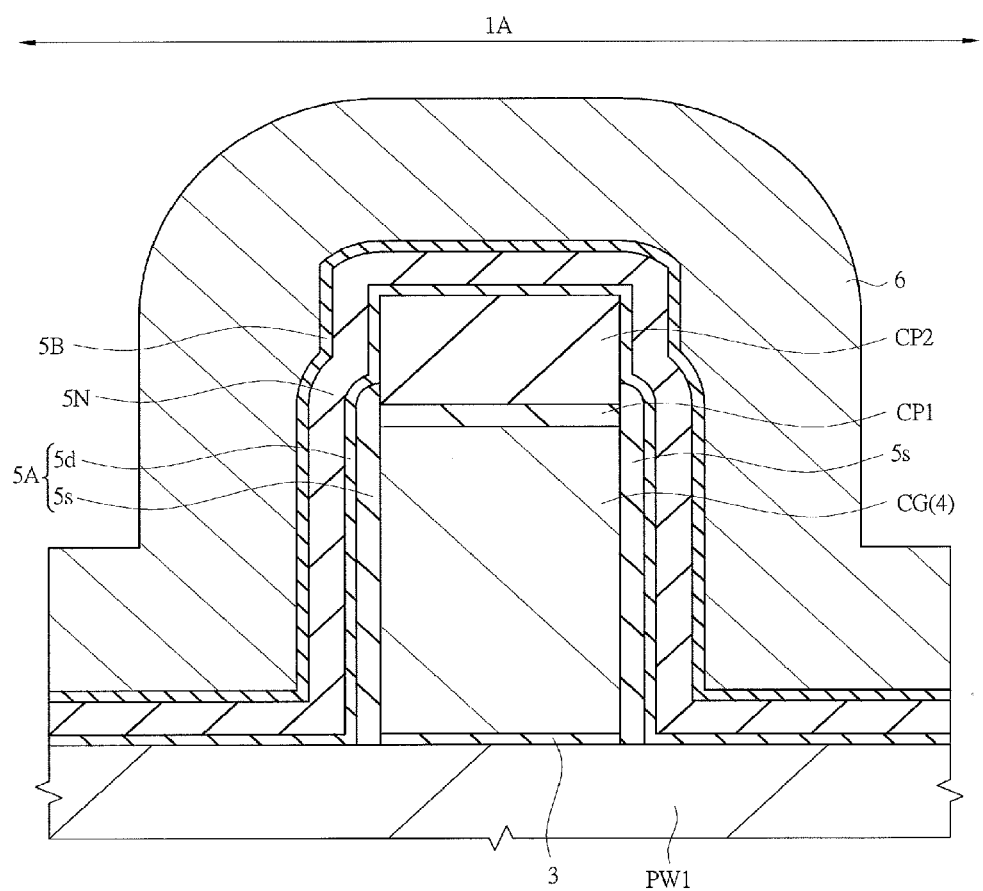
FIG. 51 is a main-part cross-sectional view showing a manufacturing step of the semiconductor device of the second embodiment continued from FIG. 50.

Then, as shown in FIG. 51, the silicon film 6 is formed as the electrically-conductive film (conductor film). As this silicon film 6, for example, a polycrystalline silicon film is formed to have a film thickness of about 50 to 200 nm by using, for example, CVD. Alternatively, the silicon film 6 may be formed by depositing an amorphous silicon film and then crystallizing it by carrying out thermal treatment. An impurity may be introduced into the silicon film 6 according to needs.

Figure 52:
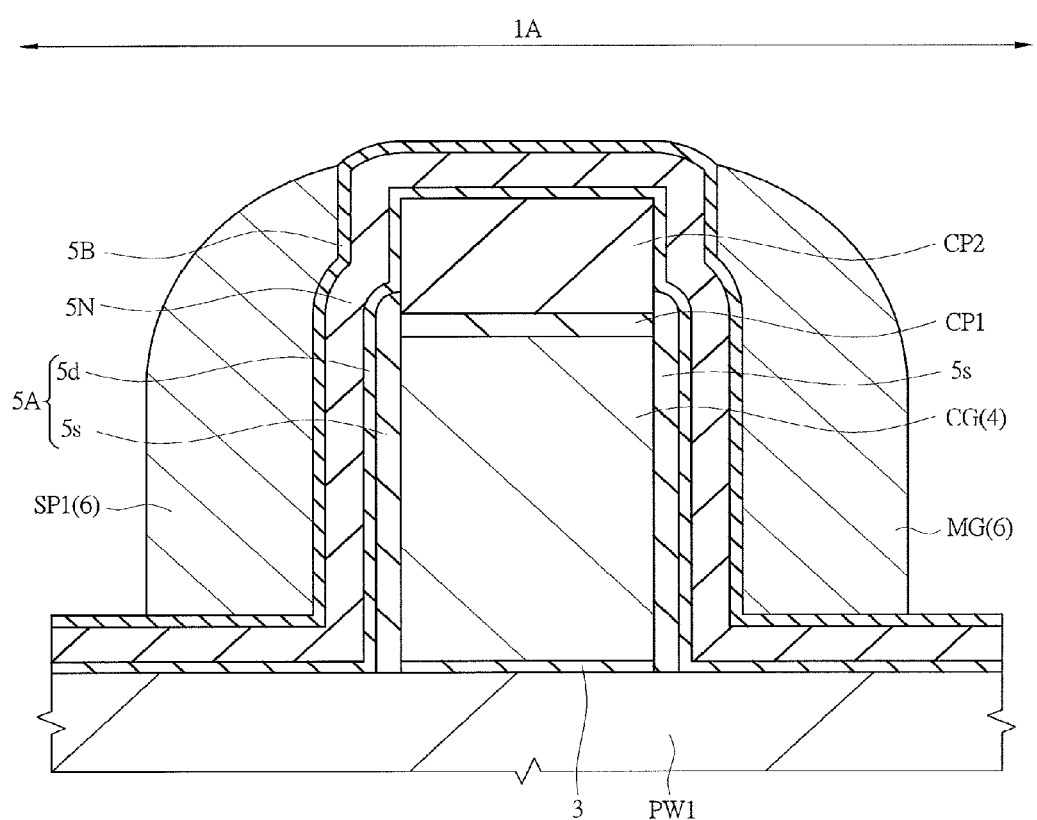
FIG. 52 is a main-part cross-sectional view showing a manufacturing step of the semiconductor device of the second embodiment continued from FIG. 51.
Figure 53:
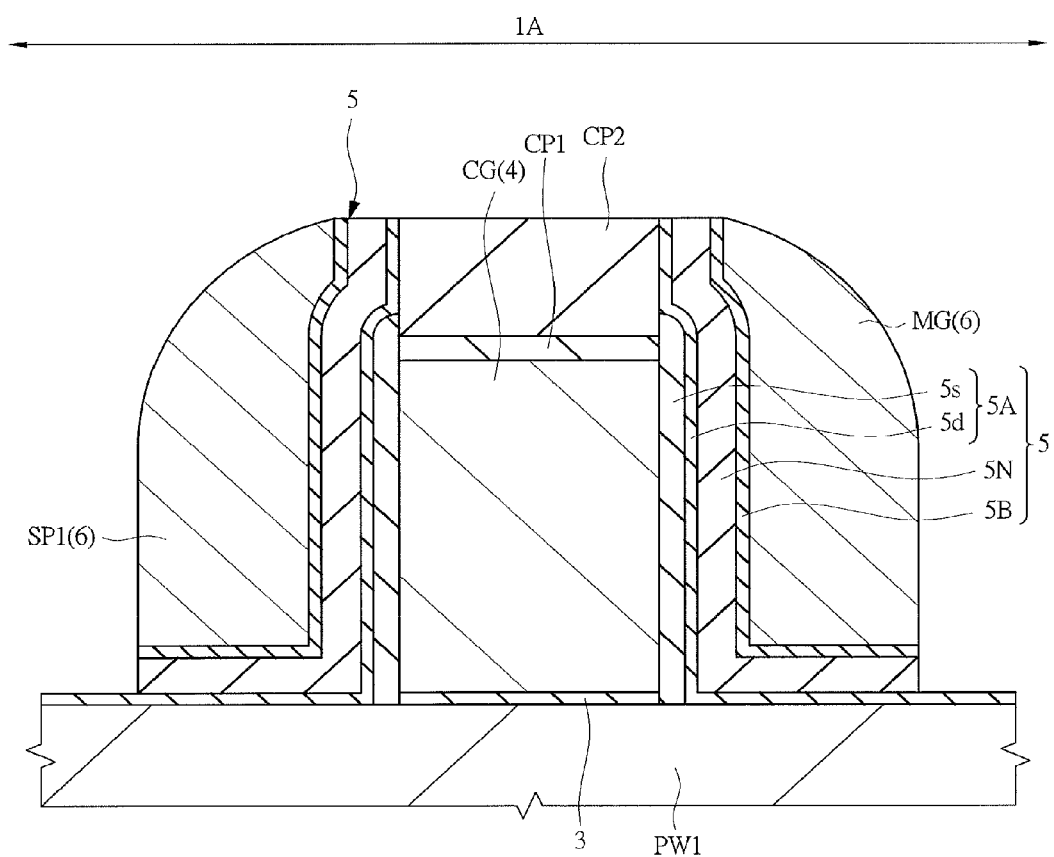
FIG. 53 is a main-part cross-sectional view showing a manufacturing step of the semiconductor device of the second embodiment continued from FIG. 52.

Then, the silicon film 6 in the memory cell region 1A is etched back (FIG. 52). Thereafter, the insulating film 5 at the upper part of the control gate electrode CG is removed by etching (FIG. 53). Since the steps after the step of forming the above-described insulating film 5 are similar to the steps described with reference to FIG. 23 to FIG. 38 in the first embodiment, the description thereof will be omitted.

DESCRIPTION OF MODIFICATION EXAMPLES

Figure 54:
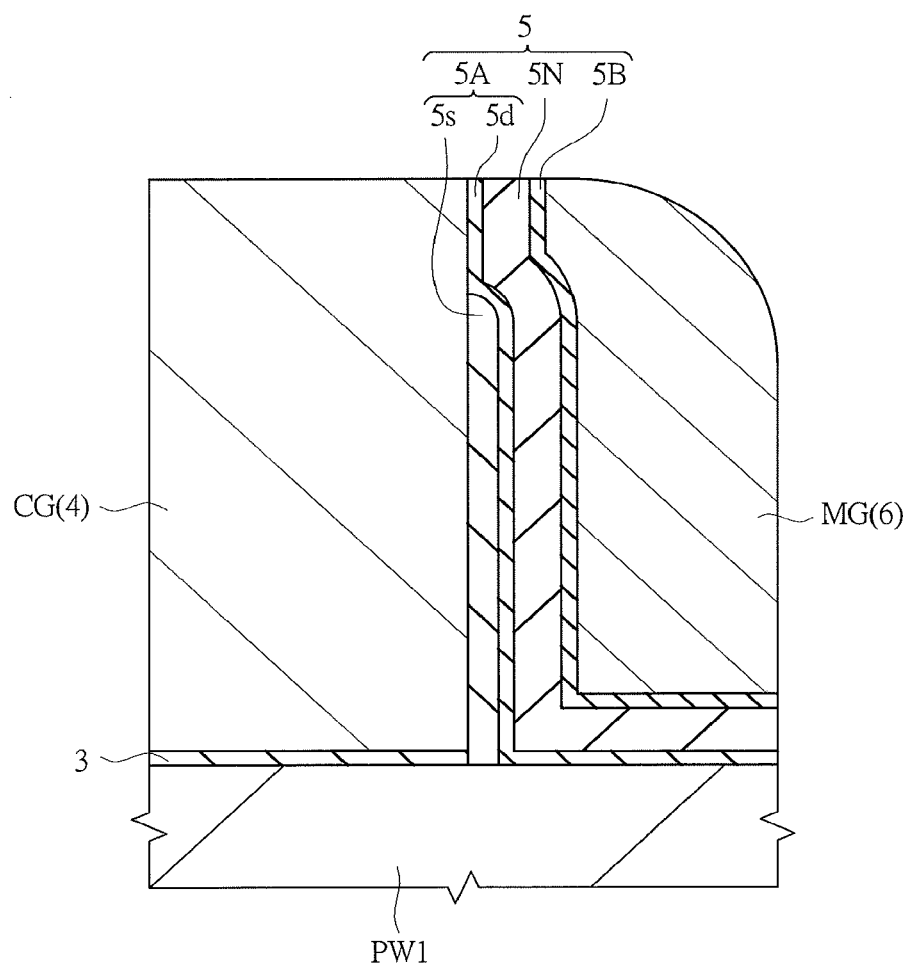
FIG. 54 is a main-part cross-sectional view showing another memory cell structure of the semiconductor device of the second embodiment.

With respect to the above-described structure of FIG. 45 having the silicon nitride film CP2 and the silicon oxide film CP1 on the control gate electrode CG, the silicon nitride film CP2 and the silicon oxide film CP1 may be omitted as shown in FIG. 54.

In this case, the height of the control gate electrode CG is arbitrarily adjustable, and the height of the control gate electrode CG may be made equivalent to the height of the silicon nitride film CP2 of the case in which the silicon nitride film CP2 is provided.

Also, it is preferred that the height H5s of the sidewall film 5s is set to 90% or more of the height HCG of the control gate electrode CG (H5s>0.9×HCG).

Then, a modification example of the shape of the sidewall film 5s of the above-described embodiment (see FIG. 45 and others) will be described below.

Modification Example A

Figure 55:
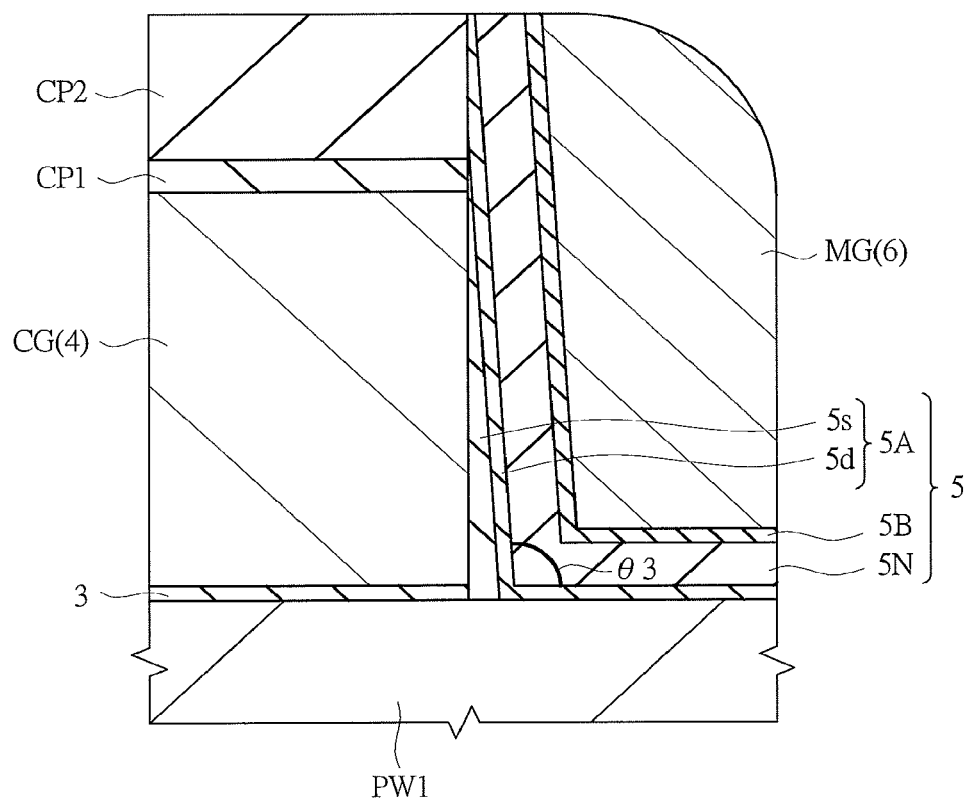
FIG. 55 is a main-part cross-sectional view showing a memory cell structure of a modification example A of the semiconductor device of the second embodiment.

FIG. 55 is a main-part cross-sectional view showing a structure of a memory cell of a semiconductor device of the modification example A of the present embodiment. Since the structure is similar to the above-described embodiment (see FIG. 45 and others) except for the sidewall film 5s, detailed description thereof will be omitted.

An insulating film 5 shown in FIG. 55 is a so-called multilayer insulating film (ONO film). Specifically, the insulating film 5 is composed of a silicon oxide film serving as a first film (lower layer film) 5A, a silicon nitride film serving as a second film (intermediate film) 5N, and a silicon oxide film serving as a third film (upper layer film) 5B. The first film (upper layer film) 5A is composed of a stacked film of a sidewall film 5s and a deposited film 5d, each of which is composed of a silicon oxide film. The second film 5N is a charge accumulating part.

In the present modification example A, the side surface of the sidewall film 5s has a tapered shape. In other words, the film thickness of the sidewall film 5s is increased from the upper part thereof to the lower part thereof, and the angle (θ3) formed by the side surface of the sidewall film 5s and the deposited film 5d (silicon nitride film (5N)) is larger than 90°. In other words, the corner part of the memory gate electrode MG is rounded more largely than the case shown in FIG. 43 and FIG. 45.

By employing the above-described structure, electric-field concentration at the corner part of the memory gate electrode MG can be reduced, and occurrence of the FN tunneling phenomenon can be suppressed. Therefore, erasure (hole injection) can be efficiently carried out, and the erasure characteristic can be improved.

A method for increasing the tapered angle, in other words, for increasing the difference in the film thickness between the upper part and the lower part will be described below.

In the above-described embodiment, in the etch-back step of the silicon oxide film (5s), the silicon oxide film (5s) is anisotropically etched (FIG. 45) from the surface thereof, and the tapered angle can be increased by adding isotropic etching conditions in this etching step.

For example, by increasing the flow rate of $CHF_3$ to be larger than the flow rate of $CF_4$ in the mixed gas of $CF_4$ and CHF; serving as the etching gas described in the above-described embodiment (see FIG. 45), isotropic etching components are increased, and the tapered angle can be increased.

Modification Example B

Figure 56:
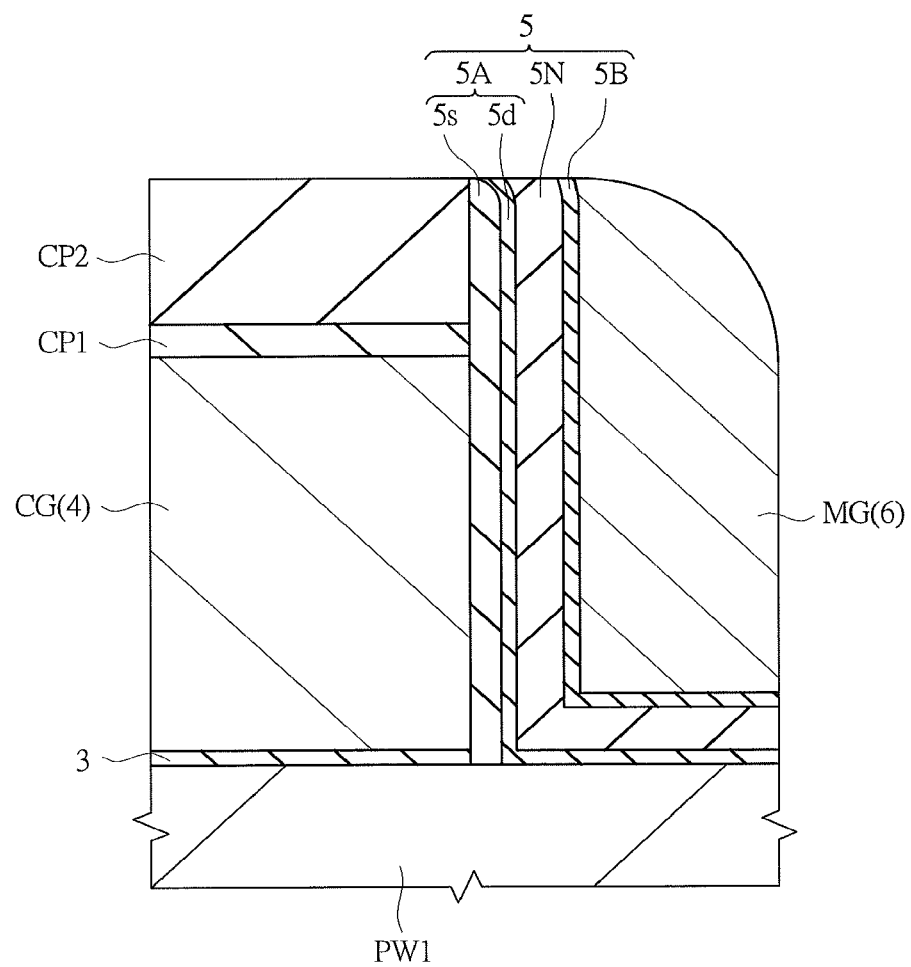
FIG. 56 is a main-part cross-sectional view showing a memory cell structure of a modification example B of the semiconductor device of the second embodiment.

FIG. 56 is a main-part cross-sectional view showing a structure of a memory cell of a semiconductor device of a modification example B of the present embodiment. Since the structure is similar to that of the above-described embodiment (see FIG. 45 and others) except for the sidewall film 5s, detailed description thereof will be omitted.

In the above-described embodiment, that is, the structure shown in FIG. 45, the height H5s of the sidewall film 5s is set to be lower than the height HMG of the memory gate electrode MG (H5s<HMG, see FIG. 45). However, as shown in FIG. 56, the height H5s of the sidewall film 5s may be made equivalent to the height HMG of the memory gate electrode MG (H5s=HMG). Also in the memory cell having the shape like this, the effect of improving the erasure characteristic described in the section <1> above can be achieved, and the memory cell proves to be useful.

In that case, the silicon oxide film (5s) formed at the upper part of the control gate electrode CG is etched back to the height of the upper part (upper surface) of the silicon nitride film (cap insulating film) CP2. As anisotropic etching conditions, for example, dry etching can be carried out under plasma with using a mixed gas of $CF_4$ and $CHF_3$ as an etching gas.

By forming the deposited film 5d thereafter, the first film (lower layer film) 5A composed of a stacked film of the sidewall film 5s and the deposited film 5d is formed. In the first film 5A, the film thickness of the part positioned on the lower side thereof is larger than that on the upper side thereof by the amount corresponding to the film thickness of the sidewall film 5s.

Third Embodiment

Hereinafter, a structure and a manufacturing method of a semiconductor device (semiconductor storage device) of the present embodiment will be described in detail with reference to drawings.

[Description of Structure]

Figure 57:
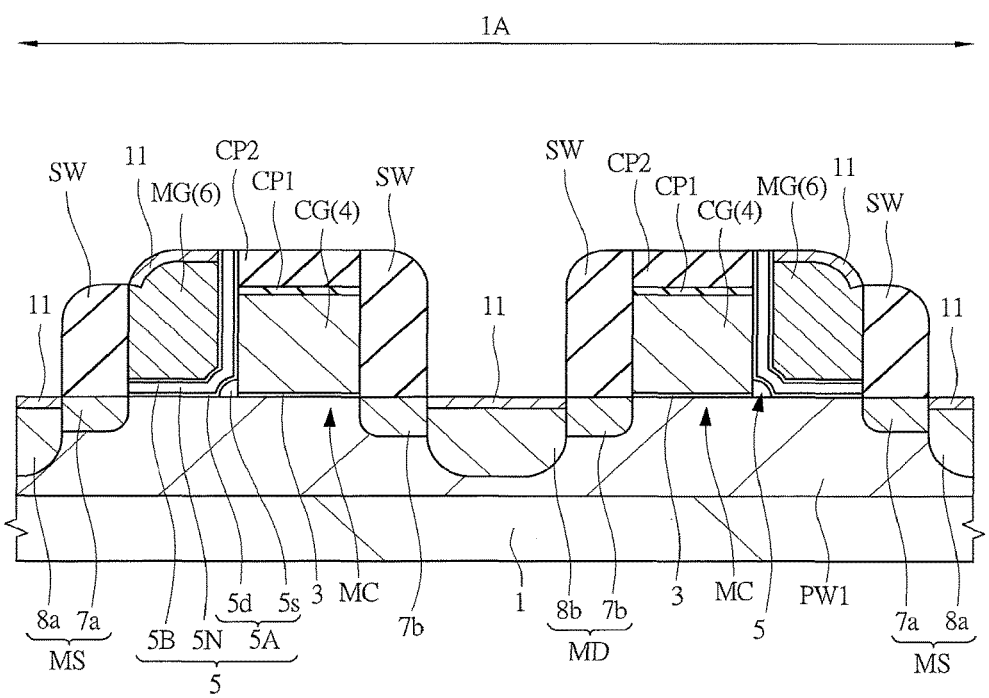
FIG. 57 is a main-part cross-sectional view showing a semiconductor device of a third embodiment.
Figure 58:
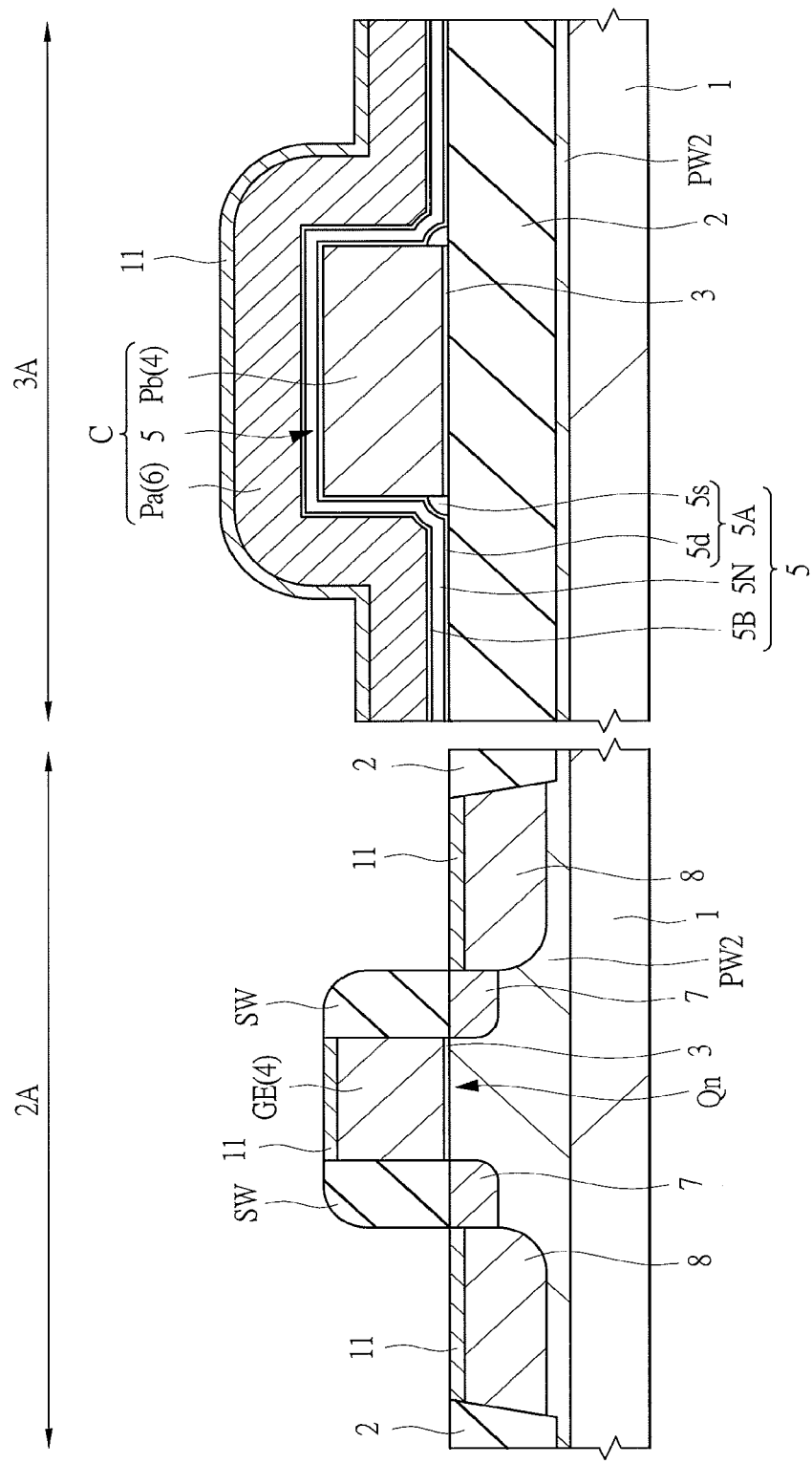
FIG. 58 is a main-part cross-sectional view showing the semiconductor device of the third embodiment.
Figure 59:
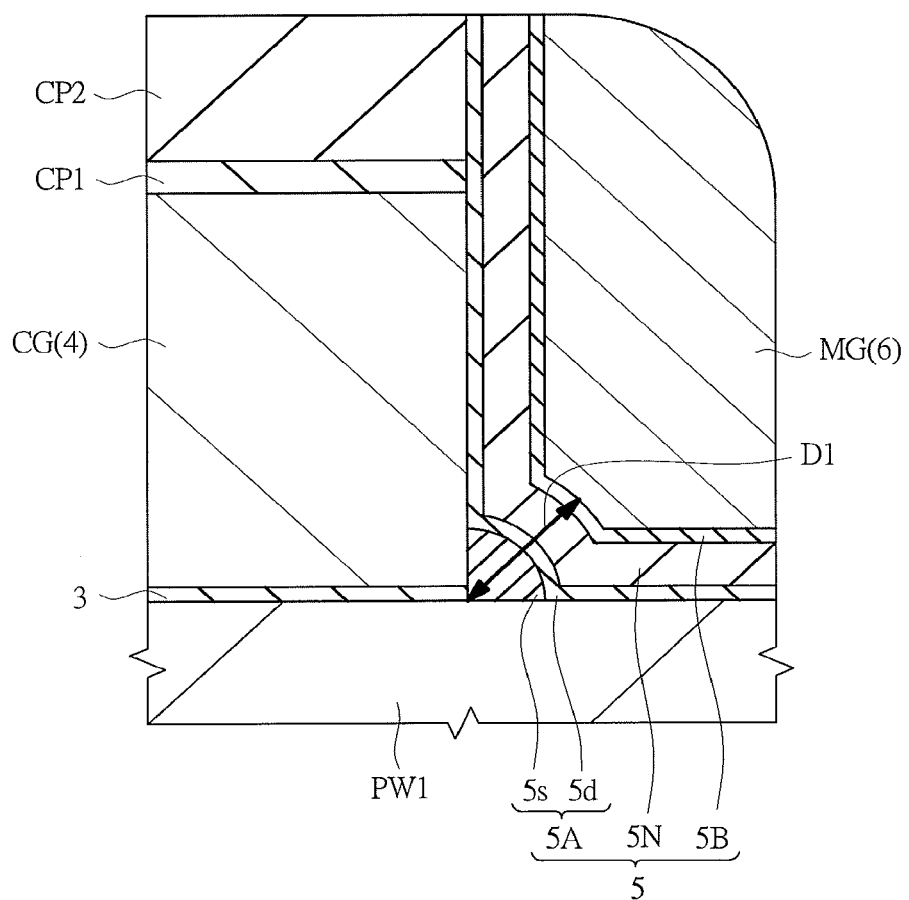
FIG. 59 is a cross-sectional view of a memory cell part of FIG. 57.

FIG. 57 and FIG. 58 are main-part cross-sectional views showing the semiconductor device of the present embodiment, and FIG. 59 is a cross-sectional view of a memory cell part of FIG. 57.

First, the semiconductor device described in the present embodiment has non-volatile memories (non-volatile semiconductor storage devices, EEPROMs, flash memories, non-volatile storage elements) and peripheral circuits.

In the non-volatile memory, a trap insulating film (insulating film capable of accumulating charge) is used as a charge accumulating part. Memory cells MC are memory cells of a split gate type. More specifically, two MISFETs, that is, a control transistor (select transistor) having a control gate electrode (select gate electrode) CG and a memory transistor having a memory gate electrode (gate electrode for memory) MG are connected in the memory cell.

Herein, a MISFET (Metal Insulator Semiconductor Field Effect Transistor) provided with a gate insulating film, which includes the charge accumulating part (charge accumulating layer), and a memory gate electrode MG is referred to as a memory transistor (transistor for storage), and a MISFET provided with a gate insulating film and the control gate electrode CG is referred to as a control transistor (select transistor, transistor for selecting memory cells).

The peripheral circuits are circuits for driving the non-volatile memories and are composed of, for example, various logic circuits. The various logic circuits are composed of, for example, n-channel-type MISFETs Qn and p-channel-type MISFETs described later. In addition, capacitive elements (herein, PIP:Poly-Insulator-Poly) C and others described later are also formed.

As shown in FIG. 57 and FIG. 58, the semiconductor device of the present embodiment includes the memory cells MC of the non-volatile memory disposed in a memory cell region 1A of a semiconductor substrate 1, the n-channel-type MISFET Qn disposed in a peripheral circuit region 2A, and the capacitive element C disposed in a peripheral circuit region 3A.

FIG. 57 shows a main-part cross-sectional view of the two memory cells MC sharing a drain region (MD), a left part of FIG. 58 shows a main-part cross-sectional view of the n-channel-type MISFET Qn, and a right part of FIG. 58 shows a main-part cross-sectional view of the capacitive element C.

As shown in FIG. 57, the two memory cells are approximately symmetrically disposed with interposing the drain region (MD (8b)) therebetween. In the memory cell region 1A, a plurality of memory cells MC are further disposed. For example, to the left of the memory cell MC on the left side of the memory cell region 1A shown in FIG. 57, the memory cells MC are disposed in the left-right direction (gate-length direction) in FIG. 57 so that a source region (MS) and a shared drain region (MD) are alternately disposed to constitute a memory cell row. Moreover, also in the direction perpendicular to the surface of paper of FIG. 57 (gate-width direction), a plurality of memory cell rows are disposed. In this manner, the plurality of memory cells MC are formed in an array.

As shown in FIG. 58, isolation regions 2 for separating elements are formed in the semiconductor substrate (semiconductor wafer) 1, and a p-type well PW2 is exposed from an active region sectioned (separated) by the isolation regions 2.

The isolation regions 2 are not shown in the cross-sectional part (FIG. 57) shown in the memory cell region 1A. However, the entire memory cell region in which the memory cells MC are formed in an array (p-type well PW1) is sectioned by the isolation regions 2. Furthermore, the isolation regions 2 are arbitrarily disposed at the locations where electrical separation is required, for example, the isolation regions 2 are disposed between the memory cell rows (except the source regions (MS)). The capacitive elements C are formed on the isolation regions 2.

First, a structure of the memory cell MC of the memory cell region 1A will be described (see FIG. 57, FIG. 59).

The memory cell MC includes the control gate electrode (first gate electrode) CG disposed above the semiconductor substrate 1 (p-type well PW1) and the memory gate electrode (second gate electrode) MG disposed above the semiconductor substrate 1 (p-type well PW1) and adjacent to the control gate electrode CG. On the control gate electrode CG, a thin silicon oxide film CP1 and a silicon nitride film (cap insulating film) CP2 are disposed. The memory cell MC further includes an insulating film 3 disposed between the control gate electrode CG and the semiconductor substrate 1 (p-type well PW1) and an insulating film 5 disposed between the memory gate electrode MG and the semiconductor substrate 1 (p-type well PW1) and disposed between the memory gate electrode MG and the control gate electrode CG. The memory cell MC further includes the source region MS and the drain region MD formed in the p-type well PW1 of the semiconductor substrate 1.

The control gate electrode CG and the memory gate electrode MG are disposed to be juxtaposed to each other in the left-right direction (gate-length direction) of FIG. 57 on a main surface of the semiconductor substrate 1 in a state in which the insulating film 5 is interposed between opposing side surfaces (sidewalls) thereof. The extending direction of the control gate electrode CG and the memory gate electrode MG is the direction perpendicular to the surface of the paper of FIG. 57 (gate-width direction). The control gate electrode CG and the memory gate electrode MG are formed above the semiconductor substrate 1 (p-type well PW1) between the drain region MD and the source region MS via the insulating films 3 and 5 (note that the control gate electrode CG is formed via the insulating film 3, and the memory gate electrode MG is formed via the insulating film 5). The memory gate electrode MG is positioned on the source region MS side, and the control gate electrode CG is positioned on the drain region MD side. In this specification, the source region MS and the drain region MD are defined based on those in an operating period. A semiconductor region to which a high voltage is applied in a writing operation described later is uniformly referred to as a source region MS, and a semiconductor region to which a low voltage is applied in the writing operation is uniformly referred to as a drain region MD.

The control gate electrode CG and the memory gate electrode MG are adjacent to each other with the insulating film 5 interposed therebetween, and the memory gate electrode MG is disposed like a sidewall spacer on a sidewall part of the control gate electrode CG via the insulating film 5. The insulating film 5 extends over both regions, that is, the region between the memory gate electrode MG and the semiconductor substrate 1 (p-type well PW1) and the region between the memory gate electrode MG and the control gate electrode CG. As described later, the insulating film 5 is composed of a stacked film of a plurality of insulating films.

The insulating film 3 formed between the control gate electrode CG and the semiconductor substrate 1 (p-type well PW1) (more specifically, the insulating film 3 below the control gate electrode CG) functions as a gate insulating film of a control transistor, and the insulating film 5 between the memory gate electrode MG and the semiconductor substrate 1 (p-type well PW1) (more specifically, the insulating film 5 below the memory gate electrode MG) functions as a gate insulating film of a memory transistor (gate insulating film having a charge accumulating part therein).

The insulating film 3 can be formed of, for example, a silicon oxide film or a silicon oxynitride film. Alternatively, other than the above-described silicon oxide film, silicon oxynitride film, and others, for example, a metal oxide film having a dielectric constant higher than that of a silicon nitride film such as a hafnium oxide film, an aluminum oxide film (alumina), or a tantalum oxide film may be used as the insulating film 3.

The insulating film 5 is a multilayer insulating film having a charge barrier film and a charge accumulating film. In this case, an ONO (oxide-nitride-oxide) film is used. Specifically, the insulating film 5 is composed of a silicon oxide film serving as a first film (lower layer film) 5A, a silicon nitride film serving as a second film (intermediate film) 5N, and a silicon oxynitride film (SiON film) serving as a third film (upper layer film) 5B. The first film (lower layer film) 5A is composed of a stacked film of a sidewall film 5s and a deposited film 5d, each of which is composed of a silicon oxide film. The second film 5N is a charge accumulating part.

The first film (lower layer film) 5A has a vertical part (perpendicular part) which is positioned between the sidewall of the control gate electrode CG and the sidewall of the memory gate electrode MG and a transverse part (horizontal part) which is positioned between the semiconductor substrate 1 (p-type well PW1) and a bottom part (bottom surface) of the memory gate electrode MG. In other words, the first film 5A is an insulating film continuously formed from the part between the sidewall of the control gate electrode CG and the sidewall of the memory gate electrode MG and to the part between the semiconductor substrate 1 and the bottom part of the memory gate electrode MG. The vertical part of the first film 5A is composed of a stacked part of the sidewall film 5s and the vertical part of the deposited film 5d, and the transverse part thereof is composed of the transverse part of the deposited film 5d.

The second film (intermediate film) 5N has a vertical part (perpendicular part) which is disposed on the first film 5A and positioned between the sidewall of the control gate electrode CG and the sidewall of the memory gate electrode MG and a transverse part (horizontal part) which is positioned between the semiconductor substrate 1 (p-type well PW1) and the bottom part (bottom surface) of the memory gate electrode MG. In other words, the second film 5N is an insulating film continuously formed from the part between the sidewall of the control gate electrode CG and the sidewall of the memory gate electrode MG to the part between the semiconductor substrate 1 and the bottom part of the memory gate electrode MG. More specifically, the second film 5N has the vertical part (perpendicular part) which is positioned between the vertical part of the first film 5A and the sidewall of the memory gate electrode MG and the transverse part (horizontal part) which is positioned between the transverse part of the first film 5A and the bottom part (bottom surface) of the memory gate electrode MG.

The third film 5B has a vertical part (perpendicular part) which is positioned between the sidewall of the control gate electrode CG and the sidewall of the memory gate electrode MG and a transverse part (horizontal part) which is positioned between the semiconductor substrate 1 (p-type well PW1) and the bottom part (bottom surface) of the memory gate electrode MG. In other words, the third film 5B is an insulating film continuously formed from the part between the sidewall of the control gate electrode CG and the sidewall of the memory gate electrode MG to the part between the semiconductor substrate 1 and the bottom part of the memory gate electrode MG. More specifically, the third film 5B has the vertical part (perpendicular part) which is positioned between the vertical part of the second film 5N and the sidewall of the memory gate electrode MG and the transverse part (horizontal part) which is positioned between the transverse part of the second film 5N and the bottom part (bottom surface) of the memory gate electrode MG.

Holes are injected from the memory gate electrode MG into the second film (charge accumulating part) 5N via the corner part of the above-described third film (tunnel film) 5B by the FN tunneling phenomenon to carry out an erasing operation of the electrons which have been written to the charge accumulating part. The operation of the memory cell will be described later. Therefore, it is preferred that the film thickness of the third film (tunnel film) 5B is 5 nm or more and 15 nm or less. A silicon oxide film may be used as the third film (tunnel film) 5B, but a barrier height is reduced when a silicon oxynitride film is used. By reducing the electrical film thickness in this manner, injection (transmission) of the holes is readily carried out, and the erasure characteristic can be improved.

It is preferred that the film thickness of the first film (deposited film 5d) 5A is 2 nm or more in order to prevent injection of electrons from the semiconductor substrate 1 (p-type well PW1) in the erasing operation. From a viewpoint of reducing an operating voltage, it is preferred that the film thickness of the first film (deposited film 5d) 5A is 6 nm or less.

The height H5s of the sidewall film 5s is set to be lower than the height HMG of the memory gate electrode MG. It is preferred that the height H5s of the sidewall film 5s is equal to or more than the film thickness of the deposited film 5d of the first film 5A and is equal to or less than the film thickness of the insulating film 5 (the total film thickness of ONO excluding the part of the sidewall film 5s). Specifically, the height H5s is preferably 10 nm or more and 20 nm or less. Also, it is preferred that the width W5s of the sidewall film 5s is equal to or more than the film thickness of the deposited film 5d of the first film 5A and is equal to or less than the film thickness of the insulating film 5 (the total film thickness of ONO). Specifically, the width W5s is preferably 10 nm or more and 20 nm or less.

When the height H5s and the width W5s of the sidewall film 5s are made equal to or more than the film thickness of the deposited film 5d of the first film 5A, for example, 10 nm or more in this manner, the sidewall film 5s can be processed with high precision. Also, when the height H5s and the width W5s of the sidewall film 5s are made equal to or less than the film thickness of the insulating film 5 (the total film thickness of ONO), for example, 20 nm or less, the characteristics of both of the writing operation (injection of electrons) and the erasing operation (injection of holes) can be improved with a good balance.

In the description above, the shapes of the stacked films (5A, 5N, 5B) corresponding to the memory cell on the side shown in FIG. 59 and others have been described as the shape of the insulating film 5. However, for example, in the left-side memory cell shown in FIG. 57, the stacked films have approximately line-symmetric shapes about the drain region (MD (8b)).

By forming the structure in which the silicon nitride film (5N) is sandwiched by the silicon oxide film (5A) and the silicon oxide film (5B) in this manner, charge can be accumulated in the silicon nitride film (5N). In other words, in the insulating film 5, the silicon nitride film (5N) is an insulating film for accumulating charge and functions as a charge accumulating layer (charge accumulating part). More specifically, the silicon nitride film (5N) is a trap insulating film formed in the insulating film 5, and the silicon oxide films (5A, 5B) positioned above and below the silicon nitride film (5N) function as charge blocking layers (charge blocking film, charge confinement layer). The stacked film of the silicon oxide film (5A), the silicon nitride film (5N), and the silicon oxide film (5B) is sometimes referred to as an ONO film. The insulating film 5 has been described as an ONO film here, but a combination of other insulating films may be employed if the second film 5N is composed of an insulating film having a charge accumulating function and the first film 5A and the third film 5B (5s, 5d) are composed by using insulating films different from the second film 5N. For example, as the insulating film having the charge accumulating function (charge accumulating layer), for example, an insulating film such as an aluminum oxide film, a hafnium oxide film, or a tantalum oxide film may be used. These films are high-dielectric-constant films having higher dielectric constant than that of a silicon nitride film. Also, an insulating film having silicon nano-dots may be used as the charge accumulating layer.

In the above-described insulating film 5, the insulating film 5 between the memory gate electrode MG and the semiconductor substrate 1 (p-type well PW1) functions as a gate insulating film of the memory transistor in a state in which charge (electrons) is retained or charge is not retained. Also, the insulating film 5 between the memory gate electrode MG and the control gate electrode CG functions as an insulating film for insulating (electrically separating) the memory gate electrode MG and the control gate electrode CG.

A channel region of the memory transistor is formed below the insulating film 5 below the memory gate electrode MG, and a channel region of the control transistor is formed below the insulating film 3 below the control gate electrode CG. In a channel forming region of the control transistor below the insulating film 3 below the control gate electrode CG, a semiconductor region (p-type semiconductor region or n-type semiconductor region) for adjusting a threshold value of the control transistor is formed according to needs. In a channel forming region of the memory transistor below the insulating film 5 below the memory gate electrode MG, a semiconductor region (p-type semiconductor region or n-type semiconductor region) for adjusting a threshold value of the memory transistor is formed according to needs.

As described above, in the writing operation, the source region MS is a semiconductor region to which a high voltage is applied, and the drain region MD is a semiconductor region to which a low voltage is applied. These regions MS and MD are composed of semiconductor regions to which an n-type impurity has been introduced (n-type impurity diffused layer).

The drain region MD is a region having a LDD (lightly doped drain) structure. More specifically, the drain region MD has an n⁻-type semiconductor region (low-concentration impurity diffused layer) 7b and an n⁺-type semiconductor region (high-concentration impurity diffused layer) 8b having an impurity concentration higher than that of the n⁻-type semiconductor region 7b. The n⁺-type semiconductor region 8b has a deeper junction depth and a higher impurity concentration than those of the n⁻-type semiconductor region 7b.

The source region MS is also a region having the LDD structure. More specifically, the source region MS has an n⁻-type semiconductor region (low-concentration impurity diffused layer) 7a and an n⁺-type semiconductor region (high-concentration impurity diffused layer) 8a having an impurity concentration higher than that of the n⁻-type semiconductor region 7a. The n⁺-type semiconductor region 8a has a deeper junction depth and a higher impurity concentration than those of the n⁻-type semiconductor region 7a.

On sidewall parts of a composite pattern of the memory gate electrode MG and the control gate electrode CG, sidewall insulating films (sidewalls, sidewall spacers) SW composed of an insulator (silicon oxide film, insulating film) such as silicon oxide are formed. More specifically, the sidewall insulating films SW are formed on the sidewall (side surface) of the memory gate electrode MG on the side opposite to the side which is adjacent to the control gate electrode CG via the insulating film 5 and on the sidewall (side surface) of the control gate electrode CG on the side opposite to the side which is adjacent to the memory gate electrode MG via the insulating film 5.

The n⁻-type semiconductor region 7a of the source region MS is formed in a self-aligning manner with respect to the sidewall of the memory gate electrode MG, and the n⁺-type semiconductor region 8a is formed in a self-aligning manner with respect to the side surface of the sidewall insulating film SW on the memory gate electrode MG side. Therefore, the low-concentration n⁻-type semiconductor region 7a is formed below the sidewall insulating film SW on the memory gate electrode MG side. Also, the high-concentration n⁺-type semiconductor region 8a is formed outside the low-concentration n⁻-type semiconductor region 7a. Therefore, the low-concentration n⁻-type semiconductor region 7a is formed so as to be adjacent to the channel region of the memory transistor, and the high-concentration n⁺-type semiconductor region 8a is formed so as to be in contact with the low-concentration n⁻-type semiconductor region 7a and be separated from the channel region of the memory transistor by the distance corresponding to the n⁻-type semiconductor region 7a.

The n⁻-type semiconductor region 7b of the drain region MD is formed in a self-aligning manner with respect to the sidewall of the control gate electrode CG, and the n⁺-type semiconductor region 8b is formed in a self-aligning manner with respect to the side surface of the sidewall insulating film SW on the control gate electrode CG side. Therefore, the low-concentration n⁻-type semiconductor region 7b is formed below the sidewall insulating film SW on the control gate electrode CG side. Also, the high-concentration n⁺-type semiconductor region 8b is formed outside the low-concentration n⁻-type semiconductor region 7b. Therefore, the low-concentration n⁻-type semiconductor region 7b is formed so as to be adjacent to the channel region of the control transistor, and the high-concentration n⁺-type semiconductor region 8b is formed so as to be in contact with the low-concentration n⁻-type semiconductor region 7b and be separated from the channel region of the control transistor by the distance corresponding to the n⁻-type semiconductor region 7b.

The control gate electrode CG is composed of an electrically-conductive film (conductor film) and is preferably composed of a silicon film 4 such as a polycrystalline silicon film. The silicon film 4 is, for example, an n-type silicon film (a polycrystalline silicon film to which an n-type impurity has been introduced, doped polysilicon film) and has a low resistivity because an n-type impurity has been introduced thereinto.

The memory gate electrode MG is composed of an electrically-conductive film (conductor film) and is formed of a silicon film 6 such as a polycrystalline silicon film as shown in FIG. 57 and FIG. 58. The memory gate electrode MG may contain an impurity such as an n-type impurity. However, the concentration of the n-type impurity is preferably low in the lower part of the memory gate electrode MG, and an intrinsic semiconductor (semiconductor having an extremely low impurity concentration, non-doped semiconductor) is more preferable. When the concentration of the n-type impurity in the lower part of the memory gate electrode MG is made low in this manner, holes can be efficiently injected into the second film (charge accumulating part) 5N and can be injected into the charge accumulating part without the recombination with the electrons generated from the n-type impurity in the erasing operation.

A metal silicide layer (metal silicide film) 11 is formed on the upper part (upper surface) of the memory gate electrode MG and on the upper surfaces (surfaces) of the $n^+$-type semiconductor region 8a and the $n^+$-type semiconductor region 8b. The metal silicide layer 11 is composed of, for example, a cobalt silicide layer or a nickel silicide layer. Diffusion resistance and contact resistance can be reduced by the metal silicide layer 11. From a viewpoint of preventing short-circuit between the memory gate electrode MG and the control gate electrode CG as much as possible, in some cases, the metal silicide layer 11 is not formed on either one or both of the upper parts of the memory gate electrode MG and the control gate electrode CG.

Next, the n-channel-type MISFET Qn of the peripheral circuit region 2A will be described.

As shown in the left side of FIG. 58, the n-channel-type MISFET Qn is disposed in the peripheral circuit region 2A. The n-channel-type MISFET Qn has the gate electrode GE disposed above the semiconductor substrate 1 (p-type well PW2), the insulating film 3 disposed between the gate electrode GE and the semiconductor substrate 1 (p-type well PW2), and source/drain regions (7, 8) formed in the semiconductor substrate 1 (p-type well PW2) on both sides of the gate electrode GE.

The extending direction of the gate electrode GE is the direction perpendicular to the paper surface of FIG. 57 (gate-width direction). The insulating film 3 disposed between the gate electrode GE and the semiconductor substrate 1 (p-type well PW2) functions as a gate insulating film of the n-channel-type MISFET Qn. The channel region of the n-channel-type MISFET Qn is formed below the insulating film 3 below the gate electrode GE.

The source/drain regions (7, 8) have an LDD structure and are composed of the $n^+$-type semiconductor region 8 and the $n^-$-type semiconductor region 7. The $n^+$-type semiconductor region 8 has a deeper junction depth and a higher impurity concentration than those of the $n^-$-type semiconductor region 7.

The sidewall insulating films (sidewalls, sidewall spacers) SW composed of an insulator (silicon oxide film, insulating film) such as silicon oxide are formed on the sidewall parts of the gate electrode GE.

The $n^-$-type semiconductor region 7 is formed in a self-aligning manner with respect to the sidewall of the gate electrode GE. Therefore, the low-concentration $n^-$-type semiconductor region 7 is formed below the sidewall insulating film SW of the sidewall part of the gate electrode GE. Accordingly, the low-concentration $n^-$-type semiconductor region 7 is formed so as to be adjacent to the channel region of the MISFET. Also, the $n^+$-type semiconductor region 8 is formed in a self-aligning manner with respect to the side surface of the sidewall insulating film SW. In this manner, the low-concentration $n^-$-type semiconductor region 7 is formed so as to be adjacent to the channel region of the MISFET, and the high-concentration $n^+$-type semiconductor region 8 is formed so as to be in contact with the low-concentration $n^-$-type semiconductor region 7 and be separated from the channel region of the MISFET by the distance corresponding to the $n^-$-type semiconductor region 7.

The gate electrode GE is composed of an electrically-conductive film (conductor film) and is preferably composed of, for example, the silicon film 4 such as an n-type polycrystalline silicon film (polycrystalline silicon film to which an n-type impurity has been introduced, doped polysilicon film) like the above-described control gate electrode CG.

The metal silicide layer 11 is formed on the upper part (upper surface) of the gate electrode GE and on the upper surface (surface) of the $n^+$-type semiconductor region 8. The metal silicide layer 11 is composed of, for example, a cobalt silicide layer or a nickel silicide layer. Diffusion resistance and contact resistance can be reduced by the metal silicide layer 11.

Next, the capacitive element C of the peripheral circuit region 3A will be described. As shown in the right side of FIG. 58, the capacitive element C is disposed in the peripheral circuit region 3A. The capacitive element C in this case has a PIP structure. Specifically, the capacitive element has an upper electrode Pa and a lower electrode Pb, and the above-described insulating film 5 (5A (5s, 5d), 5N, 5B) is disposed as a capacitive insulating film between these electrodes. Like the above-described gate electrode GE and the above-described control gate electrode CG, the lower electrode Pb is composed of the silicon film 4 such as an n-type polycrystalline silicon film (polycrystalline silicon film to which an n-type impurity has been introduced, doped polysilicon film). Also, like the above-described memory gate electrode MG, the upper electrode Pa is composed of the silicon film 6 such as a polycrystalline silicon film. The insulating film (3) is disposed in a lower layer of the lower electrode Pb. Further, the metal silicide layer 11 is disposed on the surface of the upper electrode Pa.

The insulating film 5 (5A (5d), 5N, 5B) is disposed on the upper surface of the lower electrode Pb, and the insulating film 5 (5A (5s, 5d), 5N, 5B) is disposed on the side surfaces of the lower electrode Pb. Here, the upper electrode Pa is disposed on the side surfaces of the lower electrode Pb so as to cover the insulating film 5, and corner parts are present at the parts of the upper electrode Pa extending on the semiconductor substrate 1 from the side surfaces of the lower electrode Pb. Since electric field is likely to concentrate at these parts, there is a possibility that reliability of the capacitive element C is reduced. However, when the insulating film 5 (5s) is disposed on the side surfaces of the lower electrode Pb like the capacitive element C of the present embodiment, the electric field at the corner parts of the lower electrode can be reduced, and reliability of the capacitive element C can be improved. Furthermore, since the insulating film 5 is disposed on the side surfaces of the lower electrode Pb, the capacitance values at the side surfaces of the capacitive element C are reduced, and only the region in which the lower electrode Pb and the upper electrode Pa are planarly overlapped with each other contributes as capacitance. Therefore, errors in the design value of the capacitance of the capacitive element C are reduced, and the yield of the semiconductor device can be improved.

[Description of Operations]

Figures 60, 61:
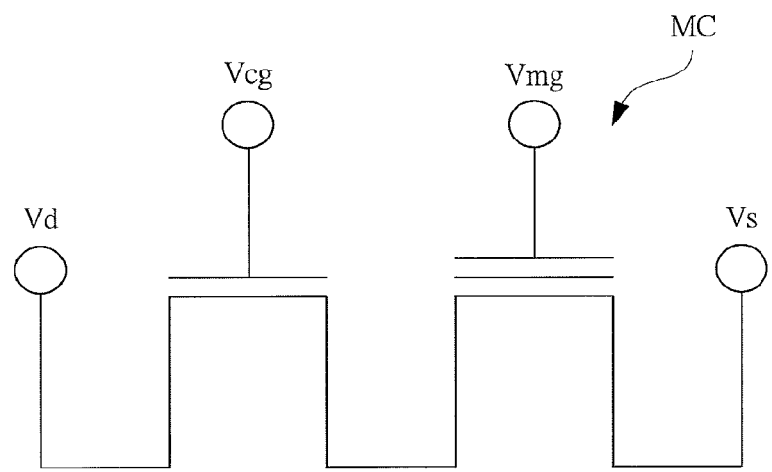
FIG. 60 is an equivalent circuit diagram of a memory cell MC.
FIG. 61 is a table showing an example of conditions of applied voltages to each part of a select memory cell in "write", "erasure", and "read" of the third embodiment.

FIG. 60 is an equivalent circuit diagram of the memory cell MC. As shown in the drawing, the memory transistor and the control transistor are connected in series between the drain region (MD) and the source region (MS) to constitute one memory cell. FIG. 61 is a table showing an example of the conditions of applied voltages to each part of the select memory cell in "write", "erasure", and "read" of the present embodiment. The table of FIG. 61 describes voltages Vmg applied to the memory gate electrode MG, voltages Vs applied to the source region (source region MS), voltages Vcg applied to the control gate electrode CG, voltages Vd (for example, Vdd=1.5 V) applied to the drain region (drain region MD), and voltages Vb applied to the p-type well PW1 in each case of "write", "erasure", and "read". Since the voltages shown in the table of FIG. 61 are suitable examples of the conditions of applied voltages, the voltages are not limited thereto and various modifications can be made according to needs. In the present embodiment, injection of electrons into the silicon nitride film (5N) serving as the charge accumulating layer (charge accumulating part) in the insulating film 5 of the memory transistor is defined as "write", and injection of holes thereinto is defined as "erasure".

As a writing method, hot-electron write which is so-called SSI (Source Side Injection) method can be used. For example, the voltages shown in the section of "write" of FIG. 61 are applied to the parts of the select memory cell, which is to carry out the write, thereby injecting electrons into the silicon nitride film (5N) in the insulating film 5 of the select memory cell. Hot electrons are generated in the channel region (between the source and the drain) below the part between the two gate electrodes (the memory gate electrode MG and the control gate electrode CG), and the hot electrons are injected into the silicon nitride film (5N) which is the charge accumulating layer (charge accumulating part) in the insulating film 5 below the memory gate electrode MG. The injected hot electrons (electrons) are trapped by a trap level in the silicon nitride film (5N) in the insulating film 5, and as a result, the threshold voltage of the memory transistor is increased.

As an erasing method, an erasing method using hole injection from the memory gate electrode MG side utilizing the FN tunneling phenomenon can be used. Details will be described later. In the case in which such an erasing method is used, the current consumption can be reduced compared with the case in which so-called BTBT (Band-To-Band Tunneling) erasure is used (see FIG. 6B).

In the read, for example, the voltages shown in the section of "read" of FIG. 61 are applied to the parts of the select memory cell which is to carry out the read. When the voltage Vmg applied to the memory gate electrode MG in the read is set to have a value between the threshold voltage of the memory transistor in the write state and the threshold voltage of the memory transistor in the erase state, the write state and the erase state can be distinguished depending on whether a current flows to the memory cell or not.

Figure 62A:
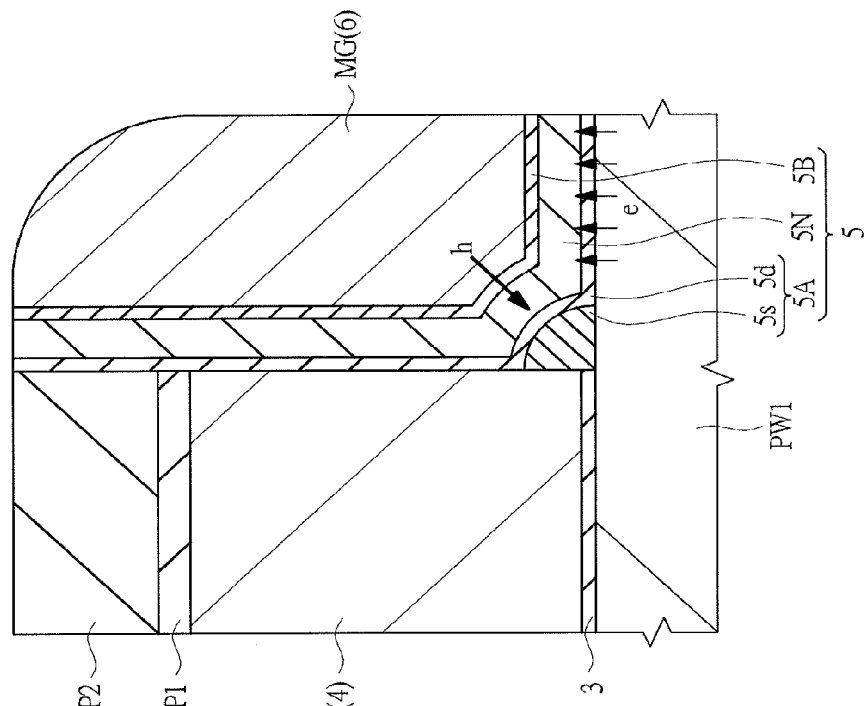
FIG. 62A is a main-part cross-sectional view showing an erased state of a memory cell part of a comparative example.
Figure 62B:
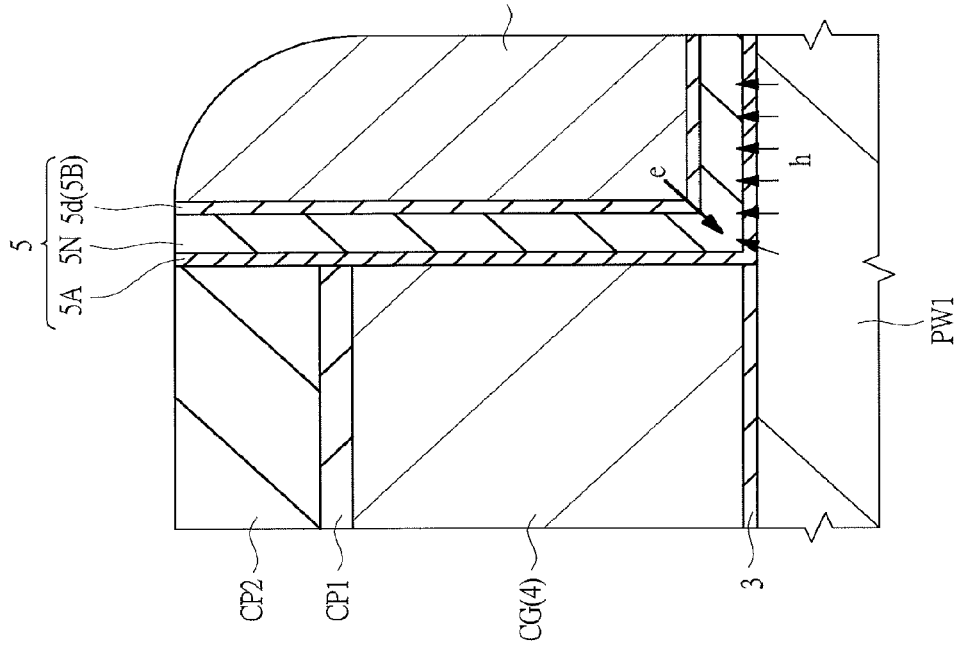
FIG. 62B is a main-part cross-sectional view showing an erased state of a memory cell part of the third embodiment.
Figure 63B:
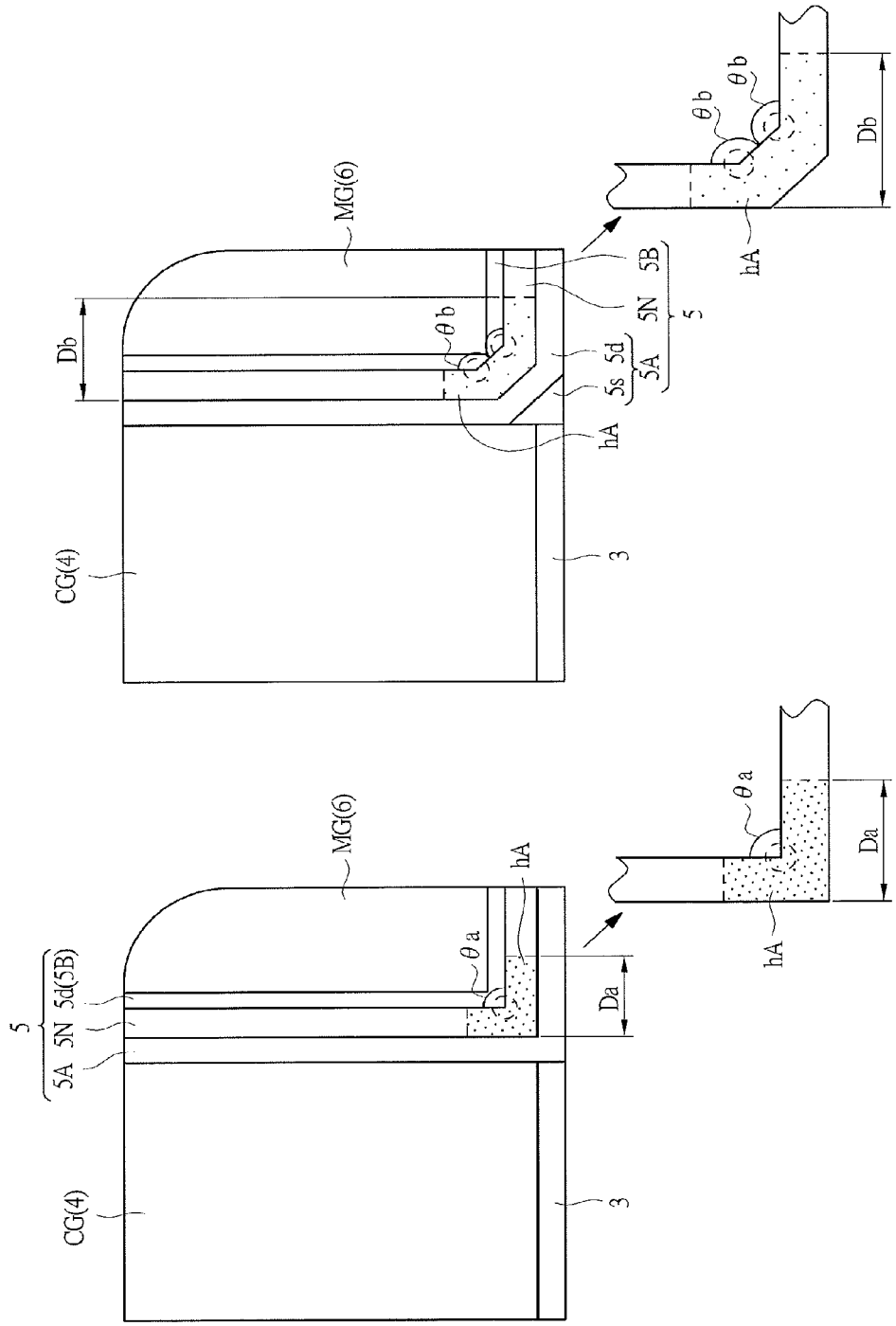
FIG. 63B is a cross-sectional view schematically showing distribution of holes in a erasing step of the memory cell part of the third embodiment.
Figure 63A:
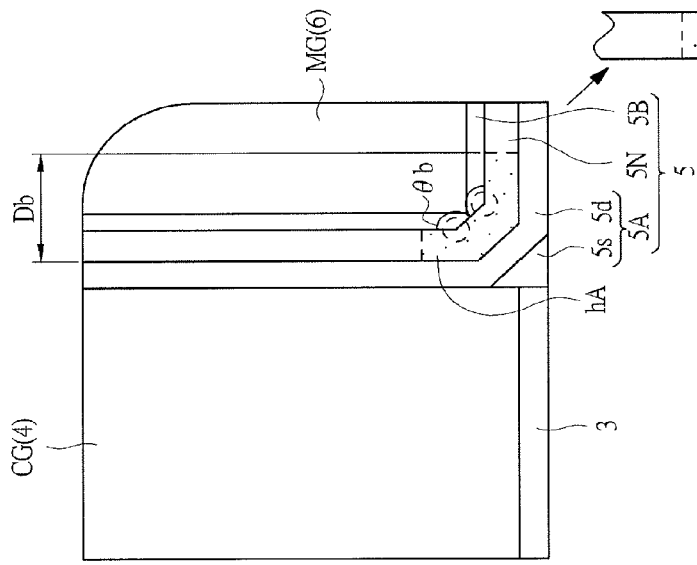
FIG. 63A is a cross-sectional view schematically showing distribution of holes in a erasing step of the memory cell part of the comparative example.

FIG. 62A and FIG. 62B are main-part cross-sectional views showing the erased state of memory cell parts of the present embodiment and the comparative example. FIG. 63A and FIG. 63B are cross-sectional views schematically showing distribution of holes in the erasing step of the memory cell parts of the present embodiment and the comparative example.

FIG. 62A shows the erased state of the memory cell part of the comparative example of the present embodiment. In the structure of this comparative example, the sidewall film 5s is omitted as shown in the drawing. The case in which an erasing method using hole injection from the semiconductor substrate side (first tunneling erasing method) is used in this memory cell of the comparative example will be described.

In this case, for example, a negative potential of −11 V is applied to the memory gate electrode MG (Vmg) to set the p-type well PW1 (Vb) to, for example, 0 V (see FIG. 5). As a result, the generated holes (h) are injected by the direct tunneling phenomenon via the silicon oxide film (5A) into the charge accumulating part (the silicon nitride film (5N) in the insulating film 5) to cancel out the electrons in the silicon nitride film (5N), or the injected holes are trapped by the trap level in the silicon nitride film (5N). As a result, the threshold voltage of the memory transistor is reduced (to be in an erased state). At this time, in the first and second embodiments, the sidewall film 5s is provided in order to suppress injection of electrons (e) from the memory gate electrode MG side (see FIG. 7, FIG. 45, and others).

On the other hand, in the memory cell part of the present embodiment, an erasing method using hole injection from the memory gate electrode MG side (second tunneling erasing method) can be used. In this case, for example, a positive potential of +12 V is applied to the memory gate electrode MG (Vmg) to set the p-type well PW1 (Vb) to, for example, 0 V (see FIG. 61). As a result, generated holes (h) are injected by the FN tunneling phenomenon via the silicon oxide film (5B) into the charge accumulating part (the silicon nitride film (5N) in the insulating film 5) to cancel out the electrons in the silicon nitride film (5N), or the injected holes are trapped by a trap level in the silicon nitride film (5N). As a result, the threshold voltage of the memory transistor is reduced (to be in an erased state). At this time, in order to suppress injection of the electrons (e) by FN tunneling from the semiconductor substrate side, the silicon oxide film (5A) in the lower layer of the silicon nitride film (5N) preferably has the film thickness of 2 nm or more and 6 nm or less, and the potential difference between Vmg and Vb is preferably 8 to 16 V.

Furthermore, in the memory cell part of the present embodiment, the locations where electric field concentrates can be dispersed by providing the sidewall film 5s, holes are injected in a wider channel region (width Db), and the erasure characteristic is improved.

More specifically, as shown in FIGS. 63A and 63B schematically showing the distribution of holes in the erasing step of the memory cell parts of the present embodiment and the comparative example, the memory cell part of the comparative example has a corner part (dashed-line circle in the drawing) of the silicon nitride film (5N) at one location, and the angle θa thereof is about 90°. On the other hand, in the present embodiment in which the sidewall film 5s is provided, the corner parts (dashed-line circle in the drawing) of the silicon nitride film (5N) are dispersed to two locations, and the angle θb thereof is larger than 90°.

Therefore, in the memory cell part of the comparative example, a hole distribution region hA is narrow, and holes are injected in a concentrated manner. The width in the gate-length direction (left-right direction of the drawing) of the hole distribution region hA is defined as Da. More specifically, the amount of holes (hole concentration) per unit volume in the hole distribution region hA is large. Also, the hole concentration is high at the corner part and becomes lower as the distance from the corner part is increased.

On the other hand, in the memory cell part of the present embodiment, the hole distribution region hA is larger than the case of the above-described comparative example (Db>Da). In other words, erasure (FN erasure) occurs in a larger channel region. Moreover, although the hole concentration is reduced, since the corner parts (dashed-line circles in the drawing) of the silicon nitride film (5N) are dispersed to two locations, the concentration difference of the hole concentration in the channel region is reduced, and distribution of the hole concentration is more uniformized compared with the case of the comparative example. Therefore, more uniform hole injection can be carried out in a larger channel region, and the erasure characteristic can be improved.

In particular, along with the miniaturization of the memory cell part, the gate length of the memory gate electrode MG tends to be reduced. Since holes can be more uniformly injected in a large channel region in this manner, the erasure characteristic of the memory cell part can be improved even in the case where the gate length of the memory gate electrode MG is miniaturized.

As described above, in the present embodiment, in the case in which the above-described second tunneling erasing method is employed, the erasure characteristic can be improved by employing the structure having the above-described sidewall film 5s.

As a matter of course, in the structure of the present embodiment, between the corner part of the memory gate electrode MG and the semiconductor substrate (PW1), the distance D1 between the upper surface and the lower surface at the corner part of the insulating film 5 can be increased by providing the sidewall film 5s (see FIG. 59). Therefore, even in the case in which the above-described first tunneling erasing method is used, electric-field concentration at the corner part can be reduced, and the erasure characteristic can be improved as described in detail in the first and second embodiments.

[Description of Manufacturing Method]

Next, a manufacturing method of the semiconductor device of the present embodiment will be described and the structure of the semiconductor device will be more specified with reference to FIG. 64 to FIG. 93. FIG. 64 to FIG. 93 are main-part cross-sectional views showing manufacturing steps of the semiconductor device of the present embodiment. Among these, FIG. 70 to FIG. 77 are main-part cross-sectional views of the memory cell region. As described above, 1A denotes the memory cell region, 2A and 3A denote the peripheral circuit regions, the n-channel-type MISFET Qn is formed in 2A, and the capacitive element C is formed in 3A.

Figure 64:
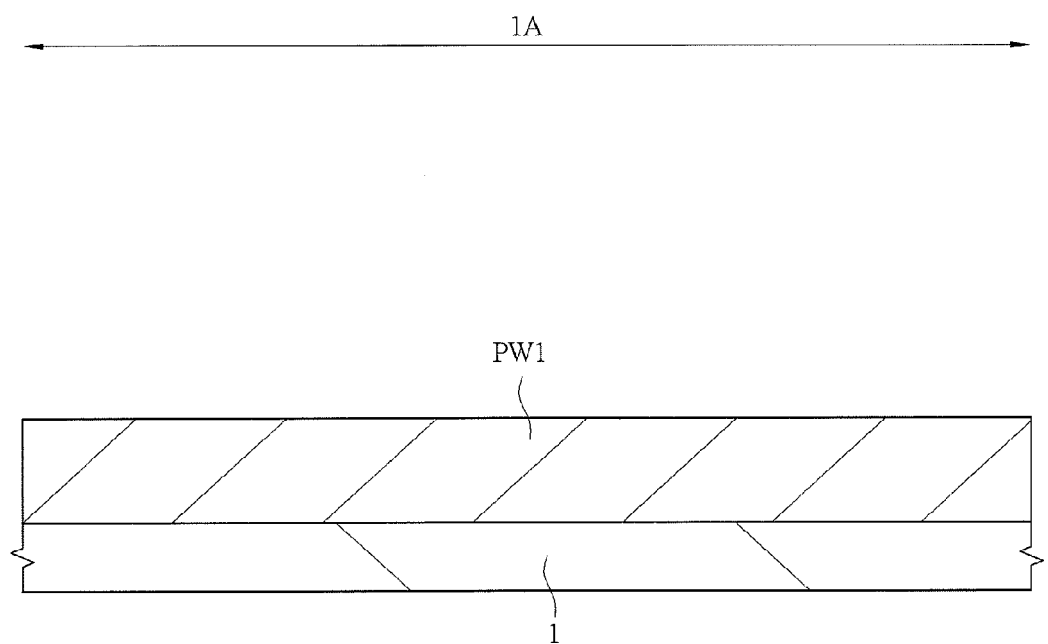
FIG. 64 is a main-part cross-sectional view showing a manufacturing step of the semiconductor device of the third embodiment.
Figure 65:
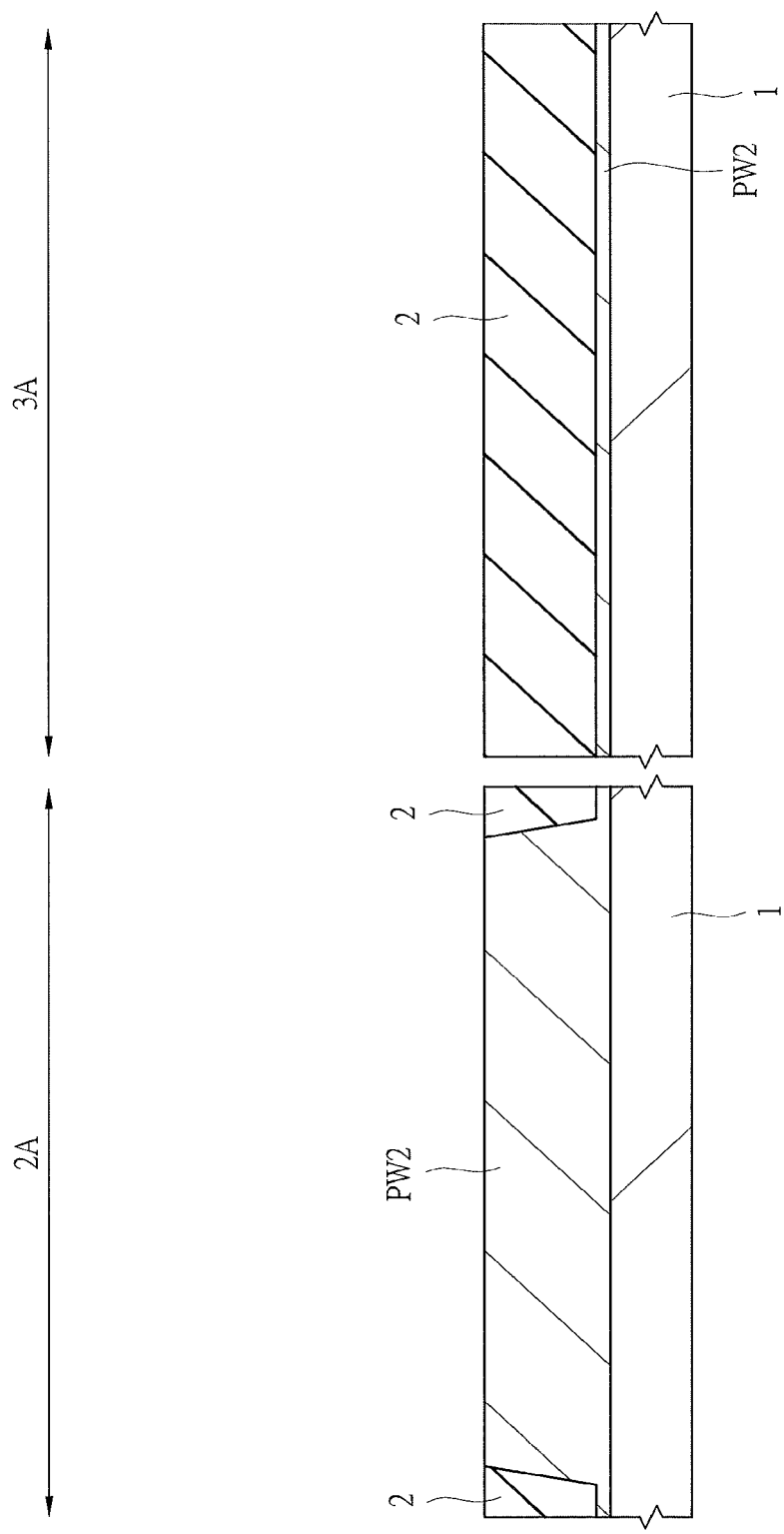
FIG. 65 is a main-part cross-sectional view showing a manufacturing step of the semiconductor device of the third embodiment.

First, as shown in FIG. 64 and FIG. 65, for example, a silicon substrate made of p-type single-crystal silicon having a specific resistance of about 1 to 10 Ωcm is prepared as the semiconductor substrate (semiconductor wafer) 1. The semiconductor substrate 1 other than a silicon substrate may be used.

Then, the isolation regions 2 are formed in the main surface of the semiconductor substrate 1. For example, the isolation regions 2 are formed by forming isolation trenches in the semiconductor substrate 1 and burying an insulating film in the isolation trenches (FIG. 65). Such an isolation method is called STI (Shallow Trench Isolation). Alternatively, the isolation regions 2 may be formed by using, for example, LOCOS (Local Oxidization of Silicon). Although the isolation regions 2 do not appear in the cross-sectional part (FIG. 64) shown in the memory cell region 1A, the isolation regions 2 are arbitrarily disposed at the locations where electrical separation is required as described above.

Then, the p-type well PW1 is formed in the memory cell region 1A of the semiconductor substrate 1, and the p-type well PW2 is formed in the peripheral circuit region 2A of the semiconductor substrate 1. The p-type wells PW1 and PW2 are formed by carrying out ion implantation of a p-type impurity (for example, boron (B)). In this case, as shown in FIG. 65, the p-type well PW2 is thinly disposed in a lower part of the isolation region 2 formed in the peripheral circuit region 3A.

Figure 66:
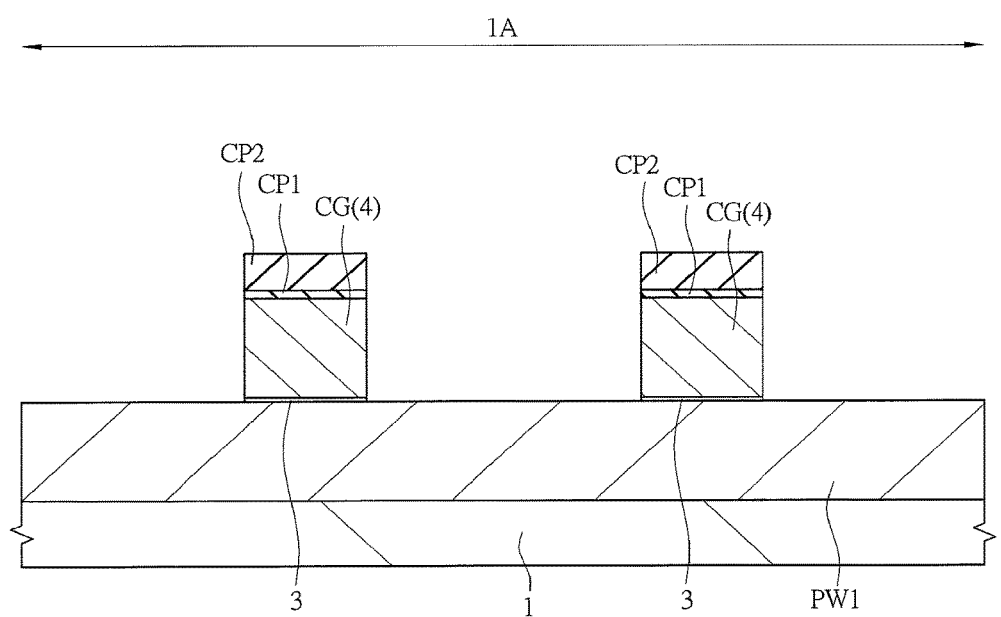
FIG. 66 is a main-part cross-sectional view showing a manufacturing step of the semiconductor device of the third embodiment continued from FIG. 64.
Figure 67:
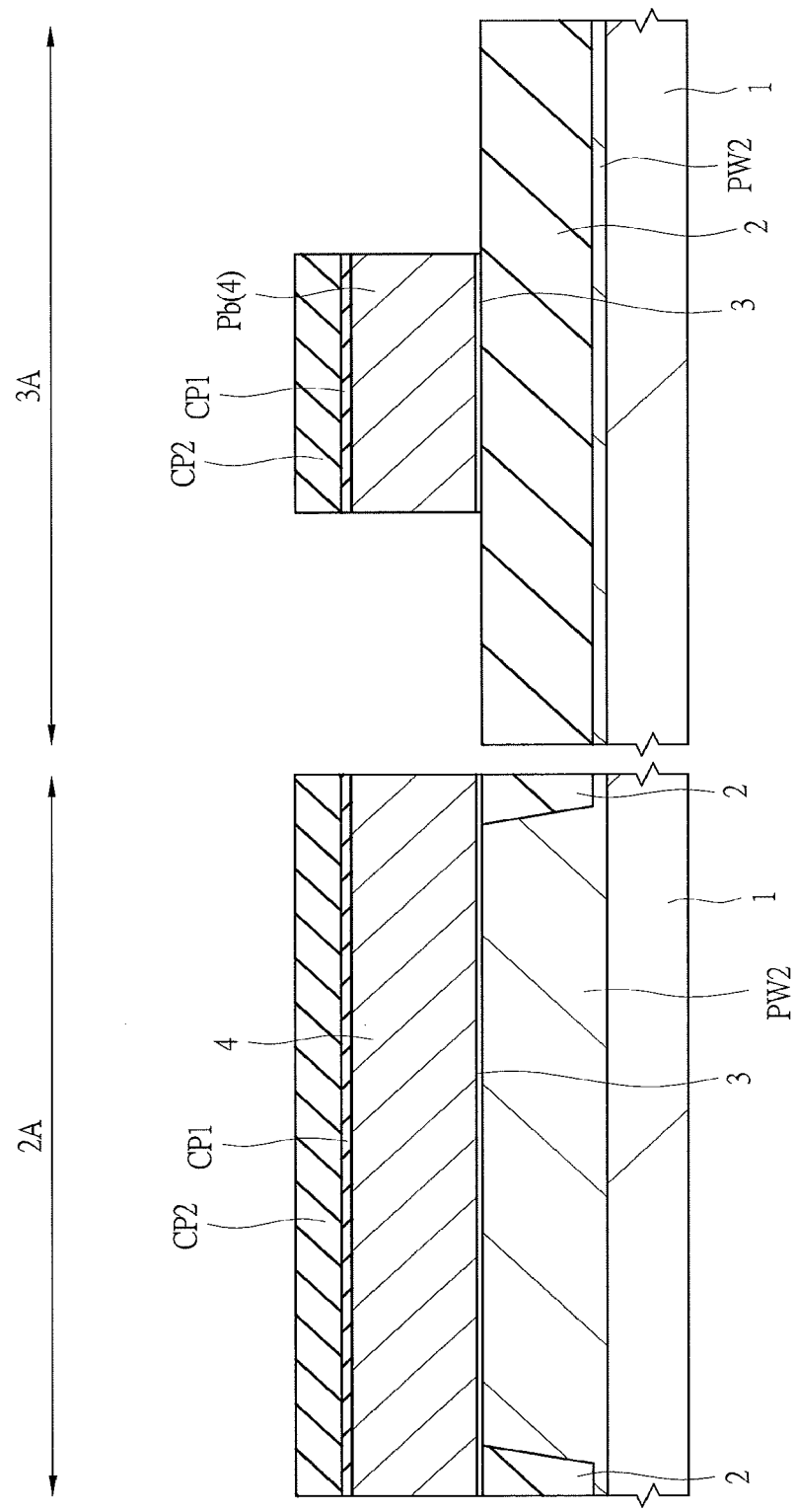
FIG. 67 is a main-part cross-sectional view showing a manufacturing step of the semiconductor device of the third embodiment continued from FIG. 65.

Then, after the surface of the semiconductor substrate 1 (p-type wells PW1 and PW2) is cleaned by, for example, diluted hydrofluoric-acid cleaning, as shown in FIG. 66 and FIG. 67, a silicon oxide film or the like is formed as the insulating film (gate insulating film) 3 by thermal oxidation so as to have a film thickness of about 2 to 3 nm on the main surface (surfaces of the p-type wells PW1 and PW2) of the semiconductor substrate 1. Other than the silicon oxide film, a different insulating film such as a silicon oxynitride film may be used as the insulating film 3. In addition to them, a metal oxide film having a higher dielectric constant than that of a silicon nitride film such as a hafnium oxide film, an aluminum oxide film (alumina), or a tantalum oxide film and a stacked film of an oxide film or the like and a metal oxide film may be formed. Other than the thermal oxidation, CVD (Chemical Vapor Deposition) may be used to form the film. Furthermore, the insulating film (gate insulating film) 3 on the memory cell region 1A and the insulating film (gate insulating film) 3 on the peripheral circuit region 2A may be formed to have different film thicknesses and may be composed of different types of films.

Then, the silicon film 4 serving as the electrically-conductive film (conductor film) is formed on the entire surface of the semiconductor substrate 1. As this silicon film 4, a polycrystalline silicon film or the like is formed to have a film thickness of about 100 to 200 nm by using, for example, CVD. The silicon film 4 may be formed by depositing an amorphous silicon film and then crystallizing it by carrying out the thermal treatment. The silicon film 4 serves as the control gate electrode CG in the memory cell region 1A, serves as the gate electrode GE of the n-channel-type MISFET Qn in the peripheral circuit region 2A, and serves as the lower electrode Pb of the capacitive element C in the peripheral circuit region 3A.

Then, an n-type impurity (for example, arsenic (As) or phosphorous (P)) is implanted into the silicon film 4 of the memory cell region 1A.

Then, the thin silicon oxide film CP1 is formed by thermally oxidizing the surface of the silicon film 4 by, for example, about 6 nm. The silicon oxide film CP1 may be formed by using CVD. Then, the silicon nitride film (cap insulating film) CP2 of about 80 to 90 nm is formed on the upper part of the silicon oxide film CP1 by using, for example, CVD.

Then, a photoresist film (not shown) is formed by using photolithography in the region in which the control gate electrodes CG are to be formed, and the silicon nitride film CP2, the silicon oxide film CP1, and the silicon film 4 are etched with using the photoresist film as a mask. Thereafter, the photoresist film is removed by, for example, asking, thereby forming the control gate electrodes CG (for example, having a gate length of about 80 nm). Such a series of steps from photolithography to removal of the photoresist film is called patterning. In this case, the silicon nitride film CP2 and the silicon oxide film CP1 are formed on the upper parts of the control gate electrodes CG, but these films can be omitted (see FIG. 95). In that case, the height of the control gate electrodes CG can be arbitrarily adjusted, and the height of the control gate electrodes CG may be made equivalent to the height of the silicon nitride film CP2 of the case in which the silicon nitride film CP2 is provided.

Here, the insulating film 3 left below the control gate electrodes CG in the memory cell region 1A serves as the gate insulating film of the control transistor. The insulating film 3 other than the part covered with the control gate electrodes CG can be removed by, for example, a subsequent patterning step.

Figure 69:
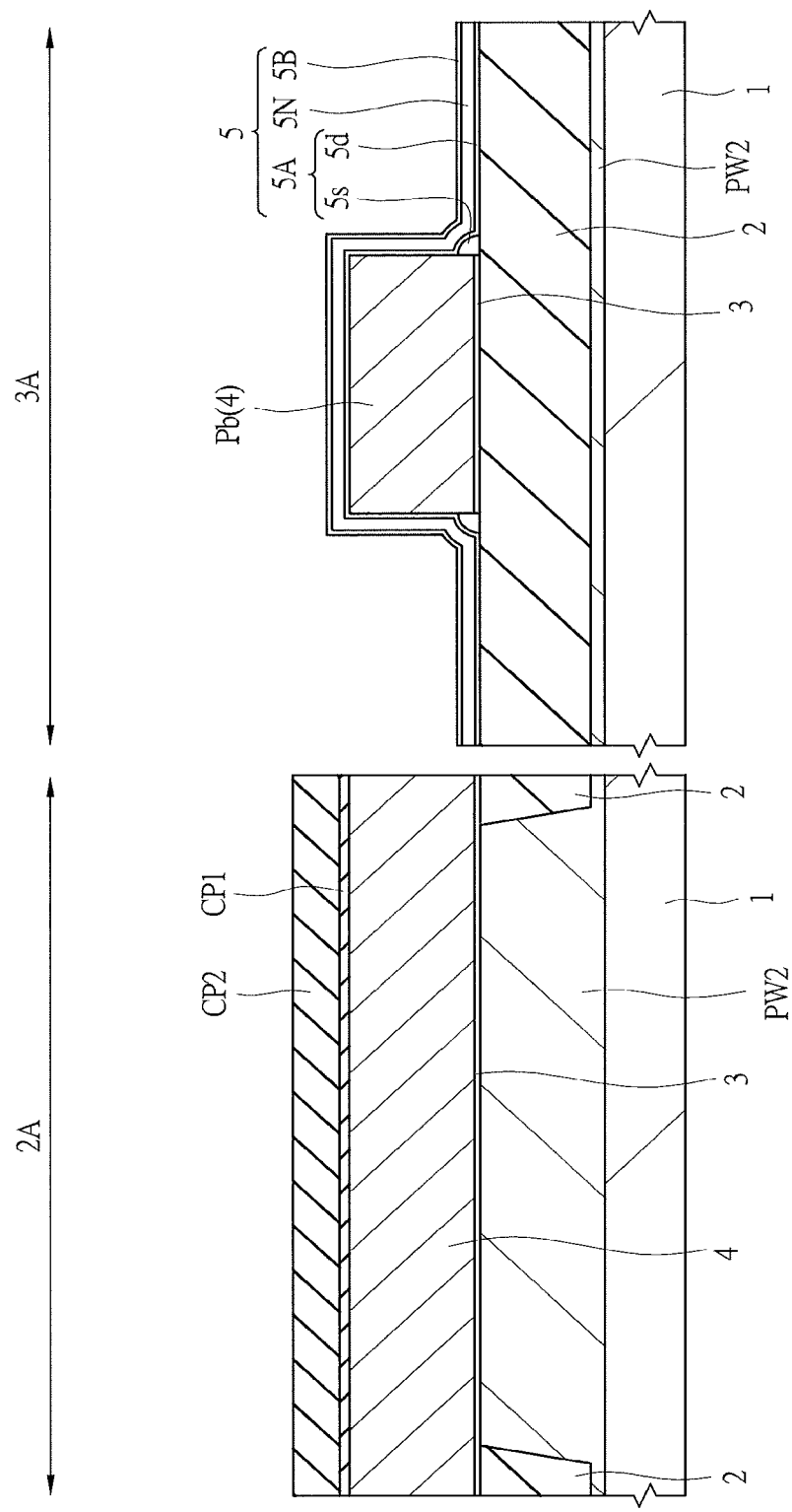
FIG. 69 is a main-part cross-sectional view showing a manufacturing step of the semiconductor device of the third embodiment continued from FIG. 67.

Then, the silicon nitride film CP2 and the silicon oxide film CP1 of the peripheral circuit region 3A are removed by etching (see FIG. 69).

Figure 68:
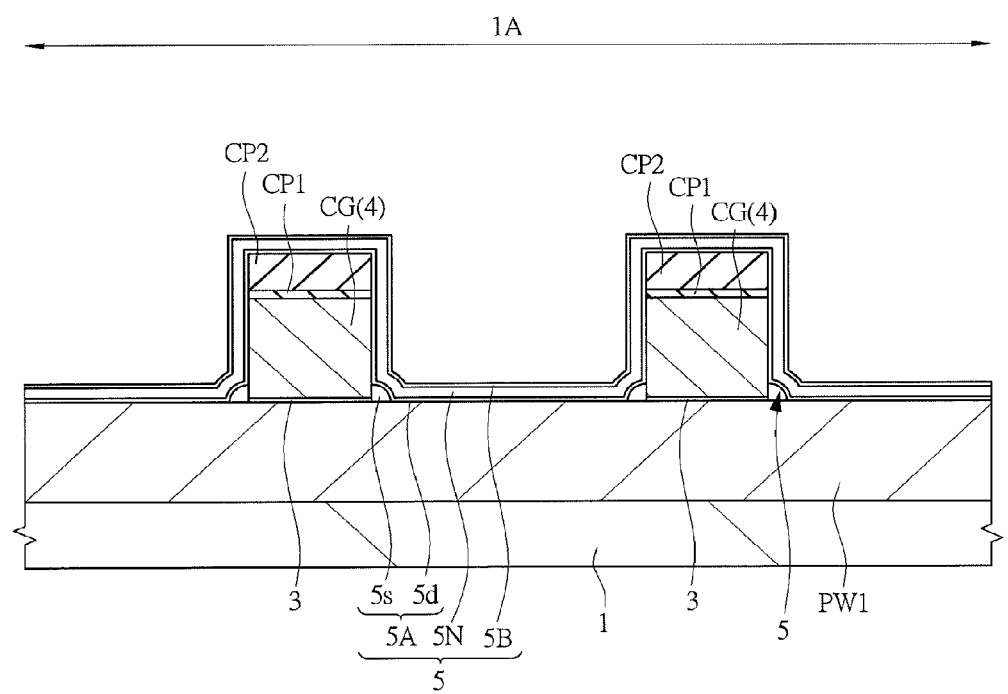
FIG. 68 is a main-part cross-sectional view showing a manufacturing step of the semiconductor device of the third embodiment continued from FIG. 66.

Then, as shown in FIG. 68 and FIG. 69, the insulating film (5A, 5N, 5B) is formed on the semiconductor substrate 1 including the part on the surfaces (upper surfaces and side surfaces) of the control gate electrodes CG (4). The step of forming the insulating film 5 will be described in detail with reference to FIG. 70 to FIG. 77, which are main-part cross-sectional views of the memory cell region 1A. In FIG. 70 to FIG. 77, in order to make the drawings easily understood, the width (gate length) of the control gate electrode CG is shown to be shorter than the other parts.

Figure 70:
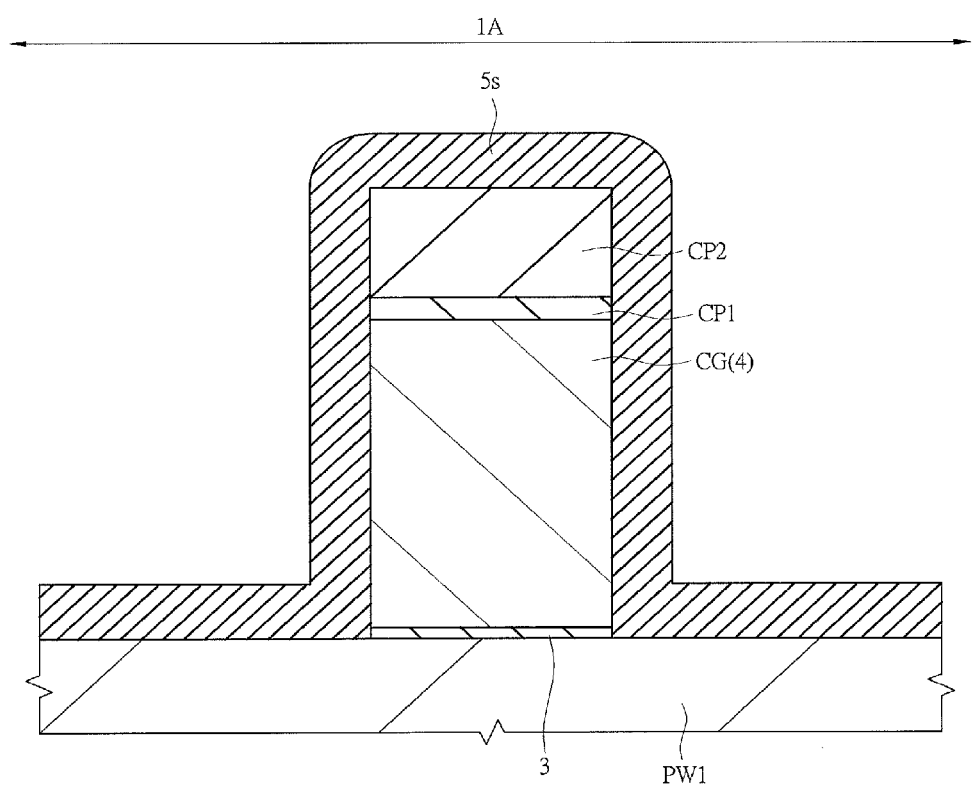
FIG. 70 is a main-part cross-sectional view showing a manufacturing step of the semiconductor device of the third embodiment.
Figure 71:
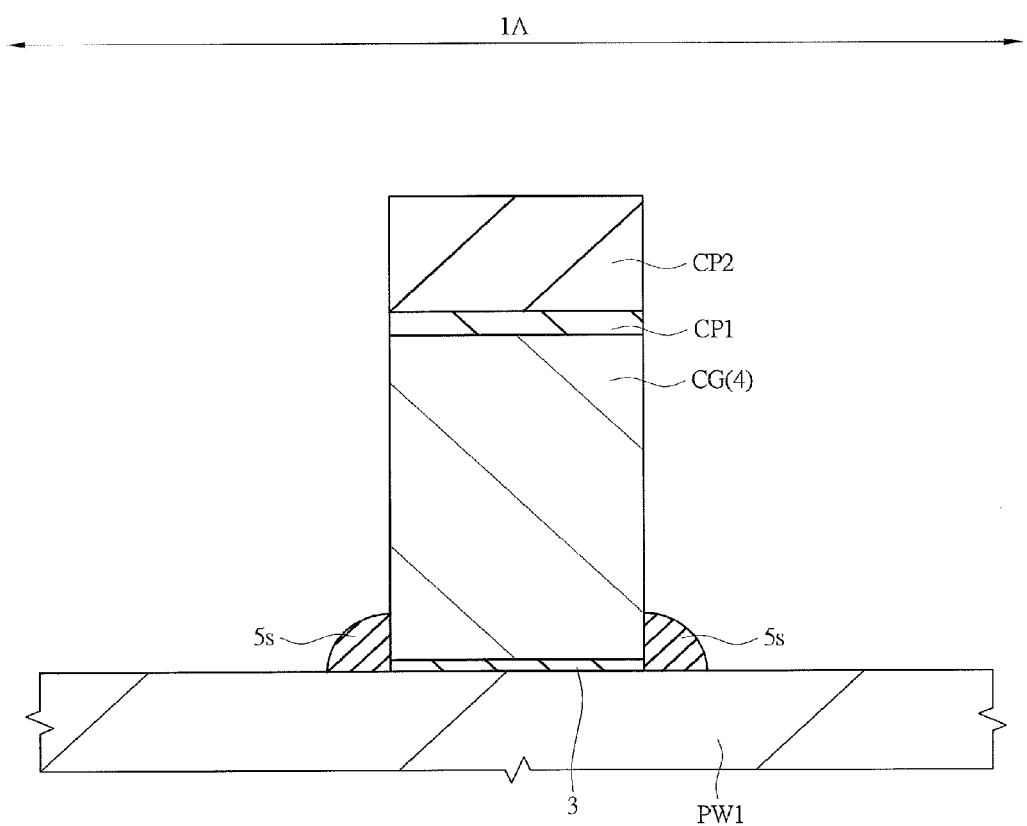
FIG. 71 is a main-part cross-sectional view showing a manufacturing step of the semiconductor device of the third embodiment continued from FIG. 70.

First, after carrying out the cleaning treatment to the main surface of the semiconductor substrate 1, as shown in FIG. 70, the silicon oxide film (5s) is deposited on the semiconductor substrate 1 (p-type well PW1) including the upper surface and the side surfaces of the control gate electrode CG so as to have a film thickness of, for example, about 10 nm to 30 nm by CVD. Then, the silicon oxide film (5s) is anisotropically etched (etched back) from the surface thereof. Through this step, as shown in FIG. 71, the sidewall film 5s composed of the silicon oxide film (5s) can be left at the sidewall parts on both sides of the control gate electrode CG. Specifically, the height H5s and the width W5s of the sidewall film 5s are preferably 10 nm or more and 20 nm or less. As the above-described anisotropic etching, for example, dry etching can be carried out under plasma with using a mixed gas of $CF_4$ and $CHF_3$ as an etching gas.

Figure 72:
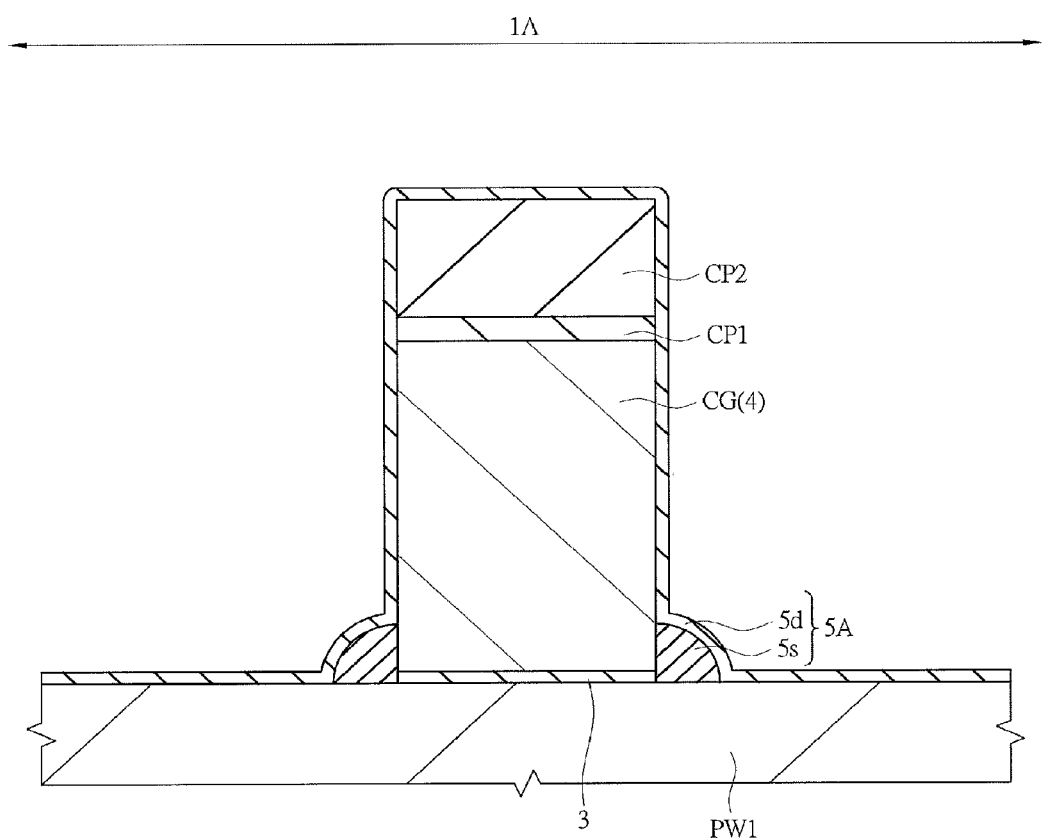
FIG. 72 is a main-part cross-sectional view showing a manufacturing step of the semiconductor device of the third embodiment continued from FIG. 71.

Then, as shown in FIG. 72, the silicon oxide film (deposited film) 5d is formed on the semiconductor substrate 1 (p-type well PW1) including the upper surface and the side surfaces of the control gate electrode CG and on the sidewall film 5s so as to have a film thickness of, for example, about 4 nm by CVD. The sidewall film 5s and the silicon oxide film 5d form the first film (lower layer film) constituting the insulating film (ONO film) 5.

Figure 94:
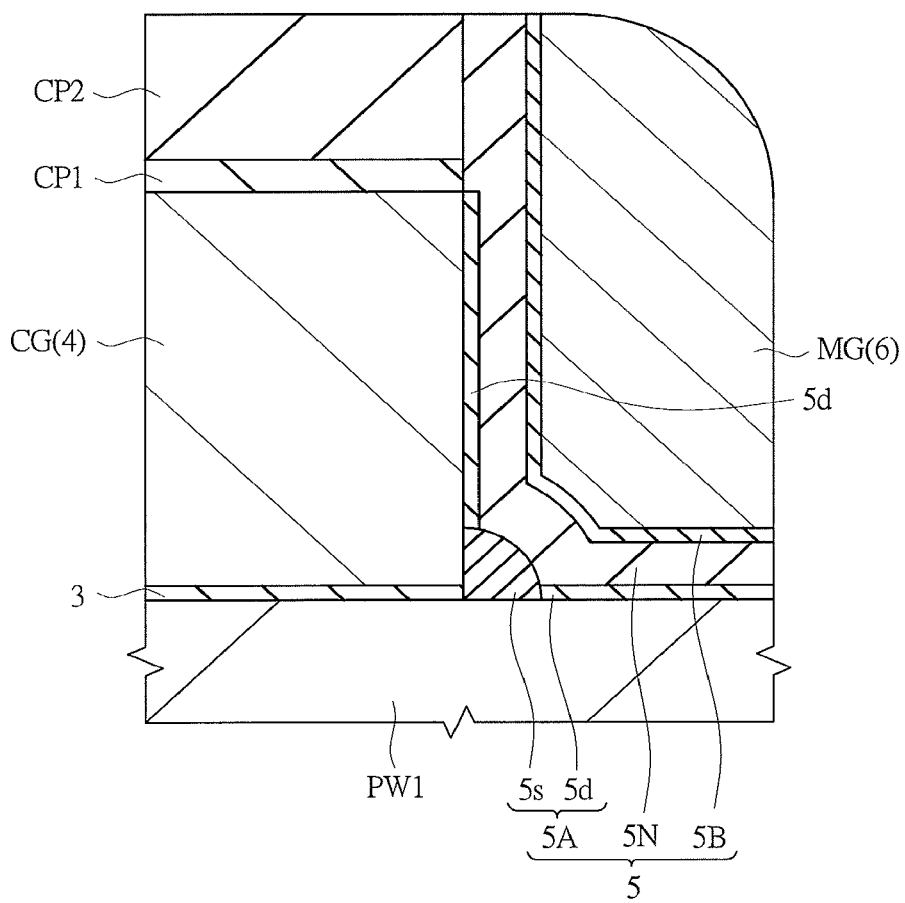
FIG. 94 is a main-part cross-sectional view showing another memory cell structure of the semiconductor device of the third embodiment.

The silicon oxide film (deposited film) 5d may be formed by thermal oxidation (preferably, ISSG (In Situ Steam Generation) oxidation) (see FIG. 94). FIG. 72 shows the shape of the silicon oxide film 5A (5s, 5d) formed by CVD.

As described above, in order to achieve a good erasure characteristic, the film thickness of the silicon oxide film (deposited film) 5d of the first film (lower layer film) constituting the insulating film (ONO film) 5 is preferably 2 nm or more and 5 nm or less.

Figure 73:
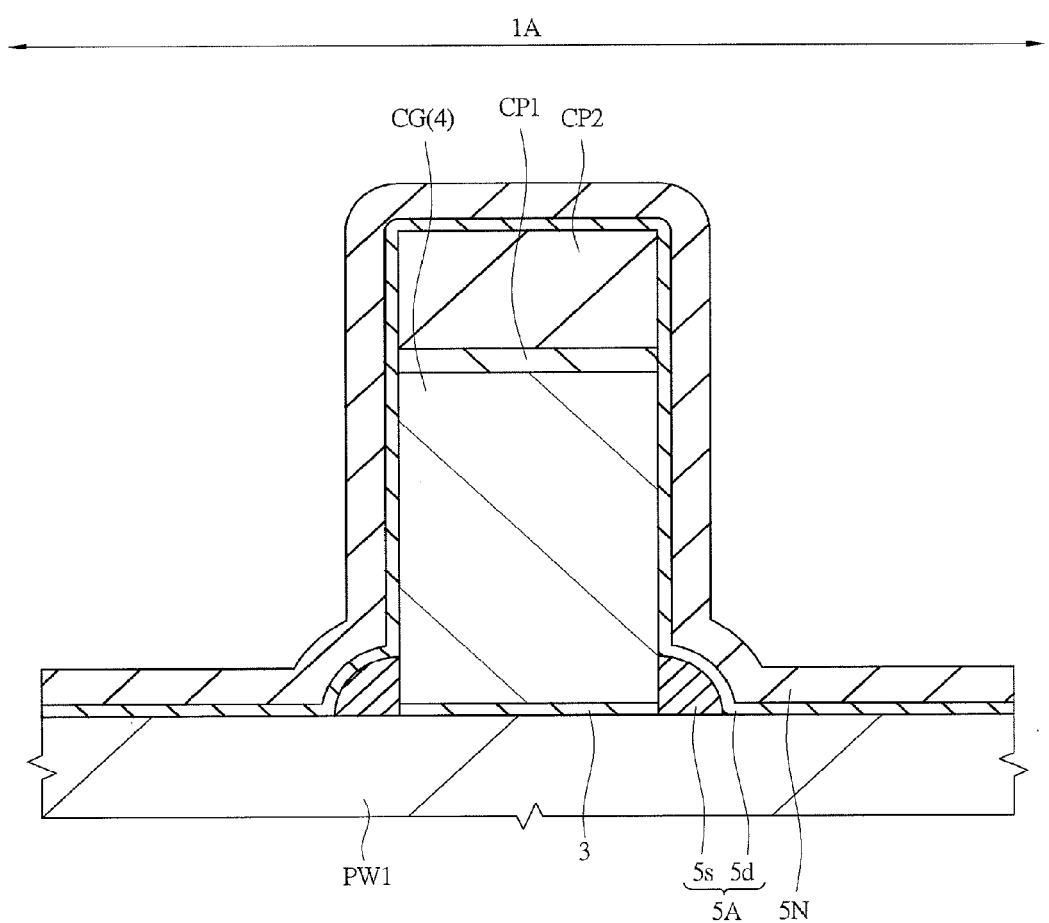
FIG. 73 is a main-part cross-sectional view showing a manufacturing step of the semiconductor device of the third embodiment continued from FIG. 72.

Then, as shown in FIG. 73, the silicon nitride film 5N is deposited on the silicon oxide film (deposited film 5d) 5A so as to have a film thickness of, for example, about 7 nm by CVD. The silicon nitride film 5N is positioned on the upper surface and the side surfaces of the control gate electrode CG and on the semiconductor substrate 1 (p-type well PW1) via the silicon oxide film 5A. As described above, the silicon nitride film 5N serves as the charge accumulating part of the memory cell and serves as the second film (intermediate film) constituting the insulating film (ONO film) 5.

Figure 74:
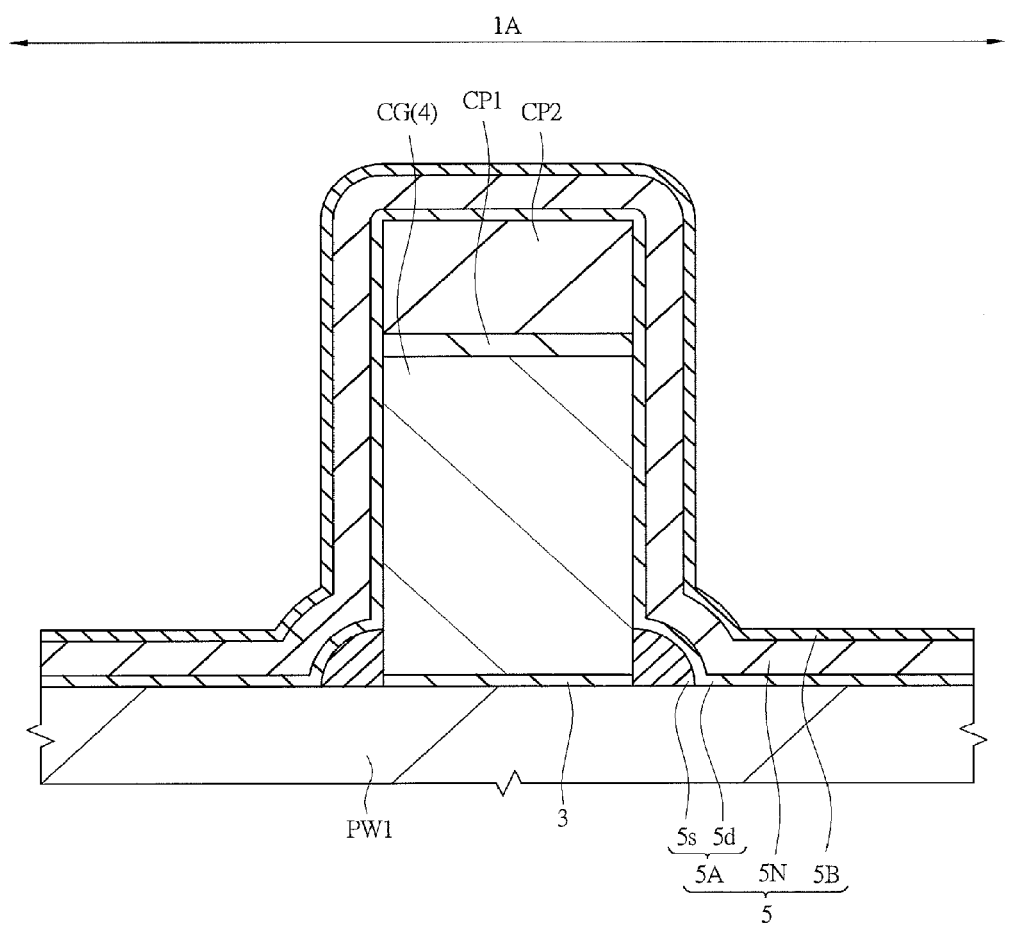
FIG. 74 is a main-part cross-sectional view showing a manufacturing step of the semiconductor device of the third embodiment continued from FIG. 73.

Then, as shown in FIG. 74, a silicon oxynitride film is deposited as the third film 5B on the silicon nitride film 5N so as to have a film thickness of, for example, about 5 nm to 15 nm by CVD. The third film (silicon oxynitride film) 5B is positioned on the upper surface and the side surfaces of the control gate electrode CG and on the semiconductor substrate 1 (p-type well PW1) via the silicon oxide film 5A and the silicon nitride film. 5N. As described above, the barrier height of the third film is preferably small in order to efficiently inject holes into the second film (charge accumulating part) 5N by the FN tunneling phenomenon via the third film (tunnel film) 5B from the memory gate electrode MG. Therefore, when an oxynitride film is used as the third film 5B, the erasure characteristic can be improved.

Through the steps above, the insulating film (ONO film) 5 composed of the first film (the sidewall film 5s and the silicon oxide film 5d, the silicon oxide film 5A), the second film (the silicon nitride film 5N), and the third film (the silicon oxide film 5B) can be formed.

In the above-described steps, the silicon oxide film 5d is formed after the sidewall film 5s is formed, but it is also possible to form the sidewall film 5s after the silicon oxide film 5d is formed. However, etching controllability in the formation of the sidewall film 5s is better when the silicon oxide film 5d is formed after the sidewall film 5s is formed.

In the present embodiment, the silicon nitride film 5N is formed as the charge accumulating part (charge accumulating layer, insulating film having a trap level) in the insulating film 5. However, for example, a different insulating film such as an aluminum oxide film, a hafnium oxide film, or a tantalum oxide film may be used. These films are high-dielectric constant films having high dielectric constant than that of a silicon nitride film. Also, the charge accumulating layer may be formed by using an insulating film having silicon nano-dots.

The insulating film 5 formed in the memory cell region 1A functions as a gate insulating film of the memory gate electrode MG and has a charge retaining (charge accumulating) function. Therefore, the insulating film 5 has a layered structure including at least three layers, and it is configured so that the potential barrier height of the inner layer (silicon nitride film 5N) is lower than the potential barrier height of the outer layers (silicon oxide films 5A and 5B).

Figure 75:
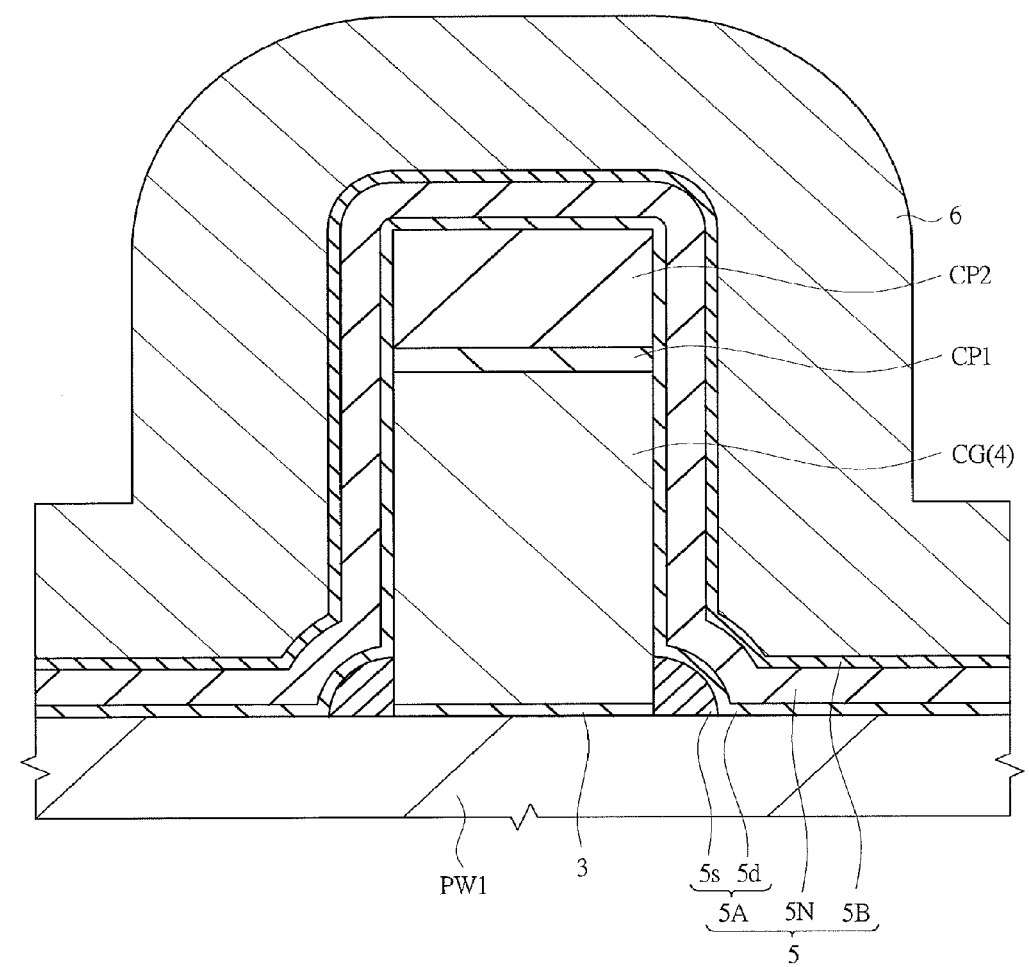
FIG. 75 is a main-part cross-sectional view showing a manufacturing step of the semiconductor device of the third embodiment continued from FIG. 74.

Then, as shown in FIG. 75, the silicon film 6 is formed as the electrically-conductive film (conductor film). As this silicon film 6, for example, a non-doped polycrystalline silicon film is formed to have a film thickness of about 50 to 200 nm by using, for example, CVD. The silicon film 6 may be formed by depositing an amorphous silicon film and then crystallizing it by carrying out the thermal treatment.

Figure 76:
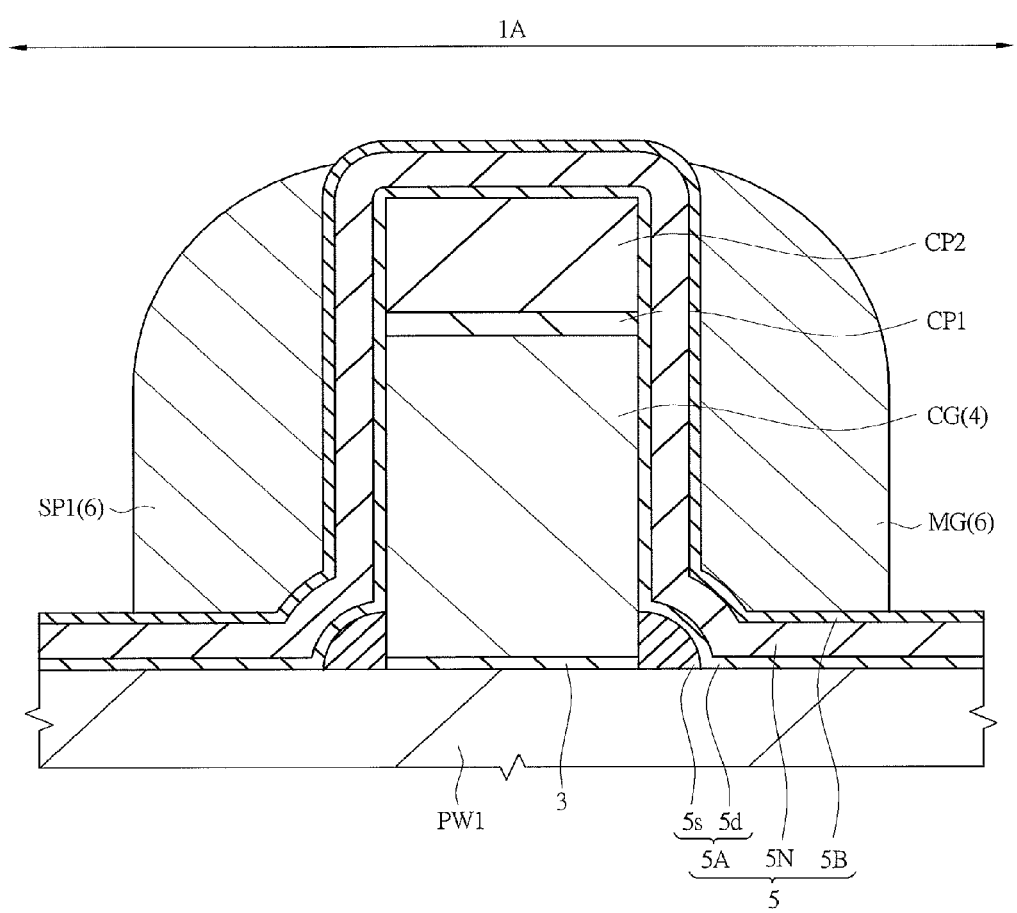
FIG. 76 is a main-part cross-sectional view showing a manufacturing step of the semiconductor device of the third embodiment continued from FIG. 75.
Figure 77:
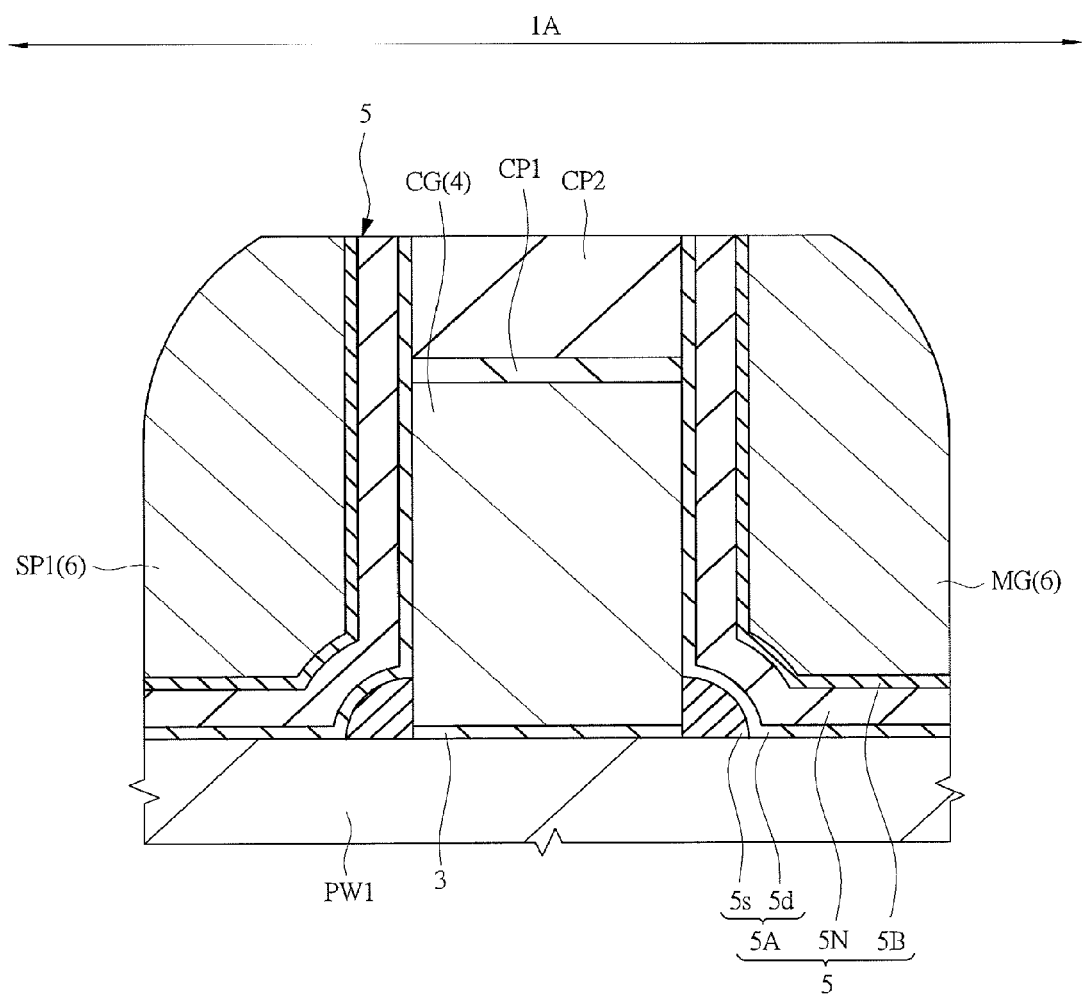
FIG. 77 is a main-part cross-sectional view showing a manufacturing step of the semiconductor device of the third embodiment continued from FIG. 76.

Then, the silicon film 6 of the memory cell region 1A is etched back (FIG. 76). Thereafter, the insulating film 5 at the upper part of the control gate electrode CG or others is removed by etching (FIG. 77). The steps after the step of forming the silicon film 6 described above will be described in further detail with reference to FIG. 78 to FIG. 93.

Figure 78:
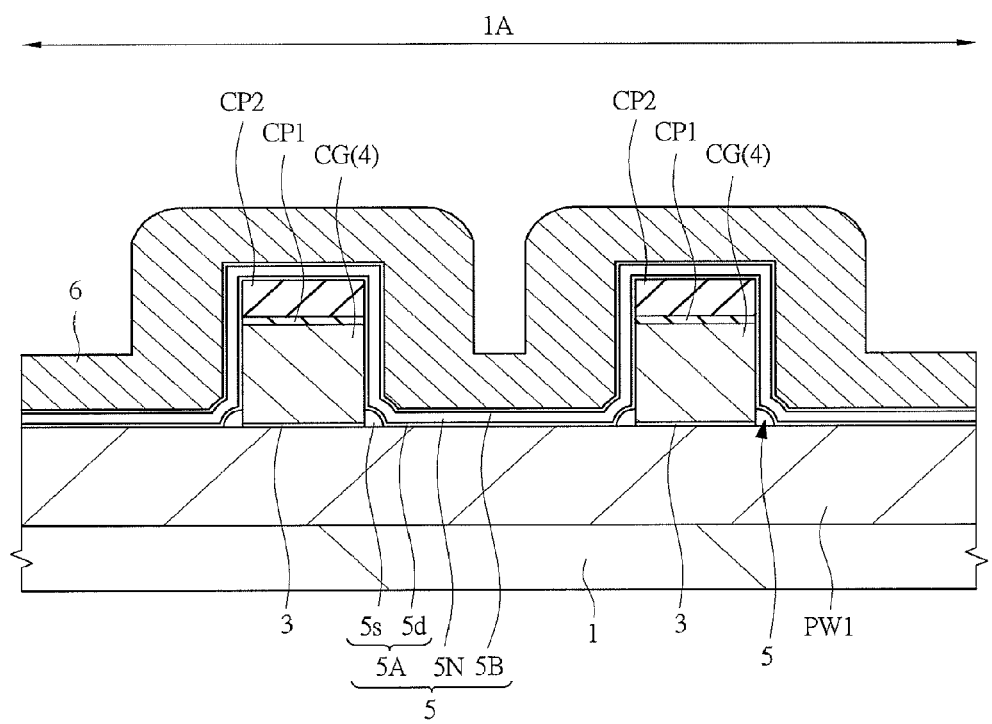
FIG. 78 is a main-part cross-sectional view showing a manufacturing step of the semiconductor device of the third embodiment continued from FIG. 68.
Figure 79:
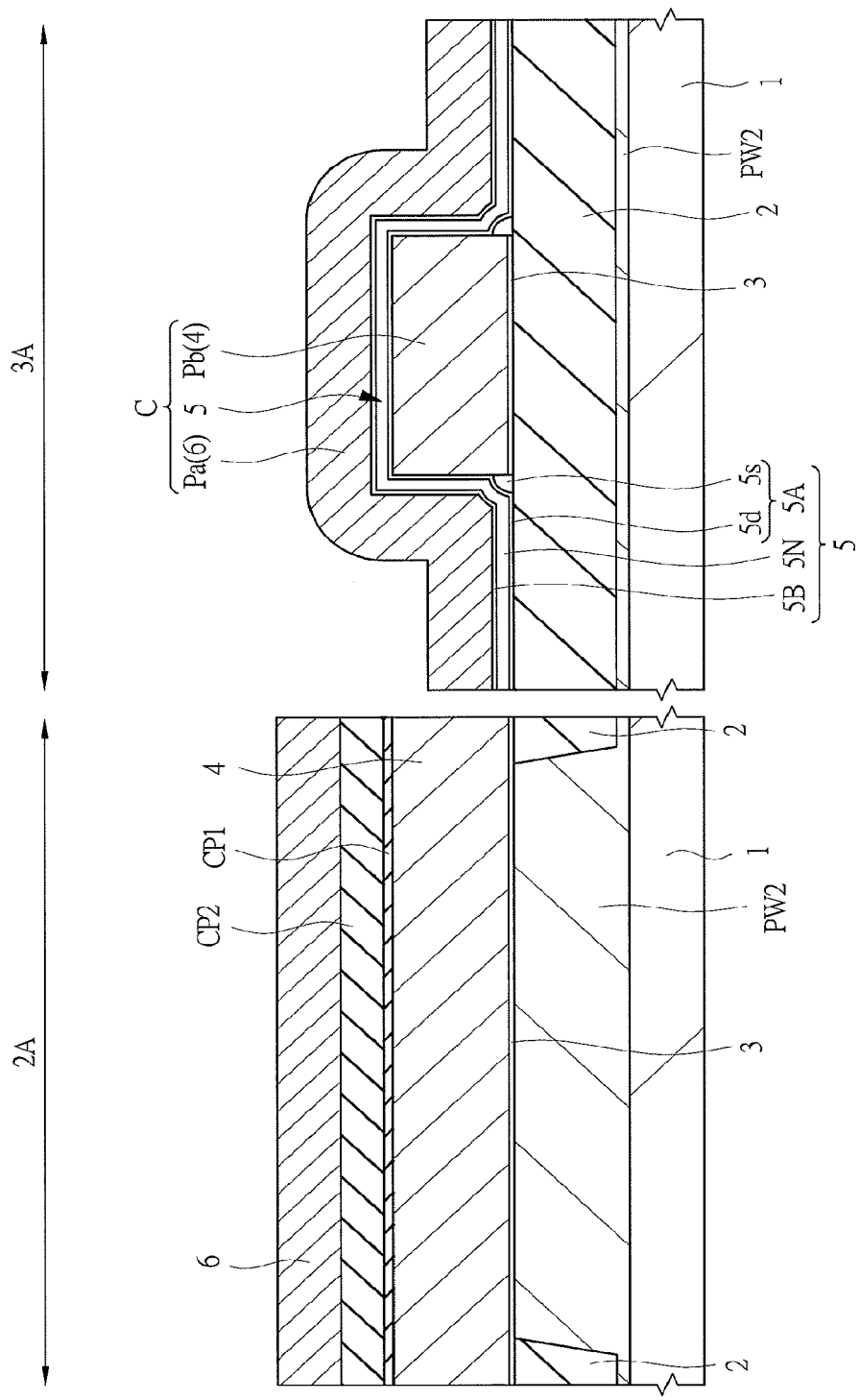
FIG. 79 is a main-part cross-sectional view showing a manufacturing step of the semiconductor device of the third embodiment continued from FIG. 69.

As shown in FIG. 78 and FIG. 79, for example, a polycrystalline silicon film is formed to have a film thickness of about 50 to 200 nm as the silicon film 6 on the upper part of the insulating film 5 by using CVD or the like. Alternatively, the silicon film 6 may be formed by depositing an amorphous silicon film and crystallizing it by carrying out thermal treatment. As described later, the silicon film 6 serves as the memory gate electrode MG (for example, having a gate length of about 50 nm) in the memory cell region 1A and serves as the upper electrode Pa of the capacitive element C in the peripheral circuit region 3A.

Figure 80:
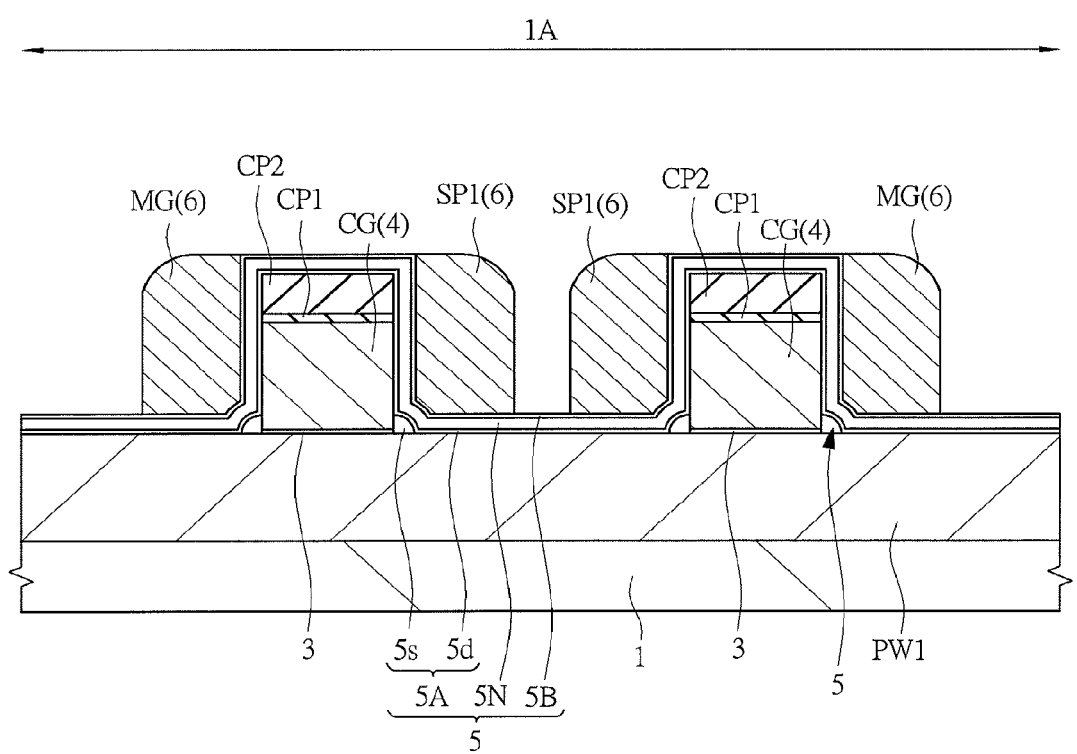
FIG. 80 is a main-part cross-sectional view showing a manufacturing step of the semiconductor device of the third embodiment continued from FIG. 78.
Figure 81:
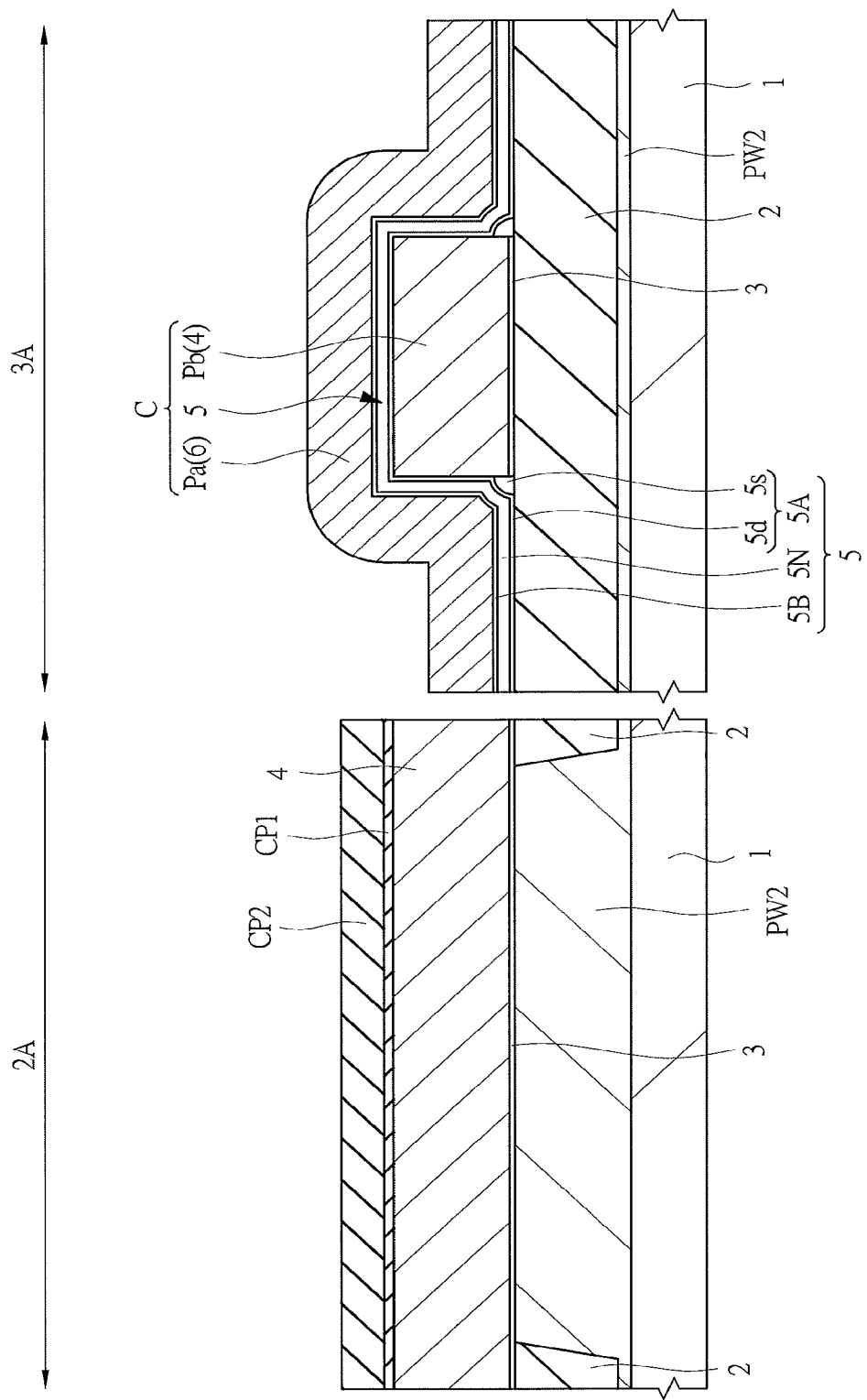
FIG. 81 is a main-part cross-sectional view showing a manufacturing step of the semiconductor device of the third embodiment continued from FIG. 79.

Then, as shown in FIG. 80 and FIG. 81, the silicon film 6 of the memory cell region 1A is etched back (selectively removed). In this etch-back step, the silicon film 6 is removed by anisotropic dry etching by the amount corresponding to a predetermined film thickness from the surface thereof. Through this step, the silicon film 6 can be left like sidewall spacers on the sidewall parts on both sides of the control gate electrode CG via the insulating film 5 (see FIG. 80, FIG. 76). In this case, in the peripheral circuit region 2A, the silicon film 6 is etched, and the silicon nitride film CP2 at the upper part of the silicon film 4 is exposed (FIG. 81). The peripheral circuit region 3A is covered with a photoresist film (not shown) or the like and the silicon film 6 is not etched. As a matter of course, if the upper electrode Pa is desired to be patterned into a desired shape, patterning may be carried out by utilizing this step.

The memory gate electrode MG is formed of the silicon film 6 left on one sidewall part out of the both sidewall parts of the control gate electrode CG described above. A silicon spacer SP1 is formed of the silicon film 6 left on the other sidewall part (FIG. 80). The memory gate electrode MG and the silicon spacer SP1 are formed on the sidewall parts which are on the mutually opposite sides of the control gate electrode CG, and have an approximately symmetric structure about the control gate electrode CG.

The insulating film 5 below the memory gate electrode MG serves as the gate insulating film of the memory transistor. The memory gate length (the gate length of the memory gate electrode MG) is determined in accordance with the deposited film thickness of the silicon film 6.

Figure 82:
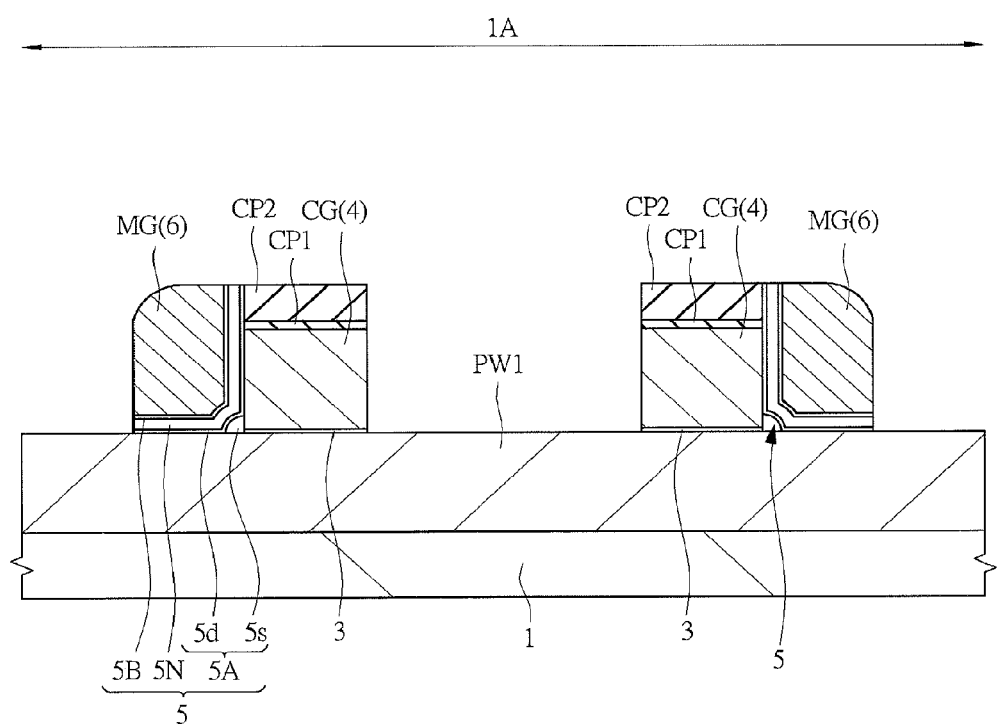
FIG. 82 is a main-part cross-sectional view showing a manufacturing step of the semiconductor device of the third embodiment continued from FIG. 80.
Figure 83:
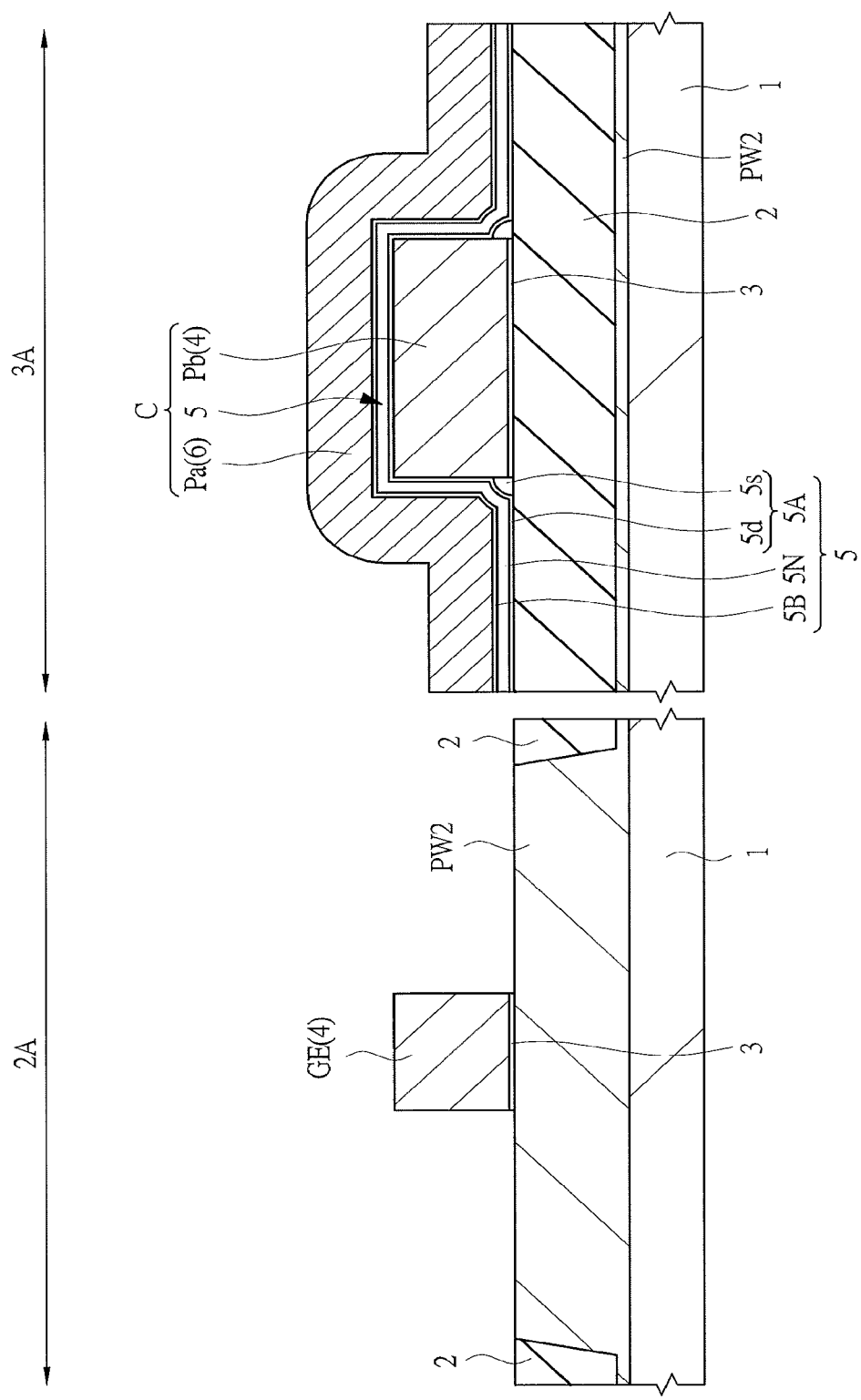
FIG. 83 is a main-part cross-sectional view showing a manufacturing step of the semiconductor device of the third embodiment continued from FIG. 81.

Then, as shown in FIG. 82 and FIG. 83, the insulating film 5 at the upper part of the control gate electrode CG is removed by etching. As a result, the silicon nitride film CP2 at the upper part of the control gate electrode CG is exposed, and the p-type well PW1 is exposed (see FIG. 82, FIG. 77). In this process, in the peripheral circuit region 2A, the insulating film 5 is etched, and the silicon film 4 is exposed.

Then, in the peripheral circuit region 2A, an impurity is introduced into the silicon film 4. For example, an n-type impurity such as phosphorous is implanted into the silicon film 4 of the region in which the n-channel-type MISFET Qn is to be formed. Although it is not illustrated, an impurity of the opposite conductivity type (p type) is implanted into the region in which the p-channel-type MISFET is to be formed.

Then, in the region of the silicon film 4 in which the gate electrode GE of the n-channel-type MISFET Qn is to be formed, a photoresist film (not shown) is formed by using photolithography, and the silicon film 4 is etched with using this photoresist film as a mask. Thereafter, the gate electrode GE is formed by removing the photoresist film by asking or the like (FIG. 83). The insulating film 3 left below the gate electrode GE serves as the gate insulating film of the n-channel-type MISFET Qn. The insulating film 3 except the part covered with the gate electrode GE may be removed in the formation of the gate electrode GE or may be removed by a subsequent patterning step.

Figure 84:
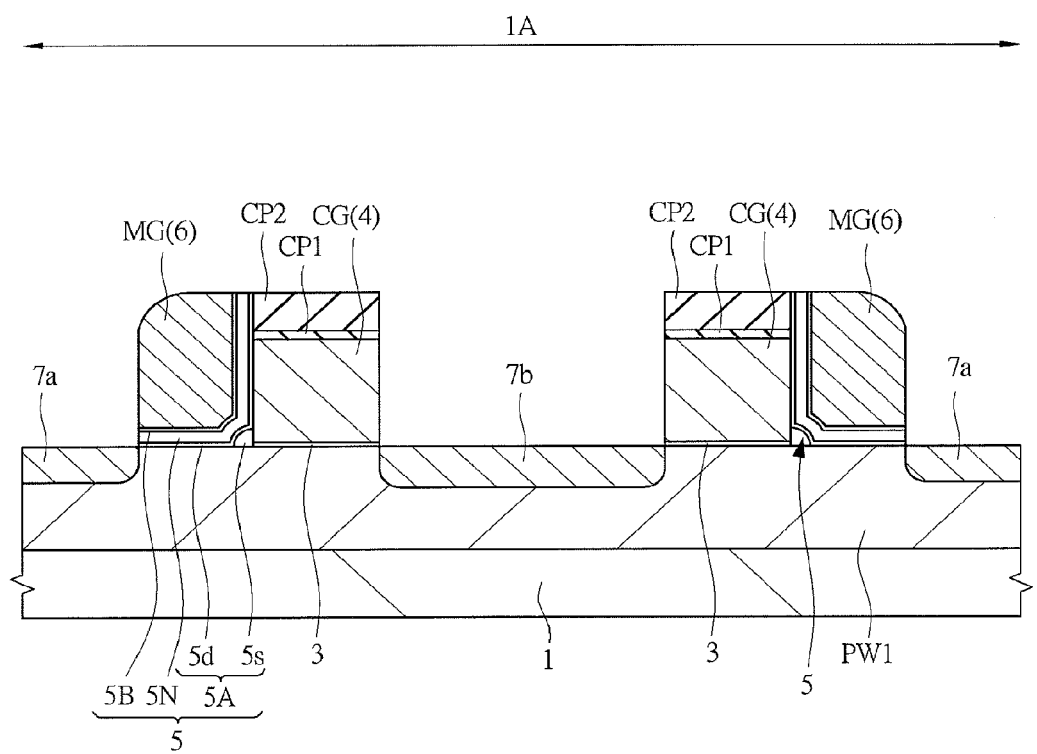
FIG. 84 is a main-part cross-sectional view showing a manufacturing step of the semiconductor device of the third embodiment continued from FIG. 82.
Figure 85:
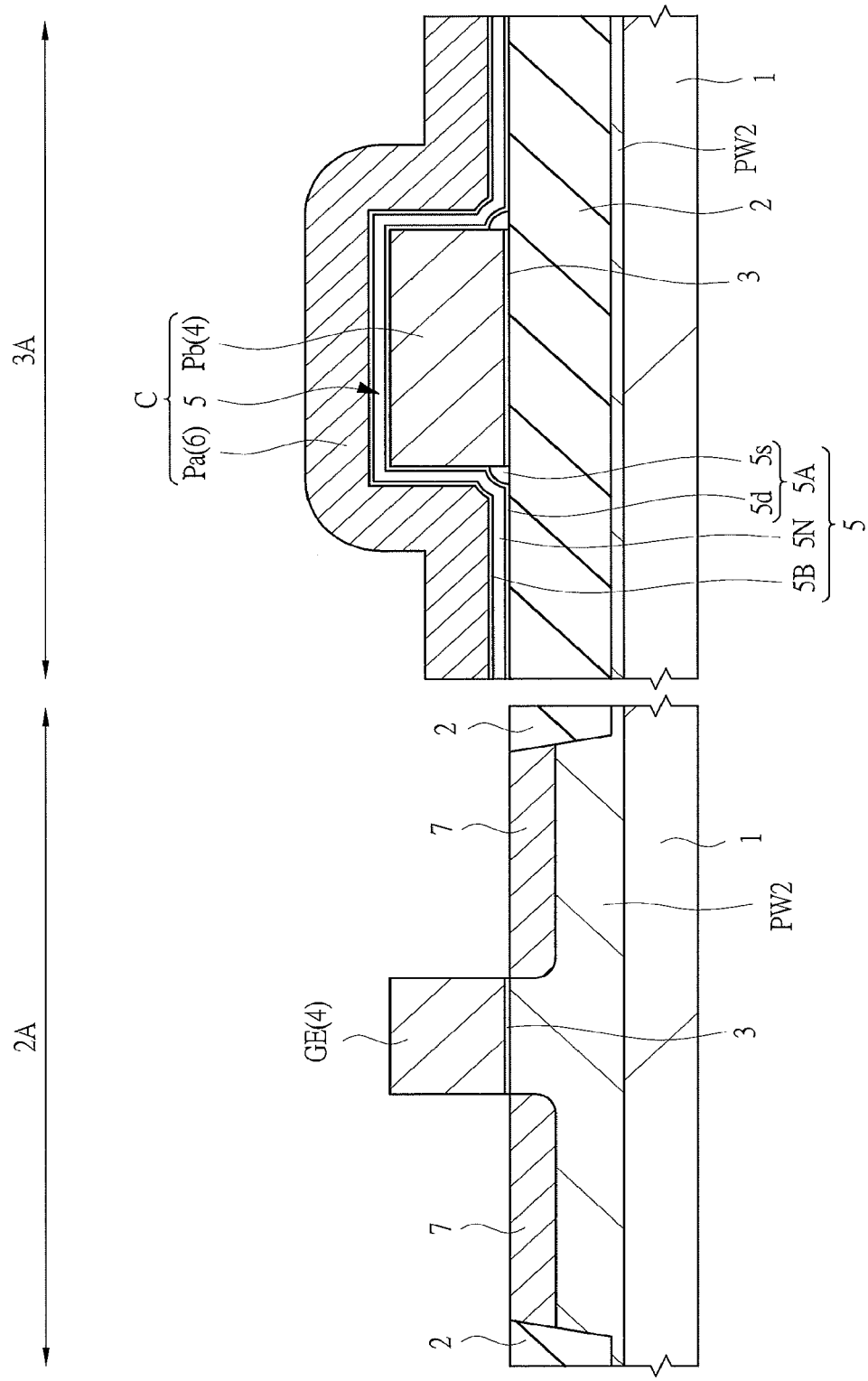
FIG. 85 is a main-part cross-sectional view showing a manufacturing step of the semiconductor device of the third embodiment continued from FIG. 83.

Then, as shown in FIG. 84 and FIG. 85, in the memory cell region 1A, the $n^-$-type semiconductor region 7a and the $n^-$-type semiconductor region 7b are formed by implanting an n-type impurity such as arsenic (As) or phosphorous (P) into the semiconductor substrate 1 (p-type well PW1) on the control gate electrode CG side. In this process, the $n^-$-type semiconductor region 7a is formed in a self-aligning manner with respect to the sidewall of the memory gate electrode MG (the sidewall on the side opposite to the side that is adjacent to the control gate electrode CG via the insulating film 5). Also, the $n^-$-type semiconductor region 7b is formed in a self-aligning manner with respect to the sidewall of the control gate electrode CG (the sidewall on the side opposite to the side adjacent to the memory gate electrode MG via the insulating film 5). In the peripheral circuit region 2A, the $n^-$-type semiconductor regions 7 are formed by implanting an n-type impurity such as arsenic (As) or phosphorous (P) into the semiconductor substrate 1 (p-type well PW2) on the both sides of the gate electrode GE. In this process, the $n^-$-type semiconductor regions 7 are formed in a self-aligning manner with respect to the sidewalls of the gate electrode GE.

The $n^-$-type semiconductor region 7a, the $n^-$-type semiconductor region 7b, and the $n^-$-type semiconductor regions 7 may be formed in the same ion implantation step, but are formed in mutually different ion implantation steps in this case. When the regions are formed in mutually different ion implantation steps in this manner, the $n^-$-type semiconductor region 7a, the $n^-$-type semiconductor region 7b, and the $n^-$-type semiconductor regions 7 can be formed to have desired impurity concentrations and desired junction depths, respectively.

Figure 86:
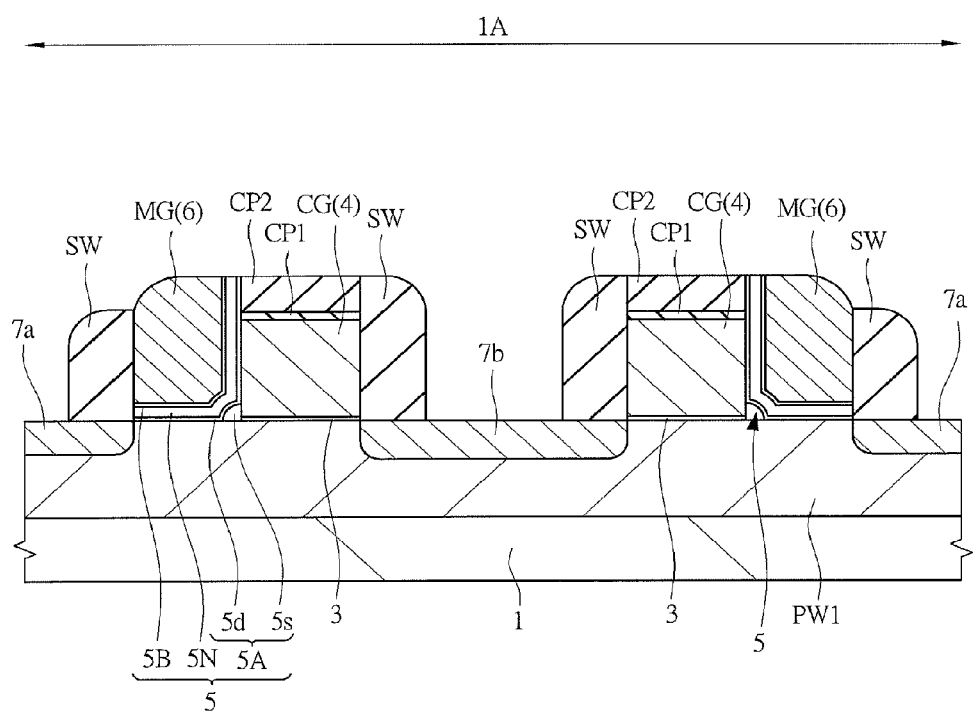
FIG. 86 is a main-part cross-sectional view showing a manufacturing step of the semiconductor device of the third embodiment continued from FIG. 84.
Figure 87:
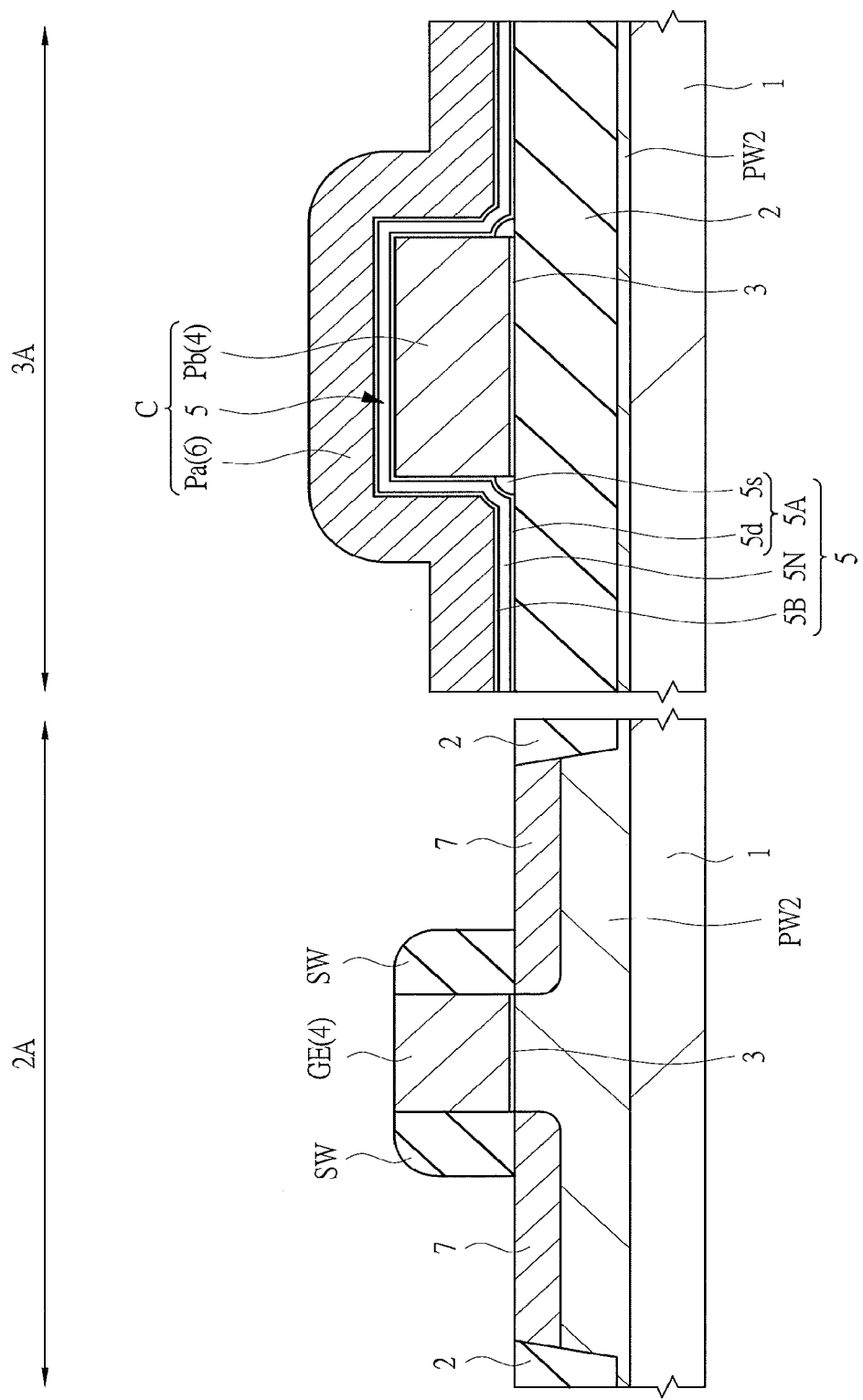
FIG. 87 is a main-part cross-sectional view showing a manufacturing step of the semiconductor device of the third embodiment continued from FIG. 85.

Then, as shown in FIG. 86 and FIG. 87, in the memory cell region 1A, the sidewall insulating film SW composed of an insulating film such as silicon oxide is formed on the sidewall parts of the pattern (composite pattern) in which the control gate electrode CG and the memory gate electrode MG are adjacent to each other via the insulating film 5. Moreover, in the peripheral circuit region 2A, the sidewall insulating film SW is formed on the sidewall parts of the gate electrode GE. The sidewall insulating film SW is formed on the sidewall parts of the above-described composite pattern (CG, MG) and on the sidewall parts of the gate electrode GE by, for example, depositing an insulating film such as a silicon oxide film on the entire main surface of the semiconductor substrate 1 and then etching back the insulating film. Other than a silicon oxide film, for example, a silicon nitride film or a stacked film of a silicon oxide film and a silicon nitride film may be used to form the sidewall insulating film SW.

Figure 88:
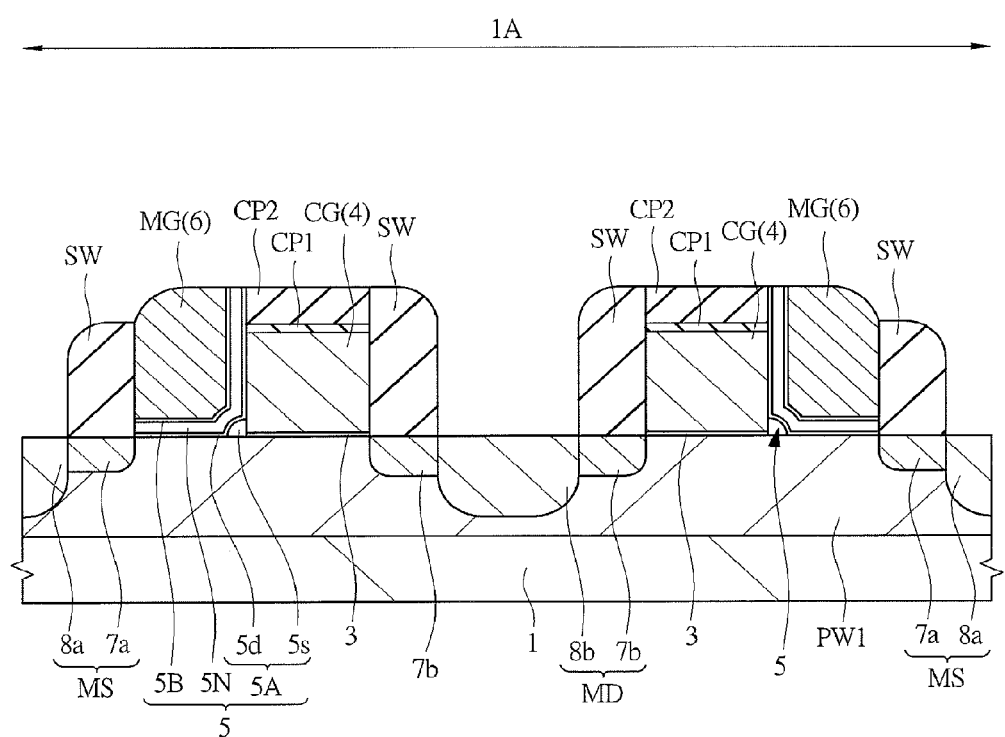
FIG. 88 is a main-part cross-sectional view showing a manufacturing step of the semiconductor device of the third embodiment continued from FIG. 86.
Figure 89:
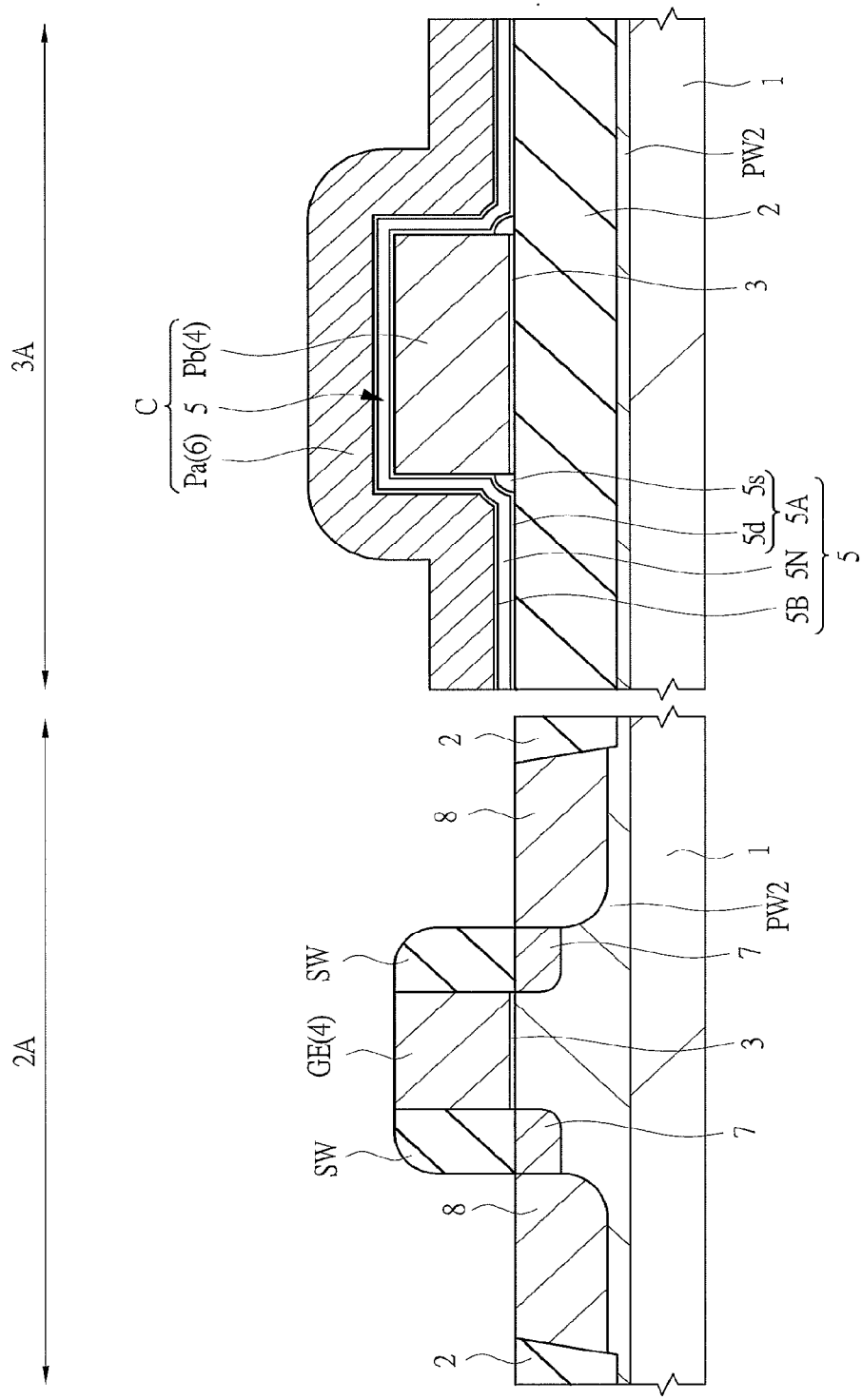
FIG. 89 is a main-part cross-sectional view showing a manufacturing step of the semiconductor device of the third embodiment continued from FIG. 87.

Then, as shown in FIG. 88 and FIG. 89, the $n^+$-type semiconductor region 8a and the $n^+$-type semiconductor region 8b having high impurity concentration are formed by implanting an n-type impurity such as arsenic (As) or phosphorous (P) into the semiconductor substrate 1 (p-type well PW1) with using the control gate electrode CG, the memory gate electrode MG, and the sidewall insulating film SW as a mask. In this process, the $n^+$-type semiconductor region 8a is formed in a self-aligning manner with respect to the sidewall insulating film SW on the memory gate electrode MG side in the memory cell region 1A. The $n^+$-type semiconductor region 8b is formed in a self-aligning manner with respect to the sidewall insulating film SW on the control gate electrode CG side in the memory cell region 1A. The $n^+$-type semiconductor region 8a is formed as a semiconductor region that has a higher impurity concentration and a deeper junction depth than those of the $n^-$-type semiconductor region 7a. The $n^+$-type semiconductor region 8b is formed as a semiconductor region that has a higher impurity concentration and a deeper junction depth than those of the $n^-$-type semiconductor region 7b.

Also, since the memory gate electrode MG is exposed at this time, the n-type impurity is implanted also to the upper part of the memory gate electrode MG. However, the diffusion amount of the n-type impurity is small in the lower part of the memory gate electrode MG, and an intrinsic semiconductor (non-doped semiconductor) is preferable. When the concentration of the n-type impurity in the lower part of the memory gate electrode MG is made low in this manner, holes can be efficiently injected into the second film (charge accumulating part) 5N and can be injected into the charge accumulating part without the recombination with the electrons generated from the n-type impurity in the erasing operation.

In the peripheral circuit region 2A, the $n^+$-type semiconductor regions 8 are formed by implanting an n-type impurity such as arsenic (As) or phosphorous (P) into the semiconductor substrate 1 (p-type well PW2) on the both sides of the gate electrode GE. In this process, the n⁺-type semiconductor regions 8 are formed in a self-aligning manner with respect to the sidewall insulating film SW on the sidewall parts of the gate electrode GE in the peripheral circuit region 2A. As a result, in the peripheral circuit region 2A, the source/drain regions (7, 8) of the LDD structure are formed on the both sides of the gate electrode GE.

Through the above-described steps, the n-type drain region MD, which functions as the drain region of the memory transistor, is formed by the n⁻-type semiconductor region 7b and the n⁺-type semiconductor region 8b having a higher impurity concentration than the region 7b, and the n-type source region MS, which functions as the source region of the memory transistor, is formed by the n⁻-type semiconductor region 7a and the n⁺-type semiconductor region 8a having a higher impurity concentration than the region 7a.

Then, thermal treatment for activating the impurities introduced into the source region MS (the n⁻-type semiconductor region 7a and the n⁺-type semiconductor region 8a), the drain region MD (the n⁻-type semiconductor region 7b and the n⁺-type semiconductor region 8b), and the source/drain regions (7, 8) is carried out.

Through the steps described above, the memory cell MC of a non-volatile memory is formed in the memory cell region 1A, and the n-channel-type MISFET Qn is formed in the peripheral circuit region 2A. The capacitive element C is formed in the peripheral circuit region 3A.

Then, according to needs, the main surface of the semiconductor substrate 1 is cleaned by carrying out, for example, wet etching using diluted hydrofluoric acid or the like. As a result, the upper surface of the n⁺-type semiconductor region 8a, the upper surface of the n⁺-type semiconductor region 8b, the upper surface of the control gate electrode CG, and the upper surface of the memory gate electrode MG are cleaned, and unnecessary matters such as natural oxide films are removed. Also, the upper surface of the n⁺-type semiconductor region 8 and the upper surface of the gate electrode GE are cleaned, and unnecessary matters such as natural oxide films are removed.

Figure 90:
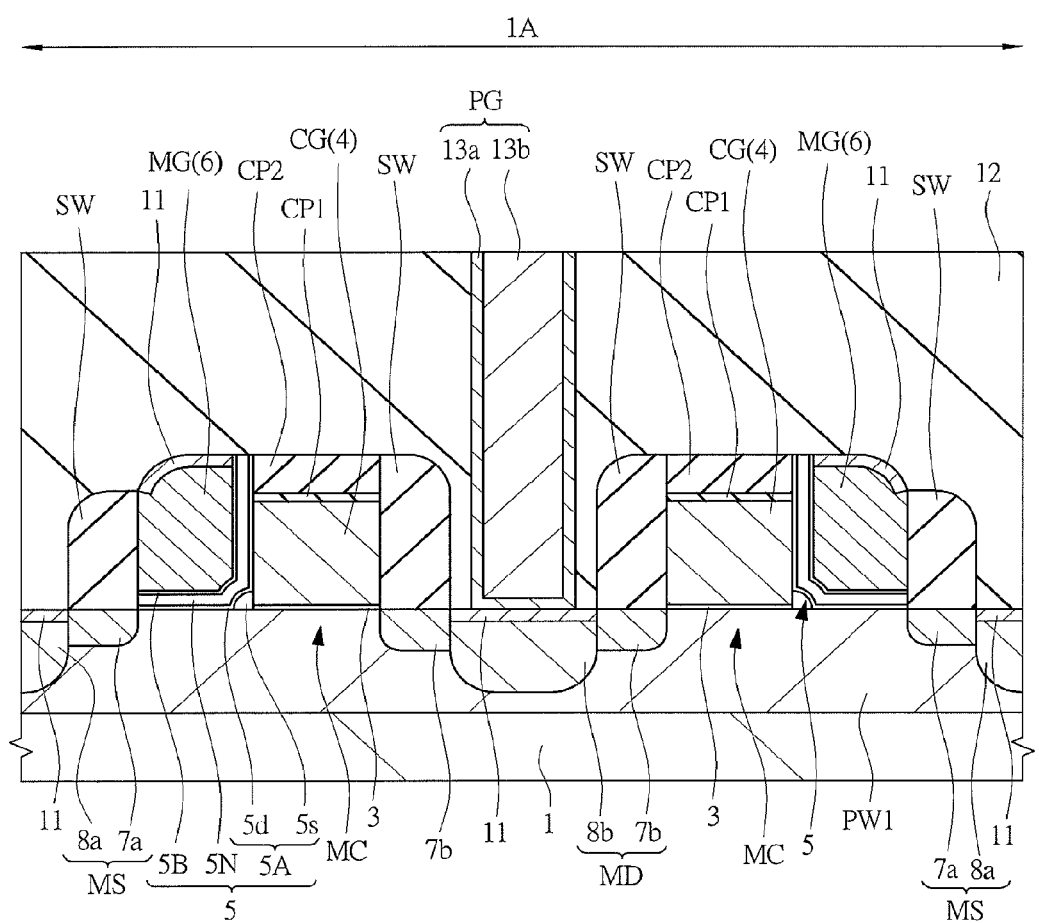
FIG. 90 is a main-part cross-sectional view showing a manufacturing step of the semiconductor device of the third embodiment continued from FIG. 88.
Figure 91:
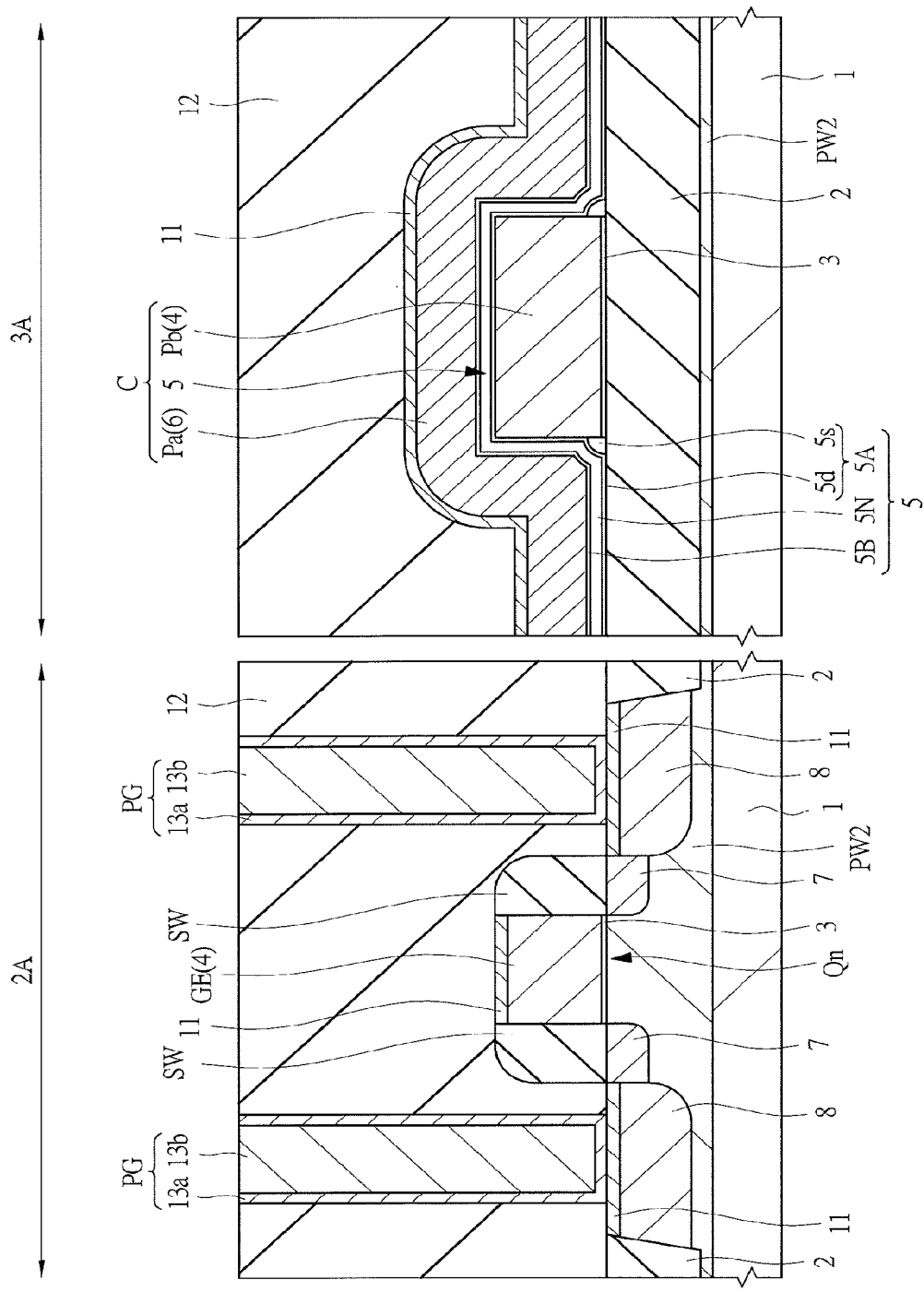
FIG. 91 is a main-part cross-sectional view showing a manufacturing step of the semiconductor device of the third embodiment continued from FIG. 89.

Then, as shown in FIG. 90 and FIG. 91, the metal silicide layer (metal silicide film) 11 is formed on each of the upper parts of the memory gate electrode MG, the n⁺-type semiconductor region 8a, and the n'-type semiconductor region 8b by using salicide techniques. Also, the metal silicide layer 11 is formed on each of the upper parts of the gate electrode GE and the n⁺-type semiconductor regions 8. Also, the metal silicide layer 11 is formed on the upper part of the upper electrode Pa of the capacitive element C.

Diffusion resistance, contact resistance, and others can be reduced by the metal silicide layer 11. The metal silicide layer 11 can be formed in the following manner.

For example, a metal film (not shown) is formed on the entire main surface of the semiconductor substrate 1, and the semiconductor substrate 1 is subjected to thermal treatment, thereby causing the upper layer parts of the memory gate electrode MG, the gate electrode GE, the n⁺-type semiconductor regions 8, 8a, and 8b, and the upper electrode Pa to react with the above-described metal film. As a result, the metal silicide layer 11 is formed on each of the upper parts of the memory gate electrode MG, the gate electrode GE, the n⁺-type semiconductor regions 8, 8a, and 8b, and the upper electrode Pa. The above-described metal film is composed of, for example, a cobalt (Co) film or a nickel (Ni) film and can be formed by using, for example, sputtering.

Then, after the unreacted metal film is removed, for example, a single film of a silicon oxide film or a stacked film of a silicon nitride film and a silicon oxide film formed on the silicon nitride film to be thicker than the silicon nitride film is formed as the insulating film (interlayer insulating film) 12 on the entire main surface of the semiconductor substrate 1 by using CVD or the like. After the formation of the insulating film 12, the upper surface of the insulating film 12 is planarized by using, for example, CMP (Chemical Mechanical Polishing) according to needs.

Then, contact holes (openings, through holes) are formed in the insulating film 12 by subjecting the insulating film 12 to dry etching. Then, a stacked film of a barrier conductor film 13a and a main conductor film 13b is formed in the contact holes. Then, the unnecessary parts of the main conductor film 13b and the barrier conductor film 13a on the insulating film 12 are removed by, for example, CMP or etch-back, thereby forming plugs PG. The plugs PG are formed on upper parts of, for example, the n⁺-type semiconductor regions 8, 8a, and 8b. Although not shown in the cross sections shown in FIG. 90 and FIG. 91, the plugs PG are formed also on the upper parts of the control gate electrode CG, the memory gate electrode MG, the gate electrode GE, and others. For example, a titanium film, a titanium nitride film, or a stacked film of these can be used as the barrier conductor film 13a. For example, a tungsten film or the like can be used as the main conductor film 13b.

Figure 92:
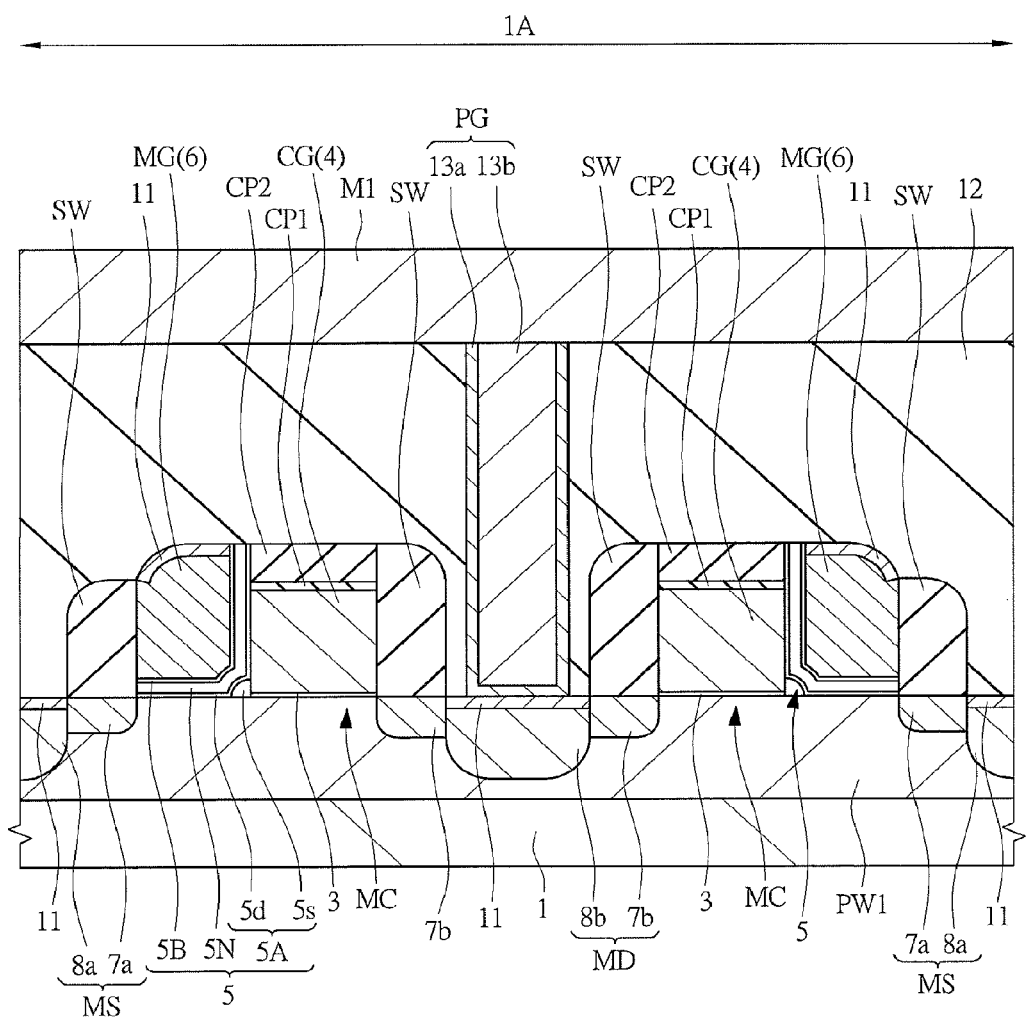
FIG. 92 is a main-part cross-sectional view showing a manufacturing step of the semiconductor device of the third embodiment continued from FIG. 90.
Figure 93:
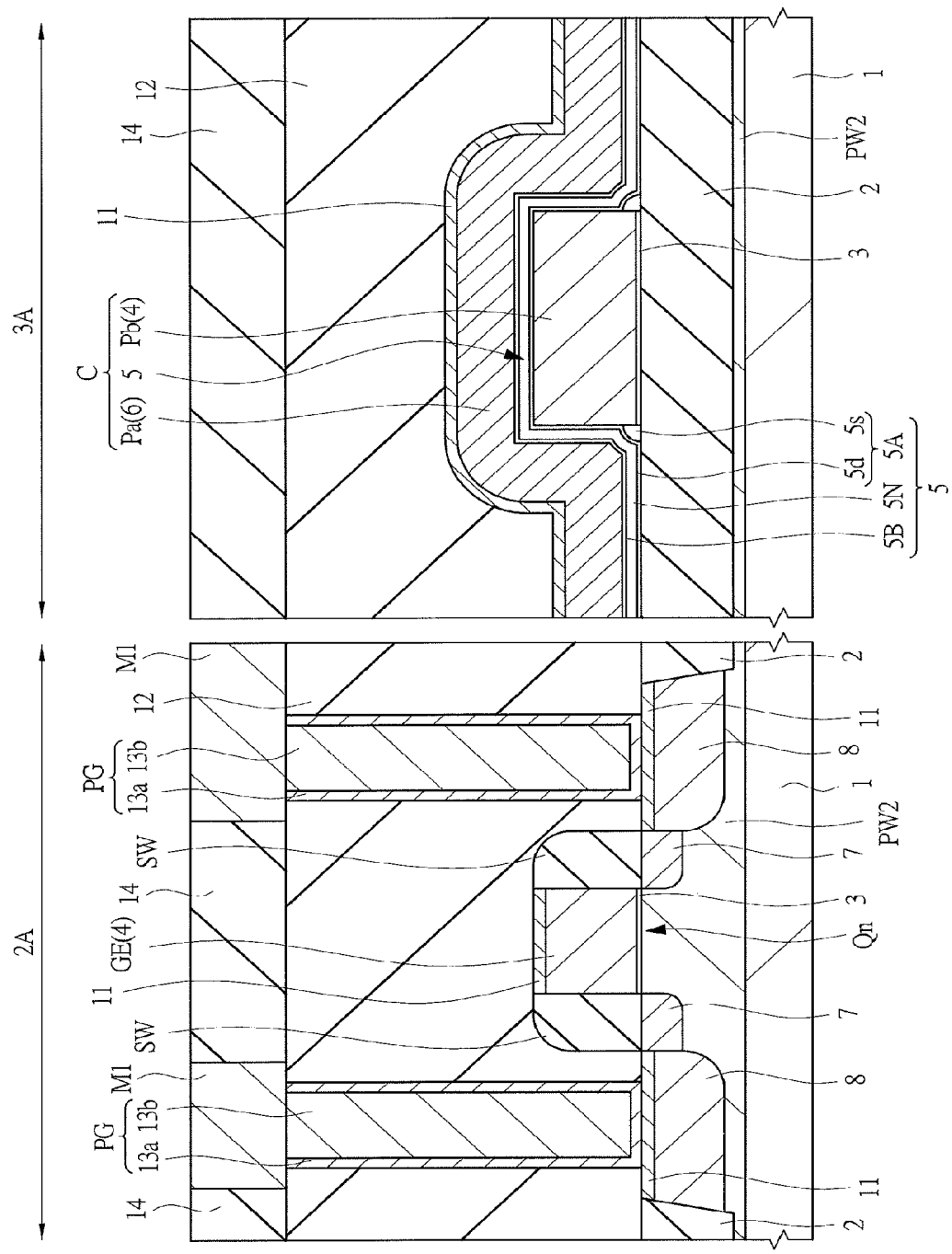
FIG. 93 is a main-part cross-sectional view showing a manufacturing step of the semiconductor device of the third embodiment continued from FIG. 91.

Then, as shown in FIG. 92 and FIG. 93, first-layer wiring (M1) is formed on the insulating film 12, in which the plugs PG have been buried. The first-layer wiring is formed by using, for example, damascene techniques (herein, single damascene techniques). First, a trench insulating film 14 is formed on the insulating film, in which the plugs PG have been buried, and wiring trenches are formed in the trench insulating film 14 by using photolithography techniques and dry etching techniques. Then, a barrier conductor film (not shown) is formed on the main surface of the semiconductor substrate 1 including the interior of the wiring trenches, and subsequently, a seed layer of copper (not shown) is formed on the barrier conductor film by, for example, CVD or sputtering. Then, a copper plating film is formed on the seed layer by using, for example, electrolytic plating to bury the interior of the wiring trenches with the copper plating film. Thereafter, the copper plating film, the seed layer, and a barrier metal film in the regions except the interior of the wiring trenches are removed by CMP, thereby forming the first-layer wiring whose main conductive material is copper. As the barrier conductor film, for example, a titanium nitride film, a tantalum film, or a tantalum nitride film can be used.

Thereafter, wiring of second and subsequent layers is formed by dual damascene, but the description thereof will be omitted here. Other than the above-described damascene techniques, each of the wirings can be formed by patterning an electrically-conductive film for wiring. In that case, as the electrically-conductive film, for example, tungsten or aluminum can be used.

DESCRIPTION OF MODIFICATION EXAMPLES

Figure 95:
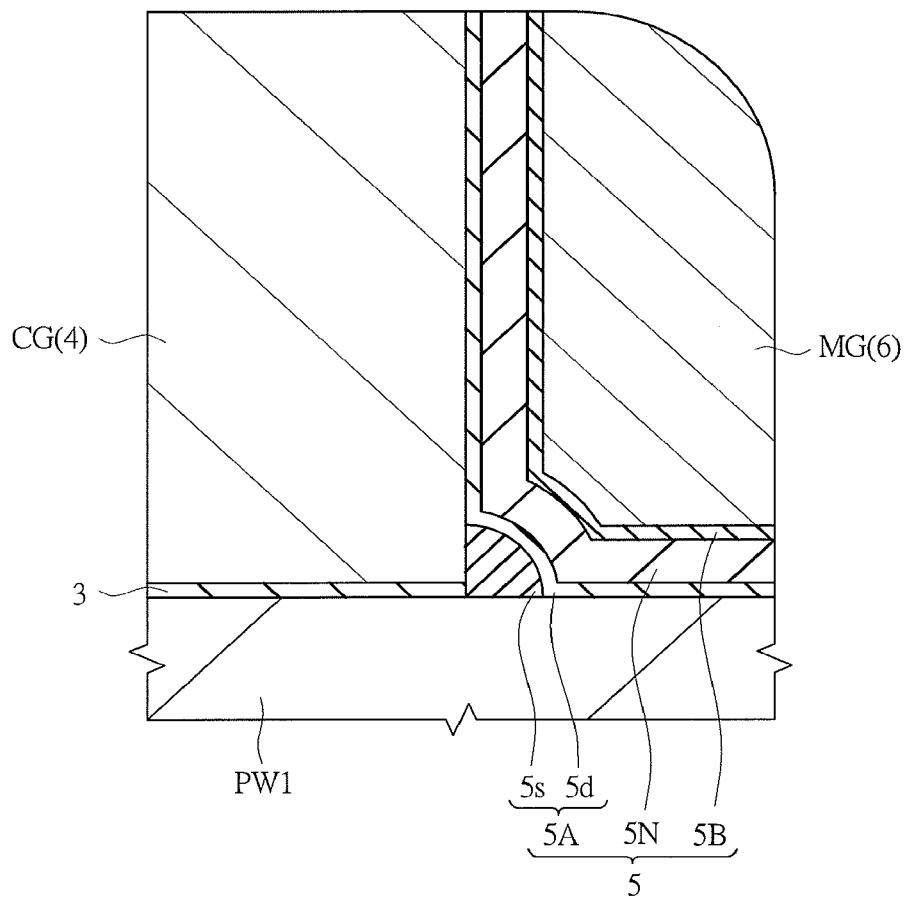
FIG. 95 is a main-part cross-sectional view showing another memory cell structure of the semiconductor device of the third embodiment.

FIG. 94 to FIG. 96 are main-part cross-sectional views showing different memory cell structures of the semiconductor device of the present embodiment.

Example 1

As described above, in the first film (lower layer film) constituting the insulating film (ONO film) 5, the silicon oxide film (deposited film) 5d can be formed by thermal oxidation or CVD. FIG. 72 and others show the shape of the silicon oxide film (deposited film) 5d formed by CVD. However, when the silicon oxide film (deposited film) 5d is formed by thermal oxidation, the structure shown in FIG. 94 is obtained.

In this case, as shown in the drawing, the silicon oxide film (deposited film) 5d is formed on the side surface of the control gate electrode CG and on the semiconductor substrate 1 (p-type well PW1).

Also in the structure shown in FIG. 94, effects similar to those described in the third embodiment can be achieved.

Example 2

With respect to the above-described structure of FIG. 59 having the silicon nitride film CP2 and the silicon oxide film CP1 on the control gate electrode CG, the silicon nitride film CP2 and the silicon oxide film CP1 may be omitted as shown in FIG. 95.

Example 3

In FIG. 59 and others, the sidewall film 5s is illustrated to have a curved shape (in the cross section thereof, arc-like shape). However, the shape of the sidewall film 5s is not limited to this shape. Examples of the shapes of the sidewall film 5s will be described with reference to FIGS. 96A to 96D.

Figure 96A:
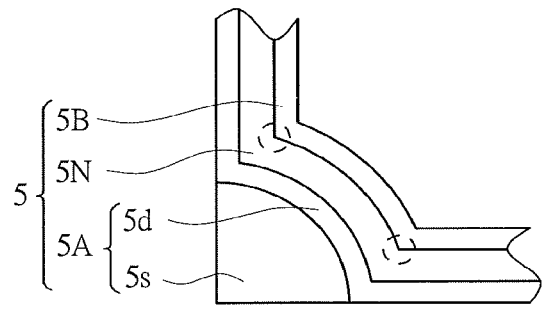
FIG. 96A is a main-part cross-sectional view showing another memory cell structure of the semiconductor device of the third embodiment.

In FIG. 96A, similar to FIG. 59 and others, the cross-sectional shape of the sidewall film 5s is an arc-like shape. In other words, the side surface of the sidewall film 5s is rounded.

Figure 96B:
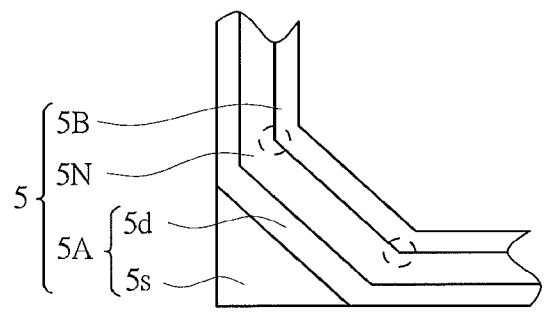
FIG. 96B is a main-part cross-sectional view showing another memory cell structure of the semiconductor device of the third embodiment.

Also, in FIG. 96B, the cross-sectional shape of the sidewall film 5s is a tapered shape (see FIG. 63). In other words, the side surface of the sidewall film 5s is inclined.

In the shapes of above-described FIGS. 96A and 96B, as described above, the corner parts (dashed-line circles in the drawings) of the silicon nitride film (5N) are dispersed to two locations, and concentration difference in the hole concentration in the channel region is reduced. Therefore, more uniform hole injection can be carried out in a larger channel region, and the erasure characteristic can be improved.

Figure 96C:
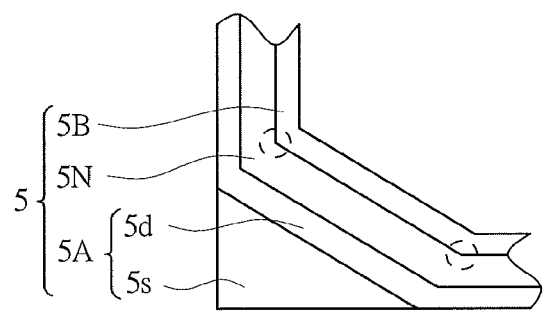
FIG. 96C is a main-part cross-sectional view showing another memory cell structure of the semiconductor device of the third embodiment.
Figure 96D:
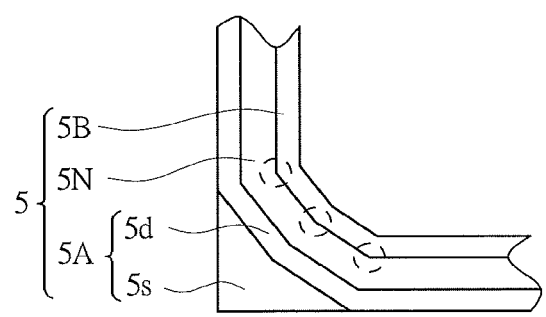
FIG. 96D is a main-part cross-sectional view showing another memory cell structure of the semiconductor device of the third embodiment.

Also, as shown in FIG. 96C, when the cross-sectional shape of the sidewall film 5s is a tapered shape, the width W5s of the sidewall film 5s may be made larger than the height H5s. Furthermore, as shown in FIG. 96D, the cross-sectional shape of the sidewall film 5s may be an approximately quadrangular shape with a corner part having an angle of 180° or more. In this case, the side surface of the sidewall film 5s has a dented shape.

Also in the shapes of above-described FIGS. 96C and 96D, the corner parts (dashed-line circles in the drawings) of the silicon nitride film (5N) are dispersed to two or more locations, and concentration difference in the hole concentration is reduced in the channel region. Therefore, more uniform hole injection can be carried out in a larger channel region, and the erasure characteristic can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

Electronic devices into which the semiconductor devices (non-volatile memories) described in the embodiments above are incorporated are not particularly limited. For example, the non-contact IC card has a strong demand for reduction in power consumption and is suitable for using the semiconductor devices of the above-described embodiments.

[Note 1]

A manufacturing method of a semiconductor device including:

(a) a step of forming a first gate electrode on a semiconductor substrate via a first insulating film;

(b) a step of forming a second insulating film having a charge accumulating part therein on the semiconductor substrate and on a surface and a side surface of the first gate electrode; and (c) a step of forming a second gate electrode on a sidewall part of the first gate electrode via the second insulating film, wherein the step (b) is a step of forming the second insulating film having a first film, a second film, and a third film and includes:

(b1) a step of forming the first film on the semiconductor substrate and on the surface and the side surface of the first gate electrode;

(b2) a step of forming the second film serving as the charge accumulating part on the first film;

(b3) a step of forming a first deposited film on the second film;

(b4) a step of anisotropically etching the first deposited film, thereby forming a sidewall film on the sidewall part of the first gate electrode via the first film and the second film; and (b5) a step of forming a second deposited film on the second film and the sidewall film, thereby forming the third film having the sidewall film and the second deposited film.

[Note 2]

The manufacturing method of the semiconductor device according to note 1, wherein a film thickness of the first film is 2 nm or less.

[Note 3]

A manufacturing method of a semiconductor device comprising:

(a) a step of forming a first gate electrode on a semiconductor substrate via a first insulating film;

(b) a step of forming a second insulating film having a charge accumulating part therein on the semiconductor substrate and on a surface and a side surface of the first gate electrode; and (c) a step of forming a second gate electrode on a sidewall part of the first gate electrode via the second insulating film, wherein the step (b) is a step of forming the second insulating film having a first film, a second film, and a third film and includes:

(b1) a step of forming a first deposited film on the semiconductor substrate and on the surface and the side surface of the first gate electrode;

(b2) a step of anisotropically etching the first deposited film, thereby forming a sidewall film on the sidewall part of the first gate electrode;

(b3) a step of forming a second deposited film on the semiconductor substrate and on the surface and the sidewall film of the first gate electrode, thereby forming the first film having the sidewall film and the second deposited film;

(b4) a step of forming the second film serving as the charge accumulating part on the first film; and (b5) a step of forming the third film on the second film.

[Note 4]

The manufacturing method of the semiconductor device according to note 3, wherein a film thickness of the second deposited film is 2 nm or less.

[Note 5]

A semiconductor device comprising:

a semiconductor substrate;

a first gate electrode disposed above the semiconductor substrate;

a second gate electrode disposed above the semiconductor substrate so as to be adjacent to the first gate electrode;

a first insulating film formed between the first gate electrode and the semiconductor substrate; and a second insulating film formed between the second gate electrode and the semiconductor substrate and between the first gate electrode and the second gate electrode, the second insulating film having a charge accumulating part therein, wherein the second insulating film includes:

a first film;

a second film disposed on the first film and serving as the charge accumulating part; and a third film disposed on the second film, the first film includes:

a sidewall film positioned between the first gate electrode and the second gate electrode; and a deposited film positioned between the second gate electrode and the semiconductor substrate, electrons are accumulated in the charge accumulating part, and the electrons accumulated in the charge accumulating part are erased when holes are injected by a tunneling phenomenon into the charge accumulating part via the third film from the second gate electrode side.

[Note 6]

The semiconductor device according to note 5, wherein the deposited film extends also to a part between the sidewall film and the second gate electrode.

[Note 7]

The semiconductor device according to note 5, wherein a height and a width of the sidewall film is 10 nm or more and 20 nm or less.

[Note 8]

The semiconductor device according to note 5, wherein a film thickness of the deposited film positioned between the second gate electrode and the semiconductor substrate is 6 nm or less.

[Note 9]

The semiconductor device according to note 8, wherein the film thickness of the deposited film positioned between the second gate electrode and the semiconductor substrate is 2 nm or more.

[Note 10]

The semiconductor device according to note 5, wherein the third film is a silicon oxynitride film.

[Note 11]

The semiconductor device according to note 10, wherein the deposited film of the first film is a silicon oxide film.

[Note 12]

The semiconductor device according to note 5, wherein the second gate electrode contains an impurity ion, and an impurity concentration in a lower part of the second gate electrode is lower than an impurity concentration in an upper part of the second gate electrode.

[Note 13]

The semiconductor device according to note 12, wherein the impurity ion is an n-type impurity ion.

[Note 14]

The semiconductor device according to note 13, wherein a lower part of the second gate electrode is intrinsic semiconductor.

What is claimed is:

1. A semiconductor device comprising:

a semiconductor substrate;

a first gate electrode disposed above the semiconductor substrate;

a second gate electrode disposed above the semiconductor substrate so as to be adjacent to the first gate electrode;

a first insulating film formed between the first gate electrode and the semiconductor substrate; and a second insulating film formed between the second gate electrode and the semiconductor substrate and between the first gate electrode and the second gate electrode, the second insulating film having a charge accumulating part therein, wherein the first and second gate electrodes are silicon electrodes, the second insulating film includes:

a first film;

a second film disposed on the first film and serving as the charge accumulating part; and a third film disposed on the second film, the first film includes:

a sidewall film positioned between the first gate electrode and the second gate electrode; and a deposited film positioned between the second gate electrode and the semiconductor substrate, electrons are accumulated in the charge accumulating part, the electrons accumulated in the charge accumulating part are erased when holes are injected by a tunneling phenomenon into the charge accumulating part via the third film from the second gate electrode side, the deposited film extends also to a part between the sidewall film and the second gate electrode, and to a part in contact with the first gate electrode, a height of the second gate electrode is higher than a height of the first gate electrode, a height of the sidewall film is lower than the height of the first gate electrode, and a width of the sidewall film is smallest at an uppermost part thereof and gradually increases from the uppermost part substantially to a bottom thereof.

2. The semiconductor device according to claim 1, wherein a height and a width of the sidewall film is 10 nm or more and 20 nm or less.

3. The semiconductor device according to claim 1, wherein a film thickness of the deposited film positioned between the second gate electrode and the semiconductor substrate is 6 nm or less.

4. The semiconductor device according to claim 3, wherein the film thickness of the deposited film positioned between the second gate electrode and the semiconductor substrate is 2 nm or more.

5. The semiconductor device according to claim 1, wherein the third film is a silicon oxynitride film.

6. The semiconductor device according to claim 5, wherein the deposited film of the first film is a silicon oxide film.

7. The semiconductor device according to claim 1, wherein the second gate electrode contains an impurity ion, and an impurity concentration in a lower part of the second gate electrode is lower than an impurity concentration in an upper part of the second gate electrode.

8. The semiconductor device according to claim 7, wherein the impurity ion is an n-type impurity ion.

9. The semiconductor device according to claim 8, wherein a lower part of the second gate electrode is intrinsic semiconductor.

* * * * *